United States Patent
Mochizuki et al.

(10) Patent No.: US 10,488,755 B2
(45) Date of Patent: Nov. 26, 2019

(54) PATTERN FORMING METHOD, PHOTO MASK MANUFACTURING METHOD, AND ELECTRONIC DEVICE MANUFACTURING METHOD

(71) Applicant: FUJIFILM Corporation, Tokyo (JP)

(72) Inventors: Hidehiro Mochizuki, Shizuoka (JP); Shuji Hirano, Shizuoka (JP); Akira Takada, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 5 days.

(21) Appl. No.: 15/718,292

(22) Filed: Sep. 28, 2017

(65) Prior Publication Data

US 2018/0017865 A1 Jan. 18, 2018

Related U.S. Application Data

(63) Continuation of application No. PCT/JP2016/060222, filed on Mar. 29, 2016.

(30) Foreign Application Priority Data

Mar. 31, 2015 (JP) ................. 2015-074104
Sep. 30, 2015 (JP) ................. 2015-192628

(51) Int. Cl.
| | | |
|---|---|---|
| *G03F 7/004* | (2006.01) | |
| *G03F 7/038* | (2006.01) | |
| *G03F 7/039* | (2006.01) | |
| *G03F 1/76* | (2012.01) | |
| *G03F 7/075* | (2006.01) | |
| *G03F 7/16* | (2006.01) | |
| *G03F 7/20* | (2006.01) | |
| *G03F 7/32* | (2006.01) | |
| *G03F 7/38* | (2006.01) | |
| *G03F 7/40* | (2006.01) | |

(52) U.S. Cl.
CPC ............. *G03F 7/0045* (2013.01); *G03F 1/76* (2013.01); *G03F 7/0046* (2013.01); *G03F 7/038* (2013.01); *G03F 7/039* (2013.01); *G03F 7/0382* (2013.01); *G03F 7/0392* (2013.01); *G03F 7/0395* (2013.01); *G03F 7/0397* (2013.01); *G03F 7/0758* (2013.01); *G03F 7/162* (2013.01); *G03F 7/168* (2013.01); *G03F 7/2037* (2013.01); *G03F 7/2063* (2013.01); *G03F 7/322* (2013.01); *G03F 7/38* (2013.01); *G03F 7/40* (2013.01)

(58) Field of Classification Search
CPC ...... G03F 7/0045; G03F 7/0046; G03F 7/038; G03F 7/0382; G03F 7/039; G03F 7/0395; G03F 7/0397; G03F 7/0758; G03F 7/162; G03F 7/168; G03F 7/2037; G03F 7/2063; G03F 7/322; G03F 7/38; G03F 7/40
USPC .................................. 430/296, 942
See application file for complete search history.

(56) References Cited

U.S. PATENT DOCUMENTS

| | | |
|---|---|---|
| 8,890,094 B2 | 11/2014 | Wieland et al. |
| 9,828,457 B2 | 11/2017 | Imada et al. |
| 9,904,167 B2 | 2/2018 | Tsuchimura |
| 2014/0346369 A1 | 11/2014 | Matsumoto |

FOREIGN PATENT DOCUMENTS

| | | |
|---|---|---|
| JP | 2006-080304 A | 3/2006 |
| JP | 2011-517130 A | 5/2011 |
| JP | 2011-203646 A | 10/2011 |
| JP | 2015-005729 A | 1/2015 |
| JP | 2015007807 A | 1/2015 |
| JP | 2015-028576 A | 2/2015 |
| KR | 1020140138357 A | 12/2014 |
| TW | 201447485 A | 12/2014 |
| TW | 201509892 A | 3/2015 |
| WO | 2015005051 A | 1/2015 |

OTHER PUBLICATIONS

The International Technology Roadmap for Semiconductors: 2013 (ITRS), Table LITH4 (Optical Mask Requirements)(2013).
Elmar Platzgummer et al., "eMET—50 KeV electron Mask Exposure Tool Development based on proven multi-beam projection technology", Proc. of SPIE, 2010, vol. 7823 782308-1.
Christof Klein et al., "Performance of the Proof-of-Concept Multi-Beam Mask Writer (MBMW POC)", Proc. of SPIE, 2013, vol. 8880 88801E-1.
International Search Report for PCT/JP2016/060222 filed Jun. 28, 2016.

(Continued)

*Primary Examiner* — Christopher G Young
(74) *Attorney, Agent, or Firm* — Sughrue Mion, PLLC

(57) ABSTRACT

A pattern forming method including a step of coating a substrate with an actinic ray-sensitive or radiation-sensitive resin composition and forming an actinic ray-sensitive or radiation-sensitive film; a step of simultaneously irradiating the actinic ray-sensitive or radiation-sensitive film with a plurality of electron beams; and a step of developing the actinic ray-sensitive or radiation-sensitive film after the irradiation with electron beams is provided. The composition contains a resin (A), a photoacid generator (B), and an acid diffusion control agent (C) and a molar ratio (Qp) between the photoacid generator (B) and the acid diffusion control agent (C), which is represented by Equation (1) is 0.3 or greater.

$Qp$ (molar ratio)=Acid diffusion control agent $(C)$/Photoacid generator $(B)$     (1)

9 Claims, No Drawings

(56) References Cited

OTHER PUBLICATIONS

International Preliminary Report on Patentability with translation of Written Opinion dated Oct. 3, 2017, issued by the International Searching Authority in application No. PCT/JP2016/060222.
Communication dated Jun. 12, 2018, from the Japanese Patent Office in counterpart application No. 2017-510046.
Communication dated Oct. 2, 2018 from the Japanese Patent Office in counterpart application No. 2017-510046.
Notification of Reason for Refusal dated Oct. 24, 2018 from the Korean Intellectual Property Office in counterpart application No. 10-2017-7030789.
Office Action dated Apr. 12, 2019, issued by the Korean Intellectual Property Office in corresponding Korean Application No. 10-2017-7030789.
Office Action dated Aug. 30, 2019 in corresponding Taiwan Application No. 105109967.

PATTERN FORMING METHOD, PHOTO MASK MANUFACTURING METHOD, AND ELECTRONIC DEVICE MANUFACTURING METHOD

CROSS-REFERENCE TO RELATED APPLICATIONS

This application is a Continuation Application of PCT Application No. PCT/JP2016/060222, filed Mar. 29, 2016, and based upon and claiming the benefit of priority from Japanese Patent Applications No, 2015-074104, filed Mar. 31, 2015; and No. 2015-192628, filed Sep. 30, 2015, the entire contents of all of which are incorporated herein by reference,

BACKGROUND OF THE INVENTION

1. Field of the Invention

The present invention relates to a pattern forming method which is suitably used in an ultra microlithography process such as the manufacturing of ultra Large Scale Integration (LSI) or a high capacity microchip, or another fabrication process and in which an actinic ray-sensitive or radiation-sensitive resin composition is used, and a photo mask manufacturing method and an electronic device manufacturing method in which this pattern forming method is included. Specifically, the present invention relates to a pattern forming method which can form a high definition pattern by using a multibeam mask writer (MBMW) that can simultaneously perform irradiation with a plurality of electron beams and in which an actinic ray-sensitive or radiation-sensitive resin composition was used, and a photo mask manufacturing method and an electronic device manufacturing method in which this pattern forming method is included.

2. Description of the Related Art

In the related art, in the process of manufacturing a semiconductor device such as an integrated circuit (IC) or LSI, microfabrication by photolithography by using a photoresist composition is performed, and a resin or an additive suitable for various lithography technologies is developed. Recently, as the integration density of integrated circuits increases, the formation of ultrafine patterns in a submicron region and a quarter micron region has been required. Accordingly, the exposure wavelength also shifts from the g line to the i line tends to be shorter in the same manner as in the excimer laser light. Therefore, currently, photolithography using the extreme ultra violet (EUV) light is also under development.

In the photolithography, a photo mask in which a circuit pattern for transferring a circuit pattern is carved on a silicon wafer is used. Currently, ideally, electron beam (EB) lithography of which resolving power is highest and microfabrication performance is excellent is used for manufacturing a photo mask.

However, miniaturization and complication of a design pattern, and electron beam exposure time is greatly increase in the manufacturing of the mask due to the increase of the number of masks caused by multiple exposure in the wafer process.

Meanwhile, it is necessary to increase the exposure dose in order to achieve a target value of line width roughness (LWR) disclosed in The International Technology Roadmap for Semiconductors: 2013 ((ITRS), Table LITH4 (Optical Mask Requirements)(2013)), but it is obvious that the electron beam exposure time further increases according to the increases of the exposure dose. Since it is important to realize good throughput in order to reduce the process cost, it is desired that technologies in which the electron beam exposure time is reduced, an exposure amount is increased, and LWR performances are enhanced is developed.

The electron beam exposure can be greatly classified into a direct drawing method and a mask projection method. A method of exposing electron beams in the related art is a point beam system. However, the method is evolved into a variable shaped beam method (VSB) and a partial batch method (cell projection) in order to increase the exposure efficiency and further proceeds to a mask projection method having all patterns in the same manner as in the light exposure, as the continuation of the evolvement. Meanwhile, there is a multibeam method (hereinafter, also referred to as "electron beam multibeam exposure") in which efficiency is increased by simultaneously performing irradiation with a plurality of electron beams at the same time (for example, refer to Elmar Platzgummer. Stefan Cernusca, Christof Klein, Jan Klikovits, Samuel Kvasnica, Hans Loeschner, "eMET—50 keV electron Mask Exposure Tool Development based on proven multibeam projection technology", Proc. SPIE Vol. 7823, 782308 (2010) and Christof Klein, Hans Loeschner, Elmar Platzgummer, "Performance of the Proof-of-Concept Multibeam Mask Writer", Proc. SPIE Vol. 8880, 88801E (2013)).

SUMMARY OF THE INVENTION

According to the electron beam multibeam exposure, it is expected that the exposure amount can be increased, and the electron beam exposure time can be reduced.

However, as a result of reviews by the present inventors, it is found that, in a case where a resist composition that is generally used for electron beam exposure is exposed with electron beam multibeam, exposure in a high exposure amount range for short exposure time becomes possible, but LWR and resolution that are required for ultrafine patterns having several tens of nm order cannot he satisfied.

The present invention has been developed in view of the above circumstances, and an object thereof is to provide a pattern forming method that can form a pattern in which both LWR performance and resolution are excellent for a short period of electron beam exposure time and thus that can enhance the productivity of a photo mask, and a photo mask manufacturing method and an electronic device manufacturing method in which this pattern forming method is included.

An aspect of the present invention is as follows.

[1] A pattern forming method comprising:

a step of coating a substrate with an actinic ray-sensitive or radiation-sensitive resin composition which contains a resin (A), a photoacid generator (B), and an acid diffusion control agent (C) and in which a molar ratio (Qp) between the photoacid generator (B) and the acid diffusion control agent (C), which is represented by Equation (1) is 0.3 or greater and forming an actinic ray-sensitive or radiation-sensitive film;

a step of simultaneously irradiating the actinic ray-sensitive or radiation-sensitive film with a plurality of electron beams; and a step of developing the actinic ray-sensitive or radiation-sensitive film after the irradiation with electron beams.

$Qp$(molar ratio)=Acid diffusion control agent $(C)$/Photoacid generator $(B)$    (1)

[2] The pattern forming method according to [1], in which the molar ratio (Qp) between a photoacid generator (B) and the acid diffusion control agent (C), which is represented by Equation (1) in the actinic ray-sensitive or radiation-sensitive resin composition is 0.5 or greater.

[3] The pattern forming method according to [1] or [2], in which a content of the photoacid generator (B) in the actinic ray-sensitive or radiation-sensitive resin composition is 10 mass % to 50 mass % with respect to a total solid content in the composition.

[4] The pattern forming method according to any one of [1] to [3], in which the actinic ray-sensitive or radiation-sensitive resin composition contains a compound represented by Formula (1-1) or (1-2), as the photoacid generator (B),

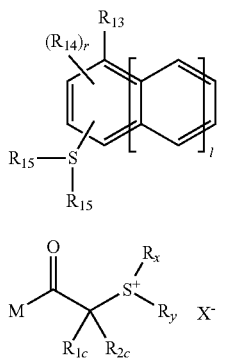

in Formula (1-1), $R_{13}$ represents a hydrogen atom, a fluorine atom, a hydroxyl group, an alkyl group, a cycloalkyl group, an alkoxy group, an alkoxycarbonyl group, or an alkoxy group having a monocyclic or polycyclic cycloalkyl skeleton, $R_{14}$'s, in a case where a plurality of $R_{14}$'s exist, each independently represent an alkyl group, a cycloalkyl group, an aikoxy group, an alkylsulfonyl group, a cycloalkylsulfonyl group, an alkylcarbonyl group, an alkoxycabonyl group, or an alkoxy group having a monocyclic or polycyclic cycloalkyl skeleton, $R_{15}$'s each independently represent an alkyl group, a cycloalkyl group, or a naphthyl group, and two $R_{15}$'s may be bonded to each other to form a ring, 1 represents an integer of 0 to 2, r represents an integer of 0 to 8, and $X^-$ represents a non-nucleophilic anion, in Formula (1-2), M represents an alkyl group, a cycloalkyl group, or an aryl group, and a cycloalkyl group may include a carbon-carbon double bond, $R_{1c}$ and $R_{2c}$ each independently represent a hydrogen atom, an alkyl group, a cycloalkyl group, a halogen atom, a cyano group, or an aryl group, $R_x$ and $R_y$ each independently represent an alkyl group, a cycloalkyl group, a 2-oxoalkyl group, an alkoxycarbonylalkyl group, an ally group, or a vinyl group, at least two of M, $R_{1c}$, $R_{2c}$, and $R_y$ are bonded to each other to form a ring, and the ring structure may include a carbon-carbon double bond, and $X^-$ represents a non-nucleophilic anion.

[5] The pattern forming method according to [4], in which the actinic ray-sensitive or radiation-sensitive resin composition contains at least a compound in which I in Formula (1-1) is 1, as the photoacid generator (B).

[6] The pattern forming method according to [4] or [5], in which the actinic ray-sensitive or radiation-sensitive resin composition contains at least a compound represented by Formula (1-2a) as the photoacid generator (B),

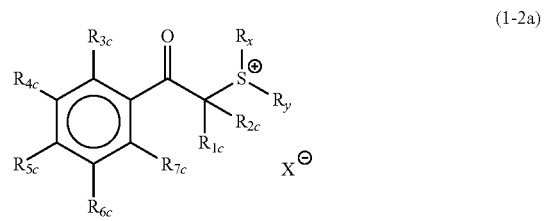

in the formula, each of $R_{1c}$, $R_{2c}$, $R_x$, $R_y$, and $X^-$ is the same as $R_{1c}$, $R_{2c}$, $R_x$, $R_y$, and $X^-$ in Formula (1-2), $R_{3c}$, $R_{4c}$, $R_{5c}$, $R_6$, and $R_{7c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group, and two or more of $R_{3c}$, $R_{4c}$, $R_{5c}$, $R_{6c}$, and $R_{7c}$, $R_{1c}$ and $R_{7c}$, and $R_7$ and $R_x$ may be bonded to each other to form rings.

[7] The pattern forming method according to any one of [1] to [6], in which the resin (A) includes an acid decomposable group which is decomposed due to an action of an acid and of which polarity increases.

[8] The pattern forming method according to any one of [1] to [6], in which the actinic ray-sensitive or radiation-sensitive resin composition further includes a compound in which a dissolution rate to a developer due to an action of an acid decreases.

[9] A photo mask manufacturing method comprising: the pattern forming method according to any one of [1] to [8].

[10] An electronic device manufacturing method comprising: the pattern forming method according to any. one of [1] to [8].

According to the present invention, it is possible to provide a pattern forming method that can form a pattern in which both LWR performance and resolution are excellent for a short period of electron beam exposure time and that can enhance productivity of a photo mask, and a photo mask manufacturing method and an electronic device manufacturing method in which this pattern forming method is included.

DESCRIPTION OF THE PREFERRED EMBODIMENTS

Hereinafter, detailed embodiments of the present invention are specifically provided.

In the description of a group (atomic group) in the present specification, a description of not indicating substitution or unsubstitution includes both a group not having a substituent and a group having a substituent. For example, an "alkyl group" not indicating substitution or unsubstitution include not only an alkyl group (unsubstituted alkyl group) not having a substituent but also an alkyl group (substituted alkyl group) having a substituent.

For example, "actinic rays" or "radiation" in the present specification mean far ultraviolet rays represented by a bright line spectrum of a mercury lamp, far ultraviolet rays represented by an excimer laser, extreme ultraviolet rays (EUV rays), X rays, or electron beams (EB). According to the present invention, "light" means actinic rays or radiation.

Unless described otherwise, "exposure" according to the present invention includes not only exposure by a mercury lamp, far ultraviolet rays represented by an excimer laser, X rays, and EUV rays, but also drawing by particle beams such as electron beams and ion beams.

The pattern forming method according to the present invention includes:

a step of coating a substrate with an actinic ray-sensitive or radiation-sensitive resin composition which contains a resin (A), a photoacid generator (B), and an acid diffusion control agent (C) and in which a molar ratio (Qp) between the photoacid generator (B) and the acid diffusion control agent (C), which is represented by Equation (1) is 0.3 or greater and forming an actinic ray-sensitive or radiation-sensitive film;

a step of simultaneously irradiating the actinic ray-sensitive or radiation-sensitive film with a plurality of electron beams; and a step of developing the actinic ray-sensitive or radiation-sensitive film after the irradiation with electron beams, $$Qp(\text{molar ratio})=\text{Acid diffusion control agent }(C)/\text{Photoacid generator }(B) \quad (1)$$

As described above, in a case where exposure is performed by a multibeam method of simultaneously irradiating a resist composition that is generally used for electron beam exposure with a plurality of electron beams, the present inventor have found that it was possible to perform exposure for a short period of exposure time and in a high exposure amount, but it was not possible to obtain desired LMR performance and resolution.

The present inventor diligently conducted research to find that, in a case where statistical fluctuation of a photoacid generator and an acid diffusion control agent in the exposure in a high exposure amount range (for example, 100 µC/cm² or greater) is reduced by increasing a ratio of an acid diffusion control agent to a photoacid generator contained in a resist composition, patterns having excellent LWR performance and excellent resolution even by the exposure in a high exposure amount range by electron beam multibeam method can be formed. In a case where, while statistical fluctuation is reduced by increasing a ratio of an acid diffusion control agent to a photoacid generator contained in the actinic ray-sensitive or radiation-sensitive resin composition, the exposure by an electron beam multibeam method is combined, it is possible to form patterns in which satisfactory LWR performance and satisfactory resolution are exhibited in a high exposure amount range (for example, 100 µC/cm² or greater), and productivity is secured.

The present invention is completed on the corresponding basis, and a first aspect thereof is to use an actinic ray-sensitive or radiation-sensitive resin composition containing a photoacid generator and an acid diffusion control agent in a ratio in which a molar ratio Qp represented by Equation (1) is 0.3 or greater in the pattern forming method including simultaneous irradiation of an actinic ray-sensitive or radiation-sensitive film with a plurality of electron beams.

$$Qp(\text{molar ratio})=\text{Acid diffusion control agent }(C)/\text{Photoacid generator }(B) \quad (1)$$

According to the multibeam method of performing simultaneous irradiation with a plurality of electron beams, even in a case where a low-sensitivity resist composition (for example, sensitivity of 100 µC/cm² or greater) in which a molar ratio Qp between a photoacid generator and an acid diffusion control agent, which is represented by Equation (1) is 0.3 or greater is used, a resist composition (for example, sensitivity of about 25 µC/cm²) having general sensitivity can be exposed for a shorter period of time, than in the electron beam exposure by a point beam method or a VSB method.

According to another aspect, after a film forming step, the pattern forming method of the present invention may further include a step of forming an overcoat by performing coating with an overcoat composition.

First, an actinic ray-sensitive or radiation-sensitive resin composition (hereinafter, also referred to as a "composition of the present invention") used in the pattern forming method according to the present invention is described below.

<Actinic Ray-Sensitive or Radiation-Sensitive Resin Composition>

According to an aspect, the composition of the present invention contains a resin (A), a photoacid generator (B), and an acid diffusion control agent (C), and a molar ratio (Qp) between the photoacid generator (B) and the acid diffusion control agent (C), which is represented by Equation (1) is 0.3 or greater.

$$Qp(\text{molar ratio})=\text{Acid diffusion control agent }(C)/\text{Photoacid generator (B)} \quad (1)$$

As described above, the fact that the molar ratio (Qp) between the photoacid generator (B) and the acid diffusion control agent (C) is 0.3 or greater has a technological meaning of causing exposure amount to be high (causing sensitivity to be low) and reducing statistical fluctuation of a photoacid generator and an acid diffusion control agent, in order to realize improvement of LWR and resolution.

According to an aspect of the present invention, the molar ratio (Qp) between the photoacid generator (B) and the acid diffusion control agent (C), which is represented by Equation (1) is preferably 0.5 or greater and more preferably 0.55 or greater. In view of securing satisfactory throughput by muitibeam exposure, the molar ratio (Qp) between the photoacid generator (B) and the acid diffusion control agent (C) is preferably 0.8 or less.

[Photoacid Generator (B)]

The composition of the present invention contains the photoacid generator (B) (hereinafter, also referred to as a "acid generator" or " the compound (B)"). The photoacid generator is a compound that generates an acid by irradiation with actinic rays or radiation.

Examples of the preferable aspect of a photoacid generator include an onium compound. Examples of the onium compound include sulfonium salt, iodonium salt, and phosphonium salt.

Examples of the other preferable aspect of the photoacid generator include a compound that generates sulfonic acid, imidic acid, or methide acid by irradiation with actinic rays or radiation. Examples of the acid generator according to the aspect include sulfonium salt, iodonium salt, phosphonium salt, oxime sulfonate, and imide sulfonate.

According to an aspect of the present invention, the photoacid generator (B) is preferably a compound represented by Formula (1-1) and a compound represented by Formula (1-2).

In a case where exposure is performed in a high exposure amount range (for example, 100 µC/cm² or greater), when, for example, a triphenylsulfonium compound generally used as a photoacid generator in a resist composition for EB exposure is used, sensitivity of a triphenylsulfonium compound is increased, and thus a half of a photoacid generator or more is already decomposed in a high exposure range of 100 μC/cm² or greater. That is, this means that, in a case where an acid generator having high sensitivity is used in the electron beam exposure in a high exposure amount range by a multibeam method, patterns are formed in a range in which a decomposition ratio change amount (hereinafter, also referred to as "generated-acid contrast") of a acid generator to an exposure amount is low. In the pattern forming method of the present invention including an electron beam multibeam exposure step, a pattern can be formed in high generated-acid contrast by using a compound represented by Formula (1-1) or (1-2) as the photoacid generator, and thus it is assumed that it is effective for improving LWR performance and resolution.

First, a compound represented by Formula (1-1) is described.

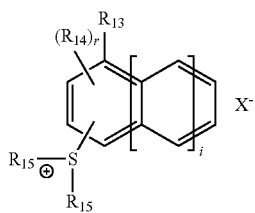

(1-1)

In Formula (1-1), $R_{13}$ represents a hydrogen atom, a fluorine atom, a hydroxyl group, an alkyl group, a cycloalkyl group, an alkoxy group, an alkoxycarbonyl group, or an alkoxy group having a monocyclic or polycyclic cycloalkyl skeleton.

$R_{14}$'s, in a case where a plurality of $R_{14}$'s exist, each independently represent an alkyl group, a cycloalkyl group, an alkoxy group, an alkylsulfonyl group, a cycloalkylsulfonyl group, an alkylcarbonyl group, an alkoxycarbonyl group, or an alkoxy group having a monocyclic or polycyclic cycloalkyl skeleton.

$R_{15}$ each independently represent an alkyl group, a cycloalkyl group, or a naphthyl group. Two $R_{15}$'s may be bonded to each other to form a ring.

l represents an integer of 0 to 2.

r represents an integer of 0 to 8.

$X^-$ represents a non-nucleophilic anion.

In Formula (1-1), alkyl groups of $R_{13}$, $R_{14}$, and $R_{15}$ each are preferably a linear or branched alkyl group having 1 to 10 carbon atoms, and examples thereof include a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, and an n-decyl group. Among these alkyl groups, a methyl group, an ethyl group, an n-butyl group, and a t-butyl group are preferable.

Examples of cycloalkyl groups of $R_{13}$, $R_{14}$, and $R_{15}$ include cyclopropyl, cyclobutyl, cyclopentyl, cyclohexyl, cycloheptyl, cyclooctyl, cyclododecanyl, cyclopentenyl, cyclohexenyl, cyclooctadienyl, and adamantyl groups. Particularly, cyclopropyl, cyclopentyl, cyclohexyl, and cyclooctyl are preferable.

Alkoxy groups of $R_{13}$ and $R_{14}$ each are preferably a linear, branched, or cyclic alkoxy roup having 1 to 10 carbon atoms, and examples thereof include a methoxy group, an ethoxy group, an n-propoxy group, an i-propoxy group, an n-butoxy group, a 2-methylpropoxy group, a 1-methylpropoxy group, a t-butoxy group, an n-pentyloxy group, a neopentyloxy group, an n-hexyloxy group, an n-heptyloxy group, an n-octyloxy group, a 2-ethylhexyloxy group, an n-nonyloxy group, an n-decyloxy group, a cycloheptyloxy group, and a cyclooctyloxy group. Among these alkoxy groups, a methoxy group, an ethoxy group, an n-propoxy group, and an n-butoxy group are preferable.

Alkoxycarbonyl groups of $R_{13}$ and $R_{14}$ each are preferably a linear or branched alkoxycarbonyl group having 2 to 11 carbon atoms. Examples thereof include a methoxycarbonyl group, an ethoxycarbonyl group, an n-propoxycarbonyl group, an i-propoxycarbonyl group, an n-butoxycarbonyl group, a 2-methylpropoxycarbonyl group, a i-methylpropoxycarbonyl group, a t-butoxycarbonyl group, an n-pentyloxycarbonyl group, a neopentyloxycarbonyl group, an n-hexyloxycarbonyl group, an n-heptyloxycarbonyl group, an n-octyloxycarbonyi group, a 2-ethylhexyloxycarbonyl group, an n-nonyloxycarbonyl group, and an n-decyloxycarbonyl group. Among these alkoxycarbonyl groups, a methoxycarbonyl group, an ethoxycarbonyl group, and an n-butoxycarbonyl group are preferable.

Examples of a group having a monocyclic or polycyclic cycloalkyl skeleton of $R_{13}$ and $R_{14}$ include a monocycle or polycyclic cycloalkyloxy group and an alkoxy group having a monocycle or polycyclic cycloalkyl group. These groups may further have a substituent.

A total number of carbon atoms in each of the monocyclic or polycyclic cycloalkyloxy groups of $R_{13}$ and $R_{14}$ is preferably 7 or greater, more preferably 7 to 15, and each of the monocycle or polycyclic cycloalkyloxy groups of $R_{13}$ and $R_{14}$ preferably has a monocyclic cycloalkyl skeleton. The monocyclic cycloalkyloxy group having 7 or greater carbon atoms in total is a monocycle cycloalkyloxy group arbitrarily having a substituent such as an alkyl group such as a methyl group, an ethyl group, a propyl group, a butyl group, a pentyl group, a hexyl group, a heptyl group, an octyl group, a dodecyl group, a 2-ethylhexyl group, an isopropyl group, a sec-butyl group, a t-butyl group, and an iso-amyl group, an alkoxy group such as a hydroxyl group, a halogen atom (fluorine, chlorine, bromine, and iodine), a nitro group, a cyano group, an amide group, a sulfonamide group, a methoxy group, an ethoxy group, a hydroxyethoxy group, a propoxy group, a hydroxypropoxy group, and a butoxy group, an alkoxycarbonyl group such as a methoxycarbonyl group and an ethoxycarbonyl group, an acyl group such as a formyl group, an acetyl group, and a benzoyl group, an acyloxy group such as an acetoxy group and a butyryloxy group, and a carboxy group, in a cycloalkyloxy group such as a cyclopropyloxy group, a cyclobutyloxy group, a cyclopentyloxy group, a cyclohexyloxy group, a cycloheptyloxy group, a cyclooctyloxy group, and cyclododecanyloxy group, and a total number of carbon atoms including carbon atoms in an arbitrary substituent on a cycloalkyl group is 7 or greater.

Examples of the polycyclic cycloalkyloxy group having 7 or greater carbon atoms in total include a norbornyloxy group, a tricyclodecanyloxy group, a tetracyclodecanyloxy group, and an adamantyloxy group, and these groups may have the above substituents.

A total number of carbon atoms in each of the alkoxy groups of $R_{13}$ and $R_{14}$ which has a monocyclic or polycyclic cycloalkyl skeleton is preferably 7 or greater, more preferably 7 to 15, and each of the alkoxy groups is preferably an alkoxy group having a monocyclic cycloalkyl skeleton. The alkoxy group having 7 or greater carbon atoms in total and having a monocyclic cycloalkyl skeleton represents an alkoxy group in which a monocyclic cycloalkyl group that may have the above substituent is substituted with an alkoxy group such as methoxy, ethoxy, propoxy, butoxy, pentyloxy, hexyloxy, heptoxy, octyloxy, dodecyloxy, 2-ethylhexyloxy, isopropoxy, sec-butoxy, t-butoxy, and iso-amyloxy, and represents an alkoxy group of which a total number of carbon atoms including carbon atoms in a substituent is 7 or greater. Examples thereof include a cyclohexylmethoxy group, a cyclopentylethoxy group, and a cyclohexylethoxy group, and a cyclohexylmethoxy group is preferable.

Examples of the alkoxy group having a polycyclic cycloalkyl skeleton having 7 or greater carbon atoms in total include a norbornyl methoxy group, a norbornyl ethoxy group, a tricyclodecanyl methoxy group, a tricyclodecanyl ethoxy group, a tetracyclodecanyl methoxy group, a tetracyclodecanyl ethoxy group, an adamantyl methoxy group, and an adamantyl ethoxy group. Among these groups, a norbornyl methoxy group and a norbornyl ethoxy group are preferable. These groups may have the above substituents.

Examples of the alkyl group of the alkylcarbonyl group of $R^{14}$ include specific examples which are the same as the above alkyl groups as $R_{13}$ to $R_{15}$.

The alkylsulfonyl group and the cycloalkylsulfonyl group as $R^{14}$ have linear, branched, and cyclic shapes, an alkylsulfonyl group and a cycloalkylsulfonyl group having 1 to 10 carbon atoms are preferable. Examples thereof include a methanesulfonyl group, an ethanesulfonyl group, an n-propanesulfonyl group, an n-butanesulfonyl group, a tert-butanesulfonyl group, an n-pentanesulfonyl group, a neopentanesulfonyl goup, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group, and a cyclohexanesulfonyl group. Among these alkylsulfonyl groups and cycloalkylsulfonyl groups, a methanesulfonyl group, an ethanesulfonyl group, an n-propanesulfonyl group, an n-butanesulfonyl group, a cyclopentanesulfonyl group, and a cyclohexanesulfonyl group are preferable.

The above groups may have substituents, and examples of the substituent include a halogen atom (for example, fluorine atom), a hydroxyl group, a carboxyl group, a cyano group, a nitro group, an alkoxy group, an alkoxyalkyl group, an alkoxycarbonyl group, and an alkoxycarbonyloxy group.

Examples of the alkoxy group include a linear, branched, or cyclic alkoxy group having 1 to 20 carbon atoms, such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group, and a cyclohexyloxy group.

Examples of alkoxyalkyl group include linear, branched, or cyclic alkoxyalkyl groups having 2 to 21 carbon atoms, such as a methoxymethyl group, an ethoxymethyl group, a 1-methoxyethyl group, a 2-methoxyethyl group, a 1-ethoxyethyl group, and a 2-ethoxyethyl group.

Examples of the alkoxycarbonyl group include a linear, branched, or cyclic alkoxycarbonyl group having 2 to 21 carbon atoms such as a methoxycarhonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group, and cyclohexyloxycarbonyl group.

Examples of the alkoxycarbonyloxy group include a linear, branched, or cyclic alkoxycarbonyloxy group having 2 to 21 carbon atoms, such as a methxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyloxy group, and cyclohexyloxycarbonyloxy group.

Examples of the ring structure that may be formed by bonding two $R_{15}$'s to each other include a 5-membered or 6-membered ring that is formed of two divalent $R_{15}$'s with a sulfur atom in Formula (1-1) and particularly preferably include a 5-membered ring (that is, tetrahydrothiophene ring), and the ring structure may be fused with an aryl group or a cycloalkyl group. This divalent $R_{15}$ may have a substituent, and examples of the substituent include a hydroxyl group, a carboxyl group, a cyano group, a nitro group, an alkoxy group, an alkoxyalkyl group, an alkoxycarbonyl group, and an alkoxycarbonyloxy group.

$R^{15}$ is preferably a methyl group, an ethyl group, a naphthyl group, and a divalent group that causes two $R^{15}$ to be bonded to each other so as to form a tetrahydrothiophene ring structure together with a sulfur atom.

A substituent that can he included in $R_{13}$ and $R_{14}$ is preferably a hydroxyl group, an alkoxy group, or an alkoxycarbonyl group, a halogen atom (particularly, fluorine atom).

l is preferably 0 or 1 and more preferably 1.

r is preferably 0 to 2.

Examples of the non-nucleophilic anion represented by $X^-$ include a sulfonic acid anion, a carboxylic acid anion, a sulfonylimide anion, a bis(alkylsulfonyl) imide anion, and a tris(alkylsulfonyl) methyl anion.

Examples of the sulfonic acid anion include an aliphatic sulfonic acid anion, an aromatic sulfonic acid anion, and a camphorsulfonic acid anion.

Examples of the carboxylic acid anion include an aliphatic carboxylic acid anion, an aromatic carboxylic acid anion, and an aralkyl carboxylic acid anion.

An aliphatic portion in an aliphatic sulfonic acid anion may be an alkyl group or may be a cycloalkyl group and is preferably an alkyl group having 1 to 30 carbon atoms and a cycloalkyl group having 3 to 30 carbon atoms. Examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, a undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group, and a bornyl group.

The aromatic group in the aromatic sulfonic acid anion is preferably an aryl group having 6 to 14 carbon atoms, and examples thereof include a phenyl group, a tolyl group, and a naphthyl group.

The alkyl group, the cycloalkyl group, and the aryl group in the aliphatic sulfonic acid anion and the aromatic sulfonic acid anion may have substituents. Examples of the substituents of the alkyl group, the cycloalkyl group, and the aryl group in the aliphatic sulfonic acid anion and the aromatic sulfonic acid anion include a nitro group, a halogen atom (fluorine atom, chlorine atom, bromine atom, and iodine atom), a carboxy group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 2 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms). With respect to an aryl group and ring structure that may be included in each of the groups, an alkyl group (preferably having 1 to 15 carbon atoms) may be exemplified as a substituent.

Examples of the aliphatic portion in the aliphatic carboxylic acid anion include an alkyl group and a cycloalkyl group that are the same as those in the aliphatic sulfonic acid anion.

Examples of the aromatic group in the aromatic carboxylic acid anion include aryl groups that are the same as those in the aromatic sulfonic acid anion.

The aralkyl group of the aralkyl carboxylic acid anion is preferably an aralkyl group having 6 to 12 carbon atoms. Examples thereof include a benzyl group, a phenethyl group, a naphthyhnethyl group, a naphthylethyl group, and a naphhylbutyl group.

The alkyl group, the cycloalkyl group, the aryl group, and the aralkyl group in the aliphatic carboxylic acid anion, the aromatic carboxylic acid anion, and the aralkyl carboxylic acid anion may have substituents. Examples of the substituent of the alkyl group, the cycloalkyl group, the aryl group, and the aralkyl group in the aliphatic carboxylic acid anion, the aromatic carboxylic acid anion, and the aralkyl carboxylic acid anion include the halogen atom, the alkyl group, the cycloalkyl group, the alkoxy group, and the alkylthio group which are the same as those in the aromatic sulfonic acid anion.

Examples of the sulfonylimide anion include a saccharin anion.

The alkyl groups in the bis(alkylsulfonyl) imide anion and the tris(alkylsulfonyl) methyl anion each are preferably an alkyl group having 1 to 5 carbon atoms. Examples thereof include a methyl group, an ethyl group, a propyl group, an isopropyl group, an n-butyl group, an isobutyl group, a sec-butyl group, a pentyl group, and a neopentyl group. Examples of the substituents of these alkyl groups include a halogen atom, an alkyl group substituted with a halogen atom, an alkoxy group, an alkyithio group, an alkyloxysulfonyl group, an aryloxysulfonyl group, and a cycloalkylaryloxysulfonyl group. An alkyl group substituted with a fluorine atom is preferable. An aspect in which two alkyl groups in the bis(alkylsulfonyl) imide anion are bonded to each other to form a cyclic structure is preferable. In this case, the formed cyclic structure is preferably a 5 to 7-membered ring.

Examples of the other non-nucleophilic anions include phosphorus fluoride, boron fluoride, and antimony fluoride.

As the non-nucleophilic anion, an aliphatic. sulfonic acid anion in which an a position of sulfonic acid is substituted with a fluorine atom, an aromatic sulfonic acid anion that is substituted with a fluorine atom or a group having a fluorine atom, a bis(alkylsulfonyl) imide anion in which an alkyl group is substituted with a fluorine atom, and a tris(alkylsulfonyl) methide anion in which an alkyl group is substituted with a fluorine atom are preferable. The non-nucleophilic anion is more preferably a perfluoro aliphatic sulfonic acid anion having 4 to 8 carbon atoms and a benzene sulfonic acid anion having a fluorine atom and even more preferably a nonafluorobutanesulfonic acid anion, a perfluorooctanesulfonic acid anion, a pentafluorobenzenesulfonic acid anion, and a 3,5-bis(trifluoromethyl) benzenesulfonic acid anion.

For example, the non-nucleophilic anion is preferably represented by Formula (LD1).

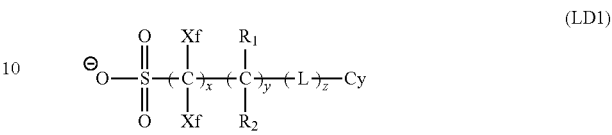

(LD1)

In the formula,

Xf's each independently represent a fluorine atom or an alkyl group substituted with at least one fluorine atom.

$R_1$ and $R_2$ each independently represent a group selected from the group consisting of a hydrogen atom, a fluorine atom, an alkyl group, and an alkyl group substituted with at least one fluorine atom.

L's each independently represent a single bond or a divalent linking group.

Cy represents a group having a cyclic structure.

x represents an integer of 1 to 20.

y represents an integer of 0 to 10.

z represents an integer of 0 to 10.

Xf represents a fluorine atom or an alkyl group substituted with at least one fluorine atom. The number of carbon atoms of this alkyl group is preferably 1 to 1.0 and more preferably 1 to 4. The alkyl group substituted with at least one fluorine atom is preferably a perfluoroalkyl group.

Xf is preferably a fluorine atom or a perfluoroalkyl group having 1 to 4 carbon atoms. Specifically, Xf is preferably a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, or $CH_2CH_2C_4F_9$.

$R_1$ and $R_2$ each independently represent a group selected from the group consisting of a hydrogen atom, a fluorine atom, an alkyl group, and an alkyl substituted group substituted with at least one fluorine atom. An alkyl group in the alkyl group and the alkyl group substituted with at least one fluorine atom is preferably an alkyl group having 1 to 4 carbon atoms. The alkyl group is more preferably a perfluoroalkyl group having 1 to 4 carbon atoms. Specifically, examples thereof include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$. Among these, $CF_3$ is preferable.

L represents a single bond or a divalent linking group. Examples of this divalent linking group include —COO—, —OCO—, —CONH—, —CO—, —O—, —S—, —SO—, —SO$_2$—, an alkylene group, a cycloalkylene group, and an alkenylene group. Among these, —CONH—, —CO—, or —S$_2$— is preferable, and —CONH— or —SO$_2$— is more preferable.

Cy represents a group having a cyclic structure. Examples of the group having a cyclic structure include an alicyclic group, an aryl group, and a group having a heterocyclic structure.

The alicyclic group may be monocyclic or may be polycyclic. Examples of the monocyclic alicyclic group include a monocyclic cycloalkyl group such as a cyclopentyl group, a cyclohexyl group, and a cyclooctyl group. Examples of the polycyclic alicyclic group include a polycyclic cycloalkyl group such as a norbornyl group, a tricyclodecanyl group, a tetracyclodecanyl group, a tetracyclododecanyl group, and an adamantyl group. Among these, an alicyclic group having 7 or more carbon atoms and having a bulky structure such as a norbornyl group, a tricyclodecanyl group, a tetracyclodecanyl group, a tetracyclododecanyl group, and an adamantyl group is preferable, in view of suppression of diffusivity in a film in a post exposure baking (PEB) step and enhancement of a mask error enhancement factor WEEP).

The aryl group may be monocyclic or may be polycyclic. Examples of the aryl group include a phenyl group, a naphthyl group, a phenanthryl group, and an anthryl group. Among these, a naphthyl group of which absorbance at 193 nm is relatively low is preferable.

A group having a heterocyclic structure may be monocyclic or may be polycyclic, but a polycyclic group can further suppress diffusion of an acid. A group having a heterocyclic structure may be aromatic or may not be aromatic. Examples of the aromatic heterocycle include a furan ring, a thiophene ring, a benzofuran ring, a benzothiophene ring, a dibenzofuran ring, a dibenzothiophene ring, and a pyridine ring. Examples of the aromatic heterocycle include a tetrahydropyran ring, a lactone ring, and a decahydroisoquinoline ring. As the heterocycle in a group having a heterocyclic structure, a furan ring, a thiophene ring, a pyridine ring, or a decahydroisoquinoline ring is particularly preferable. Examples of a lactone ring include a lactone structure exemplified in the resin (A).

A group having the cyclic structure may have a substituent. Examples of the substituent include an alkyl group, a cycloalkyl group, an aryl group, a hydroxy group, an alkoxy group, an ester group, an amide group, a urethane group, a ureido group, a thioether group, a sulfonamide group, and a sulfonic acid ester group. The alkyl group may have a linear shape or may have a branched chain shape. The alkyl group preferably has 1 to 12 carbon atoms. The cycloalkyl group may be monocyclic or may be polycyclic. The cycloalkyl group preferably has 3 to 12 carbon atoms. The aryl group is preferably 6 to 14 carbon atoms.

x is preferably 1 to 8. Among these, 1 to 4 is preferable, and 1 is particularly preferable. y is preferably 0 to 4 and more preferably 0. z is preferably 0 to 8. Among these, 0 to 4 is preferable.

For example, the non-nucleophilic anion is preferably a non-nucleophilic anion represented by Formula (LD2).

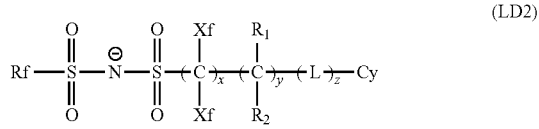

(LD2)

In Formula (LD2), Xf, $R_1$, $R_2$, L, Cy, x, y, and z are the same as those in Formula (LD1). Rf is a group including a fluorine atom.

Examples of the group including a fluorine atom represented by Rf include an alkyl group having at least one fluorine atom, a cycloalkyl group having at least one fluorine atom, and an aryl group having at least one fluorine atom.

The alkyl group, the cycloalkyl group, and the aryl group may be substituted with fluorine atoms and may be substituted with other substituents including fluorine atoms. In a case where Rf is a cycloalkyl group having at least one fluorine atom or an aryl group having at least one fluorine atom, examples Of the other substituents including fluorine atoms include an alkyl group substituted with at least one fluorine atom.

The alkyl group, the cycloalkyl group, and the aryl group may be further substituted with substituents not including fluorine atoms. As Cy is described above, examples of the substituent include substituents not. including a fluorine atom.

Examples of the alkyl group having at least one fluorine atom represented by Rf include those as described above as the alkyl group substituted with at least one fluorine atom represented by Xf. Examples of the cycloalkyl group having at least one fluorine atom represented by Rf include a perfluorocyclopentyl group and a perfluorocyclohexyl group. Examples of the aryl group having at least one fluorine atom represented by Rf include a perfluorophenyl group.

Examples of the photoacid generator (B) represented by Formula 1-1) include the following specific examples.

In the formula, $X^-$ represents a counter anion

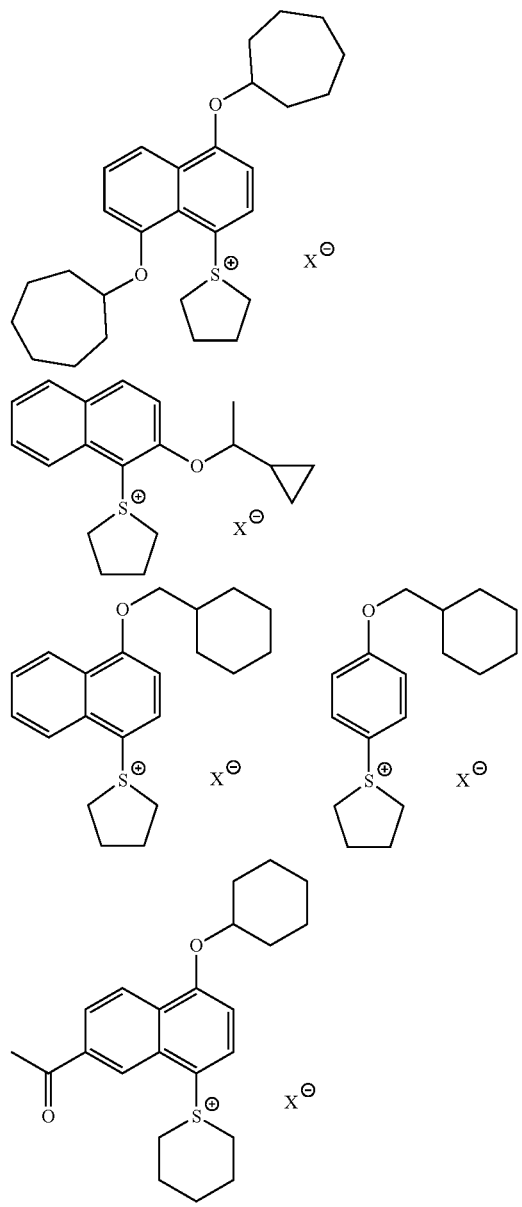

15
-continued
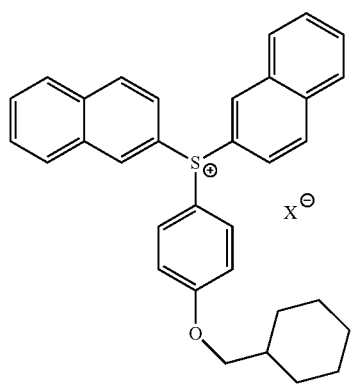
16
-continued
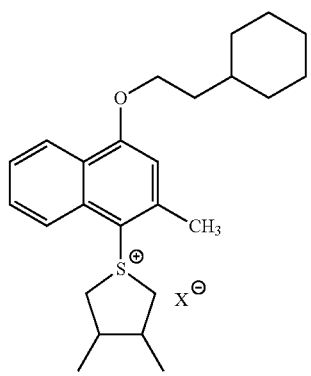
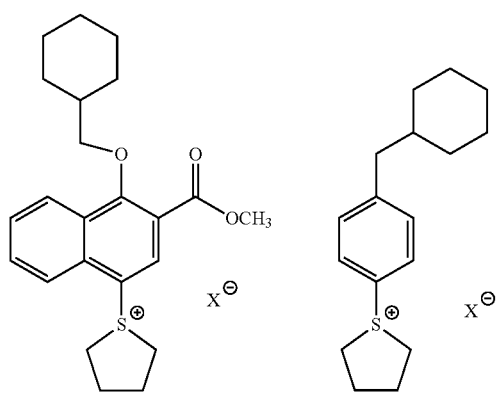
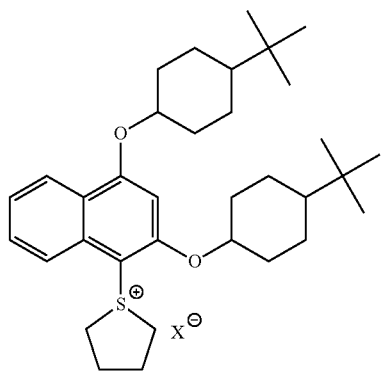
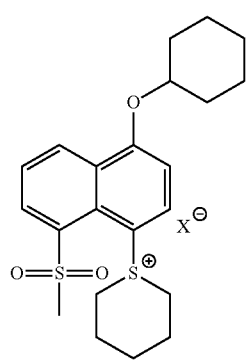
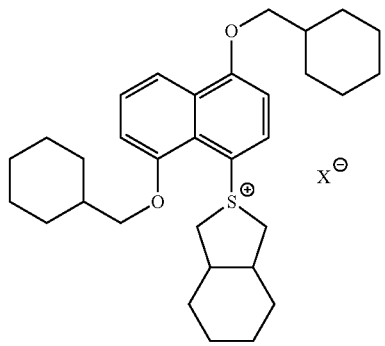
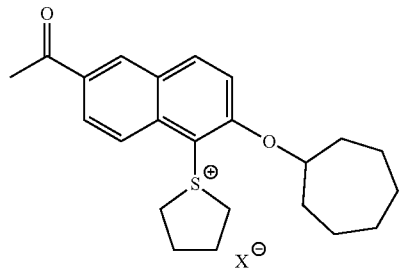
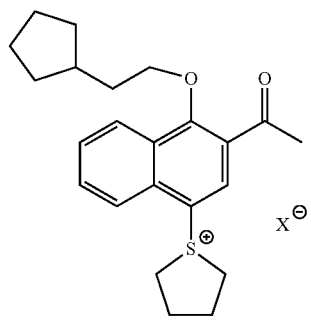

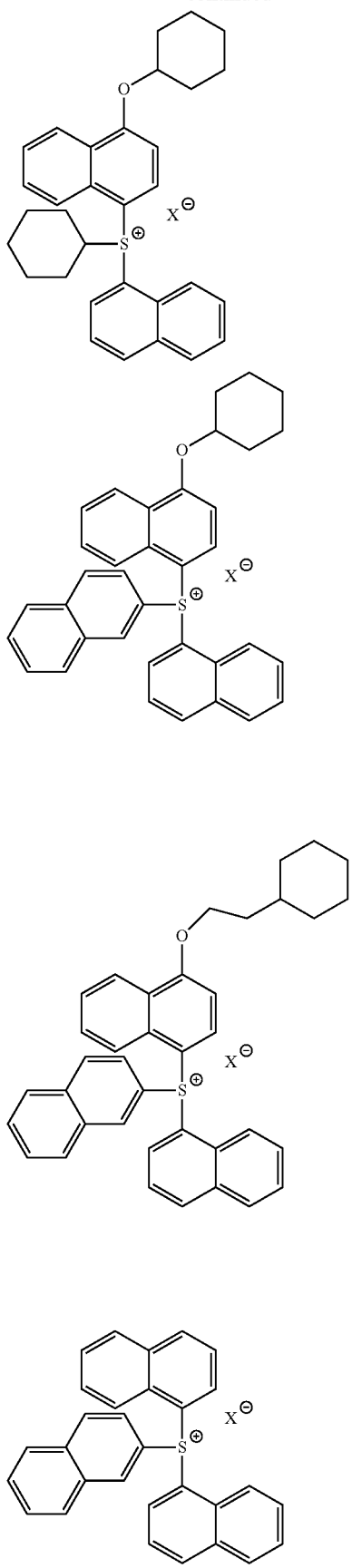
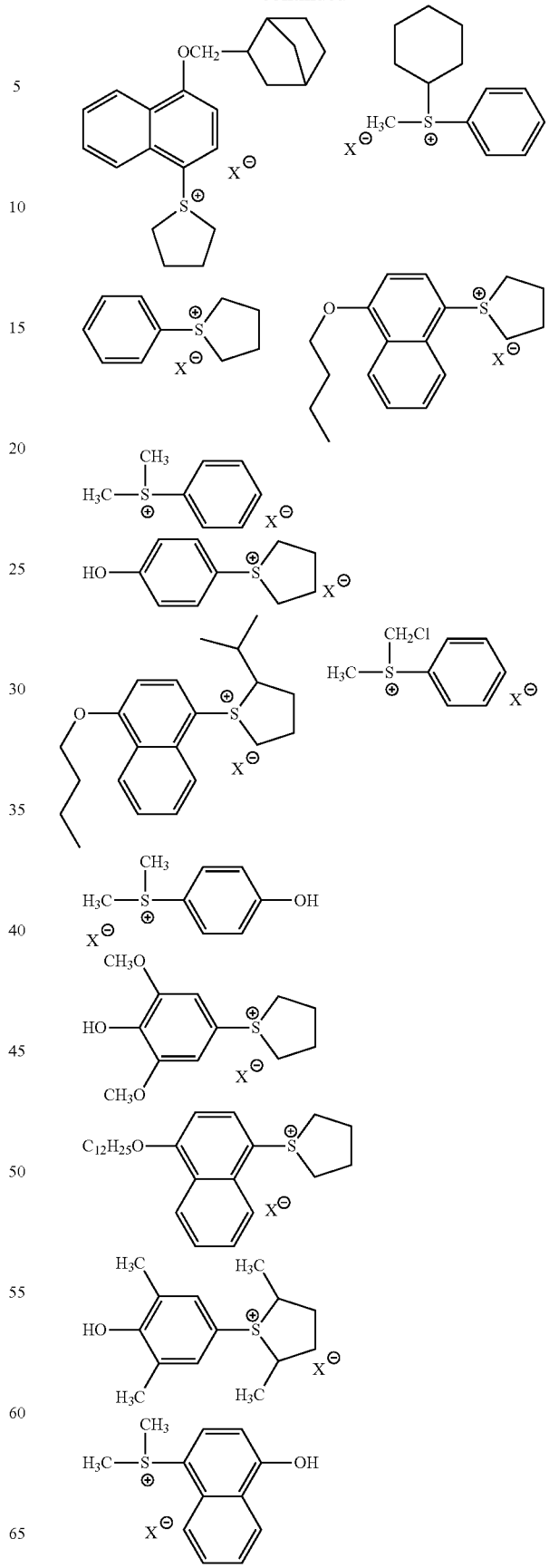

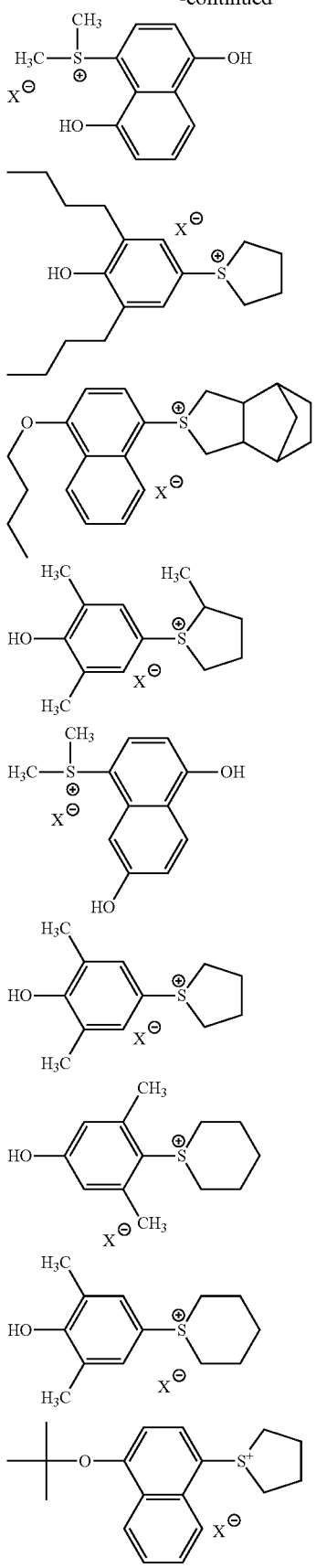

Subsequently, a compound represented by Formula (1-2) is described.

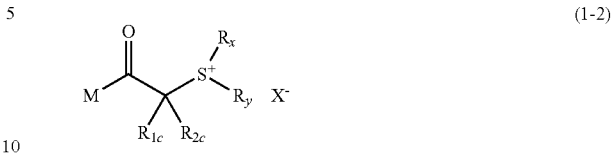

In Formula (1-2),

M represents an alkyl group, a cycloalkyl group, or an aryl group, and a cycloalkyl group may include a carbon-carbon double bond.

$R_{1c}$ and $R_{2c}$ each independently represent a hydrogen atom, an alkyl group, a cycloalkyl group, a halogen atom, a cyano group, or an aryl group.

$R_x$ and $R_y$ each independently represent an alkyl group, a cycloalkyl group, a 2-oxoalkyl group, an alkoxycarbonylalkyl group, an allyl group, or a vinyl group.

At least two of M, $R_{1c}$, $R_{2c}$, $R_x$, and $R_y$ may be bonded to each other to form a ring, and a carbon-carbon double bond may be included in this ring structure $X^-$ represents a non-nucleophilic anion.

The alkyl group as M may be linear or branched, and examples thereof include an alkyl group having 1 to 20 carbon atoms and is preferably a linear and branched alkyl group having 1 to 12 carbon atoms. Examples thereof include a methyl group, an ethyl group, an n-propyl group, an isopropyl. group, an n-butyl group, a sec-butyl. group, a tert-butyl group, a pentyl group, a hexyl group, an octyl group, and a 2-ethylhexyl group.

The cycloalkyl group as M is preferably a cycloalkyl group having 3 to 12 carbon atoms, and examples thereof include a cyclopropyl group, a cyclobutyl group, a cyclopentyl group, a cyclohexyl group, a cycloheptyl group, and a cyclodecyl group. A cycloalkyl group may have a carbon-carbon double bond.

The aryl group as M preferably have 5 to 15 carbon atoms, and examples thereof include a phenyl group and a naphthyl group.

Each of the groups as M may have a cycloalkyl group, an alkoxy group, a halogen atom, and a phenylthio group, as the substituent. The cycloalkyl group and the aryl group as M may further have alkyl groups as the substituent. The number of carbon atoms of the substituent is preferably 15 or less.

In a case where M is a phenyl group, M preferably has at least one of a linear or branched alkyl group, a cycloalkyl group, a linear, branched, or cyclic alkoxy group, and a phenylthio group, as the substituent, and it is preferable that the sum of the carbon atoms of the substituent is 2 to 15. Accordingly, in a case where the solvent. solubility is enhanced, and generation of particles in a case of preservation is suppressed.

Examples of the alkyl group as $R_{1c}$ and $R_{2c}$ include an alkyl group having 1 to 12 carbon atoms, and is preferably a linear and branched alkyl group having 1 to 5 carbon atoms (for example, methyl group, ethyl group, linear or branched propyl group).

Examples of the cycloalkyl group as $R_{1c}$ and $R_{2c}$ include a cycloalkyl group having 3 to 12 carbon atoms and is preferably a cycl.opropyl group, a cyclobutyl group, a cyclopentyl group, a cyclohexyl group, a cycloheptyl group, and a cyclodecyl group.

Examples of the halogen atom include a fluorine atom, a chlorine atom, a bromine atom, and an iodine atom.

The aryl group as $R_{1c}$ and $R_{2c}$ preferably has 5 to 15 carbon atoms, and examples thereof include a phenyl group and a naphthyl group.

The ring structure formed by bonding at least two of M, $R_{1c}$, $R_{2c}$, $R_x$, and $R_y$ is preferably a 3 to 12-membered ring, more preferably a 3 to 10-membered ring, and even more preferably a 3 to 6-membered ring. The ring structure may have a carbon-carbon double bond.

In a case where $R_1$ and $R_{2c}$ are bonded to each other to form a ring, the group formed by bonding $R_{1c}$ and $R_{2c}$ is preferably an alkylene group having 2 to 10 carbon atoms, and examples thereof include an ethylene group, a propylene group, a butylene group, a pentylene group, and a hexylene group. The ring formed by bonding $R_{1c}$ and $R_{2c}$ may have a hetero atom such as an oxygen atom in the ring.

Examples of the alkyl group as $R_x$ and $R_y$ include those which are the same as alkyl groups as $R_{1c}$ and $R_{2c}$.

The cycloalkyl group is preferably a cycloalkyl group having 3 to 8 carbon atoms, and examples thereof include a cyclopentyl group and a cyclohexyl group.

Examples of 2-oxoalkyl group include a group having >C=O at a second position of an alkyl group as $R_{1c}$ and $R_{2c}$.

The alkoxy group in the alkoxycarbonylalkyl group may have any one of a linear shape, a branched shape, and a cyclic shape. Examples thereof include an alkoxy group having 1 to 10 carbon atoms, and is preferably a linear and branched alkoxy group having 1 to 5 carbon atoms (for example, methoxy group, ethoxy group, linear or branched propoxy group, linear or branched butoxy group, and linear or branched pentoxy group), a cyclic alkoxy group having 3 to 8 carbon atoms (for example, cyclopentyloxy group and cyclohexyloxy group). Examples of the alkoxycarbonylalkyl group in the alkyl group include an alkyl group having 1 to 12 carbon atoms and is preferably a linear alkyl group having 1 to 5 carbon atoms (for example, methyl group and ethyl group).

The allyl group is particularly limited. However, an unsubstituted allyl group or an allyl group substituted with a monocyclic or polycyclic cycloalkyl group is preferable, The vinyl group is not particularly limited. However, an unsubstituted vinyl group or a vinyl group which is substituted a monocyclic or polycyclic cycloalkyl group is preferable.

Examples of the ring structure that may be formed by bonding $R_x$ and $R_y$ to each other include a 5-membered or 6-membered ring formed by divalent $R_x$ and $R_y$ (for example, a methylene group, an ethylene group, and a propylene group) together with a sulfur atom in Formula (1-2) and is particularly preferably a 5-membered ring (that is, a tetrahydrothiophene ring). The ring formed by bonding $R_x$ and $R_y$ may further have a hetero atom such as an oxygen atom, in addition to a sulfur atom in the formula.

$R_x$ and $R_y$ each are preferably an alkyl group having four or more carbon atoms, more preferably an alkyl group having six or more carbon atoms, and even more preferably an alkyl group having eight or more carbon atoms.

The non-nucleophilic anion represented by $X^-$ is the same as $X^-$ in Formula (1-1)

According to an aspect of the present invention, the compound represented by Formula (1-2) is preferably a compound represented by Formula (1-2a).

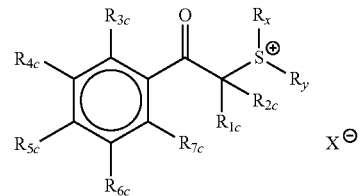

(1-2a)

In the formula, $R_{1c}$, $R_{2c}$, $R_x$, $R_y$, and $X^-$ are respectively the same as $R_{1c}$, $R_{2c}$, $R_x$, $R_y$, and $X^-$ in Formula (1-2).

$R_{3c}$, $R_{4c}$, $R_{5c}$, $R_{6c}$, and $R_{7c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an aryithio group. Any two or more of $R_{3c}$, $R_{4c}$, $R_{5c}$, $R_{6c}$, and $R_{7c}$, $R_{1c}$ and $R_{7c}$, or $R_{7c}$ and $R_x$ are bonded to each other to form a ring.

The alkyl groups as $R_{3c}$ to $R_{7c}$ may have any one of a linear shape or a branched shape, and examples thereof include an alkyl group having 1 to 20 carbon atoms, and is preferably a linear or branched alkyl group having 1 to 12 carbon atoms (for example, methyl group, ethyl group, linear or branched propyl group, linear or branched butyl group, linear or branched pentyl group). Examples of the cycloalkyl group include a cycloalkyl group having 3 to 10 carbon atoms (for example, cyclopentyl group and cyclohexyl group).

The aryl group as $R_{3c}$ to $R_{7c}$ preferably has 5 to 15 carbon atoms, and examples thereof include a phenyl group and a naphthyl group.

The alkoxy group as $R_{3c}$ to $R_{7c}$ may be any one of a linear shape, a branched shape, or a cyclic shape, and examples thereof include an alkoxy group having 1 to 10 carbon atoms and is preferably a linear or branched alkoxy group having 1 to 5 carbon atoms (for example, methoxy group, ethoxy group, linear or branched propoxy group, linear or branched butoxy group, or linear or branched pentoxy group), a cyclic alkoxy group having 3 to 10 carbon atoms (for example, cyclopentyloxy group or a cyclohexyloxy group).

Specific examples of the alkoxy group in the alkoxycarbonyl group as $R_{3c}$ to $R_{7c}$ include specific examples of the alkoxy group as $R_{1c}$ to $R_{5c}$.

Specific examples of the alkyl group in the alkylcarbonyloxy group and the alkylthio group as $R_{3c}$ to $R_{7c}$ are the same as the specific examples of the alkyl group as $R_3$ to $R_{7c}$.

Specific examples of the cycloalkyl group in the cycloalkylcarbonyloxy group as $R_{3c}$ to $R_{7c}$ are the same as the specific examples of the cycloalkyl group as $R_{3c}$ to $R_{7c}$.

Specific examples of an aryl group in the aryloxy group and the arylthio group as $R_{3c}$ to $R_{7c}$ are the same as specific examples of the aryl group as $R_{3c}$ to $R_{7c}$. Any one of $R_{3c}$ to $R_{7c}$ is preferably a linear or branched alkyl group, a cycloalkyl group, or a linear, branched, or cyclic alkoxy group, and it is even more preferable that the sum of carbon atoms in $R_{3c}$ to $R_{7c}$ is 2 to 15. Accordingly, solvent solubility is enhanced, and generation of particles in a case of preservation is suppressed.

Examples of the ring structure that may be formed by bonding two or more of $R_{3c}$ to $R_{7c}$ to each other preferably include a 5-membered or 6-membered ring and particularly preferably include a 6-membered ring (for example, phenyl ring).

Examples of the ring structure that may be formed by bonding $R_{1c}$ and $R_{7c}$ to each other include a 4 or more-membered ring (particularly preferably 5 to 6-membered ring) formed together with a carbonyl carbon atom and a carbon atom in Formula (1-2a) by bonding $R_{1c}$ and $R_{7c}$ to each other and constituting a single bond or an alkylene group (methylene group, ethylene group, and the like), and it is preferable that the both are methyl groups.

$R_{3c}$ to $R_{7c}$ may further have substituents, and examples of the substituent include a halogen atom (for example, fluorine atom), a hydroxyl group, a carboxyl group, a cyano group, a nitro group, an alkyl group, a cycloalkyl group, an aryl group, an alkoxy group, an aryloxy group, an acyl group, an arylcarbonyl group, an alkoxyalkyl group, an aryloxyalkyl group, an alkoxycarbonyl group, an aryloxycarbonyl group, an alkoxycarbonyloxy group, and an aryloxycarbonyloxy group.

Examples of the alkyl group include a linear or branched alkyl group having 1 to 12 carbon atoms such as a methyl group, an ethyl group, an n-propyl group, an i-propyl group, an n-butyl group, a 2-methylpropyl group, a 1-methyipropyl group, and a t-butyl group.

Examples of the cycloalkyl group include a cycloalkyl group having 3 to 10 carbon atoms such as a cyclopentyl group and a cyclohexyl group.

Examples of the aryl group include an aryl group having 6 to 15 carbon atoms such as a phenyl group and a naphthyl group.

Examples of the alkoxy group include a linear, branched, or cyclic alkoxy group having 1 to 20 carbon atoms such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group, and a cyclohexyloxy group.

Examples of the aryloxy group include an aryloxy group having 6 to 10 carbon atoms such as a phenyloxy group and a naphthyloxy group.

Examples of the acyl group include a linear or branched acyl group having 2 to 12 carbon atoms such as an acetyl group, a propionyl group, an n-butanoyl group, an i-butanoyl group, an n-heptanoyl group, a 2-methylbutanoyl group, a 1-methylbutanoyl group, and a t-heptanoyl group.

Examples of the arylcarbonyl group include an arylcarbonyl group having 6 to 10 carbon atoms such as a phenylcarbonyl group and a naphthylcarbonyl group.

Examples of the alkoxyalkyl group include a linear, branched, or cyclic alkoxyalkyl group having 2 to 21 carbon atoms such as a methoxymethyl group, an ethoxymethyl group, a 1-methoxyethyl group, a 2-methoxyethyl group, a 1-ethoxyethyl group, and a 2-ethoxyethyl group.

Examples of the aryloxyalkyl group include an aryloxy group having 7 to 12 carbon atoms such as a phenyloxymethyl group, a phenyloxyethyl group, a naphthyloxymethyl group, and a naphthyloxyethyl group.

Examples of the alkoxycarbonyl group include a linear, branched, or cyclic alkoxycarbonyl group having 2 to 21 carbon atoms such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group, and cyclohexyloxycarbonyl group.

Examples of the aryloxycarbonyl group include an aryloxycarbonyl group having 7 to 11 carbon atoms such as a phenyloxycarbonyl group and a naphthyloxycarbonyl group.

Examples of the alkoxycarbonyloxy group include a linear, branched, or cyclic alkoxycarbonyloxy group having 2 to 21 carbon atoms such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyloxy group, and cyclohexyloxycarbonyloxy group.

Examples of the aryloxycarbonyloxy group include an aryloxycarbonyloxy group having 7 to 11 carbon atoms such as a phenyloxycarbonyloxy group and a naphthyloxycarbonyloxy group.

In Formula (1-2a), it is more preferable that $R_{3c}$, $R_{4c}$, $R_{6c}$, and $R_{7c}$ each independently represent a hydrogen atom, and $R_{5c}$ represents a group other than a hydrogen atom, that is, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

Specific examples of the compound represented by Formula (1-2a) include compounds disclosed in paragraphs 0047 and 0048 of JP2004-233661A, and paragraphs 0040 to 0046 of JP2003-35948A, in addition to the compounds exemplified below.

Examples of the cation of the photoacid generator (B) represented by Formula (1-2) include the following specific examples.

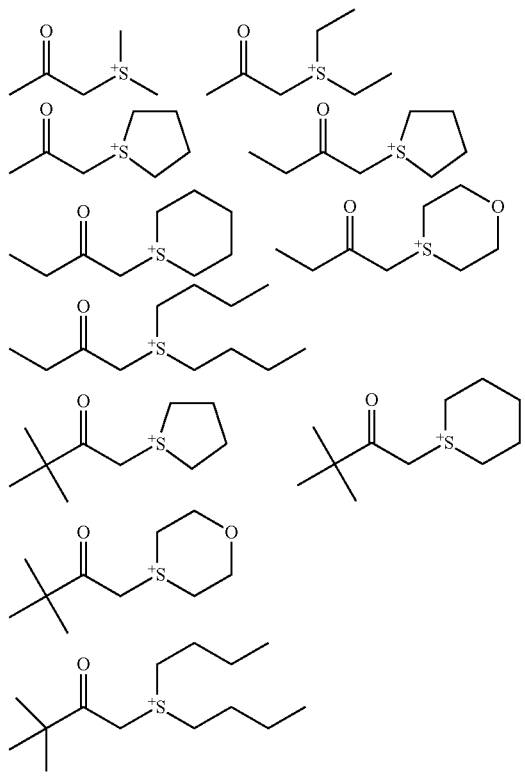

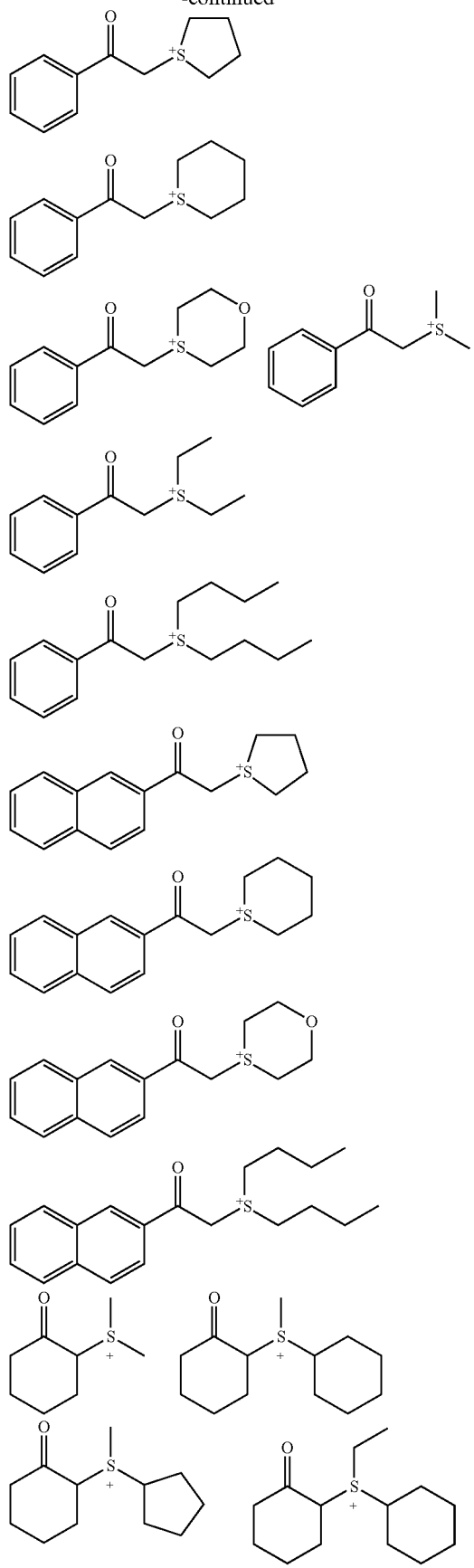
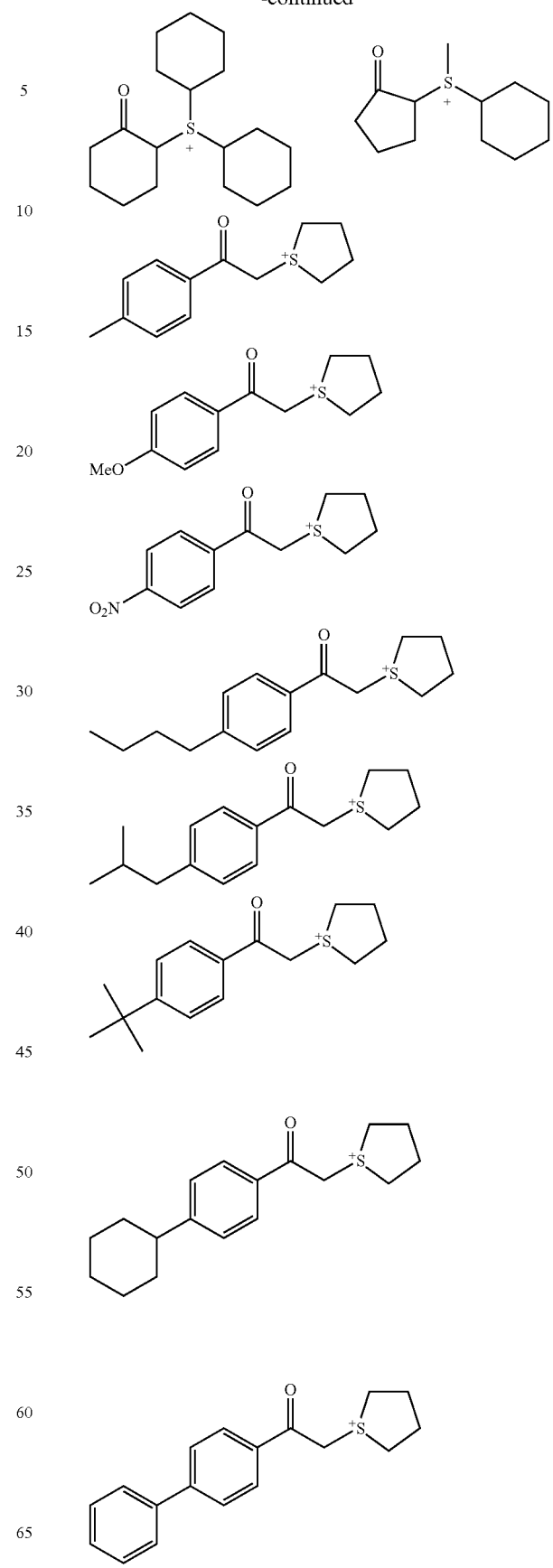

-continued
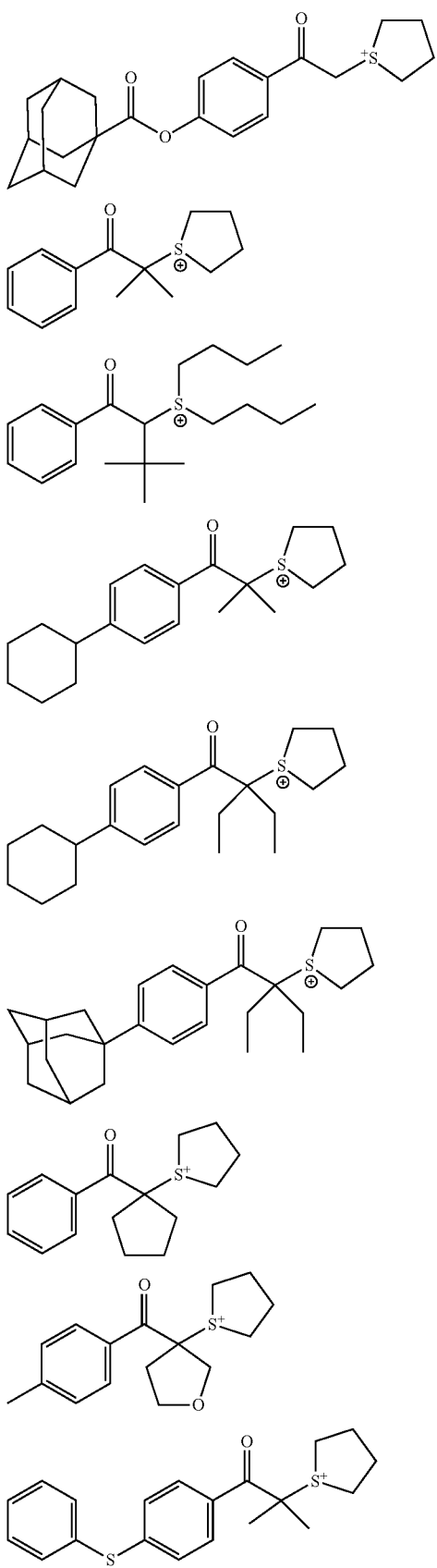
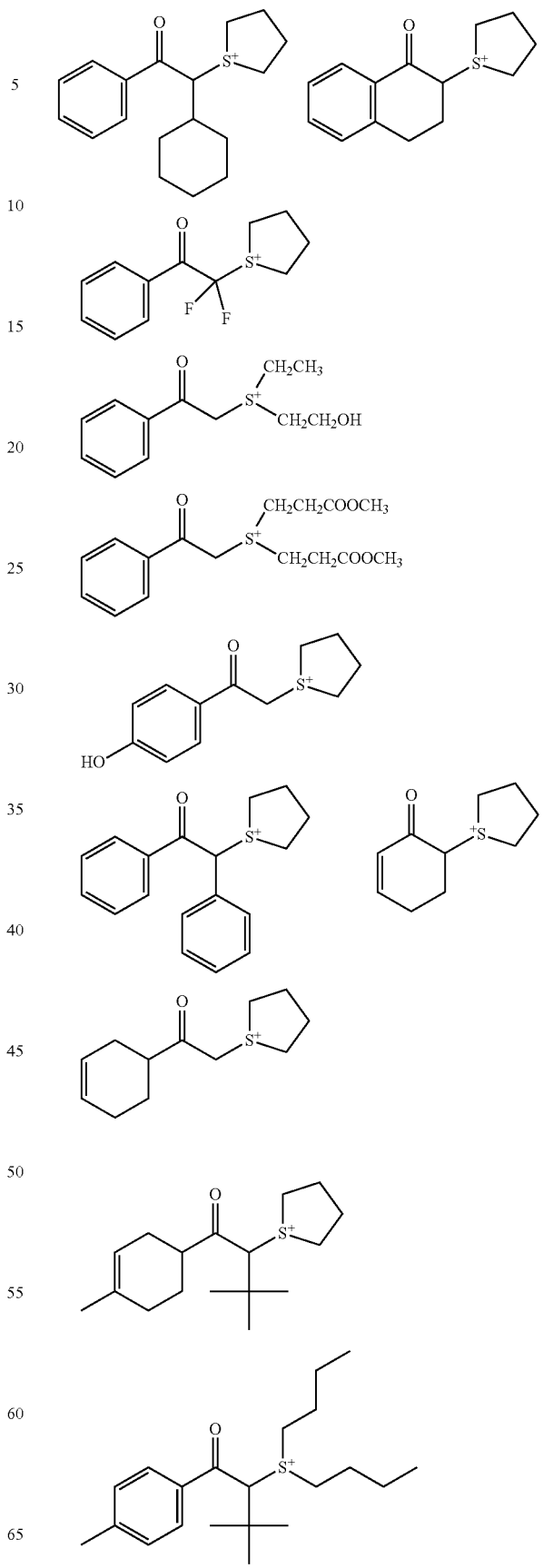

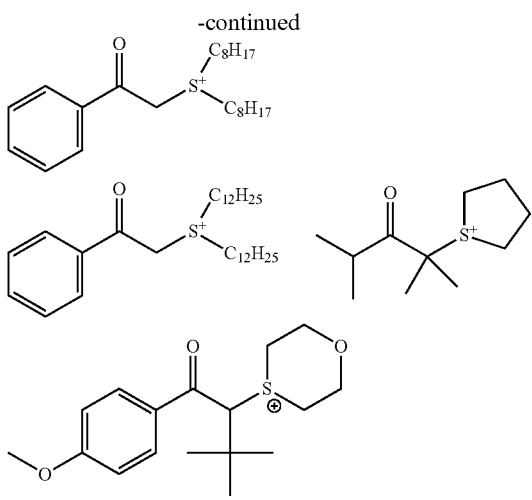

According to an aspect of the present invention, compounds represented by Formula (ZI), (ZII), or (ZIII) is used as the photoacid generator (B).

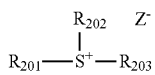
(ZI)

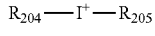
(ZII)

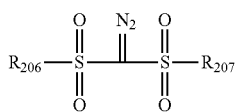
(ZIII)

In Formula (Zi), $R_{201}$, $R_{202}$, and $R_{203}$ each independently represent an organic group.

The number of carbon atoms of the organic group as $R_{201}$, $R_{202}$, and $R_{203}$ is generally 1 to 30 and preferably 1 to 20.

Two of $R_{201}$ to $R_{203}$ may be bonded to each other to form a ring structure and may include an oxygen atom, a sulfur atom, an ester bond, an amide bond, a carbonyl group in the ring. Examples of the group formed by bonding two of $R_{201}$ to $R_{203}$ include an alkylene group (for example, butylene group and pentylene group).

$Z^-$ represents a non-nucleophilic anion (anion having remarkably low ability to cause nucleophilic reaction).

Examples of $Z^-$ include a sulfonic acid anion (aliphatic sulfonic acid anion, aromatic sulfonic acid anion, camphor sulfonic acid anion, and the like), a carboxylic acid anion (aliphatic carboxylic acid anion, aromatic carboxylic. acid anion, aralkyl carboxylic acid anion, and the like), a sulfonylimide anion, a bis(alkylsulfonyl) imide anion, and a tris(alkylsulfonyl) methide anion. $Z^-$ may be anions as $X^-$ included in the acid generator represented by Formula (1-1) or (1-2).

The aliphatic portion in the aliphatic sulfonic acid anion and the aliphatic carboxylic acid anion may be an alkyl group or may be a cycloalkyl group, and is preferably a linear or branched alkyl group having 1 to 30 carbon atoms and a cycloalkyl group having 3 to 30 carbon atoms.

The aromatic group in the aromatic sulfonic acid anion and the aromatic carboxylic acid anion is preferably an aryl group having 6 to 14 carbon atoms, and examples thereof include a phenyl group, a tolyi group, and a naphthyl group.

The alkyl group, the cycloalkyl group, and the aryl group may have substituents. The specific examples thereof include a halogen atom such as a nitro group and a fluorine atom, a carboxyl group, a hydroxyl group, an amino group; a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 2 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms). With respect to the aryl group and the ring structure included in each of the groups, examples of the substituent further include an alkyl group (preferably having 1 to 15 carbon atoms).

The aralkyl group in the aralkyl carboxylic acid anion is preferably an aralkyl group having 6 to 12 carbon atoms, and examples thereof include a benzyl group, a phenethyl group, a naphthylmethyl group, a naphthylethyl group, and a naphthylbutyl group.

Examples of the sulfonylimide anion include a saccharin anion.

The alkyl group in the bis(alkylsulfonyl) imide anion or the tris(alkylsulfonyl) methide anion is preferably an alkyl group having 1 to 5 carbon atoms. Examples of the substituent of the alkyl group include a halogen atom, an alkyl group substituted with a halogen atom, an alkoxy group, an alkylthio group, an alkyloxysulfonyl group, an aryloxysulfonyl group, and a cycloalkylaryloxysulfonyl group. The substituent is preferably a fluorine atom or an alkyl group substituted with a fluorine atom.

Examples of the other $Z^-$ include phosphorus fluoride, boron fluoride, and antimony fluoride.

$Z^-$ is preferably an aliphatic sulfonic acid anion in which at least α position of a sulfonic acid is substituted with a fluorine atom, an aromatic sulfonic acid anion which is substituted with a fluorine atom or a group having a fluorine atom, a bis(alkylsulfonyl) imide anion in which an alkyl group is substituted with a fluorine atom, and a tris(alkylsulfonyl) methide anion in which an alkyl group is substituted with a fluorine atom. The non-nucleophilic anion is more preferably a perfluoro aliphatic sulfonic acid anion (even more preferably having 4 to 8 carbon atoms) or a benzene sulfonic acid anion having a fluorine atom, and even more preferably a nonafluorobutanesulfonic acid anion, a perfluorooctanesulfonic acid anion, a pentafluorobenzenesulfonic acid anion, and a 3,5-bis(trifluoromethyl) benzenesulfonic acid anion.

In view of acid strength, it is preferable that pKa of a generated acid is −1 or less, in order to enhance sensitivity.

Examples of the organic groups of $R_{201}$, $R_{202}$, and $R_{203}$ include an aryl group (preferably having 6 to 15 carbon atoms), a linear or branched alkyl group (preferably having 1 to 10 carbon atoms), and a cycloalkyl group (preferably having 3 to 15 carbon atoms).

It is preferable that at least one of $R_{201}$, $R_{202}$, and $R_{203}$ is an aryl group, and it is more preferable that all of $R_{201}$, $R_{202}$, and $R_{203}$ are aryl groups. In addition to the phenyl group and the naphthyl group, the aryl group can be a heteroaryl group such as an indole residue and a pyrrole residue. The aryl group may further have a substituent. Examples of the substituent include a halogen atom such as a nitro group and a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having to 7 carbon atoms), an acyl group (preferably having 2 to 12 carbon atoms), and an alkoxycarbonyloxy group (preferably having 2 to 7 carbon atoms), and the present invention is not limited to these.

Two selected from $R_{201}$, $R_{202}$, and $R_{203}$ may be a single bond or may be bonded to each other via a linking group. Examples of the linking group include an alkylene group (preferably having 1 to 3 carbon atoms), —O—, —S—, —CO—, —SO$_2$—, but the present invention is not limited to these.

Examples of the preferable structure in a case where at least one of $R_{201}$, $R_{202}$ and $R_{203}$ is not an aryl group include cation structures such as those disclosed in paragraphs 0046 and 0047 of JP2004-233661A or paragraphs 0040 to 0046 of JP2003-35948A, compounds exemplified as Formulae (I-1) to (I-70) in US2003/0224288A1, and compounds exemplified as Formulae (IA-1) to (IA-54) and (IB-1) to (IB-24) in US2003/0077540A1.

In Formula (ZII) or (ZIII), $R_{204}$ to $R_{207}$ each independently represent an aryl group, an alkyl group, or a cycloalkyl group.

The aryl group, the alkyl group, and the cycloalkyl group of $R_{204}$ to $R_{207}$ are the same as aryl groups described as the aryl group, the alkyl group, and the cycloalkyl group as $R_{201}$ to $R_{203}$.

The aryl group, the alkyl group, and the cycloalkyl group of $R_{204}$ to $R_{207}$ may have substituents. Examples of the substituent include those included in the aryl group, the alkyl group, and the cycloalkyl group of $R_{20}$ to $R_{203}$.

$Z^-$ represents a non-nucleophilic anion, and examples thereof include those which are the same as the non-nucleophilic anion of $Z^-$ in Formula (ZI).

Examples of the photoacid generator (B) further include compounds represented by Formulae (ZIV), (ZV), and (ZVI).

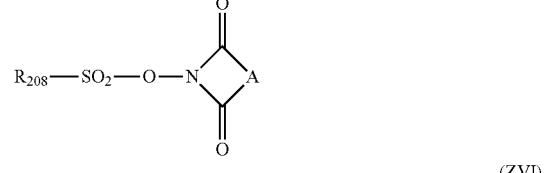

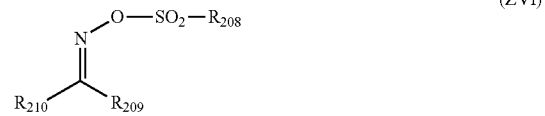

In Formulae (ZIV) to (ZVI), $Ar_3$ and $Ar_4$ each independently represent an aryl group.

$R_{208}$, $R_{209}$, and $R_{210}$ each independently represent an alkyl group, a cycloalkyl group, or an aryl group.

A represents an alkylene group, an alkenylene group, or an arylene group.

Examples of the photoacid generator that can be used other than the photoacid generator represented by Formula (1-1) or (1-2) are provided below. Examples of the photoacid generator that can be used other than the photoacid generator represented by Formula (1-1) or (1-2) include those disclosed in paragraphs 0368 to 0377 of JP2014-41328A, paragraphs 0240 to 0262 of JP2013-228681A, and paragraph 0339 of US2015/004533A, in addition to those provided above.

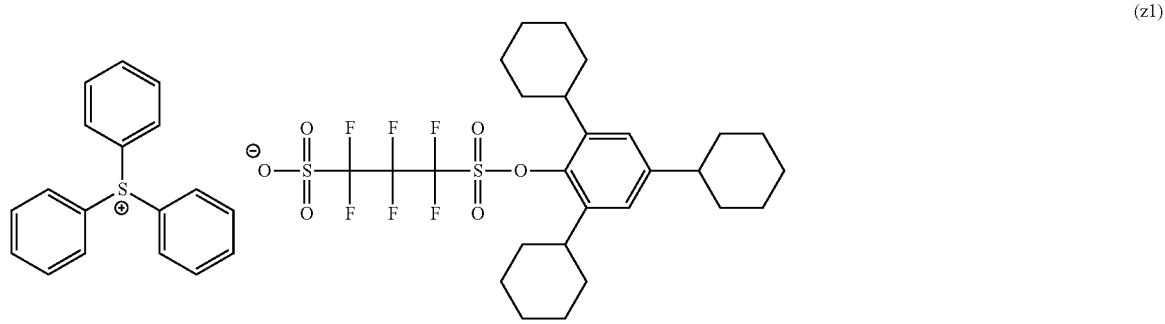

(z1)

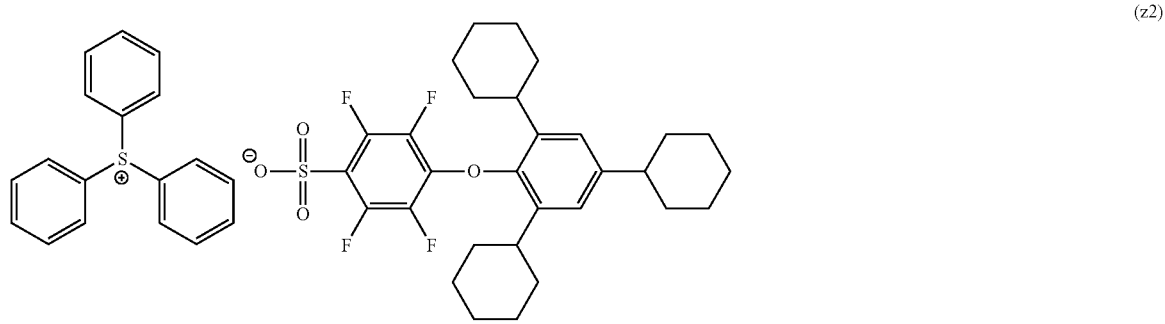

(z2)

-continued
(z3)
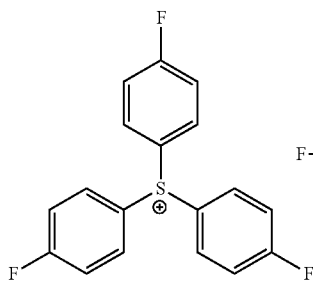 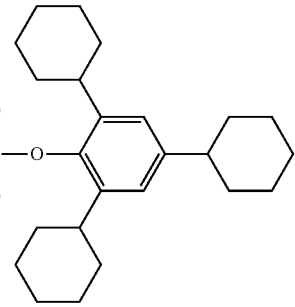
(z4) (z5)
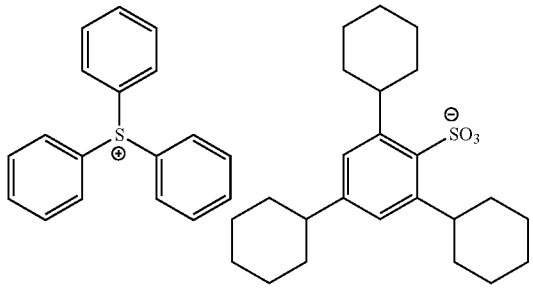 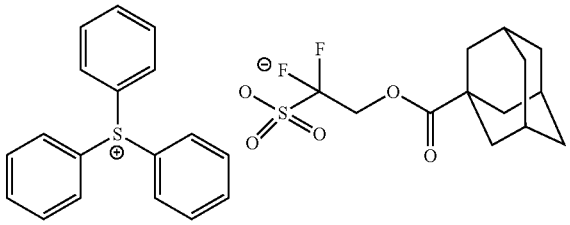
(z6) (z7)
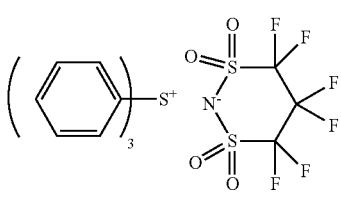 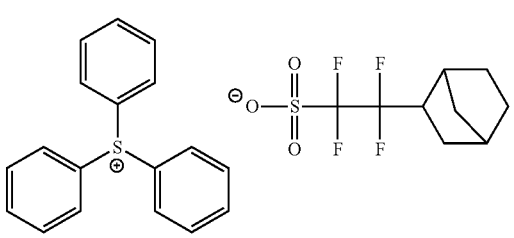
(z8) (z9)
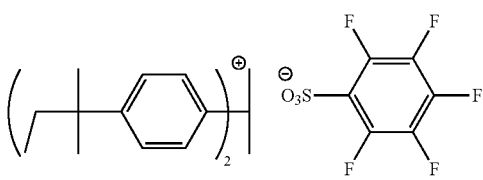 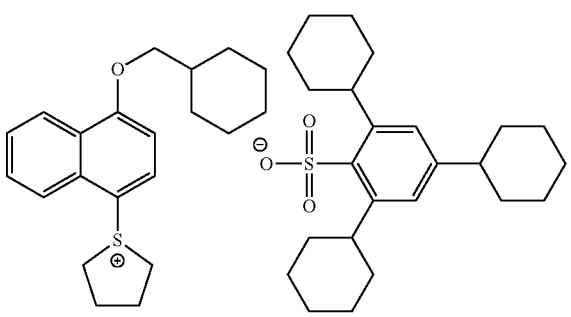
(z10)
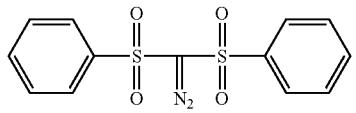
(z11)
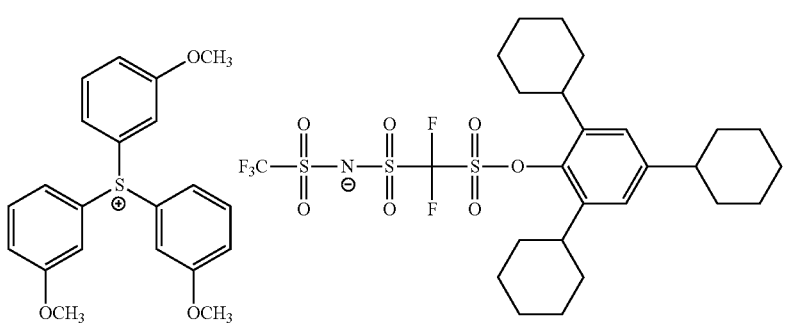

-continued
(z12)
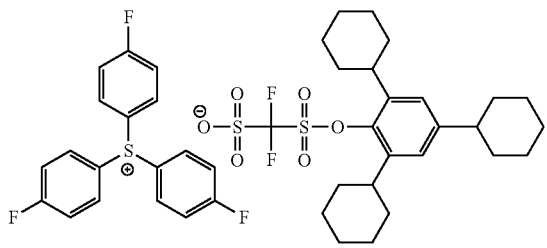
(z13)
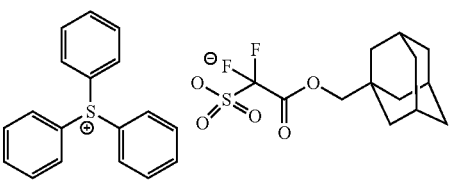
(z14)
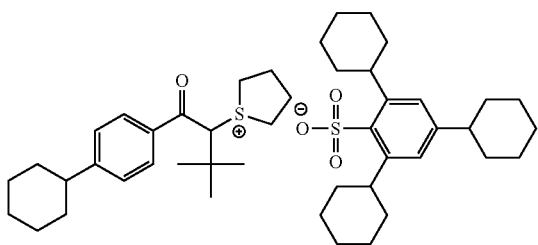
(z15)
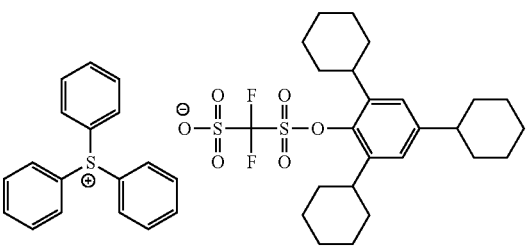
(z16)
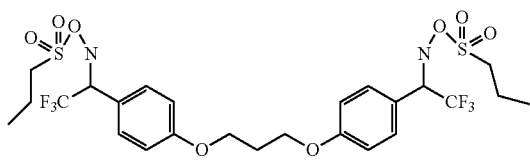
(z17)
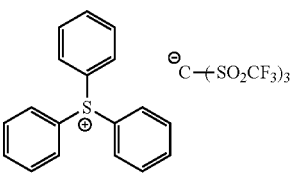
(z18)
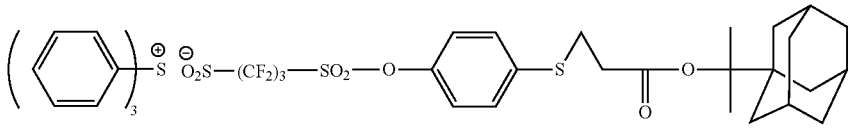
(z19)
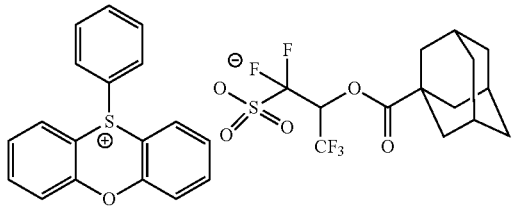
(z20)
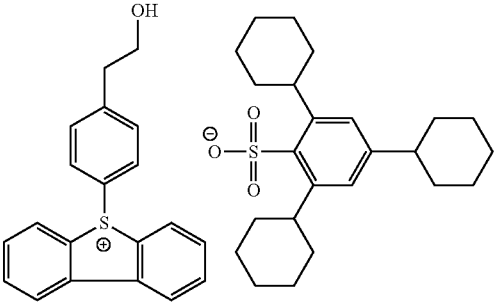
(z-21)
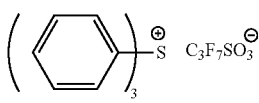
(z-22)
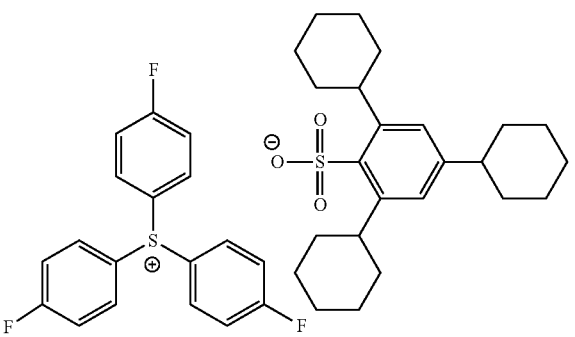

-continued

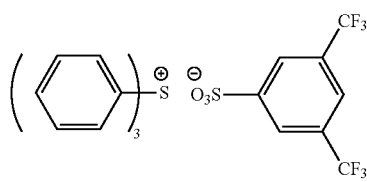
(z23)

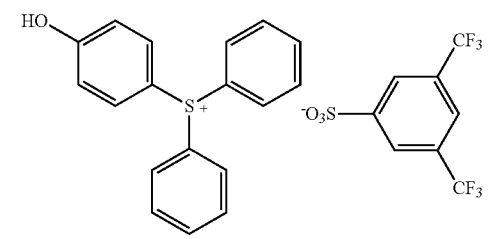
(z24)

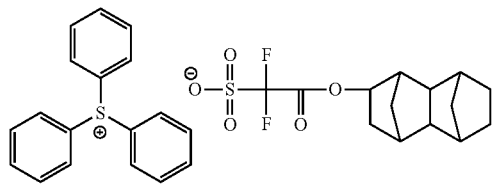
(z25)

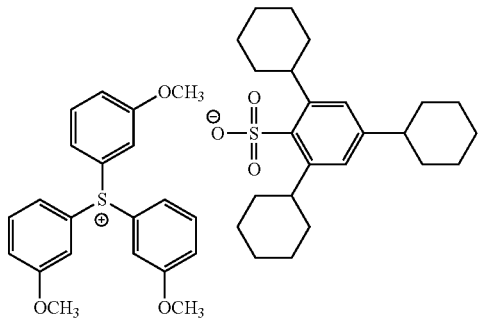
(z26)

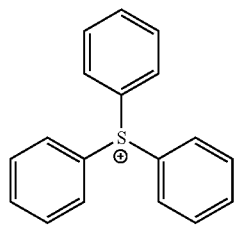
(z27)

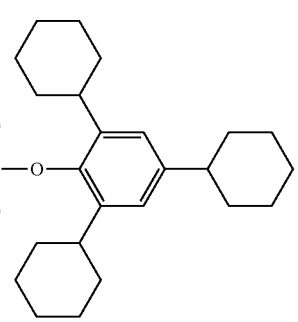

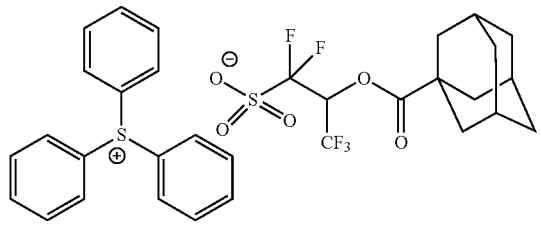
(z28)

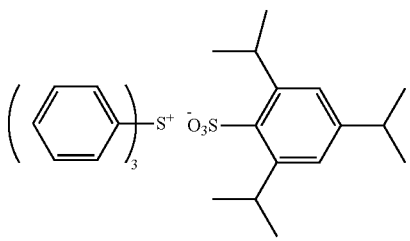
(z29)

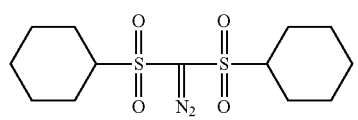
(z30)

In the composition of the present invention, two or more photoacid generators (B) may be used in combination.

The content of the photoacid generator (B) in the composition is preferably 10 to 50 mass %, more preferably 15 to 45 mass %, and even more preferably 20 to 40 mass % with respect to the total solid content of the actinic ray-sensitive or radiation-sensitive resin composition of the present invention.

[Acid Diffusion Control Agent (C)]

The composition of the present invention contains the acid diffusion control agent (C). The acid diffusion control agent functions as a quencher for trapping an acid generated from the photoacid generator due to exposure, and performs a role of controlling a diffusion phenomenon of an acid in a coated film.

Examples of the acid diffusion control agent (C) include compounds described in (1) to (6).

(1) A basic compound or an ammonium salt compound in which basicity decreases due to irradiation with actinic rays or radiation, According to an aspect, the composition of the present invention preferably contains a basic compound or an ammonium salt compound (hereinafter, also referred to as a "compound (N)") in which basicity decreases due to irradiation with actinic rays or radiation as the acid diffusion control agent.

The compound (N) is preferably the compound (N-1) having a basic functional group or an ammonium group together with a group that generates an acidic functional group due to irradiation with actinic rays or radiation. That is, the compound (N) is preferably a basic compound having a basic functional group and a group that generates an acidic functional group due to irradiation with actinic rays or radiation or an ammonium salt compound having an ammonium group and a group that generates an acidic functional group due to irradiation with actinic rays or radiation.

Specific examples of the compound (N) include compounds exemplified as the specific examples of a compound (PA) that has a proton acceptor functional group described below and that generates a compound decomposed due to irradiation with actinic rays or radiation such that proton acceptor properties are decreased or disappeared or proton acceptor properties are changed to acidity. In addition to the compounds exemplified below, for example, compounds of (A-1) to (A-44) disclosed in US2010/0233629A, compounds of (A-1) to (A-23) disclosed in US2012/0156617A, compounds disclosed in paragraphs 0421 to 0428 of JP2014-41328A, and compounds disclosed in paragraphs 0108 to 0116 of JP2014-134686A can be preferably used in the present invention, as the compound (N).

The molecular weight of the compound (N) is preferably 500 to 1,000.

The composition of the present invention may or may not contain the compound (N). In a case where the composition contains the compound (N), the content of the compound (N) is preferably 0.1 to 30 mass % and more preferably 0.1 to 20 mass % with respect to the solid content of the composition of the present invention.

(2) Basic Compound (N') Different from Compound (N)

According to another aspect of the invention, the composition of the present invention may contain a basic compound (N') different from the compound (N) as the acid diffusion control agent, in order to reduce a performance change according to the elapse of time from the exposure to the heating.

Examples of the basic compound (N') preferably include compounds having structures provided in Formulae (A') to (E').

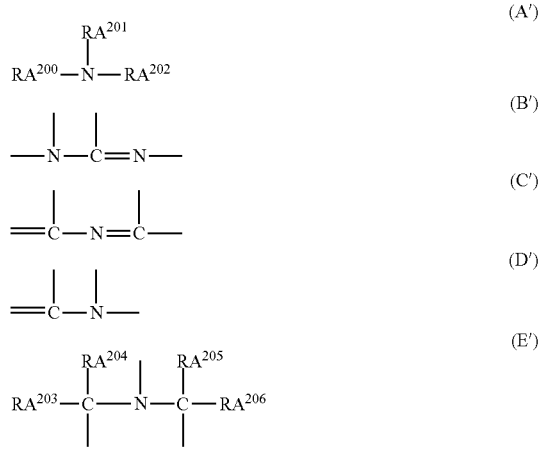

In Formulae (A') and (E'), $RA^{200}$, $RA^{201}$, and $RA^{202}$ may be identical to each other or may be different from each other and each represent a hydrogen atom, an alkyl group (preferably having 1 to 20 carbon atoms), a cycloalkyl group (preferably having 3 to 20 carbon atoms), or an aryl group (having 6 to 20 carbon atoms). $RA^{201}$ and $RA^{202}$ may be bonded to each other to form a ring. $RA^{203}$, $RA^{204}$, $RA^{205}$, and $RA^{206}$ may be identical to each other or may be different from each other, and each represent an alkyl group (preferably having 1 to 20 carbon atoms).

The alkyl group may have a substituent, and an alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

These alkyl groups in Formulae (A') and (E') are more preferably unsubstituted.

Preferable specific examples of the basic compound (N') include guanidine, aminopyrrolidine, pyrazole, pyrazoline, piperazine, aminomorpholine, aminoalkyl morpholine, and piperidine. Even more preferable specific examples thereof include a trialkylamine structure, a compound having an imidazole structure, a diazabicyclo structure, an onium hydroxide structure, an onium carboxylate structure, an aniline structure, or a pyridine structure, an alkylamine derivative having a hydroxyl group and/or an ether bond, and an aniline derivative having a hydroxyl group and/or an ether bond.

Examples of the compound having an imidazole structure include imidazole, 2,4,5-triphenylimidazole, and benzimidazole. Examples of the compound having a diazabicyclo structure include 1,4-diazabicyclo[2,2,2]octane, 1,5-diazabicyclo[4,3,0]non-5-ene, 1,8-diazabicyclo[5,4,0]undec-7-ene. Examples of the compound having an onium hydroxide structure include triarylsulfonium hydroxide, phenacyl sulfonium hydroxide, and sulfonium hydroxide having a 2-oxoalkyl group. Specific examples thereof include triphenylsulfonium hydroxide, tris(t-butylphenyl) sulfonium hydroxide, bis(t-butylphenyl) iodonium hydroxide, phenacylthiophenium hydroxide, 2-oxopropylthiophenium hydroxide. The compound having an onium carboxylate structure is a compound in which an anion portion of the compound having an onium hydroxide structure is a carboxylate, and examples of thereof include acetate, adamantine 1-carboxylate, and perfluoroalkyl carboxylate. Examples of the compound having a trialkylamine structure include tri(n-butyl) amine and tri(n-octyl) amine. Examples of the compound having an aniline structure include 2,6-diisopropylaniline, N,N-dimethylaniline, N,N-dibutyladdine, and N,N-dihexylaniline. Examples of the alkylamine derivative having a hydroxyl group and/or an ether bond include ethanolamine, diethanolamine, triethanolamine, and tris(methoxyethoxyethyl) amine. Examples of the aniline derivative having a hydroxyl group and/or an ether bond include N,N-bis (hydroxyethyl) aniline.

Preferably examples of the basic compound further include an amine compound having a phenoxy group, an ammonium salt compound having a phenoxy group, an amine compound having a sulfonic acid ester group, and an ammonium salt compound having a sulfonic acid ester group. Specific examples thereof include compounds (C1-1) to (C3-3) exemplified in [0066] of US2007/0224539A, and the present invention is not limited thereto.

The composition of the present invention may or may not contain a compound (N'). In a case where the composition contains a compound (N'), the content of the compound (N') is preferably 0.001 to 10 mass % and more preferably 0.01 to 5 mass % with respect to the solid content of the composition of the present invention.

(3) Nitrogen-Containing Organic Compound having a Group that Leaves Due to an Action of an Acid According to another aspect, the omposition of the present. invention may contain nitrogen-containing organic compound (hereinafter, also referred to as a "basic compound (N")" having a group that leaves due to an action of an acid as one acid diffusion control agent. Specific examples of the compound are provided below, as an example of the compound.

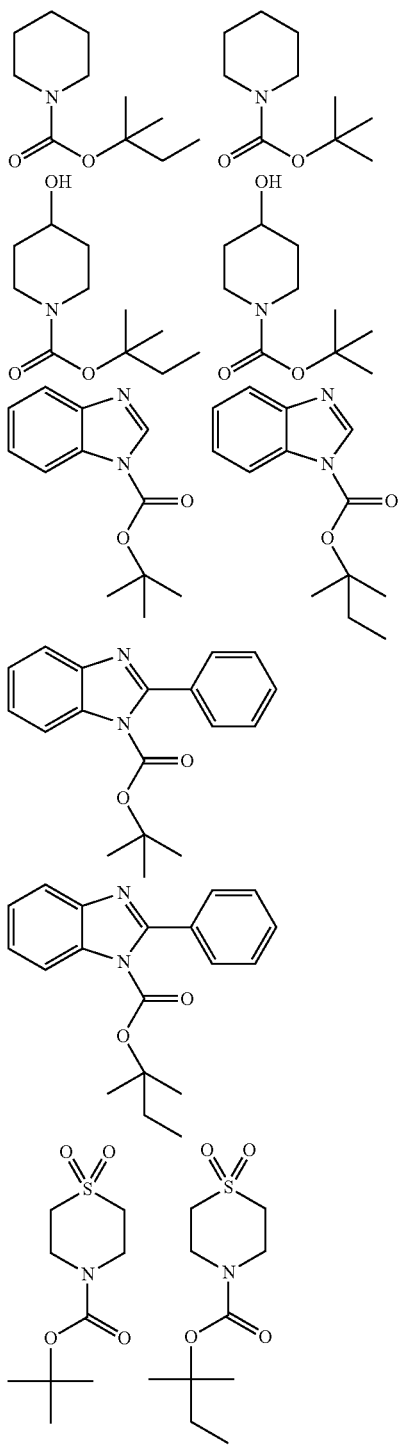

The compound can be synts esized according to the method disclosed in JP2009- 199021A.

As the basic compound (N"), a compound having an amine oxide structure can also be used. As the specific examples of the compound, triethylamine pyridine N-oxide, tributylamine N-oxide, triethanolamine N-oxide, tris (methoxyethyl) amine N-oxide, tris(2-(methoxymethoxy) ethyl) amine=oxide, 2,2',2"-nitrilotriethyl propionate N -oxide, and N-2-(2-methoxyethoxy)methoxyethyl morpholine N-oxide, and amine oxide compounds exemplified in JP2008-102383.A may be used.

The molecular weight of the basic compound (N") is preferably 250 to 2,000 and even more preferably 400 to 1,000. In view of reduction of LWR and local pattern dimension evenness, the molecular weight of the basic compound is preferably 400 or greater, more preferably 500 or greater, and even more preferably 600 or greater.

The basic compound (N") may be used together with the compound (N) or may be used singly, or two or more kinds thereof may be used in combination.

The composition of the present invention may or may not contain the basic compound (N"). In a case where the composition contains the basic compound (N"), the used amount of the basic compound (N") is generally 0.001 to 10 mass % and preferably 0.01 to 5 mass % with respect to the solid content of the composition of the present invention.

(4) Ammonium Salt

An ammonium salt may be appropriately used as a basic compound.

The cation of the ammonium salt is preferably a tetraalkylammonium cation substituted with an alkyl group having 1 to 18 carbon atoms, more preferably tetramethylammonium cation, tetraethylammonium cation, tetra(n-butyl) ammonium cation, tetra(n-heptyl) ammonium cation, tetra(n-octyl) ammonium cation, dimethyl hexadecyl ammonium cation, and benzyl trimethyl cation, and most preferably tetra (n-butyl) ammonium cation.

Examples of an anion of an ammonium salt include halide, sulfonate, borate, phosphate, hydroxide, and carboxylate. Among these, hydroxide, and carboxylate are particularly preferable.

As the halide, chloride, bromide, and iodide are particularly preferable.

As the sulfonate, organic sulfonate having 1 to 20 carbon atoms is particularly preferable. Examples of organic sulfonate include alkyl sulfonates and aryl sulfonates having 1 to 20 carbon atoms.

An alkyl group included in alkyl sulfonate may have a substituent. Examples of the substituent include a fluorine atom, a chlorine atom, a bromine atom, an alkoxy group, an acyl group, and an aryl group. Specific examples of the alkyl sulfonate include methanesulfonate, ethanesuifonate, butanesulfonate, hexanesulfonate, octane sulfonate, benzylsulfonate, trifluoromethanesulfonate, pentafluoroethanesulfonate, and nonafluorobutanesulfonate.

Examples of the aryl group contained in the aryl sulfonate include a phenyl group, a naphthyl group, and an anthryl group. The aryl group may have a substituent. As the substituent, for example, a linear or branched alkyl group having 1 to 6 carbon atoms and a cycloalkyl group having 3 to 6 carbon atoms are preferable. Specifically, for example, methyl, ethyl, n-propyl, isopropyl, n-butyl, i-butyl, t-butyl, n-hexyl, and cyclohexyl groups are preferable. Examples of the other substituents include an alkoxy group having 1 to 6 carbon atoms, a halogen atom, cyano, nitro, and acyl groups, and acyloxy groups.

The carboxylate may be aliphatic carboxylate or aromatic carboxylate. Examples thereof include acetate, lactate, pyruvate, trifluoroacetate, adamantine carboxylate, hydroxyadamantane carboxylate, benzoate, naphthoate, salicylate, phthalate, and phenolate. Particularly, benzoate, naphthoate, and phenolate are preferable, and benzoate is most preferable.

In this case, as the ammonium salt, tetra(n-butyl) ammonium benzoate and tetra(n-butyl) ammonium phenolate are preferable.

In a case where the ammonium salt is hydroxide, it is particularly preferable that the ammonium salt is tetraalkylammonium hydroxide having 1 to 8 carbon atoms (tetraalkylammonium hydroxide such as tetramethylammonium hydroxide, tetraethylammonium hydroxide, and tetra-(n-butyl) arnrnonium hydroxide).

(5) Onium Salt

According to another aspect, the composition of the present invention may include onium salt represented by Formula (6A) or (6B), as an acid diffusion control agent. In relation to acid strength of the photoacid generator that is generally used in the resist composition, it is expected that the onium salt controls the diffusion of a generated acid in a resist system.

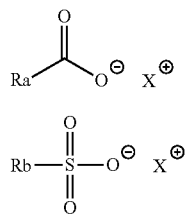

(6A)

(6B)

In Formula (6A),

Ra represents an organic group. Here, an organic group in which a fluorine atom is substituted with a carbon atom directly bonded to a carboxylic acid group in the formula is excluded.

$X^+$ represents an onium cation.

In Formula (6B),

Rh represents an organic group. Here, an organic group in which a fluorine atom is substituted with a carbon atom directly bonded to a sulfonic acid group in the formula is excluded.

$X^+$ represents an onium cation.

The organic groups represented by Ra and Rb are preferably an organic group in which an atom directly bonded to a carboxylic acid group or a sulfonic acid group is a carbon atom in the formula. Here, in this case, a fluorine atom does not have to be substituted with a carbon atom directly bonded to a sulfonic acid group or a carboxylic acid group in order to cause an acid to be relatively weaker than the acid generated from the above photoacid generator.

Examples of the organic group represented by Ra and Rb include an alkyl group having 1 to 20 carbon atoms, a cycloalkyl group having 3 to 20 carbon atoms, an aryl group having 6 to 30 carbon atoms, an aralkyl group having 7 to 30 carbon atoms, or a heterocyclic group having 3 to 30 carbon atoms. In the groups a portion or all of hydrogen atoms may be substituted.

Examples of the substituent that can be included in the alkyl group, the cycloalkyl group, the aryl group, the aralkyl group, and the heterocyclic group include a hydroxyl group, a halogen atom, an alkoxy group, a lactone group, and an alkylcarbonyl group.

Examples of the onium cation represented by $X^+$ in Formulae (6A) and (6B) include a sulfonium cation, an ammonium cation, an iodonium cation, a phosphonium cation, and a diazonium cation. Among these, a sulfonium cation is more preferable.

For example, as the sulfonium cation, arylsulfonium cation having at least one aryl group is preferable, and triarylsulfonium cation is more preferable. The aryl group may have a substituent, and the aryl group is preferably a phenyl group.

Examples of the sulfonium cation and the iodonium cation preferably include structures described in the compound (B).

Specific structures of the onium salt represented by Formula (6A) or (6B) are provided below.

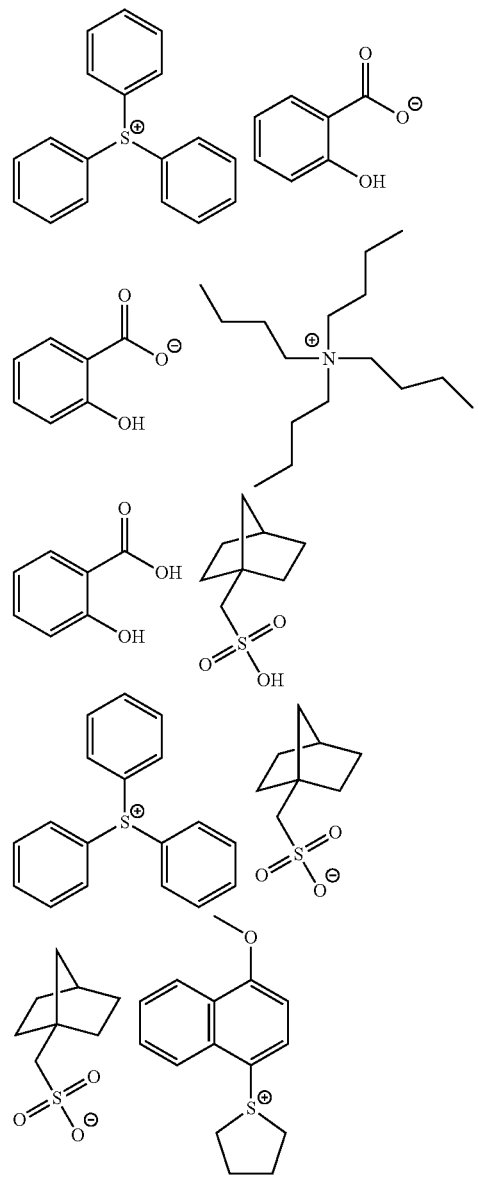

-continued

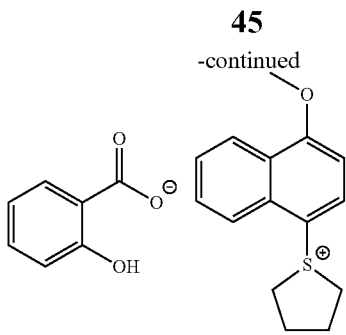

The composition of the present invention may or may not contain the onium salt. In a case where the composition contains the onium salt, the content of the onium salt is preferably 0.001 to 20 mass % and more preferably 0.01 to 10 mass % with respect to the solid content in the composition of the present invention.

(6) Betaine Compound

According to another aspect, the composition of the present invention may contain a compound (hereinafter, also referred to as a betaine compound) having both an onium salt structure and an acid anion structure in one molecule as the acid diffusion control agent. Examples of the onium salt structure include sulfonium, iodoniuun, and ammonium structures. According to an aspect, sulfonium and iodonium structures are preferable. As the acid anion structure, a sulfonic acid anion or a carboxylic acid anion is preferable.

The actinic ray-sensitive or radiation-sensitive resin. composition according to the present invention may contain a betaine compound represented by Formula (I) as the acid diffusion control agent.

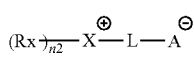   (I)

In Formula (I),

A⁻ represents an organic acid anion, L represents a single bond or a divalent linking group, X⁺ represents a nitrogen cation or a sulfur cation, and Rx each independently represent an alkyl group or an aryl group. A plurality of Rx's may be bonded to each other to form a ring, and the formed ring may have a nitrogen atom, an oxygen atom, or a sulfur atom as a ring member.

n2 represents 3 in a case where X⁺ is a nitrogen cation, and represents 2 in a case where X⁺ is a sulfur cation.

With respect to the betaine compound represented by Formula (I), for example, contents in paragraphs 0167 to 0177 of JP2014-199273A can be referred to, and the contents thereof are incorporated to the present specification.

The composition of the present invention may contain a compound included in Formula (I) of JP2012-189977A, a compound represented by Formula (I) of JP2013-6827A, a compound represented by Formula (I) JP2013-8020A, and a betaine compound represented by Formula (I) of JP2012-252124A, as the acid diffusion control agent. Specific examples of the betaine compound are provided below.

C1-1

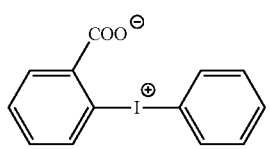

C1-2

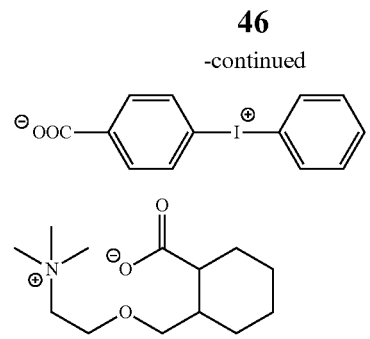

C1-3

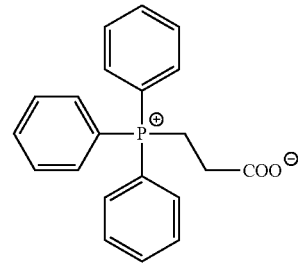

C1-4

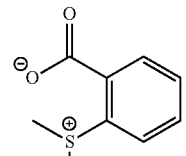

C1-5

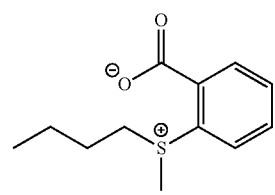

C1-6

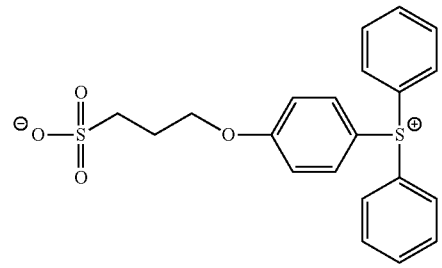

C1-7

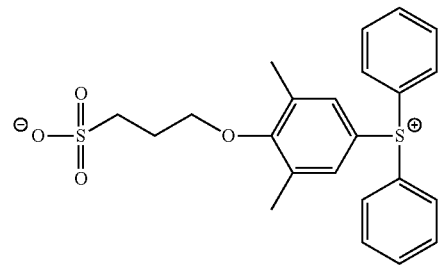

C1-8

C1-9

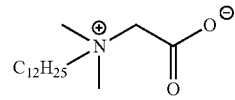

The composition of the present invention may or may not contain the betaine compound. In a case where the composition contains the betaine compound, the content of the betaine compound is preferably 0.001 to 20 mass % and more preferably 0.01 to 10 mass % with respect to the solid content of the composition of the present invention.

[Resin (A)]

The composition of the present invention contains the resin (A).

According to one aspect of the present invention, the resin (A) is preferably a resin (hereinafter, also referred to as an "acid decomposable resin") having a group (hereinafter, referred to as an "acid decomposable group") that is decomposed due to an action of an acid on a main chain or a side chain of the resin or both a main chain and a side chain such that polarity increases. Before and after the irradiation with actinic rays or radiation, the polarity of the acid decomposable resin greatly changes, dissolution contrast in a case of being developed by using an alkaline developer or an organic solvent-based developer is enhanced. Therefore, it is possible to obtain a form of a positive tone pattern in a case of being developed by using an alkaline developer and it is possible to obtain a form of a negative pattern in a case of being developed by using an organic solvent-based developer.

According to another aspect of the present invention, the resin (A) may be a resin not including an acid decomposable group. In this case, the composition of the present invention preferably includes a crosslinking agent described below, and a negative pattern can be obtained by performing development by using an alkaline developer.

The resin (A) even more preferably contains a repeating unit having an acid decomposable group. As the repeating unit having an acid decomposable group, a repeating unit having a group that is decomposed due to an action of an acid and generates an alkali soluble group is preferable.

The acid decomposable group is preferably a group obtained by substituting a hydrogen atom of an alkaline soluble polymer such as a —COOH group and an —OH group with a group that is released due to an action of an acid. The group that is released due to an action of an acid is particularly preferably an acetal group or a tertiary ester group.

An example of a matrix resin when this acid decomposable group is bonded as a side chain includes an alkaline soluble resin having —OH or a —COOH group at a side chain. Examples of this alkaline soluble resin include resins described below.

The alkali dissolution rate of this alkaline soluble resin is preferably 17 nm/sec or greater measured by 0.261 N tetramethyl ammonium hydroxide (TMAH) (23° C.). This rate is particularly preferably 33 nm/sec or greater.

In this point of view, examples of particularly preferable alkaline soluble resin include a resin including a hydroxystyrene structure unit such as o-, m-, and p-poly(hydroxystyrene), and copolymers of these, partially O-alkylated products or O-acylated products of hydrogenated poly(hydroxystyrene), a halogen- or alkyl-substituted poly(hydroxystyrene), and poly(hydroxystyrene), a styrene-hydroxystyrene copolymer, an α-methylstyrene-hydroxystyrene copolymer, and a hydrogenated novolac resin; and a resin including a repeating unit having a carboxyl group such as a (meth)acrylic acid and a norbornene carboxylic acid.

Examples of the preferable repeating unit having the acid decomposable group include t-butoxycarbonyloxystyrene, 1-alkoxyethoxystyrene, and (meth)acrylic acid tertiary alkyl ester. As the repeating unit, 2-alkyl-2-adamantyl (meth)acrylate or dialkyl(1-adamantyl)methyl (meth)acrylate are more preferable.

As disclosed in EP254853A, JP1990-25850A (JP-H02-25850A), JP1991-223860A (JP-H03-223860A), and JP1992-251259A (JP-H04-251259A), the acid decomposable resin can be obtained, for example, by reacting a precursor of a group that is released due to an action of an acid with a resin, or copolymerizing an alkaline soluble resin monomer bonded to the group that is released due to the action of the acid with various monomers.

Since the composition according to the present invention is used for electron beam irradiation, the resin (A) preferably has a hydroxystyrene repeating unit. It is even more preferable that the resin (A) is a copolymer of hydroxystyrene protected by a group that is released due to the action of the acid and hydroxystyrene or a copolymer of hydroxystyrene and (meth)acrylic acid tertiary alkyl ester.

With respect to the resin, specifically, examples of the repeating unit having a group include a resin having a repeating unit expressed by Formula (A) below. In a case where the resin having the repeating unit is used, the dry etching resistance of the formed pattern is improved.

In the formula, $R_{01}$, $R_{02}$, and $R_{03}$ each independently represents, for example, a hydrogen atom, an alkyl group, a cycloalkyl group, a halogen atom, a cyano group, or an alkoxycarbonyl group. $Ar_j$ represents, for example, an aromatic ring group. $R_{03}$ and $Ar_1$ are alkylene groups, and both are bonded to each other to form a 5-membered or 6-membered ring together with a —C—C— chain.

n items of Y's each independently represent a hydrogen atom or a group that is released due to an action of an acid. However, at least one of the Y's represents a group that is released due to an action of an acid.

n represents an integer of 1 to 4, preferably an integer of 1 or 2 is, and more preferably 1.

The alkyl groups as $R_{01}$ to $R_{03}$ are, for example, an alkyl group having 20 or less carbon atoms, and preferably a methyl group, an ethyl group, a propyl group, an isopropyl group, an n-butyl group, a sec-butyl group, a hexyl group, a 2-ethylhexyl group, an octyl group, or a dodecyl group. It is more preferable that the alkyl group is an alkyl group having 8 or less carbon atoms. The alkyl group may have a substituent.

As the alkyl group included in the alkoxycarbonyl group, the same alkyl groups as the alkyl groups in $R_{01}$ to $R_{03}$ are preferable.

The cycloalkyl group may be a monocyclic cycloalkyl group or may be a polycyclic cycloalkyl group. It is preferable that examples thereof include a monocyclic cycloalkyl group having 3 to 8 carbon atoms such as a cyclopropyl group, a cyclopentyl group, and a cyclohenyl group. In addition, these cycloalkyl groups may have substituents.

Examples of the halogen atom include a fluorine atom, a chlorine atom, a bromine atom, and an iodine atom, and a fluorine atom is more preferable.

In a case where $R_{03}$ represents an alkylene group, the alkylene group is preferably a group having 1 to 8 carbon atoms, such as a methylene group, an ethylene group, a propylene group, a butylene group, a hexylene group, and an octylene group.

The aromatic ring group as is preferably an aromatic ring group having 6 to 14 carbon atoms, and examples thereof include a benzene ring, a toluene ring, and a naphthalene ring. In addition, these aromatic ring groups may have substituents.

Examples of the group Y that is released due to an action of an acid include groups represented by —C($R^{36}$)($R^{37}$)($R^{38}$), —C(=O)—O—C($R^{36}$)($R^{37}$)($R^{38}$), —C($R^{01}$)($R^{02}$)(O$R^{39}$), —C($R^{01}$)($R^{02}$)—C(=O)—O—($R^{36}$)($R^{37}$)($R^{38}$), and —CH($R^{36}$)(AR).

In the formula, $R^{36}$ to $R^{39}$ each independently represent an alkyl group, a cycloalkyl group, an aryl group, an aralkyl group, or an alkenyl group. $R^{36}$ and $R^{37}$ are bonded to each other to form a ring structure.

$R^{01}$ and $R^{02}$ each independently represent a hydrogen atom, an alkyl group, a cycloalkyl group, an aryl group, an aralkyl group, or an alkenyl group.

Ar represents an aryl group.

An alkyl group as $R^{36}$ to $R^{39}$, $R^{01}$, or $R^{02}$ is preferably an alkyl group having 1 to 8 carbon atoms, and examples thereof include a methyl group, an ethyl group, a propyl group, an n-butyl group, a sec-butyl group, a hexyl group, and an octyl group.

The cycloalkyl group as $R^{36}$ to $R^{39}$, $R^{01}$, or $R^{02}$ may be a monocyclic cycloalkyl group or may be a polycyclic cycloalkyl group. As the monocyclic cycloalkyl group, a cycloalkyl group having 3 to 8 carbon atoms is preferable, and examples thereof include a cyclopropyl group, a cyclobutyl group, a cyclopentyl group, a cyclohexyl group, and cyclooctyl group. As the polycyclic cycloalkyl group, a cycloalkyl group having 6 to 20 carbon atoms is preferable, and examples thereof include an adamantyl group, a norbornyl group, an isobornyl group, a camphanyl group, a dicyclopentyl group, an α-pinenyl group, a tricyclodecanyl group, a tetracyclododecyl group, and an androstanyl group. In addition, a portion of a carbon atom in a cycloalkyl group may be substituted with a hetero atom such as an oxygen atom.

The aryl group as $R^{36}$ to $R^{39}$, $R^{01}$, $R^{02}$, or Ar is preferably an aryl group having 6 to 10 carbon atoms, and examples thereof include a phenyl group, a naphthyl group, and an anthryl group.

The aralkyl group as $R^{36}$ to $R^{39}$, $R^{01}$, or $R^{02}$ preferably an aralkyl group having 7 to 12 carbon atoms, and for example, a benzyl group, a phenethyl group, and a naphthylmethyl group are preferable.

The alkenyl group as $R^{36}$ to $R^{39}$, $R^{01}$, or $R^{02}$ is preferably an alkenyl group having 2 to 8 carbon atoms, and examples thereof include a vinyl group, an allyl group, a butenyl group, and a cyclohexanyl group.

A ring that can be formed by bonding $R^{36}$ and $R^{37}$ to each other may be a monocyclic type or may be a polycyclic type. As the monocyclic type, a cycloalkane structure having 3 to 8 carbon atoms is preferable, and examples thereof include a cyclopropane structure, a cyclobutane structure, a cyclopentane structure, a cyclohexane structure, a cycloheptane structure, and a cyclooctane structure. As the polycyclic type, a cycloalkane structure having 6 to 20 carbon atoms is preferable, and examples thereof include an adamantane structure, a norbornene structure, a dicyclopentane structure, a tricyclodecane structure, and a tetracyclododecane structure. In addition, a portion of the carbon atom in the ring structure is substituted with a hetero atom such as an oxygen atom.

The respective groups may have substituents. Examples of the substituent include an alkyl group, a cycloalkyl group, an aryl group, an amino group, an amido group, an ureido group, a urethane group, a hydroxyl group, a carboxyl group, a halogen atom, an alkoxy group, a thioether group, an acyl group, an acyloxy group, an alkoxycarbonyl group, a cyano group, and a nitro group. The substituent preferably has 8 or less carbon atoms.

As the group Y that is released due to an action of an acid, a structure expressed by Formula (B) below is more preferable.

(B)

In the formula, $L_1$ and $L_2$ each independently represent a hydrogen atom, an alkyl group, a cycloalkyl group, an aryl group, or an aralkyl group.

M represents a single bond or a divalent linking group.

Q represents an alkyl group, a cycloalkyl group, a cyclic aliphatic group, an aromatic ring group, an amino group, an ammonium group, a mercapto group, a cyano group, or an aldehyde group. In addition, the cyclic aliphatic group and the aromatic ring group may have hetero atoms.

At least 2 of Q, M, or $L_1$ may be bonded to each other to form a 5-membered or 6-membered ring.

An example of the alkyl group as $L_1$ and $L_2$ is an alkyl group having 1 to 8 carbon atoms, and specific examples thereof include a methyl group, an ethyl group, a propyl group, an isopropyl group, an n-butyl group, a sec-butyl group, a t-butyl group, a hexyl group, and an octyl group.

The cycloalkyl group as $L_1$ and $L_2$ is, for example, a cycloalkyl group having 3 to 15 carbon atoms, and specific examples thereof include a cyclopentyl group, a cyclohexyl group, a norbornyl group, and an adamantyl group.

The aryl group as $L_1$ and $L_2$ is, for example, an aryl group having 6 to 15 carbon atoms, and specific examples thereof include a phenyl group, a tolyl group, a naphthyl group, and an anthryl group.

The aralkyl group as $L_1$ and $L_2$ is, for example, an aralkyl group having 6 to 20 carbon atoms, and specific examples thereof include a benzyl group and a phenethyl group.

The divalent linking group as M is, for example, an alkylene group (for example, a methylene group, an ethylene group, a propylene group, a butylene group, a hexylene group, or an octylene group), a cycloalkylene group (for example, a cyclopentyl group or a cyclohexylene group), an alkenylene group (for example, an ethylene group, a propenyl group, or a butenyl group), an arylene group (for example, a phenylene group, a tolylene group, or a naphthylene group), —S—, —O—, —CO—, —SO$_2$—, and —N($R_0$)—, or a bond of 2 or more of these groups. Here, $R_0$ is a hydrogen atom or an alkyl group. The alkyl group as $R_0$ is, for example, an alkyl group having 1 to 8 carbon atoms, and specific examples thereof include a methyl group, an ethyl group, a propyl group, an n-butyl group, a sec-butyl group, a hexyl group, and an octyl group.

The alkyl group and the cycloalkyl group as Q are the same as the respective groups as $L_1$ and $L_2$ described above.

Examples of the cyclic aliphatic group or the aromatic ring group as Q include the cycloalkyl group and the aryl group as $L_1$ and $L_2$ described above. This cycloalkyl group and this aryl group are preferably groups having 3 to 15 carbon atoms.

Examples of the cyclic aliphatic group or the aromatic ring group including the hetero atom as Q include a group having a heterocyclic ring structure such as thiirane, cyclothiolane, thiophene, furan, pyrrole, benzothiophene, benzofuran, benzopyrrole, triazine, imidazole, benzimidazole, triazole, thiadiazole, thiazole, and pyrrolidone. However, the cyclic aliphatic group or the aromatic ring group is not limited thereof as long as a group is a ring formed with carbon and a hetero atom, or a ring formed only with hetero atoms.

An example of the ring structure that can be formed by bonding at least 2 of Q, M, or $L_1$ include a 5-membered or 6-membered ring structure obtained by forming a propylene group or a butylene group with these. In addition, the 5-membered or 6-membered ring structure contains an oxygen atom.

The respective groups represented by $L_1$, $L_2$, M, and Q in Formula (2) may have substituents. Examples of the substituent include an alkyl group, a cycloalkyl group, an aryl group, an amino group, an amido group, an ureido group, a urethane group, a hydroxyl group, a carboxyl group, a halogen atom, an alkoxy group, a thioether group, an acyl group, an acyloxy group, an alkoxycarbonyl group, a cyano group, and a nitro group. These substituents preferably have 8 or less carbon atoms.

As the group represented by -(M-Q), the group having 1 to 30 carbon atoms is preferable, and a group having 5 to 20 emboli atoms is more preferable. Particularly, in view of outgas suppression, a group having 6 or more carbon atoms is preferable.

The acid decomposable resin may be a resin having a repeating unit expressed by Formula (X) below, as a repeating unit having an acid decomposable group.

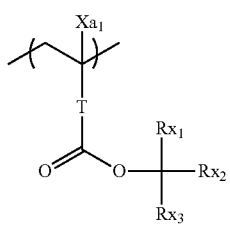

(X)

In Formula (X), $Xa_j$ represents a hydrogen atom, a methyl group, a trifluoromethyl group, or a hydroxymethyl group.

T represents a single bond or a divalent linking group.

$Rx_1$ to $Rx_3$ each independently represent a straight chain or branched alkyl group or a monocyclic or polycyclic cycloalkyl group. In addition, 2 of $Rx_1$ to $Rx_3$ may be bonded to each other to form a monocyclic or polycyclic cycloalkyl group.

Examples of the divalent linking group as T include an alkylene group, a —(COO-Rt)-group, and an —(O-Rt)-group. Here, Rt represents an alkylene group or a cycloalkylene group.

T is preferably a single bond or a —(COO-Rt)-group. Here, Rt is preferably an alkylene group having 1 to 5 carbon atoms, and a —$CH_2$— group or a —$(CH_2)_3$— group is more preferable.

The alkyl group as $Rx_1$ to $Rx_3$ is preferably an alkyl group having 1 to 4 carbon atoms such as a methyl group, an ethyl group, an n-propyl group, an isopropyl group, an n-butyl group, an isobutyl group, and a t-butyl group.

The cycloalkyl group as $Rx_1$ to $Rx_3$ is preferably a monocyclic cycloalkyl group such as a cyclopentyl group and a cyclohexyl group or a polycyclic cycloalkyl group such as a norbornyl group, a tetracyclodecanyl group, a tetracyclododecanyl group, and an adamantyl group.

As the cycloalkyl group that can be formed by bonding 2 of $Rx_1$ to $Rx_3$, a monocyclic cycloalkyl group such as a cyclopentyl group and a cyclohexyl group, or a polycyclic cycloalkyl group having a norbornyl group, a tetracyclodecanyl group, a tetracyclododecanyl group, and an adamantyl group is preferable.

Particularly, $Rx_1$, is a methyl group or an ethyl group; and an aspect in which $Rx_2$ and $Rx_3$ are bonded to each other and the cycloalkyl group described above is formed is preferable.

According to an embodiment, the resin (A) preferably has a phenolic hydroxyl group. Here, the phenolic hydroxyl group refers to a group obtained by substituting a hydrogen atom of an aromatic ring group with a hydroxy group. The aromatic ring of this aromatic ring group is a monocyclic or polycyclic aromatic ring, and examples thereof include a benzene ring or a naphthalene ring.

In a case where the resin (A) according to the present invention is a resin having a phenolic hydroxyl group, the resin (A) preferably contains a repeating unit having at least one phenolic hydroxyl group. The repeating unit having a phenolic hydroxyl group is not particularly limited, but is preferably a repeating unit expressed by Equation (1) below:

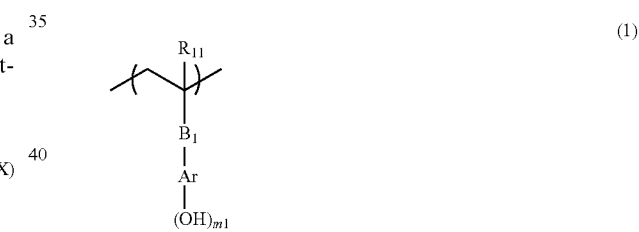

(1)

In Equation (1), $R_{11}$ is a hydrogen atom, a methyl group that may have a substituent, or a halogen atom, $B_1$ is a single bond or divalent linking group.

Ar represents an aromatic ring.

m1 represents an integer of 1 or greater.

Examples of the methyl group that may have a substituent in $R_{11}$ include a trifluoromethyl group and a hydroxymethyl group.

$R_{11}$ is preferably a hydrogen atom or a methyl group. For the reason of developability, a hydrogen atom is preferable.

As a divalent linking group of $B_1$, a carbonyl group, an alkylene group (preferably having 1 to 10 carbon atoms and more preferably having 1 to 5 carbon atoms), sulfonyl group (—S(=O)$_2$—), —O—, —NH— or a divalent linking group obtained by combining these is preferable.

$B_1$ preferably represents a single bond, a carbonyloxy group (—C(=O)—O—), or —C(=O)—NH—, more preferably represents a single bond or a carbonyloxy group (—C(=O)—O—). In view of dry etching resistance enhancement, a single bond is particularly preferable.

An aromatic ring of Ar is a monocyclic or polycyclic aromatic ring, an aromatic hydrocarbon ring that may have substituent having 6 to 18 carbon atoms such as a benzene ring, a naphthalene ring, an anthracene ring, a fluorene ring, and a phenanthrene ring. Examples thereof include an aromatic heterocyclic ring including a heterocyclic ring such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a triazole ring. Among these, in view of resolving power, a benzene ring and a naphthalene ring are preferable, and in view of sensitivity, a benzene ring is most preferable.

m1 is preferably an integer of 1 to 5 and most preferably 1. When m1 is 1 and Ar is a benzene ring, a substitution position of —OH may be a para position, a meta position, or an ortho position with respect to the bonding position to $B_1$ of a benzene ring (a polymer main chain, in a case where $B_1$ is a single bond). However, in view of crosslinking reaction, a para position and a meta position are preferable, and a para position is more preferable.

An aromatic ring of Ar may have a substituent in addition to a group expressed by —OH above, and examples of the substituent include an alkyl group, a cycloalkyl group, a halogen atom, a hydroxyl group, an alkoxy group, a carboxyl group, an alkoxycarbonyl group, an alkylcarbonyl group, an alkylcarbonyloxy group, an alkylsulfonyloxy group, and an arylcarbonyl group.

The repeating unit having the phenolic hydroxyl group is more preferably a repeating unit expressed by Formula (2) below, for the reason of crosslinking reaction, developability, and dry etching resistance.

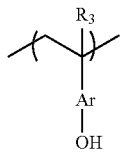

(2)

In Formula (2), $R_3$ represents a hydrogen atom or a methyl group.

Ar represents an aromatic ring.

$R_3$ represents a hydrogen atom or a methyl group, and is preferably a hydrogen atom for the reason of developability.

Ar in Formula (2) has the same meaning as Ar in Equation (1), and a preferable range thereof is the same. The repeating unit expressed by Formula (2) is preferably a repeating unit (that is, a repeating unit in Formula (2), in which $R_3$ is a hydrogen atom, Ar is a benzene ring) derived from hydroxy styrene, in view of sensitivity.

the resin (A) may be only formed with the repeating unit having the phenolic hydroxyl group as above, or may have a repeating unit described below in addition to the repeating unit having the phenolic hydroxyl group as above. In this case, the content of the repeating unit having the phenolic hydroxyl group is preferably 10 to 98 mol %, more preferably 30 to 97 mol %, and even more preferably 40 to 95 mol % with respect to the total repeating unit in the resin (A). Accordingly, particularly, in a case where the actinic ray-sensitive or radiation-sensitive film is a thin film (for example, in a case where a film thickness is 10 to 200 nm), dissolving speed with respect to the alkaline developer in an exposure portion in the actinic ray-sensitive or radiation-sensitive film according to the present invention which is formed by using the resin (A) can be more securely decreased (that is, a dissolving speed of the actinic ray-sensitive or radiation-sensitive film using the resin (A) can be more securely controlled to the optimum). As a result, it is possible to more securely enhance the sensitivity.

Examples of the repeating unit having the phenolic hydroxyl group are provided below, but the present invention is not limited thereto.

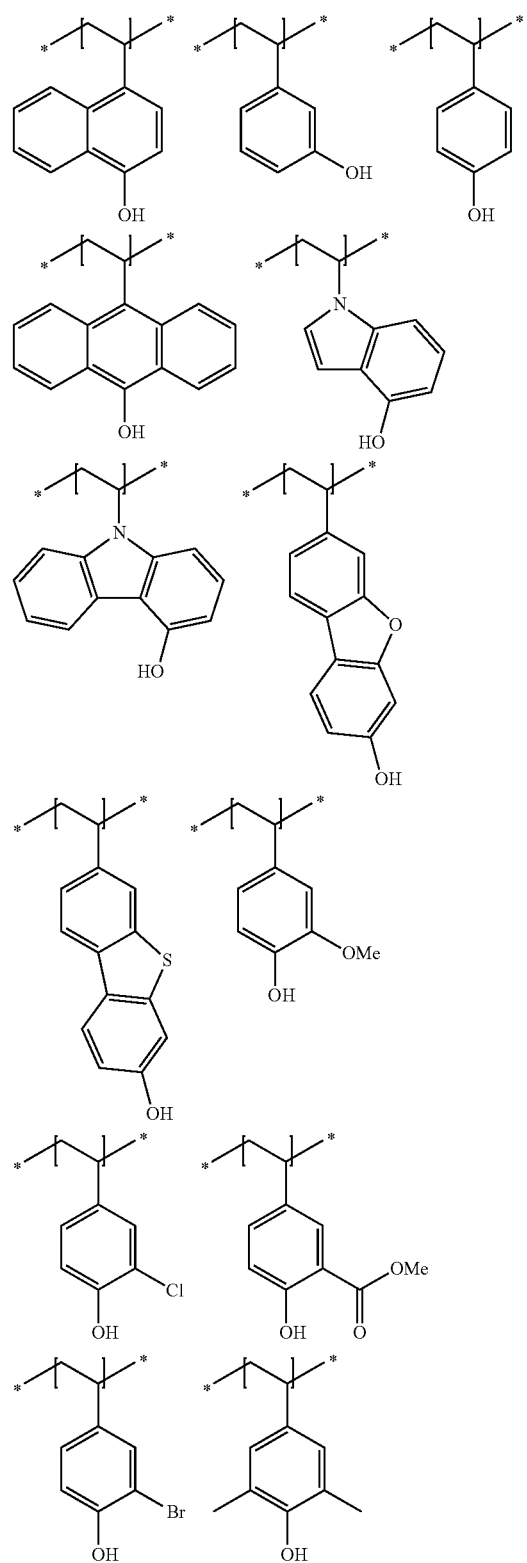

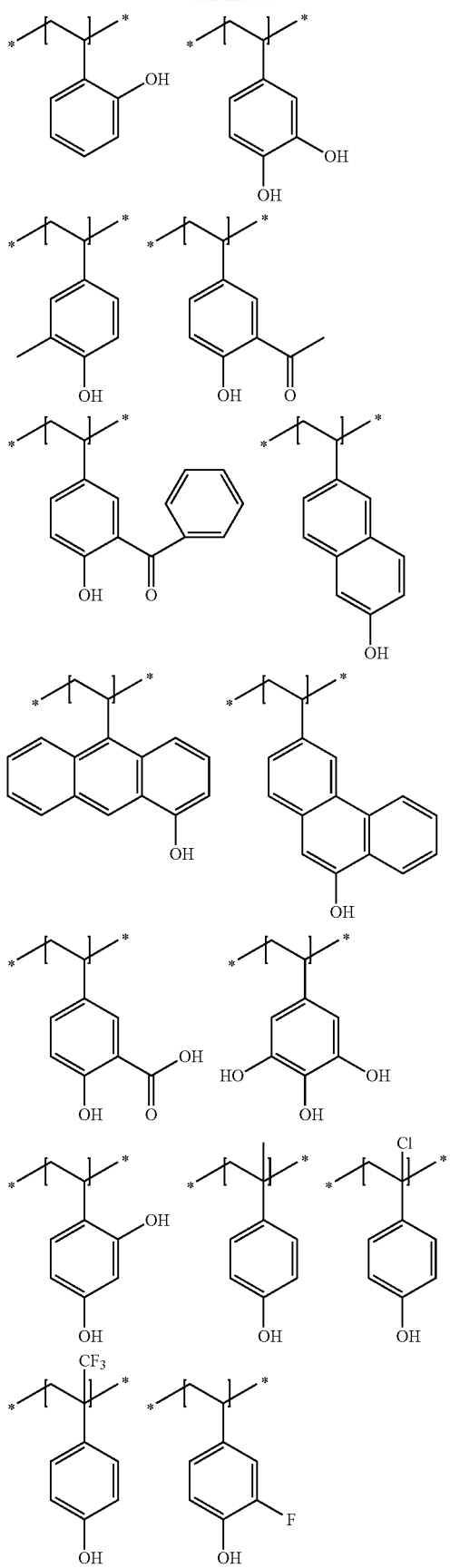
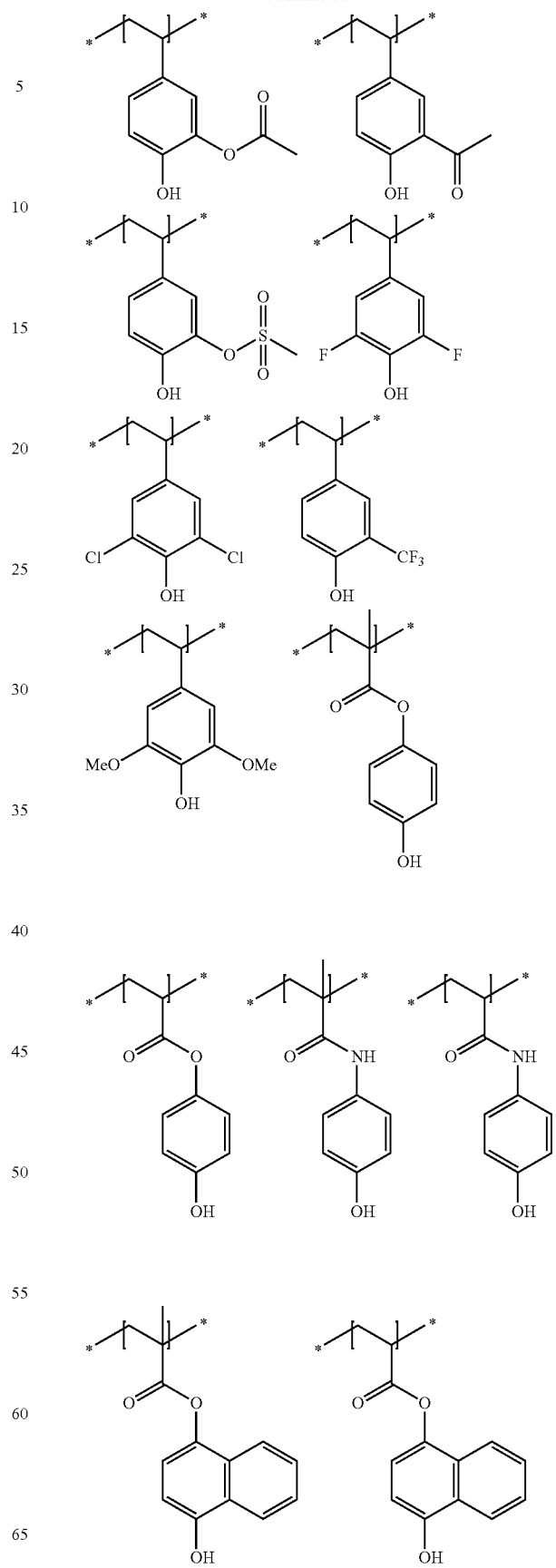

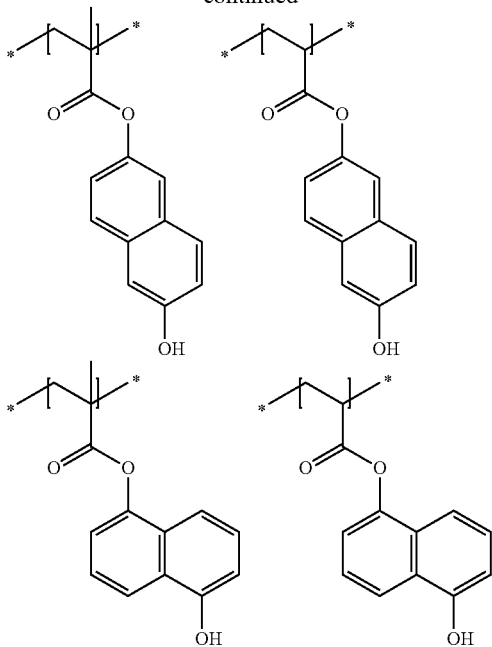

the resin (A) is a group having a non-acid decomposable polycyclic alicyclic hydrocarbon structure, and it is preferable to have a structure in which a hydrogen atom of a phenolic hydroxyl group is substituted, since a high glass transition temperature (Tg) is obtained, and dry etching resistance becomes satisfactory.

In a case where the resin (A) has the specific structure described above, the glass transition temperature (Tg) of the compound (P) becomes high, and thus an extremely strong actinic ray-sensitive or radiation-sensitive film can be formed, such that diffusion properties of an acid or dry etching resistance can he controlled. Accordingly, since diffusion properties of an acid in the exposed portion with actinic rays such as electron beams or extreme ultraviolet rays or radiation are extremely suppressed, resolving power, pattern forms, and LER in a fine pattern become further excellent. It is considered that the resin (A) having a non-acid decomposable polycyclic alicyclic hydrocarbon structure contributes further improvement of dry etching resistance.

Specifics are unclear, but it is assumed that. the polycyclic alicyclic hydrocarbon structure has high donating properties of a hydrogen radical and becomes a hydrogen source at the time of decomposition of a photoacid generator, decomposition efficiency of a photoacid generator is further improved, and acid generation efficiency becomes higher. Therefore, it is considered that this contributes to more excellent sensitivity.

In the specific structure described above that may be included in the resin (A) according to the present invention, an aromatic ring such as a benzene ring and a group having a non-acid decomposable polycyclic alicyclic hydrocarbon structure are linked to each other via an oxygen atom derived from the phenolic hydroxyl group. As described above, the structure contributes to high dry etching resistance and can increase the glass transition temperature (Tg) of the resin (A). Therefore, it is assumed that high resolving power is provided by these effects in combination.

According to the present. invention, non-acid decomposable properties mean properties of not causing decomposition reaction by an acid generated by an acid generator.

Specifically, the group having the non-acid decomposable polycyclic alicyclic hydrocarbon structure is preferably a group stable to an acid and an alkali. The group stable to an acid and an alkali means a group which does not exhibit acid decomposable properties and alkali decomposable properties. Here, the acid decomposable properties mean properties of causing decomposition reaction by an action of an acid generated by an acid generator, and an example of the group exhibiting the acid decomposable properties includes an acid decomposable group that is described in the "repeating unit having the acid decomposable group" described below.

The alkali decomposable properties mean properties of causing decomposition reaction by an action of an alkaline developer, and an example of the group exhibiting alkali decomposable properties includes a group that is included in a resin which is suitably used in the actinic ray-sensitive or radiation-sensitive resin composition used for forming a positive tone pattern and which is decomposed by an action of an alkaline developer well-known in the related art such that a dissolution rate in an alkaline developer increases (for example, a group having a lactone structure).

The group having the polycyclic alicyclic hydrocarbon structure is not particularly limited as long as the group is a univalent group having a polycyclic alicyclic hydrocarbon structure, but a total number of carbon atoms is preferably 5 to 40 and more preferably 7 to 30. The polycyclic alicyclic hydrocarbon structure may have an unsaturated bond in the ring.

The polycyclic alicyclic hydrocarbon structure in the group having the polycyclic alicyclic hydrocarbon structure means a structure of having plural monocyclic alicyclic hydrocarbon groups or a polycyclic alicyclic hydrocarbon structure, and may be a bridged type. As the monocyclic alicyclic hydrocarbon group, a cycloalkyl group having 3 to 8 carbon atoms is preferable, and examples thereof include a cyclopropyl group, a cyclopentyl group, a cyclohexyl group, a cyclohutyl group, and a cyclooctyl group, and, the structure having plural monocyclic alicyclic hydrocarbon group has plural items of these groups. The structure having plural monocyclic alicyclic hydrocarbon groups preferably has two to four monocyclic alicyclic hydrocarbon groups and particularly preferably has two monocyclic alicyclic hydrocarbon groups.

Examples of the polycyclic alicyclic hydrocarbon structure include bicyclo, tricyclo, or tetracyclo structures having 5 or more carbon atoms, a polycyclic structure having 6 to 30 carbon atoms is preferable, and examples thereof include an adamantane structure, a decalin structure, a norbornene structure, a norbornene structure, a cedrol structure, an isobornane structure, a humane structure, a dicyclopentane structure, an u-pinene structure, a tricyclodecane structure, a tetracyclododecane structure, or an androstane structure. In addition, a portion of carbon atoms in the monocyclic or polycyclic cycloalkyl group may be substituted with a hetero atom such as an oxygen atom.

Preferable examples of the polycyclic alicyclic hydrocarbon structure described above include an adamantane structure, a decalin structure, a norbornene structure, a norbornene structure, a cedrol structure, a structure having plural cyclohexyl groups, a structure of having plural cycloheptyl groups, a structure of having plural cyclooctyl groups, a structure of having plural cyclodecanyl groups, a structure of having plural cyclododecanyl groups, and a tricyclodecane structure. An adamantane structure is most preferable, in view of dry etching resistance (that is, a group of having the non-acid decomposable polycyclic alicyclic hydrocarbon structure is most preferably a group of having a non-acid decomposable adamantine structure).

Chemical formulae of these polycyclic alicyclic hydrocarbon structures (with respect to structures having plural monocyclic alicyclic hydrocarbon groups, monocycle alicyclic hydrocarbon structures corresponding to the monocyclic alicyclic hydrocarbon groups (specifically, structures of Formulae (47) to (50) below)) are provided below.

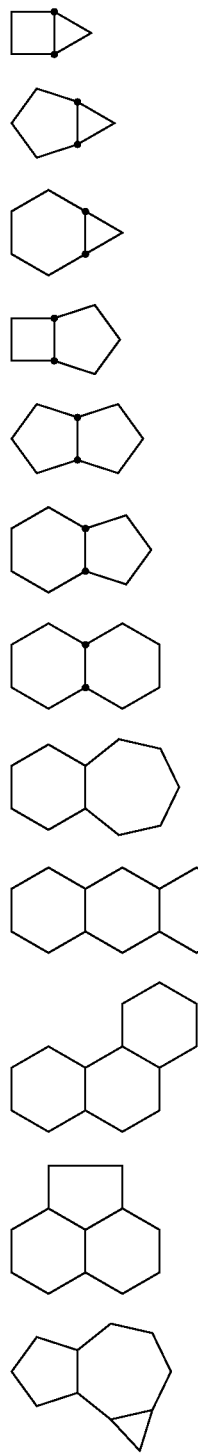

(1) (2) (3) (4) (5) (6) (7) (8) (9) (10) (11) (12)

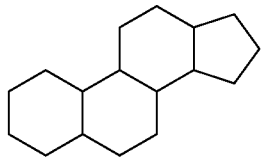

(13)

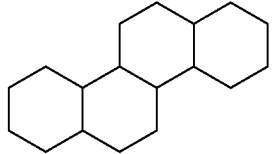

(14)

(15)

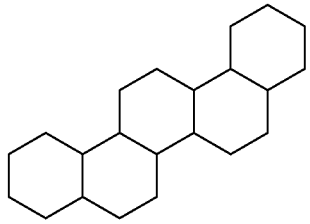

(16)

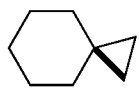

(17)

(18)

(19)

(20)

(21)

(22)

(23)

(24)

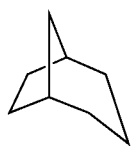

-continued
(25)
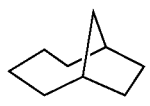
(26)
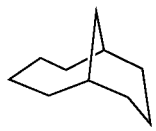
(27)
(28)
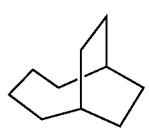
(29)
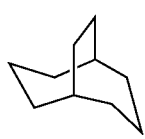
(30)
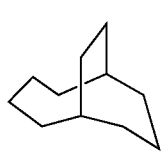
(31)
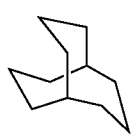
(32)
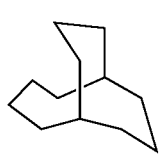
(33)
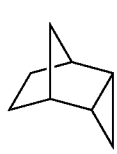
(34)
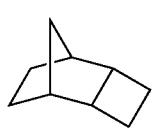
(35)
-continued
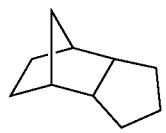
(36)
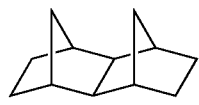
(37)
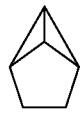
(38)
(39)
(40)
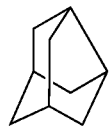
(41)
(42)
(43)
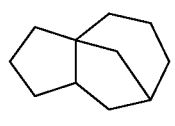
(44)
(45)
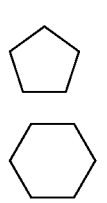
(46)
(47)
(48)

(49)

(50)

(51)

The polycyclic alicyclic hydrocarbon structure may have a substituent, and examples of the substituent include an alkyl group (preferably having 1 to 6 carbon atoms), a cycloalkyl group (preferably having 3 to 10 carbon atoms), an aryl group (preferably having 6 to 15 carbon atoms), a halogen atom, a hydroxyl group, an alkoxy group (preferably having 1 to 6 carbon atoms), a carboxyl group, a carbonyl group, a thiocarbonyl group, and an alkoxycarbonyl group (preferably having 2 to 7 carbon atoms), and groups obtained by combining these groups (a total number of carbon atoms is preferably 1 to 30, and a total number of carbon atoms is more preferably 1 to 15).

As the polycyclic alicyclic hydrocarbon structure, a structure expressed by any one of Formulae (7), (23), (40), (41), and (51) above and a structure of having 2 univalent groups using any one of hydrogen atom as a bonding hand in the structure of Formula (48) above are preferable, a structure expressed by any one of Formulae (23), (40), and (51) and a structure of having 2 univalent groups using any one of hydrogen atom as a bonding hand in the structure of Formula (48) above are more preferable, and a structure expressed by Formula (40) is most preferable.

As the group having the polycyclic alicyclic hydrocarbon structure, a univalent group using any one of hydrogen atom in the polycyclic alicyclic hydrocarbon structure above as a bonding hand is preferable.

A structure in which a hydrogen atom in a phenolic hydroxyl group is substituted with a group having the non-acid decomposable polycyclic alicyclic hydrocarbon structure is preferably contained in the resin. (A) as a repeating unit having the structure and more preferably contained in the resin (A) as the repeating unit expressed by Formula (3) below.

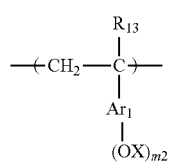
(3)

In Formula (3), $R_{13}$ represents a hydrogen atom or a methyl group.

X represents a group having a non-acid decomposable polycyclic alicyclic hydrocarbon structure.

$Ar_1$ represents an aromatic ring.

m2 represents an integer of 1 or greater.

$R_{13}$ in Formula (3) represents a hydrogen atom or a methyl group, and a hydrogen atom is particularly preferable.

Examples of the aromatic ring of $Ar_1$ of Formula (3) include an aromatic hydrocarbon ring that may have a substituent having 6 to 18 carbon atoms such as a benzene ring, a naphthalene ring, an anthracene ring, a fluorene ring, and a phenanthrene ring or examples thereof include an aromatic heterocyclic ring including a heterocyclic ring such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring. Among these, in view of resolving power, a benzene ring and a naphthalene ring are preferable and a benzene ring is most preferable.

The aromatic ring of $Ar_1$ may have a substituent in addition to a group expressed by —OX described above, and examples of the substituent include an alkyl group (preferably having 1 to 6 carbon atoms), a cycloalkyl group (preferably having 3 to 10 carbon atoms), an aryl group (preferably having 6 to 15 carbon atoms), a halogen atom, a hydroxyl group, an alkoxy group (preferably having 1 to 6 carbon atoms), a carboxyl group, and an alkoxycarbonyl group (preferably having 2 to 7 carbon atoms), and an alkyl group, an alkoxy group, and an alkoxycarbonyl group are preferable, and an alkoxy group is more preferable.

X represents a group having a non-acid decomposable polycyclic alicyclic hydrocarbon structure. Specific examples and preferable ranges of the group having the non-acid decomposable polycyclic alicyclic hydrocarbon structure expressed by X are the same as those described above. X is more preferably a group represented by —Y—$X_2$ in Formula (4) below.

m2 is preferably an integer of 1 to 5, and most preferably 1. When m2 is 1 and $Ar_1$ is a benzene ring, the substitution position of —OX may be a para position, may be a meta position, or may be an ortho position with respect to the bonding position to the polymer main chain of the benzene ring, a para position or a meta position is preferable, and a para position is more preferable.

According to the present invention, the repeating unit expressed by Formula (3) above is preferably a repeating unit expressed by Formula (4) below.

In a case where the resin (A) having a repeating unit expressed by Formula (4) is used, Tg of the resin (A) increases and forms an extremely strong actinic ray-sensitive or radiation-sensitive film. Therefore, diffusion properties of an acid and dry etching resistance can be more definitely improved.

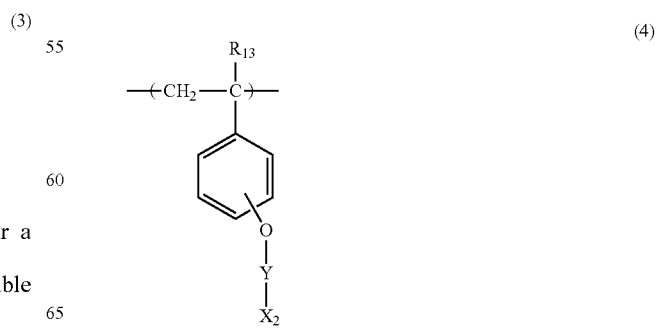
(4)

In Formula (4), $R_{13}$ represents a hydrogen atom or a methyl group.

Y represents a single bond or a divalent linking group.

$X_2$ represents a non-acid decomposable polycyclic alicyclic hydrocarbon group.

Preferable examples of the repeating unit expressed by Formula (4) above are described below.

$R_{13}$ in Formula (4) represents a hydrogen atom or a methyl group, but a hydrogen atom is particularly preferable.

In Formula (4), Y is preferably a divalent linking group. The preferable group as a divalent linking group of Y is a carbonyl group, a thiocarbonyl group, and an alkylene group (preferably having 1 to 10 carbon atoms, more preferably having 1 to 5 carbon atoms), a sulfonyl group, —$COCH_2$—, or —NH—, or a divalent linking group obtained by combining these (a total number of carbon atoms is preferably 1 to 20, and a total number of carbon atoms is more preferably 1 to 10), a carbonyl group, —$COCH_2$—, a sulfonyl group, —CONH—, and —CSNH— are more preferable, a carbonyl group and —$COCH_2$— are even more preferable, and a carbonyl group is particularly preferable.

$X_2$ represents a polycyclic alicyclic hydrocarbon group and has non-acid decomposable properties. A total number of carbon atoms in the polycyclic alicyclic hydrocarbon group is preferably 5 to 40 and more preferably 7 to 30. The polycyclic alicyclic hydrocarbon group may have an unsaturated bond in a ring.

A polycyclic alicyclic hydrocarbon group like this is a group having plural monocyclic alicyclic hydrocarbon groups or a polycyclic alicyclic hydrocarbon group, and may be a bridged type. As the monocyclic alicyclic hydrocarbon group, a cycloalkyl group having 3 to 8 carbon atoms is preferable. Examples thereof include a cyclopropyl group, a cyclopentyl group, a cyclohexyl group, a cyclobutyl group, and a cyclooctyl group, and plural items of these groups are included. The group having plural monocyclic alicyclic hydrocarbon groups preferably includes two to four monocyclic alicyclic hydrocarbon groups, and particularly preferably includes two monocyclic alicyclic hydrocarbon groups.

An example of the polycyclic alicyclic hydrocarbon group includes a group having a bicyclo, tricyclo, or tetracyclo structure having five or more carbon atoms, and a group having a polycyclic structure having 6 to 30 carbon atoms is preferable, and examples thereof include ani adamantyl group, a norbomyl group, a norbornyl group, an isoboronyl group, a camphanyl group, a dicyclopentyl group, a-pinenyl group, a tricyclodecanyl group, a tetracyclododecyl group, and an androstanyl group. In addition, a portion of carbon atoms in a monocyclic or polycyclic cycloalkyl group is substituted with a hetero atom such as an oxygen atom.

The polycyclic alicyclic hydrocarbon group of $X_2$ above is preferably an adamantyl group, a decalin group, a norbornyl group, a norbornyl group, a cedrol group, a group having plural cyclohexyl groups, a group having plural cycloheptyl groups, a group having plural cyclooctyl groups, a group having plural cyclodecanyl groups, a group having plural cyclododecanyl groups, and a tricyclodecanyl group, and an adamantyl group is most preferable, in view of dry etching resistance. Example of the chemical formula of the polycyclic alicyclic hydrocarbon structure in the polycyclic alicyclic hydrocarbon group of $X_2$ include the same examples of the chemical formula of the polycyclic alicyclic hydrocarbon structure in the group having the polycyclic alicyclic hydrocarbon structure described above, and preferable ranges are also the same. The polycyclic alicyclic hydrocarbon group of includes a univalent group using any one of hydrogen atoms in the polycyclic alicyclic hydrocarbon structure described above as a bonding hand.

The polycyclic alicyclic hydrocarbon group may have a substituent, and examples of the substituent include the same examples described as the substituent that may be included in the polycyclic alicyclic hydrocarbon structure.

The substitution position of —O—Y—$X_2$ in Formula (4) may be a para position, may be a. meta position, or may be an ortho position with respect to the bonding position to the polymer main chain of the benzene ring, but a para position is preferable.

According to the present invention, the repeating unit expressed by Formula (3) above is most preferably a repeating unit expressed by Formula (4').

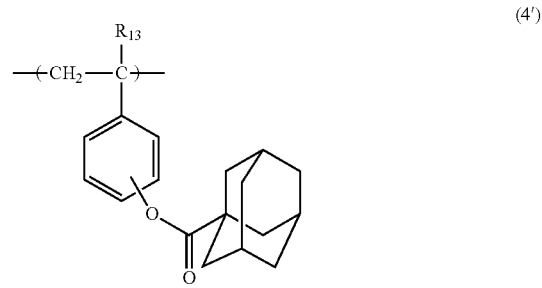

In Formula (4'), $R_{13}$ represents a hydrogen atom or a methyl group.

$R_{13}$ in Formula (4') represents a hydrogen atom or a methyl group, and a hydrogen atom is particularly preferable.

The substitution position of the adamantyl ester group in Formula (4') may be a para position, may be a meta position, or may be an ortho position with respect to the bonding position to the polymer main chain of the benzene ring, but a para position is preferable.

The specific examples of the repeating unit expressed by Formula (3) are as below.

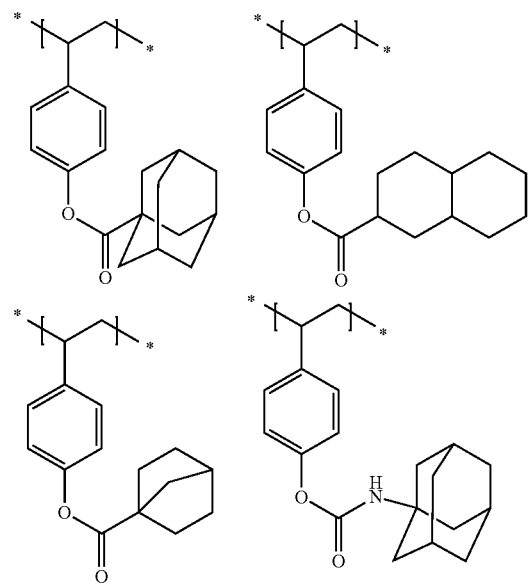

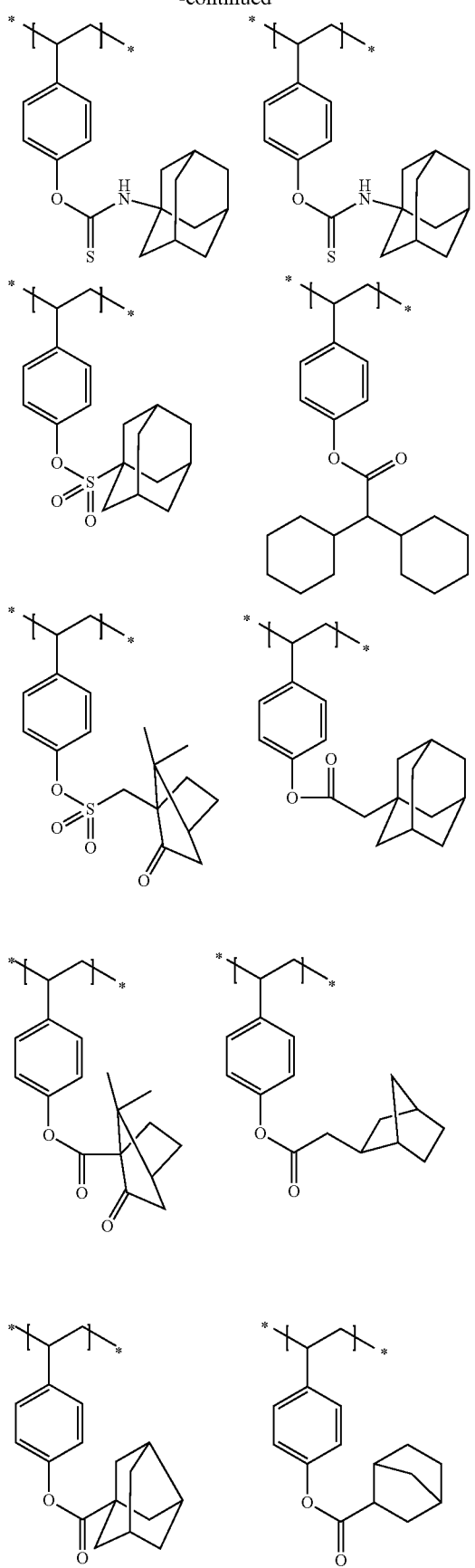
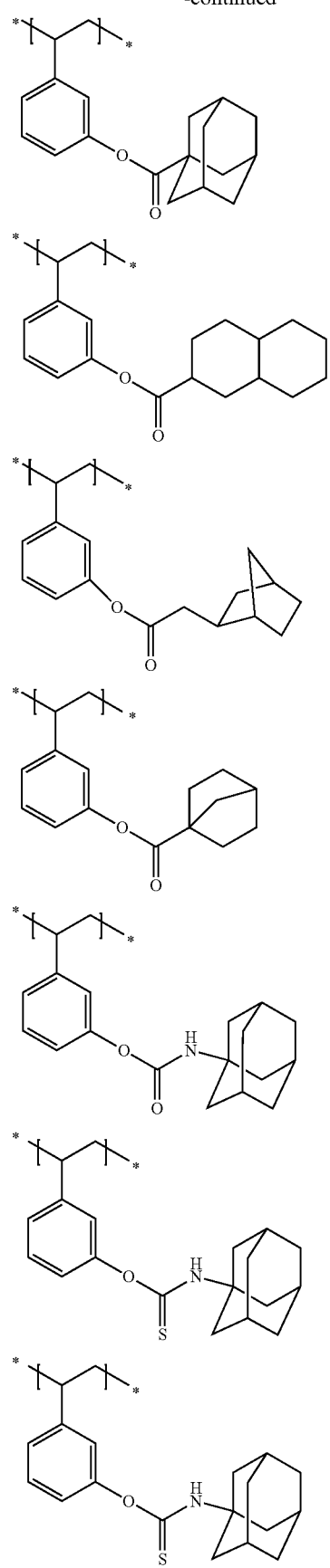

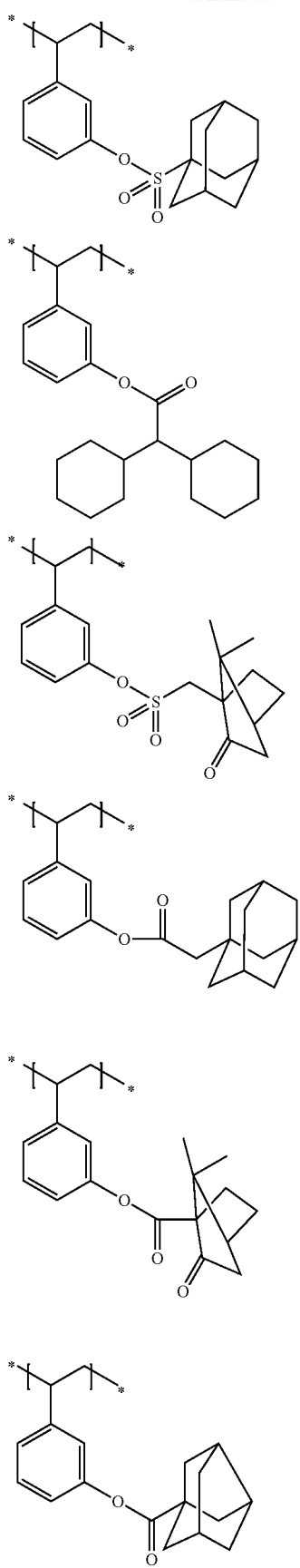
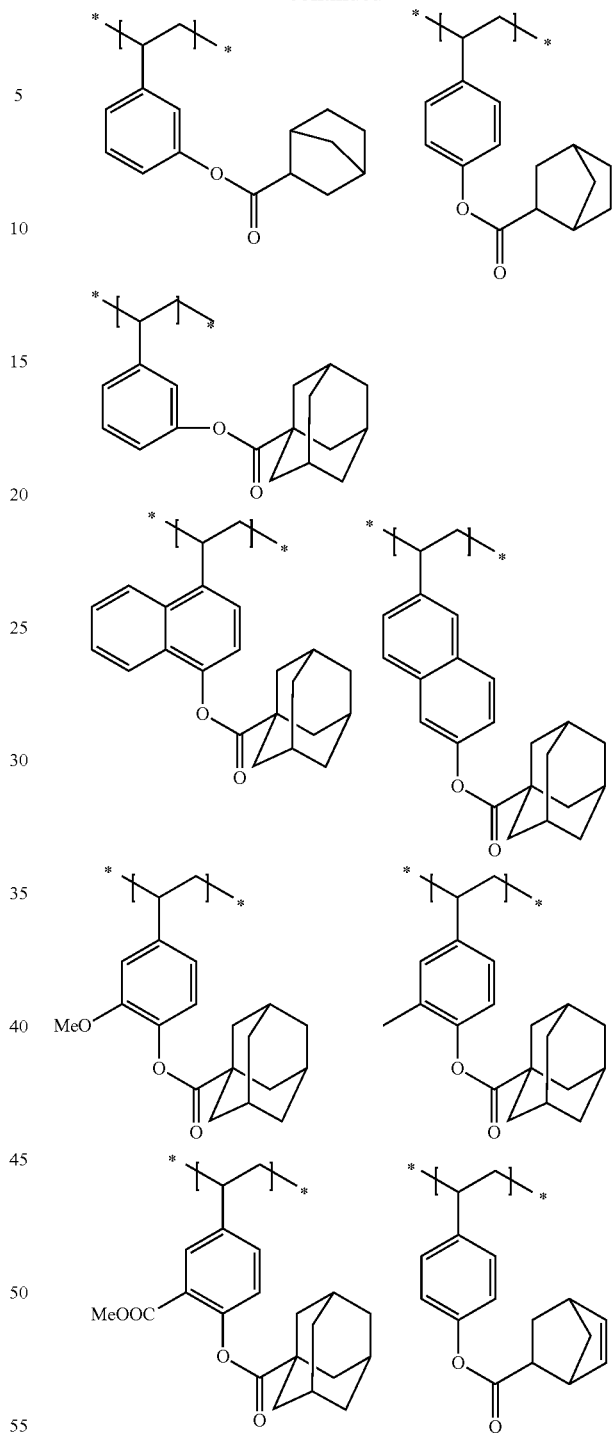

In a case where the resin (A) contains a repeating unit having a structure in which a hydrogen atom in a phenolic hydroxyl group is substituted with a group having the non-acid decomposable polycyclic alicyclic hydrocarbon structure above, the content of the repeating unit is preferably 1% to 40% by mol and more preferably 2% to 30% by mol with respect to the total repeating unit of the resin (A).

It is preferable that the resin (A) used in the present invention further has a repeating unit (hereinafter, referred to as "another repeating unit") as described below, as a repeating unit in addition to the repeating unit.

Examples of the polymerizable monomer for forming another repeating unit include styrene, alkyl-substituted styrene, alkoxy-substituted styrene, halogen-substituted styrene, O-alkylated styrene, O-acylated styrene, hydrogenated hydroxystyrene, a maleic acid, an acrylic acid derivative (acrylic acid, acrylic acid ester), a methacrylic acid derivative (a methacrylic acid, methacrylic acid ester, and the like), an N-substituted maleimide, acrylonitrile, methacrylonitrile, vinyl naphthalene, vinyl anthracene, and indene that may have a substituent.

the resin (A) may not contain another repeating unit, but in a case where another repeating unit is contained, the content of another repeating unit is generally 1% to 30% by mol, preferably 1% to 20% by mol, and more preferably 2% to 10% by mol with respect to the total repeating unit that forms the resin (A).

the resin (A) can be synthesized by a well-known radical polymerization method, a well-known anion polymerization method, or a well-known living radical polymerization method (an infester method and the like). For example, in the anion polymerization method, a polymer can be obtained by dissolving a vinyl monomer in a proper organic solvent, using a metal compound (butyl lithium and the like), and performing a reaction generally under a cooling condition.

As the resin (A), a polyphenol compound manufactured by condensation reaction of a compound containing aromatic ketone or aromatic aldehyde, and one to three phenolic hydroxyl groups (for example, JP2008-145539A), a calixarene derivative (for example, JP2004-18421A), a noria derivative (for example, JP2009-222920A), and a polyphenol derivative (for example, JP2008-94782A) can be applied, and the compound (P) may be synthesized by performing modification with a polymer reaction.

The content (a total when plural types are included) of the repeating unit having an acid decomposable group in the acid decomposable resin is preferably in the range of 3% to 90% by mol, more preferably in the range of 5% to 80% by mol, and particularly preferably in the range of 7% to 70% by mol with respect to a total repeating unit of the acid decomposable resin.

As the group having the non-acid decomposable polycyclic alicyclic hydrocarbon structure described above, specific examples of the resin (A) having the structure in which the hydrogen atom of the phenolic hydroxyl group is substituted are provided below, but the present invention is not limited thereto.

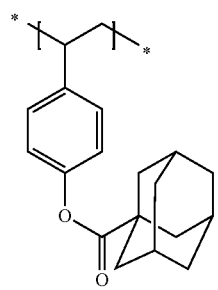
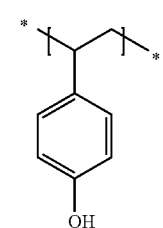

-continued

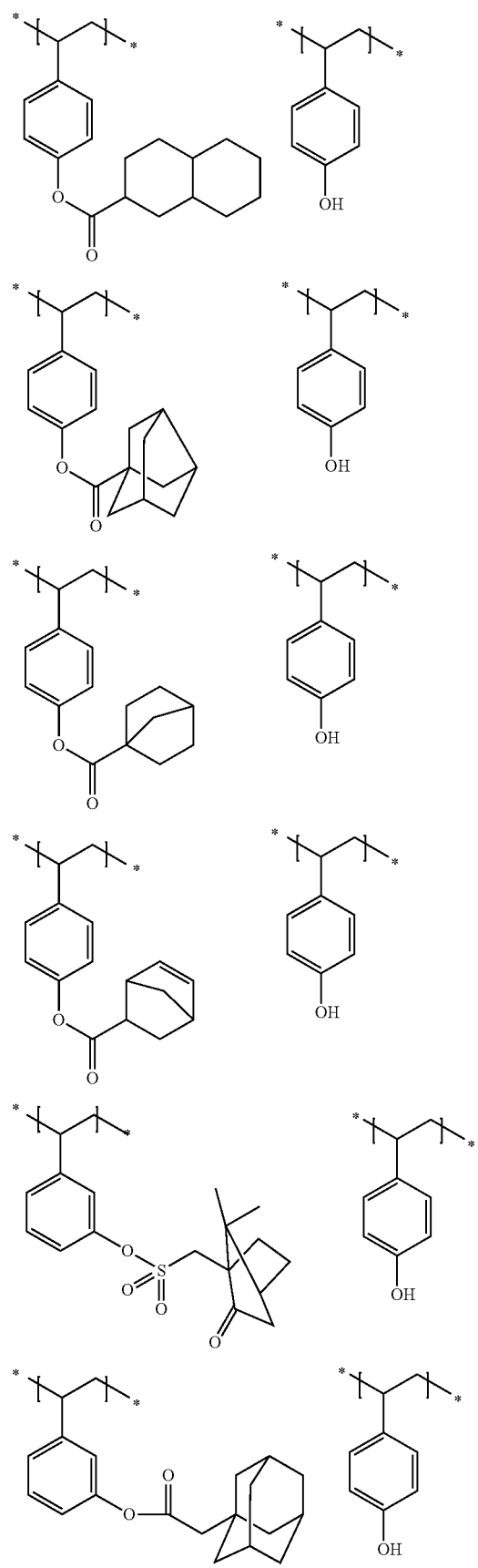

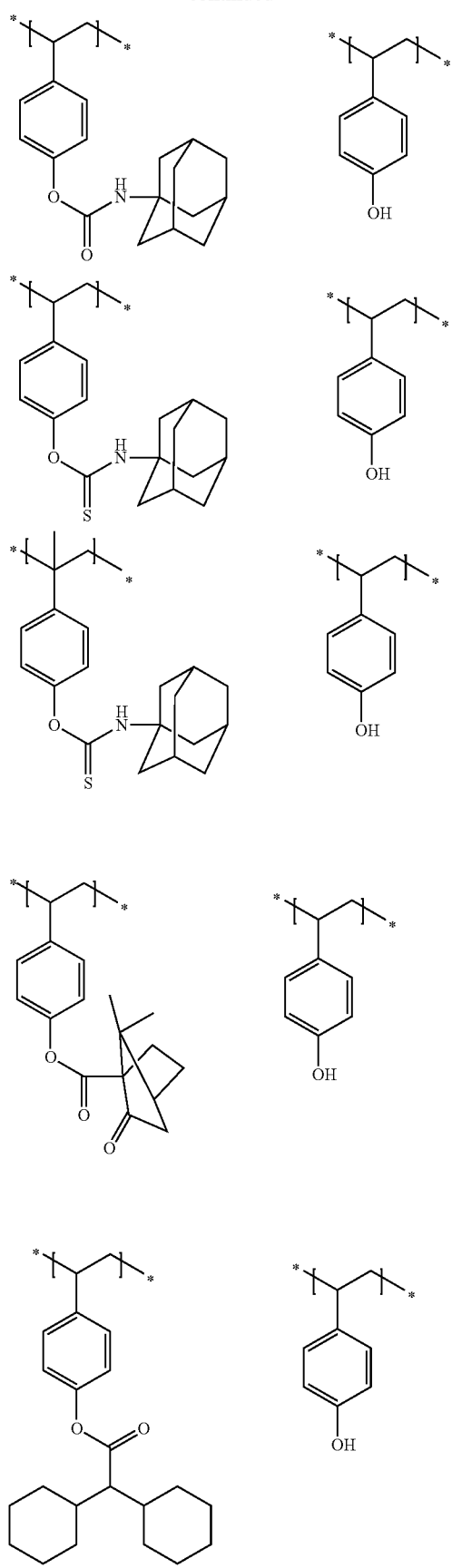
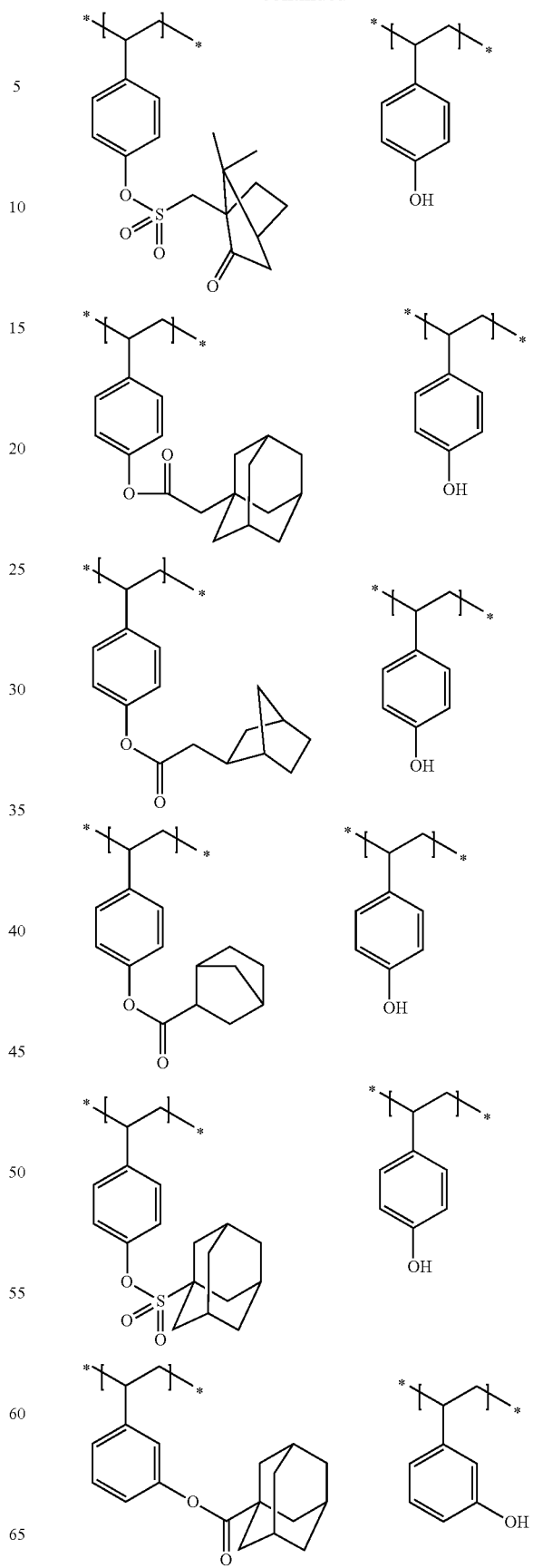

75
-continued
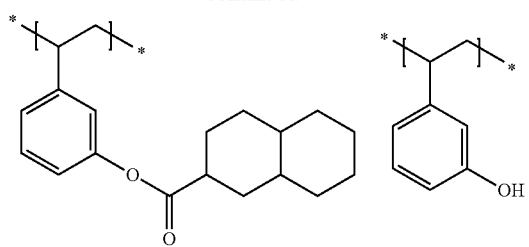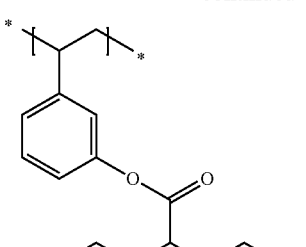
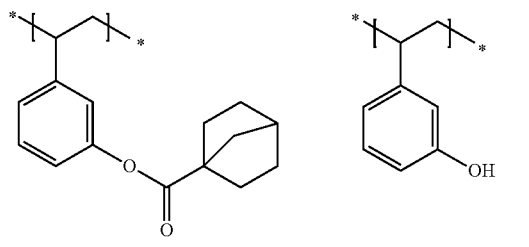
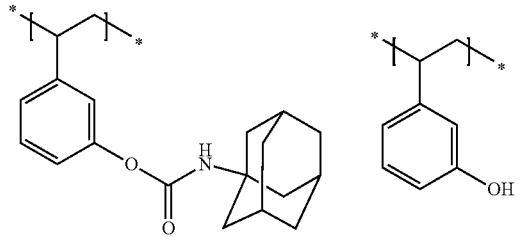
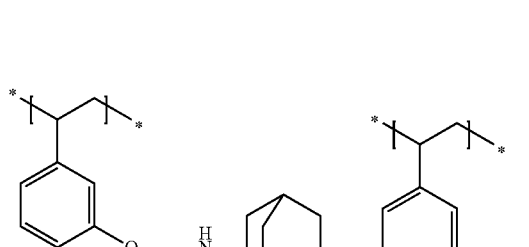
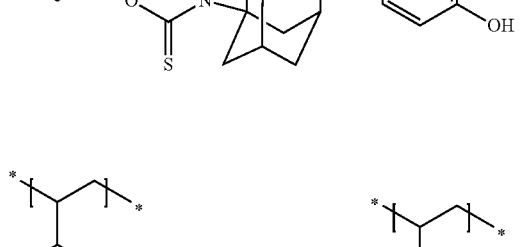
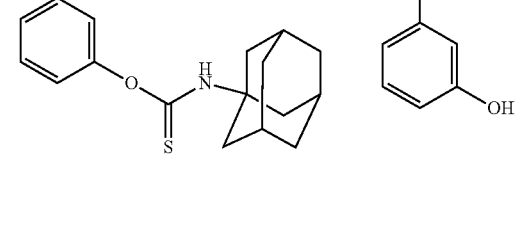
76
-continued
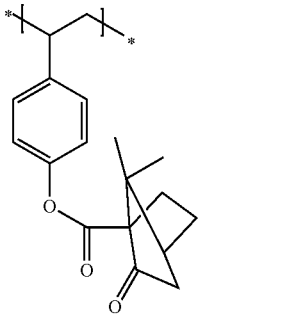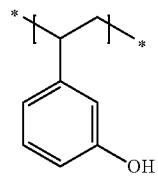
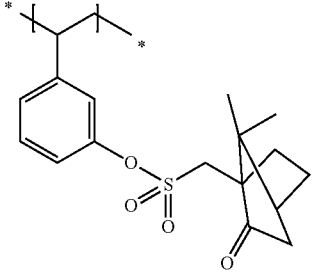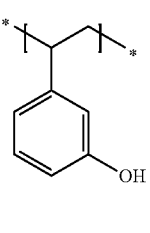
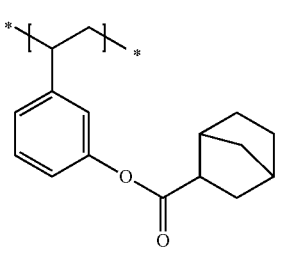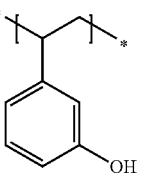
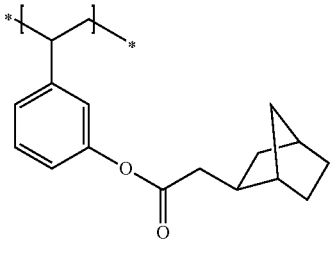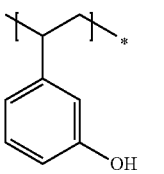
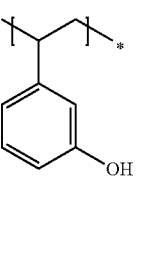

77
-continued
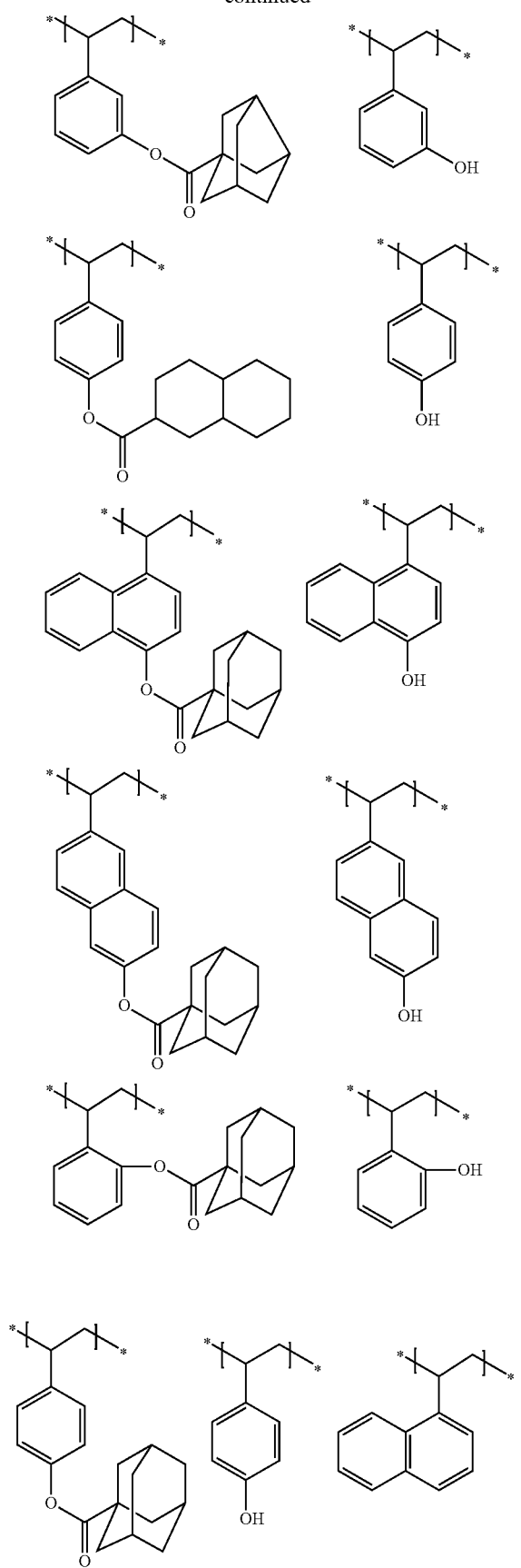
78
-continued
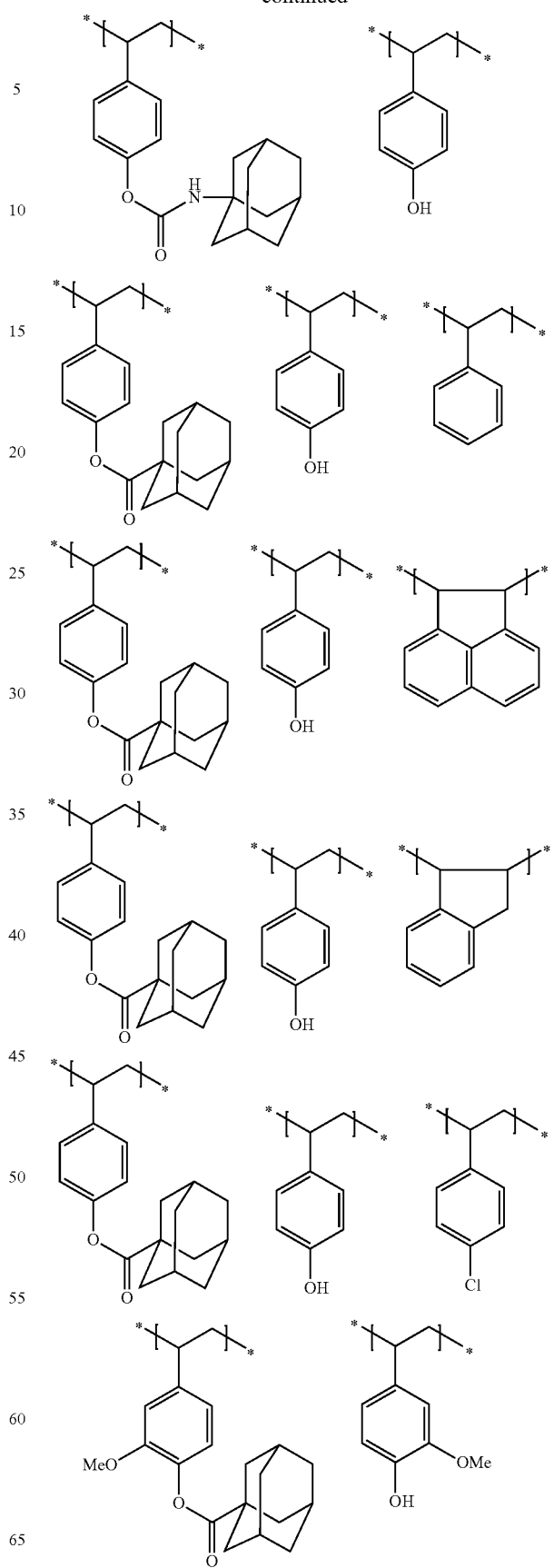

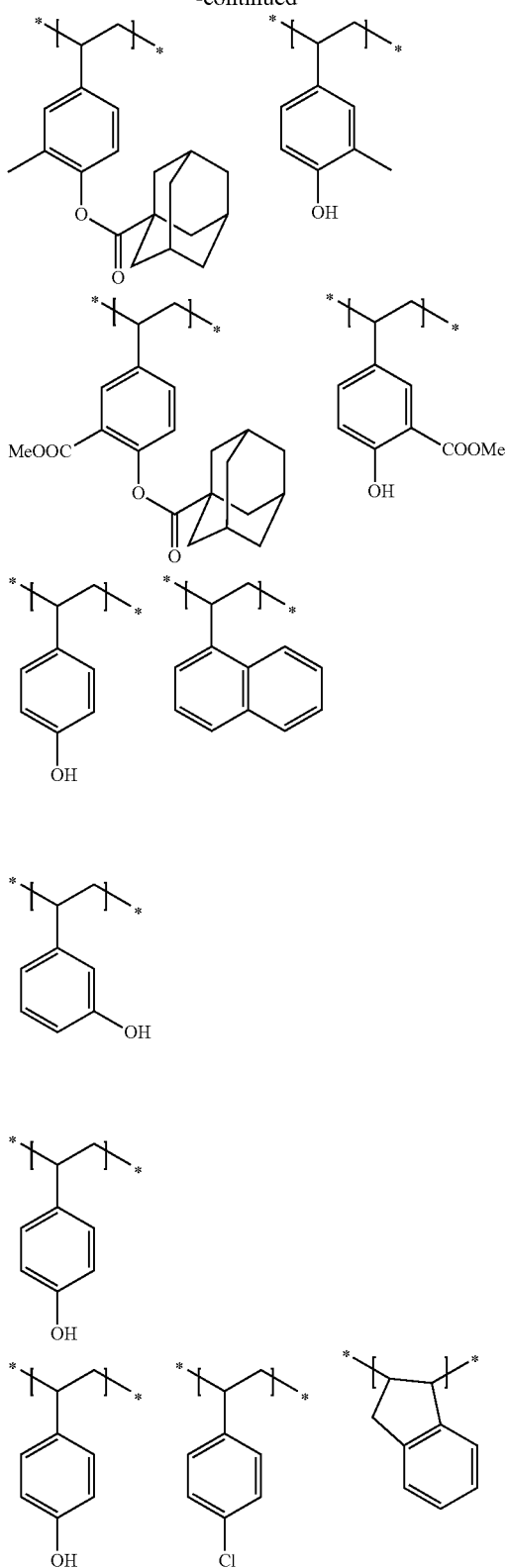

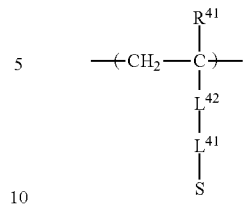

(4)

$R^{41}$ represents a hydrogen atom or a methyl group. $L^{41}$ represents a single bond or a divalent linking group. $L^{42}$ represents a divalent linking group. S represents structure portion that is decomposed due to the irradiation of actinic rays or radiation and generates an acid at a side chain.

The resin (A) may contain a repeating unit represented by Formula (V) or (VI),

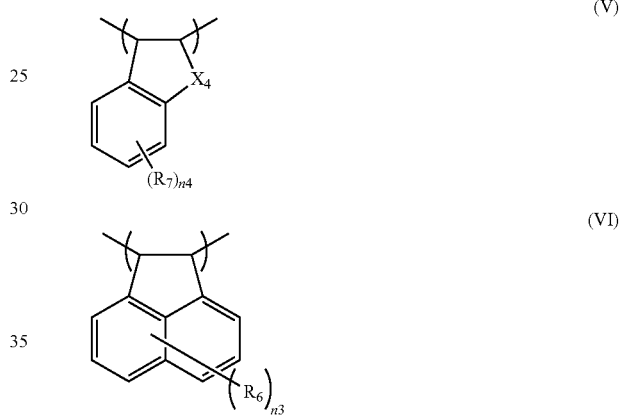

In the formula, $R_6$ and $R_7$ each independently represent a hydrogen atom, a hydroxy group, a linear, branched, or cyclic alkyl group, an alkoxy group, or an acyloxy group, which has 1 to 10 carbon atoms, a cyano group, a nitro group, an amino group, a halogen atom, an ester group (—OCOR or —COOR: R is an alkyl group having 1 to 6 carbon atoms or a fluorinated alkyl group), or a carboxyl group.

$n_3$ represents an integer of 0 to 6.

$X^4$ is a methylene group, an oxygen atom, or a sulfur atom.

Specific examples of the repeating unit represented by Formula (V) or (VI) are provided below, but the present invention is not limited thereto.

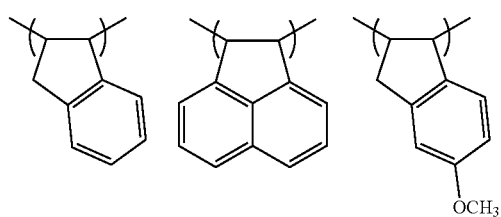

the resin (A) may have a repeating unit having an ionic structure portion that is decomposed due to irradiation of actinic rays or radiation and generates an acid at a side chain of a resin. Examples of the repeating unit include a repeating unit expressed by Formula (4) below.

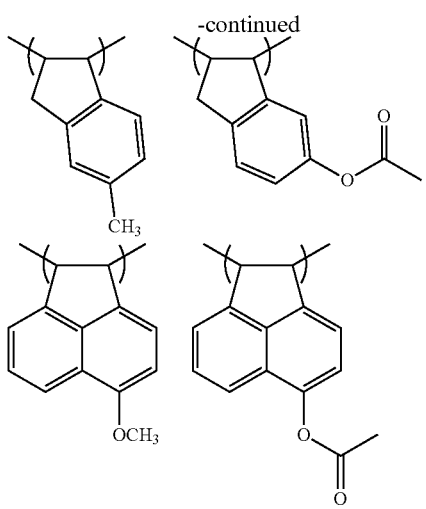
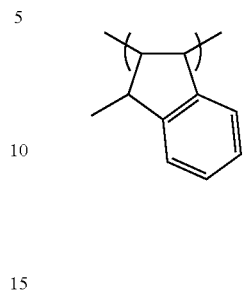
Specific examples of the resin (A) as the acid decomposable resin described above are provided below, but the present invention is not limited thereto.
(R-1)
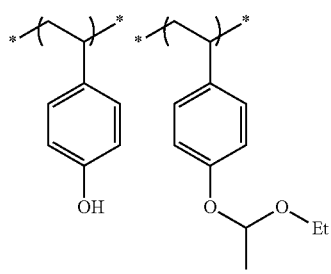
(R-2)
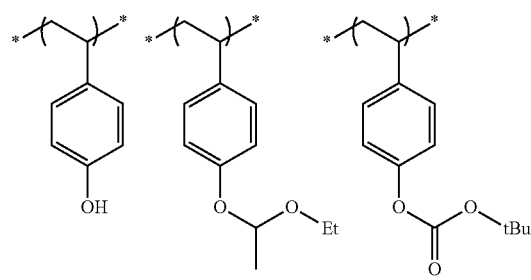
(R-3)
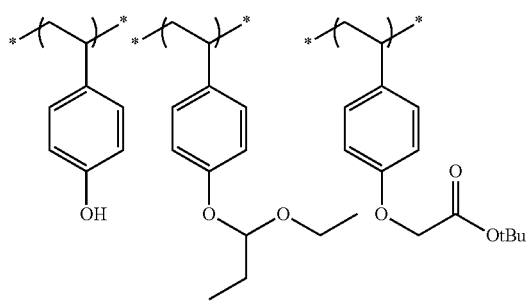
(R-4)
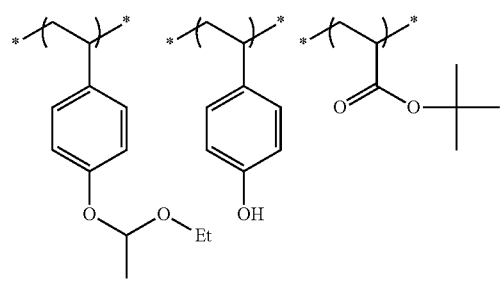
(R-5)
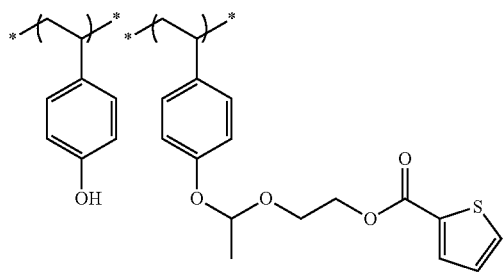
(R-6)
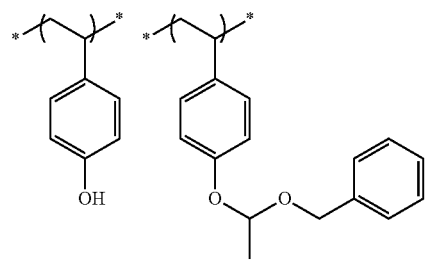

-continued
(R-7)
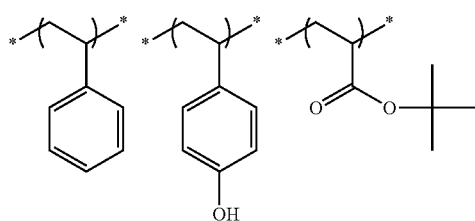
(R-8)
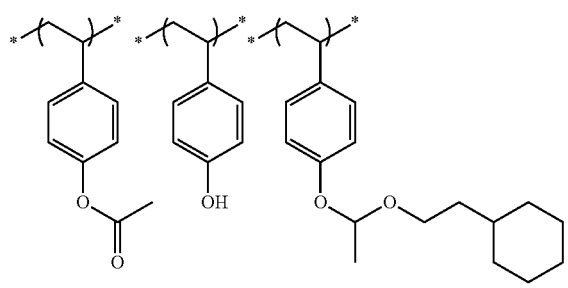
(R-9)
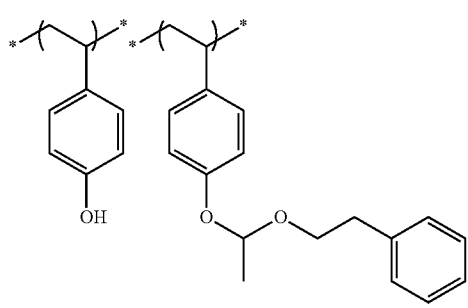
(R-10)
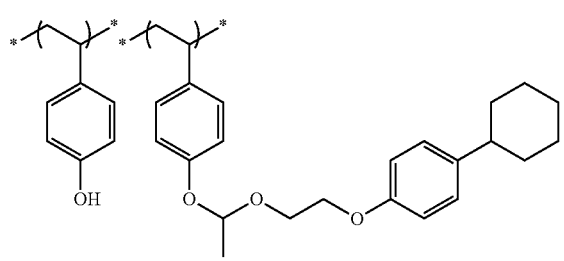
(R-11)
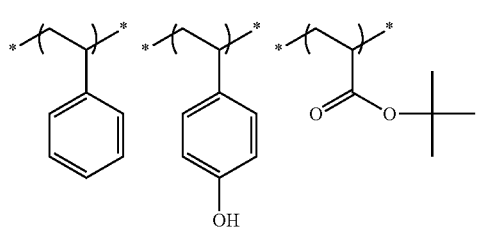
(R-12)
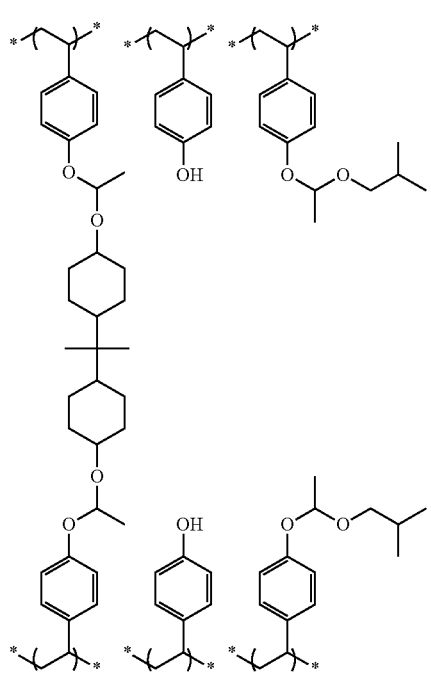
(R-13)
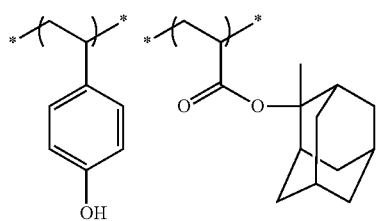
(R-14)
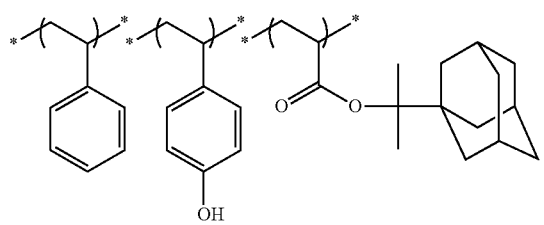

-continued
(R-15)
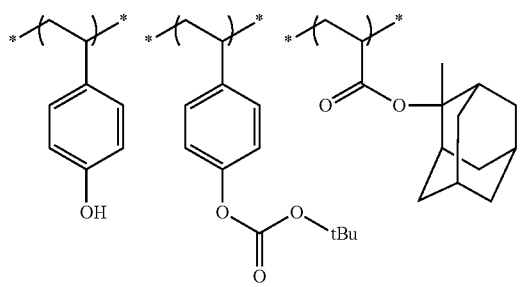
(R-16)
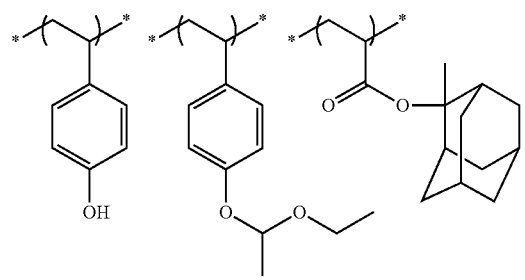
(R-17)
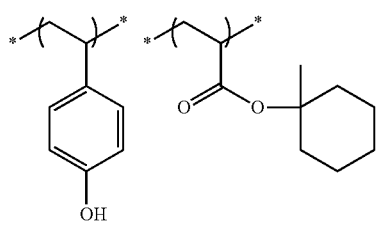
(R-18)
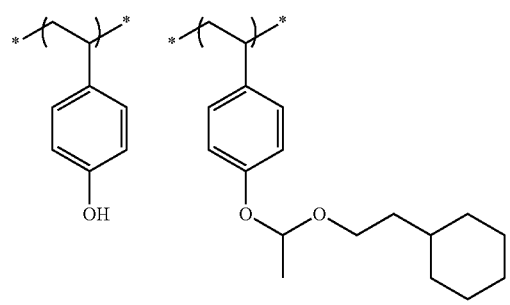
(R-19)
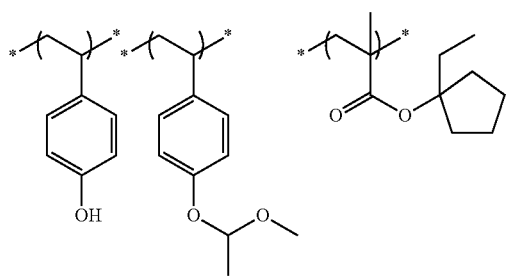
(R-20)
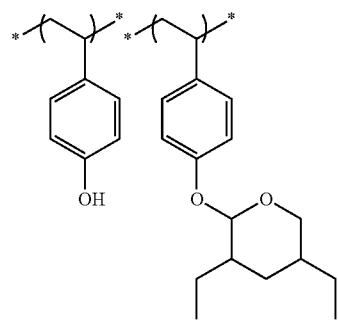
(R-21)
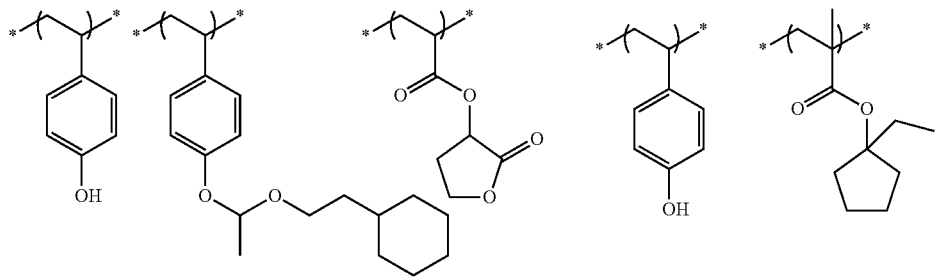
R-23
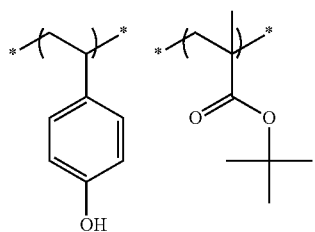
R-24
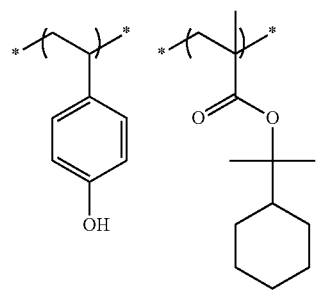

-continued
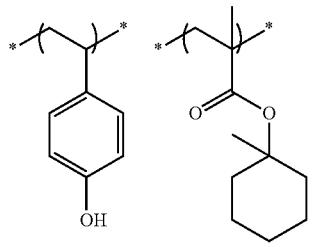
R-25
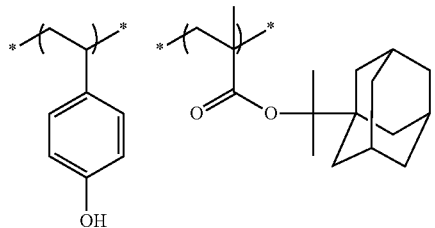
R-26
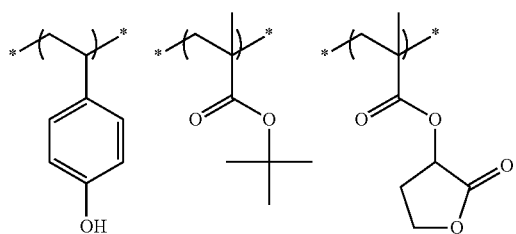
R-27
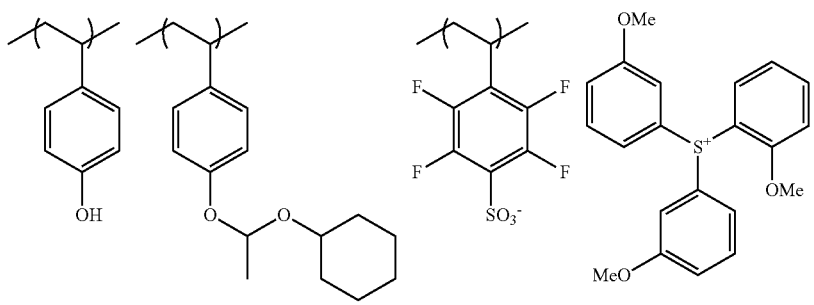
R-28
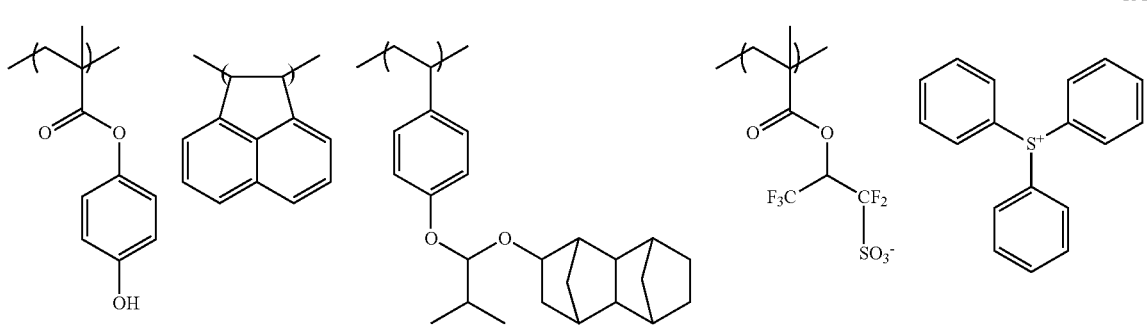
R-29
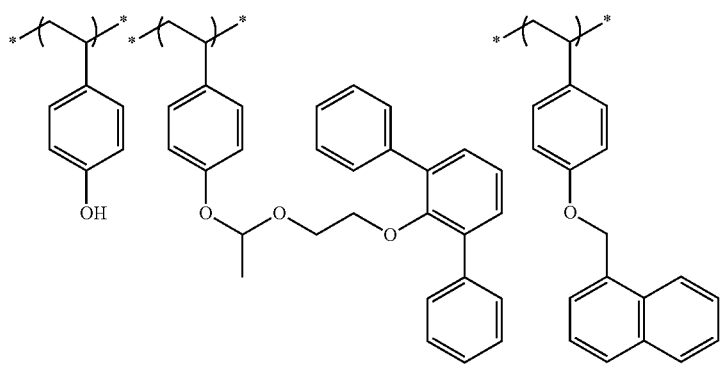

-continued
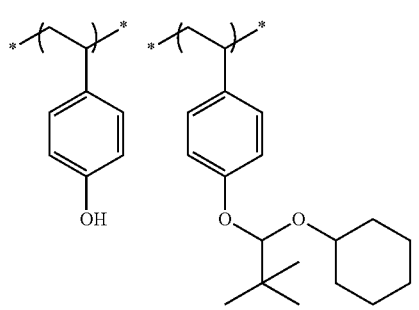
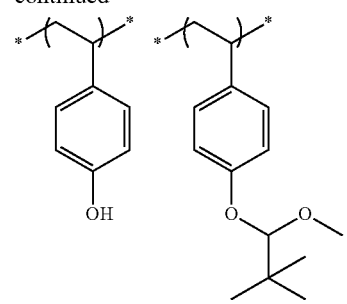
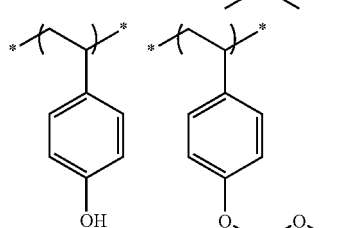
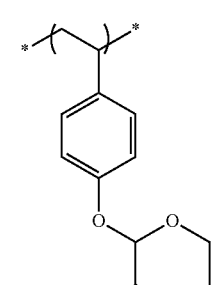
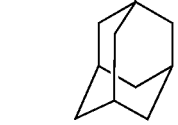
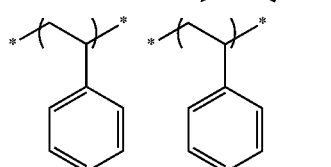
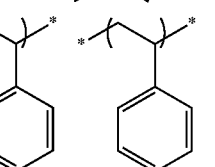
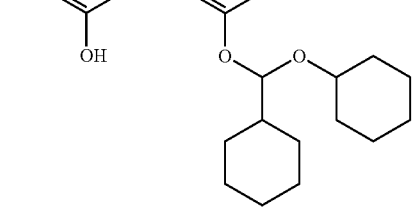
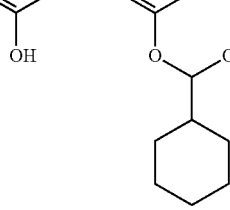
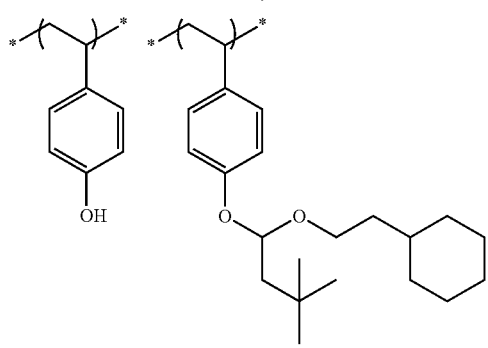
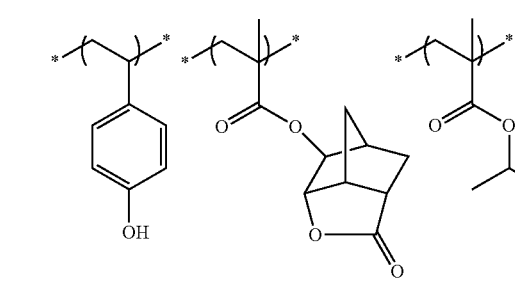
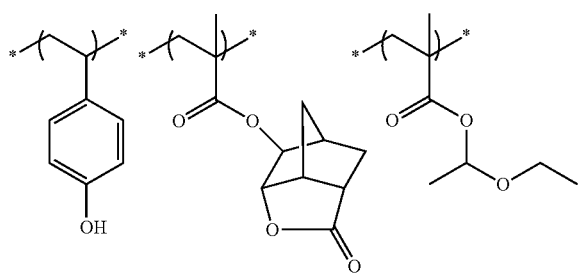
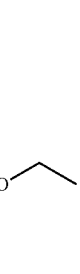

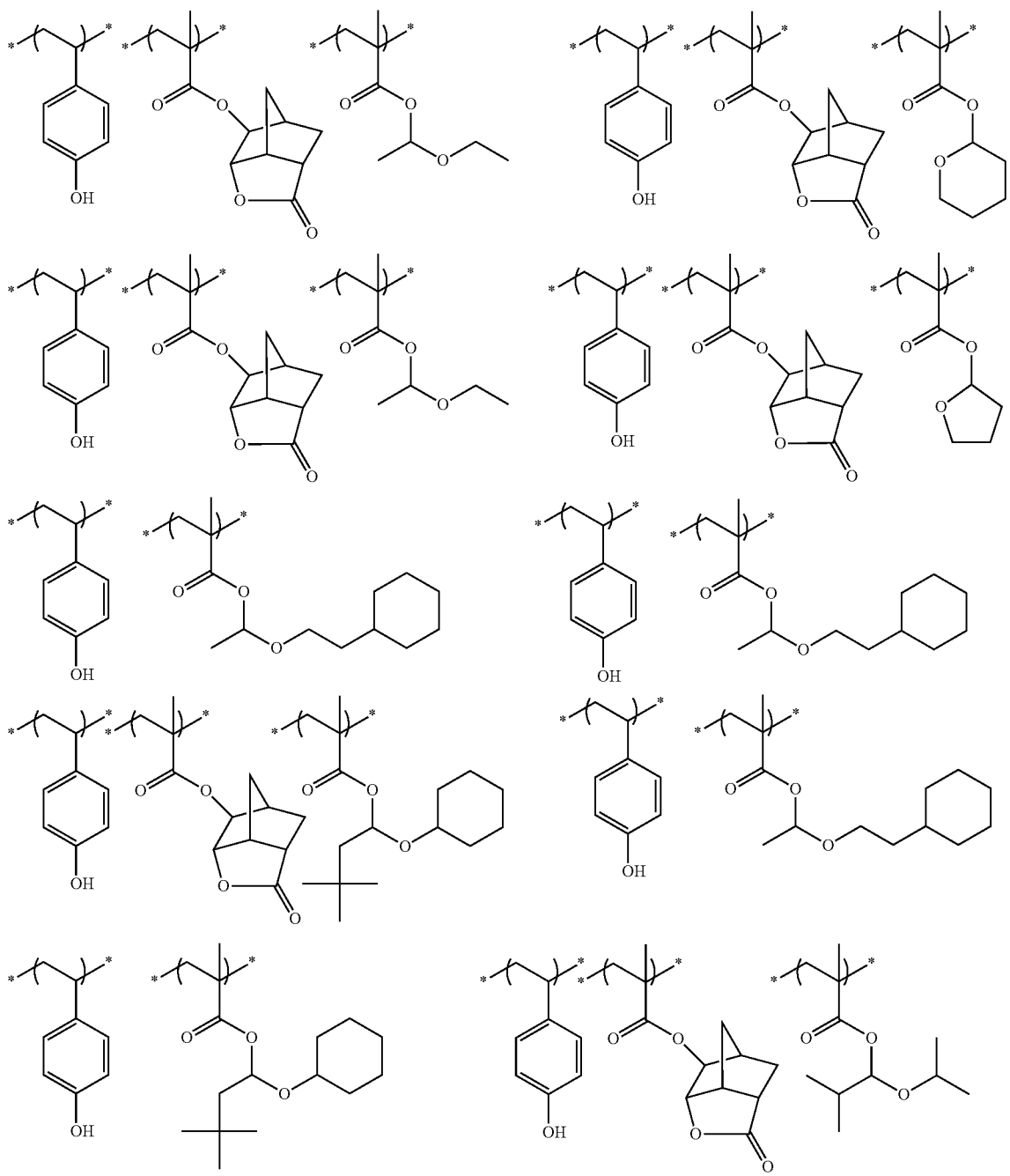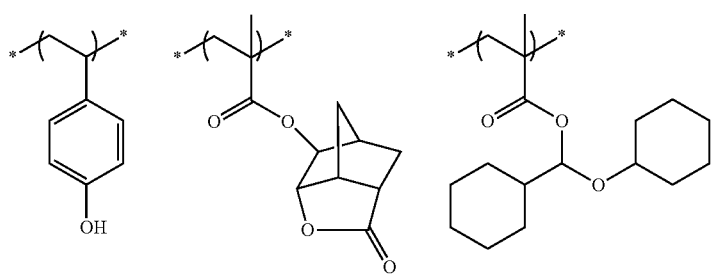

-continued
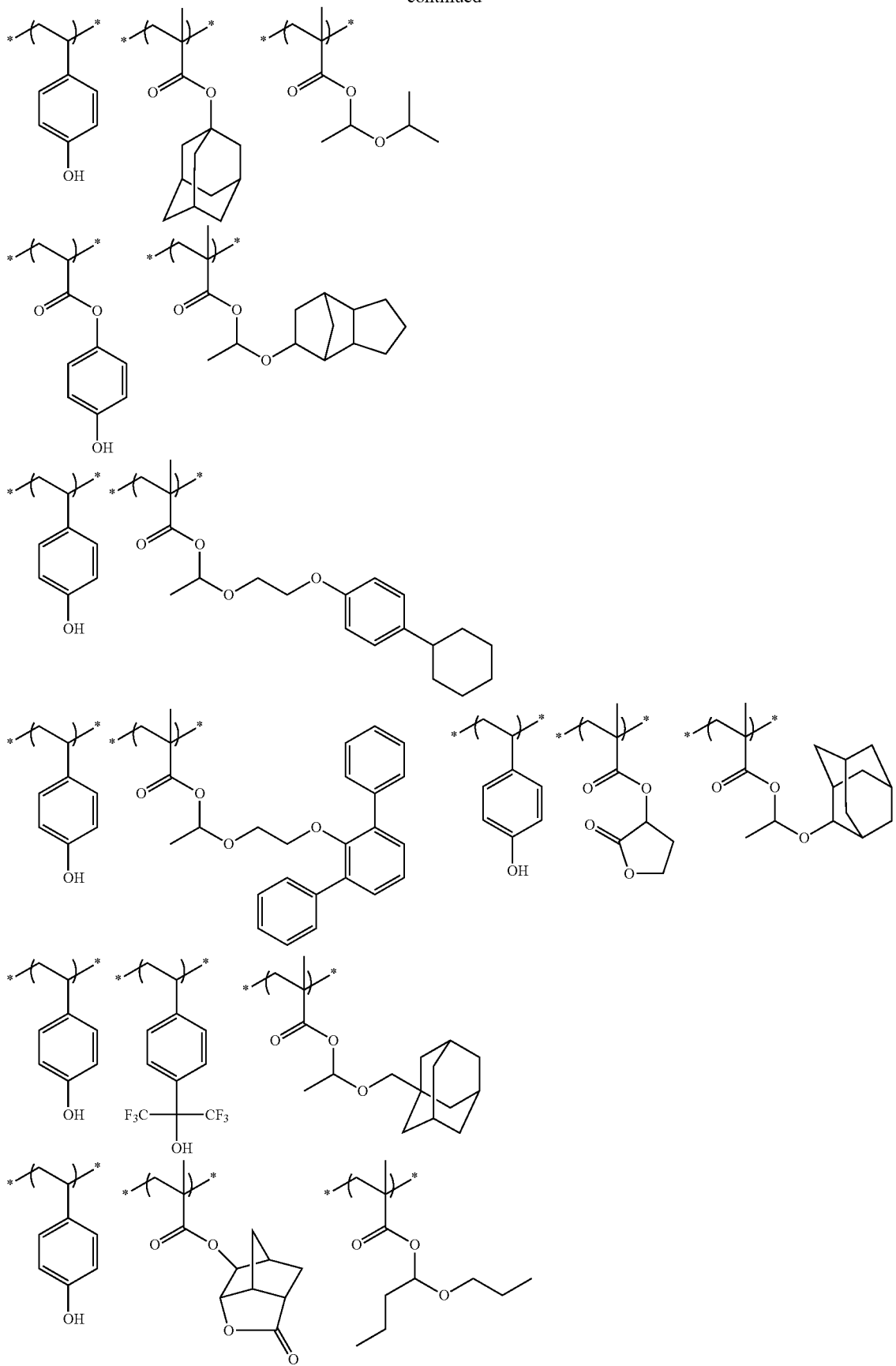

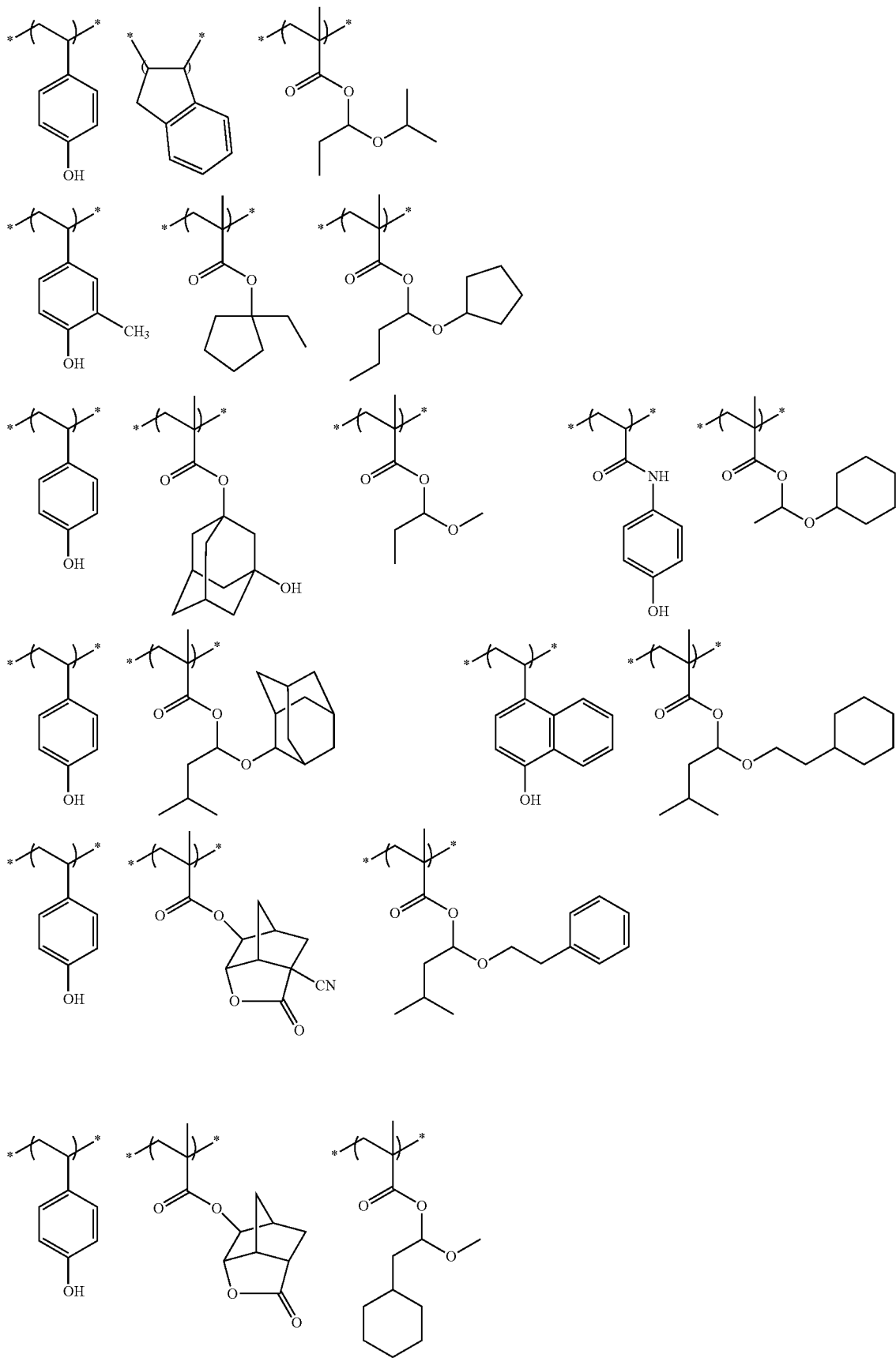

-continued
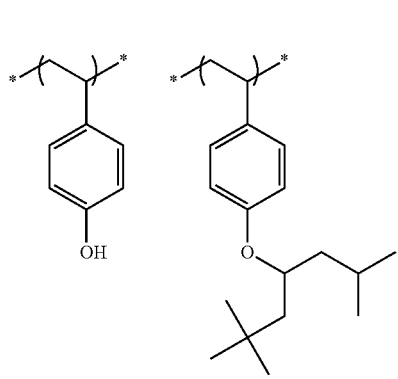
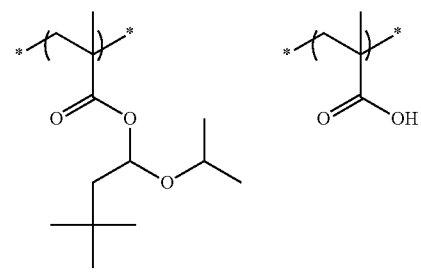
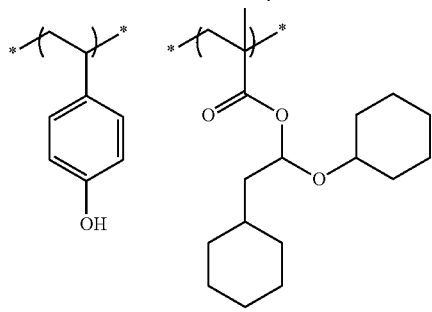
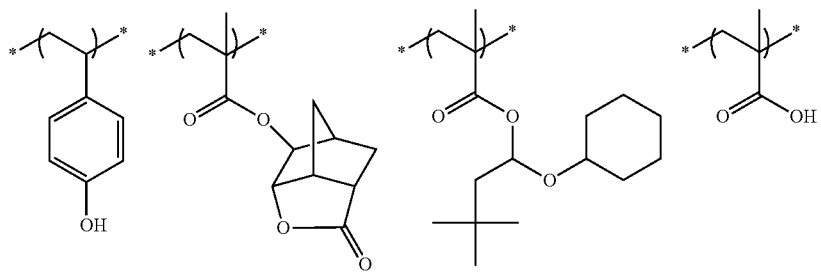
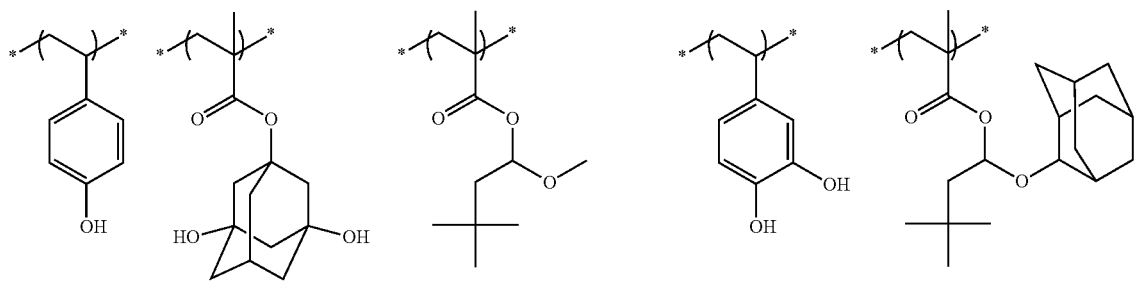
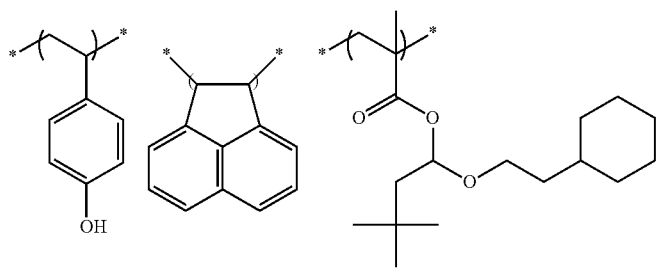

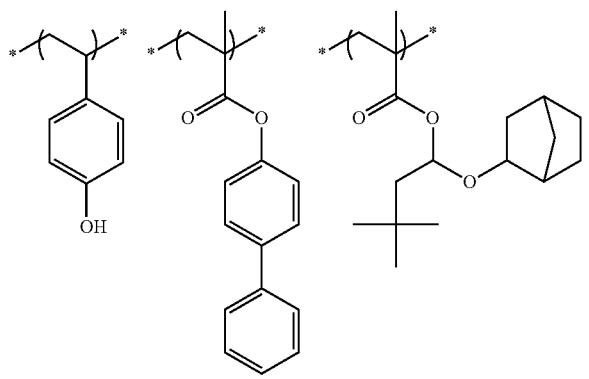
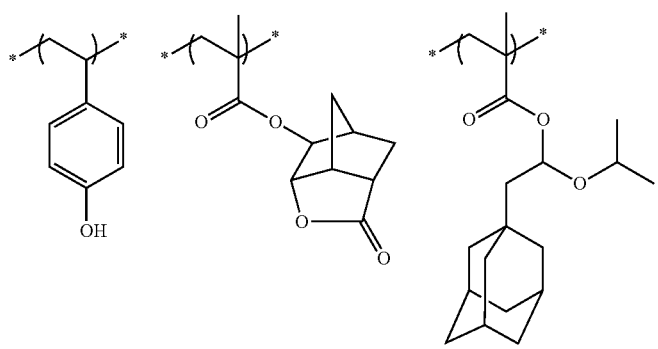
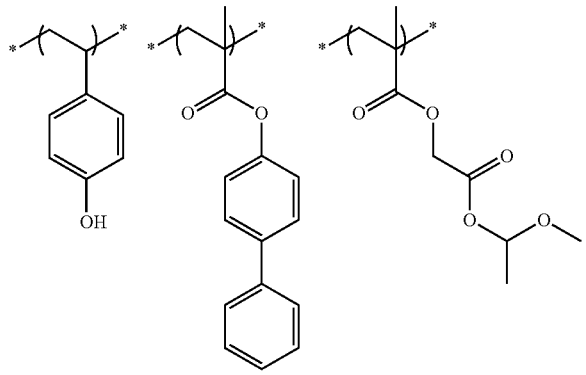
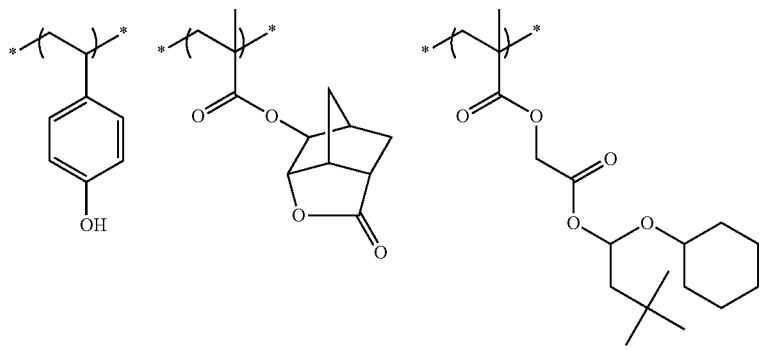
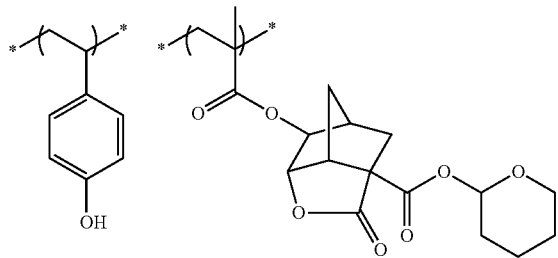

-continued
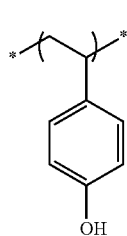 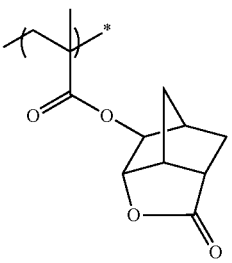 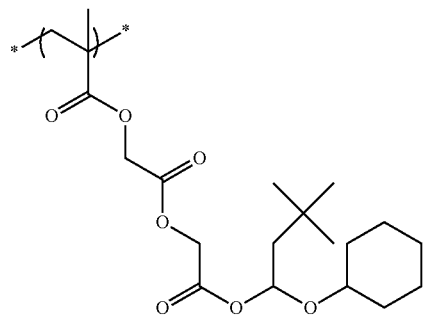
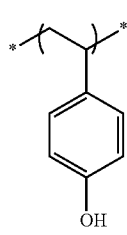 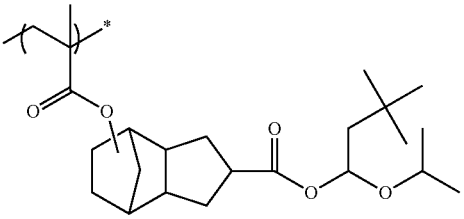
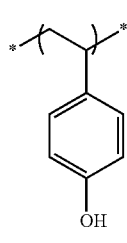 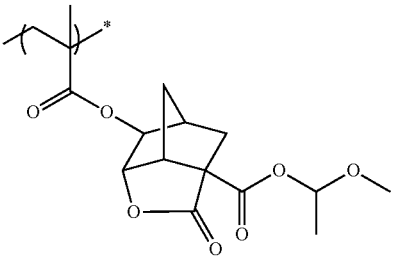
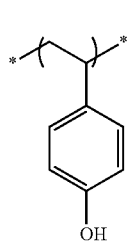 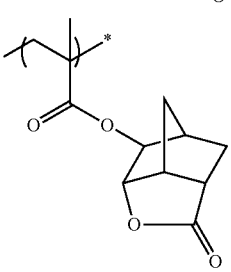 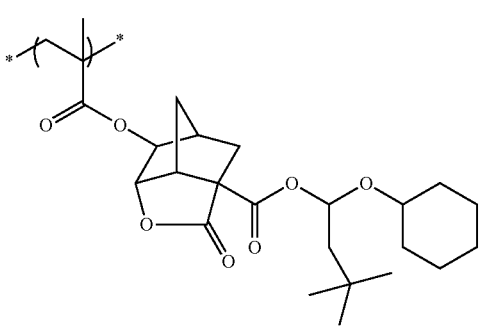
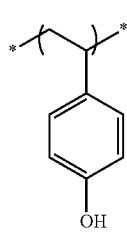 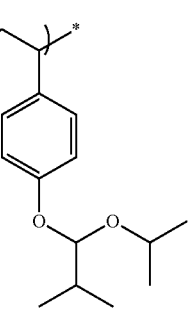 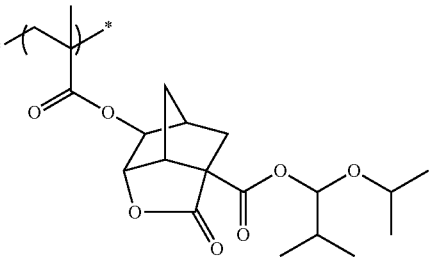 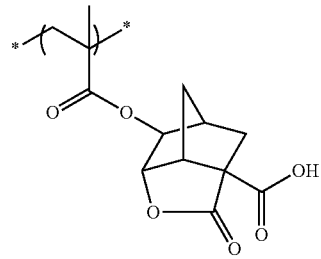
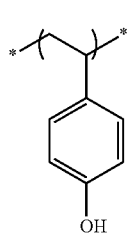 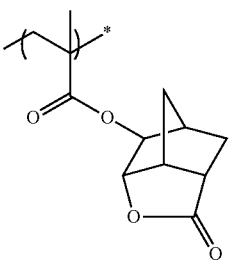 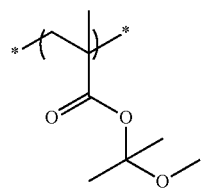

-continued

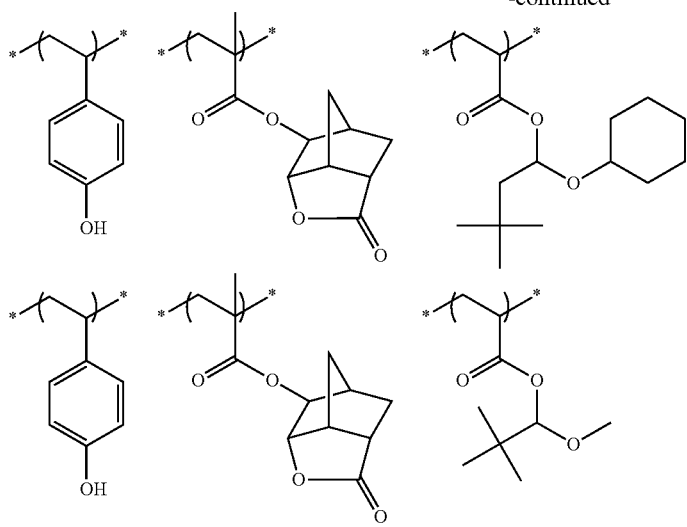

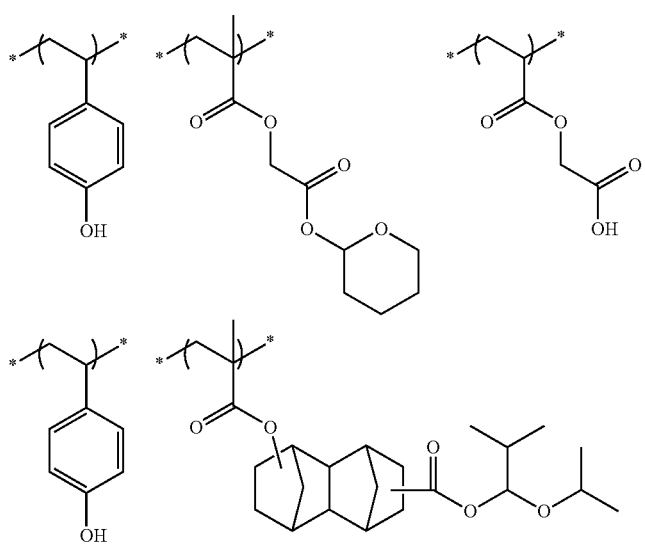

In the specific examples above, tBu represents a t-butyl group. The content ratio of the group that can be decomposed by an acid is calculated by a formula B/(B+S) with the number (B) of groups that can be decomposed by acid in a resin and the number (S) of polar groups (alkaline soluble polymers at the time of alkaline development) that are not protected with groups that are released by an acid. The content ratio thereof is preferably 0.01 to 0.7, more preferably 0.05 to 0.50, and even more preferably 0.05 to 0.40.

The resin according to the present invention may have a monocyclic or polycyclic alicyclic hydrocarbon structure. Particularly, in a case where the composition according to the present invention is irradiated with light of ArF excimer laser, the composition preferably has an alicyclic hydrocarbon structure.

This resin may have a repeating unit including at least one type selected from a lactone group or a sultone group. Particularly, in a case where the composition according to the present invention is irradiated with ArF excimer light, it is preferable to have a repeating unit having at least one type selected from a lactone group or a sultone group. The lactone group is preferably a group having a 5-membered to 7-membered ring lactone structure, and particularly, it is preferable that a group in which another ring structure is condensed in a form of forming a bicyclo structure or a Spiro structure in a 5-membered to 7-membered ring lactone structure.

An optical isomer generally exists in a repeating unit having a lactone structure, and any optical isomer may be used. One type of optical isomer may be used singly, or plural optical isomers may be used in mixture. In a case where one type of optical isomer is mainly used, an optical isomer having optical purity of 90% ee or greater is preferable, and an optical isomer having optical purity of 95% ee or greater is more preferable.

Examples of the particularly preferable repeating unit having the lactone group include repeating units described below. In a case where an optimum lactone group is selected, a pattern profile and density dependency become satisfactory. In the formula, Rx and R represent H, $CH_3$, $CH_2OH$, or $CF_3$.

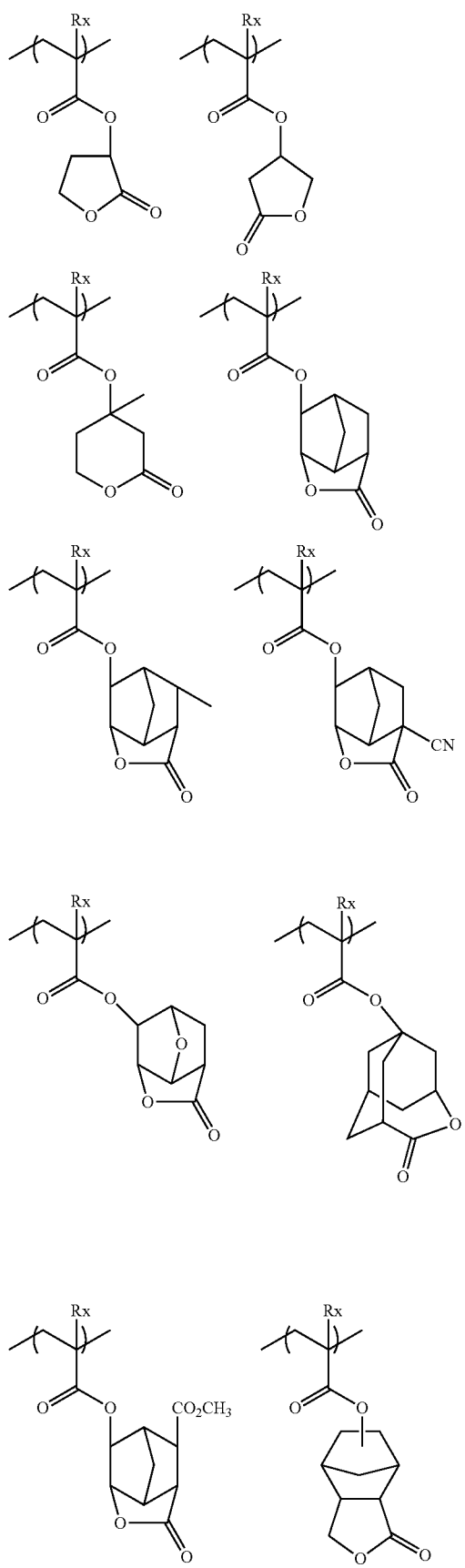

107
-continued
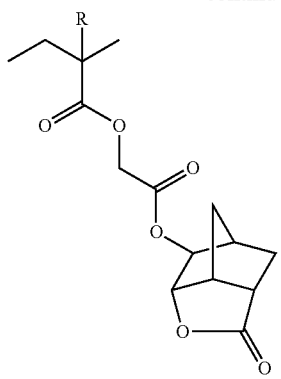
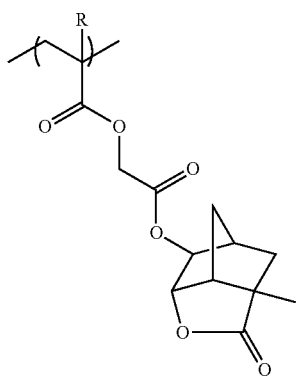
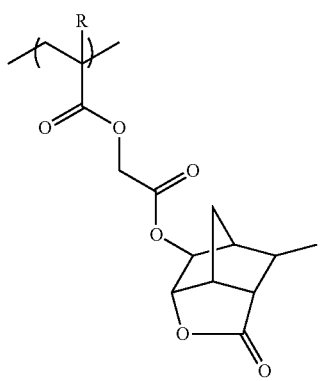
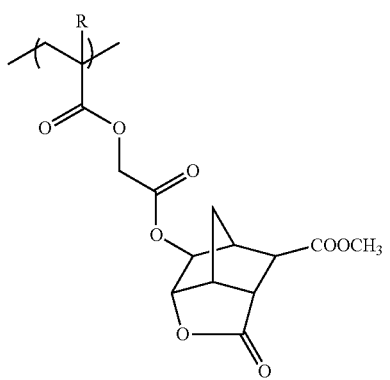
108
-continued
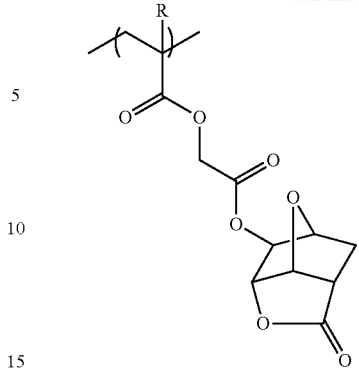
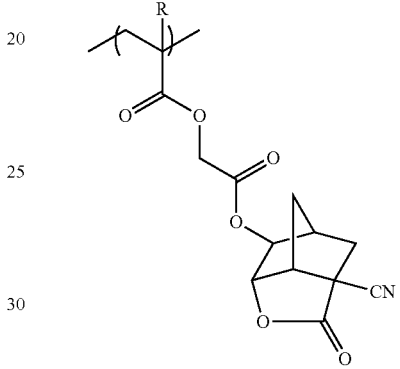
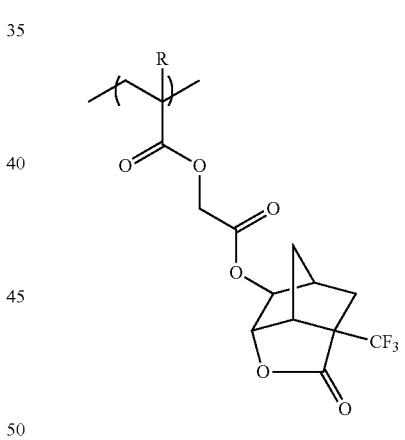

109
-continued
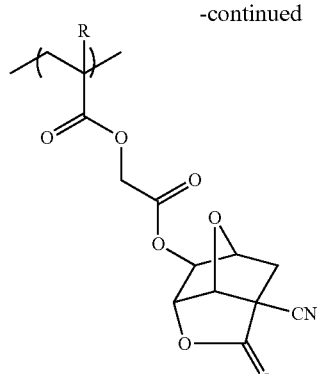
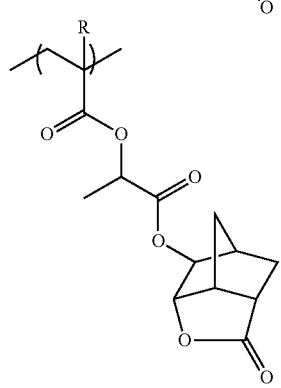
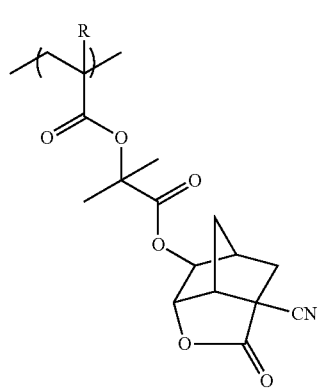
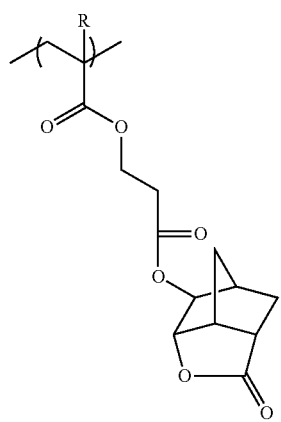
110
-continued
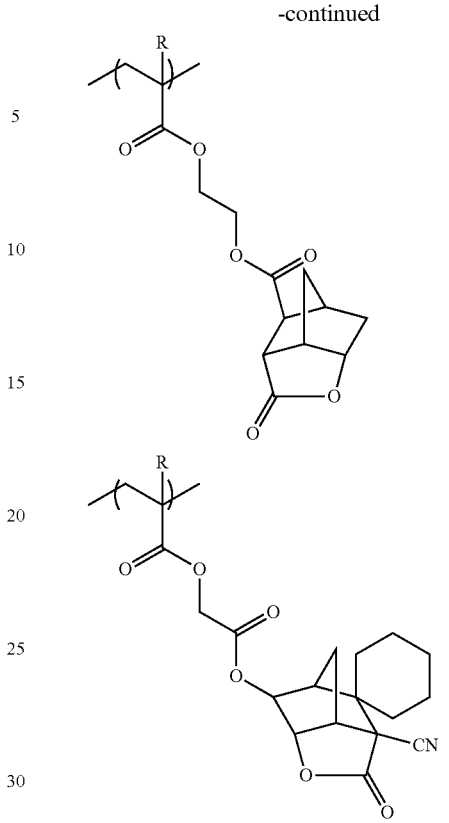
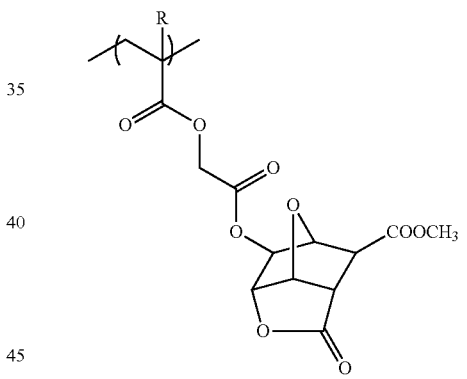
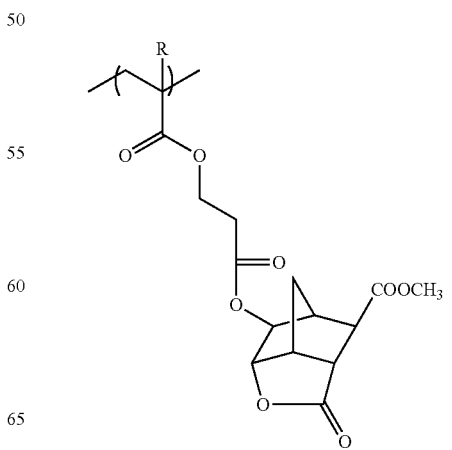

-continued

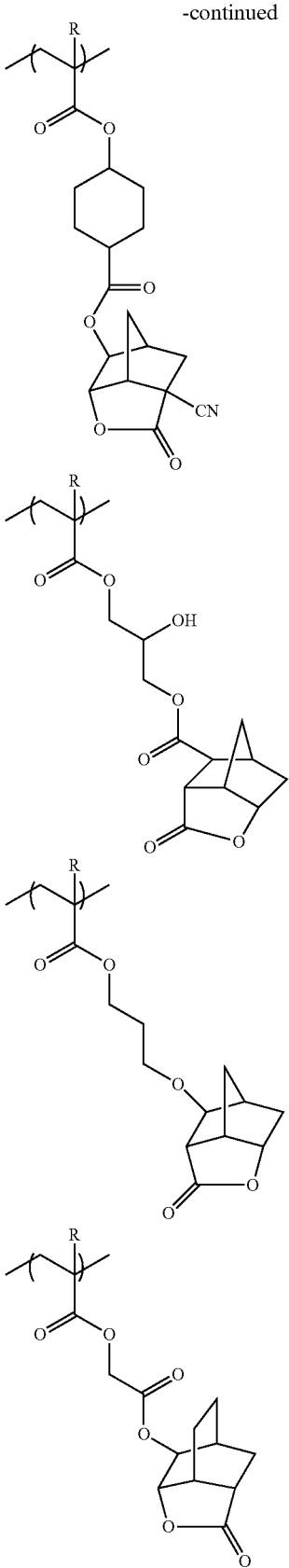

As the repeating unit that this resin includes, a repeating unit in which a sultone group is substituted with a lactone group in the repeating unit having the lactone group described above is also preferable.

The resin (A) may further have a repeating unit having a silicon atom on a side chain. Examples thereof include a (meth)acrylate-based repeating unit having a silicon atom and a vinyl-based repeating unit having a silicon atom. A repeating unit (b) having a silicon atom on a side chain typically a repeating unit having a group having a silicon atom on a side chain. Examples of the group having a silicon atom include a trimethylsilyl group, a triethylsilyl group, a triphenylsilyl group, a tricyclohexylsilyl group, a tristrimethylsiloxysilyl group, a tristrimethylsilylsilyl group, a methyl bistrimethylsilylsilyl group, a methyl bistrimethylsiloxysilyl group, a dimethyltrimethylsilylsilyl group, a dimethyltrimethylsiloxysilyl group, cyclic or linear polysiloxane as described below, or a basket-type, ladder-type, or random-type silsesquioxane structure. In the formula, R and R1 each independently represent a monovalent substituent.
* represents a bonding hand.

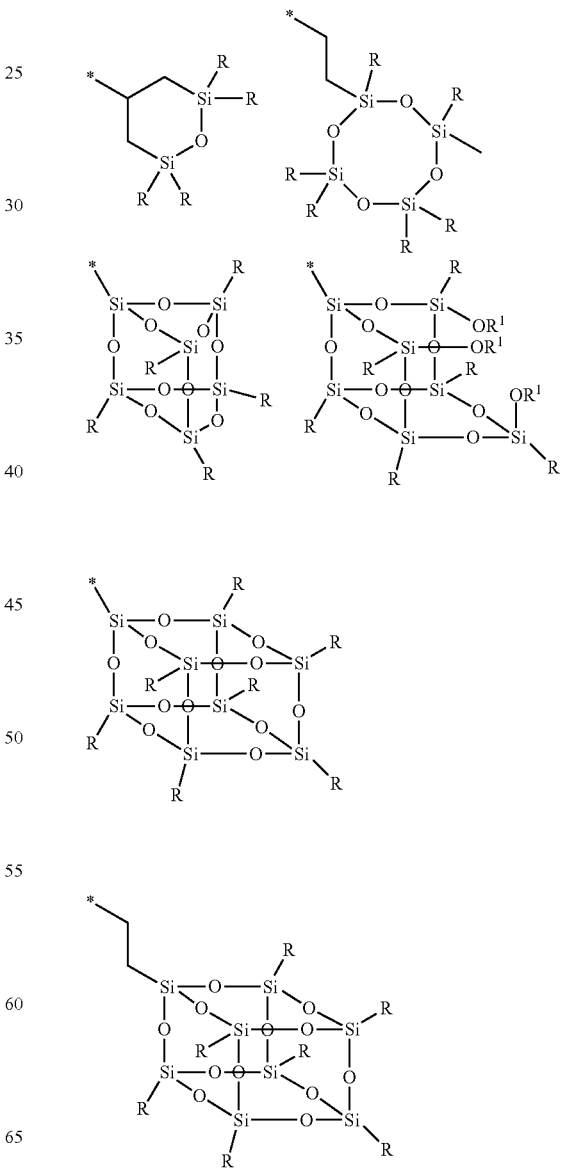

-continued

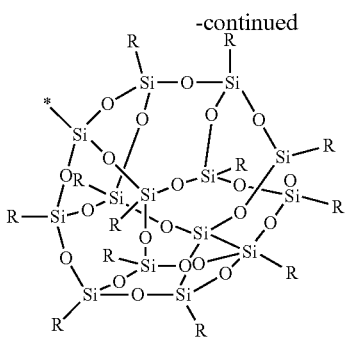

Examples of the repeating unit having the above group suitably include a repeating unit derived from an acrylate or methacrylate compound having the above group or a repeating unit derived from a compound having the above group and a vinyl group.

The repeating unit having a silicon atom is preferably a repeating unit having a silsesquioxane structure. Accordingly, excellent collapse performance can be exhibited in the forming of the pattern which is ultrafine (for example, line width 50 nm or less) and of which a cross-sectional shape has a high aspect ratio (for example, film thickness/line width is 3 or greater).

Examples of the silsesquioxane structure include a basket-type silsesquioxane structure, a ladder-type silsesquioxane structure (a ladder-type silsesquioxane structure), and a random-type silsesquioxane structure. Among these, a basket-type silsesquioxane structure is preferable.

Here, the basket-type silsesquioxane structure is a silsesquioxane structure having a basket-shaped skeleton. The basket-type silsesquioxane structure may be a complete basket-type silsesquioxane structure or an incomplete basket-type silsesquioxane structure. However, a complete basket-type silsesquioxane structure is preferable.

The ladder-type silsesquioxane structure is a silsesquioxane structure having a ladder-shaped skeleton.

The random-type silsesquioxane structure is a silsesquioxane structure with a random skeleton.

The basket-type silsesquioxane structure is preferably a siloxane st ure represented. by Formula (S).

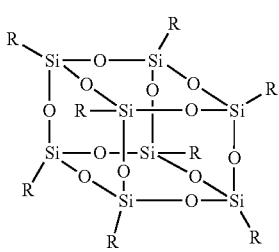 (S)

In Formula (S), R represents a monovalent organic group. A plurality of R's may be identical to or different from each other.

The organic group is not particularly limited. However, specific examples thereof include a hydroxy group, a nitro group, a carboxy group, an alkoxy group, an amino group, a mercapto group, a blocked mercapto group (for example, a mercapto group blocked (protected) with an acyl group), an acyl group, an imide group, a phosphino group, a phosphinyl group, a silyl group, a vinyl group, a hydrocarbon group which may have a hetero atom, a (meth)acryl group-containing group, and an epoxy group-containing group.

Examples of the hetero atom of the hydrocarbon group which may have a hetero atom include an oxygen atom, a nitrogen atom, a sulfur atom, and a phosphorus atom.

Examples of the hydrocarbon group of the hydrocarbon group which may have a hetero atom include an aliphatic hydrocarbon group, an aromatic hydrocarbon group, and a group formed by combining these groups.

The aliphatic hydrocarbon group may have any one of a linear shape, a branched chain shape, or a cyclic shape. Specific examples of the aliphatic hydrocarbon group include a linear or branched alkyl group (particularly having 1 to 30 carbon atoms), a linear or branched alkenyl group (particularly having 2 to 30 carbon atoms), and a linear or branched alkynyl group (particularly, having 2 to 30 carbon atoms).

Examples of the aromatic hydrocarbon group include an aromatic hydrocarbon group having 6 to 18 carbon atoms such as a phenyl group, a tolyl group, a xylyl group, and a naphthyl group.

The content (the sum in a case of having a plurality of kinds) of the repeating unit having a silicon atom on a side chain in the resin (A) is preferably in the range of 1 to 50 mol %, more preferably in the range of 1 to 30 mol %, and particularly preferably in the range of 2 to 20 mol % with respect to the total repeating unit of the acid decomposable resin.

A weight average molecular weight of the acid decomposable resin that is decomposed due to an action of an acid and of which solubility in an alkaline developer increases is preferably in the range of 2,000 to 200,000, in terms of polystyrene obtained according to a gel permeation chromatography (GPC) method. In a case where the weight average molecular weight is caused to be 2,000 or greater, heat resistance and dry etching resistance can be particularly improved. In a case where the weight average molecular weight is caused to be 200,000 or less, developability is are particularly improved, and also film forming properties can be improved, due to decrease of viscosity of the composition.

The weight average molecular weight is more preferably in the range of 1,000 to 200,000, even more preferably in the range of 2,000 to 50,000, and particularly preferably in the range of 2,000 to 10,000. In the forming of fine patterns using electron beams, X rays, high energy rays having a wavelength of 50 nm or less (for example, EUV), the weight average molecular weight is most preferably in the range of 3,000 to 6,000. It is possible to achieve the improvement of the heat resistance and the decrease of the resolving power of the composition at the same time, by adjusting the molecular weight.

The dispersion degree (Mw/Mn) of the resin that is decomposed due to an action of an acid and of which solubility in an alkaline developer increases is preferably 1.0 to 3.0, more preferably 1.0 to 2.5, and even more preferably 1.0 to 1.6. In a case where the dispersion degree is adjusted, it is possible to improve, for example, line edge roughness performances.

In the composition according to the present invention, two or more types of resins (A) may be used in combination.

A formulation ratio of the resin (A) occupying the composition according to the present invention is preferably 40 to 99 mass % and more preferably 50 to 99 mass % based on the total solid content.

<Solvent (D)>

Examples of the solvent that can be used in the composition according to the present invention preferably include ethylene glycol monoethyl ether, acetate, cyclohexanone, 2-heptanone, propylene glycol monomethyl ether (PGME, also referred to as 1-methoxy-2-propanol), propylene glycol monomethyl ether acetate (PGMEA, also referred to as 1-methoxy-2-acetoxypropane), propylene glycol monomethyl ether propionate, propylene glycol monoethyl ether acetate, methyl 3-methoxypropionate, ethyl 3-ethoxypropionate, methyl β-methoxyisobutyrate, ethyl butyrate, propyl butyrate, methyl isobutyl ketone, ethyl acetate, isoamyl acetate, propyl propionate, butyl propionate, methyl 2-hydroxyisobutyrate, ethyl lactate, toluene, xylene, cyclohexyl acetate, diacetone alcohol, N-methyl pyrrolidone, N,N-dimethyl formamide, β-butyrolactone, N,N-dimethylacetamide, propylene carbonate, ethylene carbonate, 4-methyl-2-pentanol, and decane. These solvents may be used singly or in combination.

[Compound (D) in which Dissolution Rate Decreases to Developer Due to Action of Acid]

The actinic ray-sensitive or radiation-sensitive resin composition of the present invention contains a compound (D)(also referred to as a "compound (D)") in which a dissolution rate with respect to the developer decrease due to the action of an acid. Here, the "developer" may be an alkaline developer that contains an alkaline aqueous solution or may be an organic developer that contains an organic solvent.

The compound (D) may be a polymer compound or may be a low molecular compound.

In view of reactivity and developability, the compound (D) is preferably a phenol derivative.

[N-A] Resin in Which Dissolution Rate with Respect to Developer Decreases Due to Action of Acid The resin (also referred to as a "resin [N-A]") in which a dissolution rate with respect to a developer decreases due to an action of an acid is not particularly limited. However, the resin is preferably a resin in which a dissolution rate with respect to the developer decreases due to an action of an acid generated from the acid generator described below.

Examples of the resin [N-A] include a resin having a group that is polymerized by an action of an acid or active species. The resin [N-A] is preferably a resin having at least one of a repeating unit represented by Formula (L-1) and a repeating unit represented by Formula (L-2).

As the resin having a repeating unit represented by Formula (L-1), compounds disclosed in [0030] to [0047] of JP2012-242556A can be suitably used. As the resin having a repeating unit represented by Formula (L-2), compounds disclosed in [0044] to [0048] of JP2014-24999A and [0020] to [0031] of JP2013-164588A can be suitably used.

According to the present invention, at least one of the repeating unit represented by Formula (L-1) and the repeating unit represented by Formula (L-2) may be incorporated to a portion of the resin (A) or may be incorporated to a resin different from the resin (A).

(L-1)

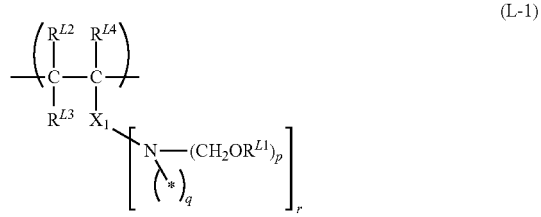

$R^{L1}$ represents a hydrogen atom, an alkyl group, or a cycloalkyl group. p represents 1 or 2. q represents an integer represented by (2-p). * represents a bonding hand to another atom that constitutes a repeating unit (L-1). In a case where p is 2 or r is 2 or greater, a plurality of $R^{L1}$'s may be identical to or different from each other. $R^{L2}$, $R^{L3}$, and $R^{L4}$ each independently represent a hydrogen atom, an alkyl group, a cycloalkyl group, a halogen atom, a cyano group, or an alkoxycarbonyl group. $X_1$ represents a single bond or a r+ monovalent group selected from the group consisting of a linear or branched hydrocarbon group, a cyclic hydrocarbon group that may contain a hetero atom as a ring member, —O—, —S—, —CO—, —SO$_2$—, —NR—, and a group obtained by combining these. R represents a hydrogen atom, alkyl group, or a group represented by —CH$_2$OR$^{L1}$. $R^{L1}$ in a group represented by —CH$_2$OR$^{L1}$ is the same as $R^{L1}$. r represents an integer of 1 to 5. Here, in a case where $X_1$ is a single bond, r is 1.

The alkyl group in $R^{L1}$ may be any one of a linear shape or a branched shape, and examples thereof include an alkyl group having 1 to 20 carbon atoms (for example, a methyl group, an ethyl group, a propyl group, an isopropyl group, a butyl group, an isobutyl group, a t-butyl group, an n-pentyl group, an n-hexyl group, an n-octyl group, and an n-dodecyl). The alkyl group is preferably the alkyl group having 1 to 8 carbon atoms, more preferably an alkyl group having 1 to 6 carbon atoms, and particularly preferably an alkyl group having 1 to 4 carbon atoms.

The cycloalkyl group in $R^{L1}$ may have any one of a monocyclic shape or a polycyclic shape, and examples thereof include a cycloalkyl. group having 3 to 17 carbon atoms (for example, a cyclopentyl group, a cyclohexyl group, a norbornanyl group, and an adamantyl group). The cycloalkyl group is preferably a cycloalkyl group having 5 to 12 carbon atoms, more preferably a cycloalkyl group having 5 to 10 carbon atoms, and particularly preferably a cycloalkyl group having 5 to 6 carbon atoms.

$R^{L1}$ in Formula (L-1) is preferably a hydrogen atom or an alkyl group having 1 to 8 carbon atoms, more preferably a hydrogen atom or an alkyl group having 1 to 6 carbon atoms, and particularly preferably a hydrogen atom or an alkyl group having 1 to 4 carbon atoms.

$R^{L2}$, $R^{L3}$, and $R^{L4}$ each independently represent a hydrogen atom, an alkyl group, a cycloalkyl group, a halogen atom, a cyano group, or an alkoxycarbonyl group.

$X_1$ represents a single bond or a (r+1)-valent group selected from the group consisting of a linear or branched hydrocarbon group, a cyclic hydrocarbon group which may contain a hetero atom as a ring member, —O—, —S—, —CO—, —SO$_2$—, (R represents a hydrogen atom, an alkyl group, or a group represented by —CH$_2$OR$^{L1}$), and a group obtained by combining these. $R^{L1}$ represented by —CH$_2$OR$^{L1}$ may be the same as $R^{L1}$ in Formula (L-1).

r represents an integer of 1 to 5. Here, in a case where $X_1$ is a single bond, r is 1.

Specific examples of the repeating unit represented by Formula (L-1) are provided below, but the present invention is not limited to these. R represents a hydrogen atom or a methyl group.

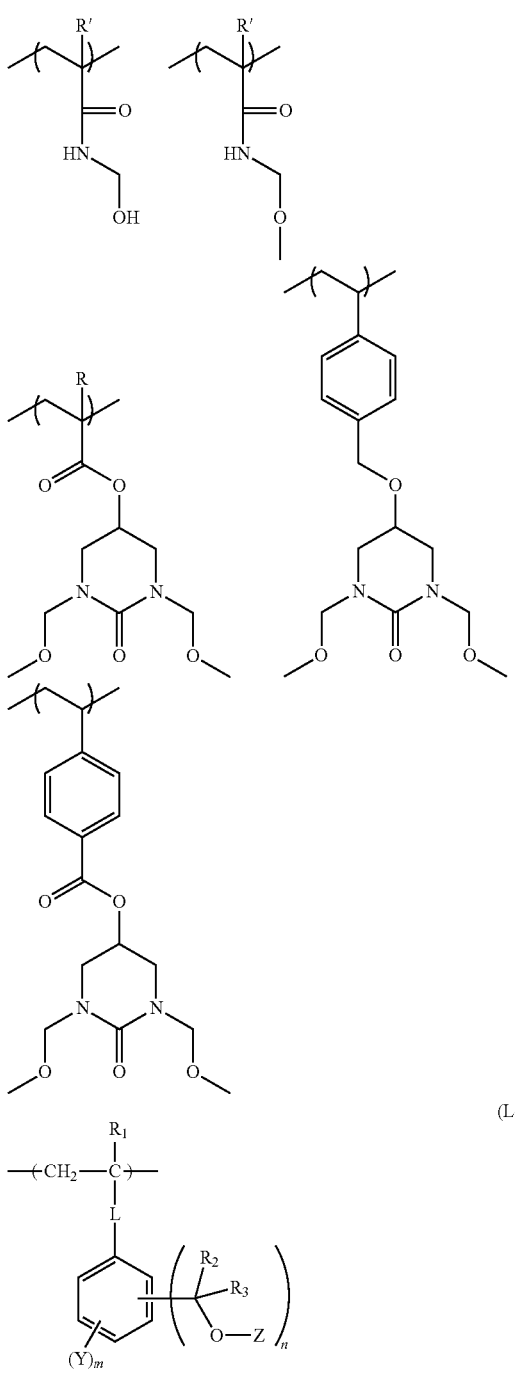

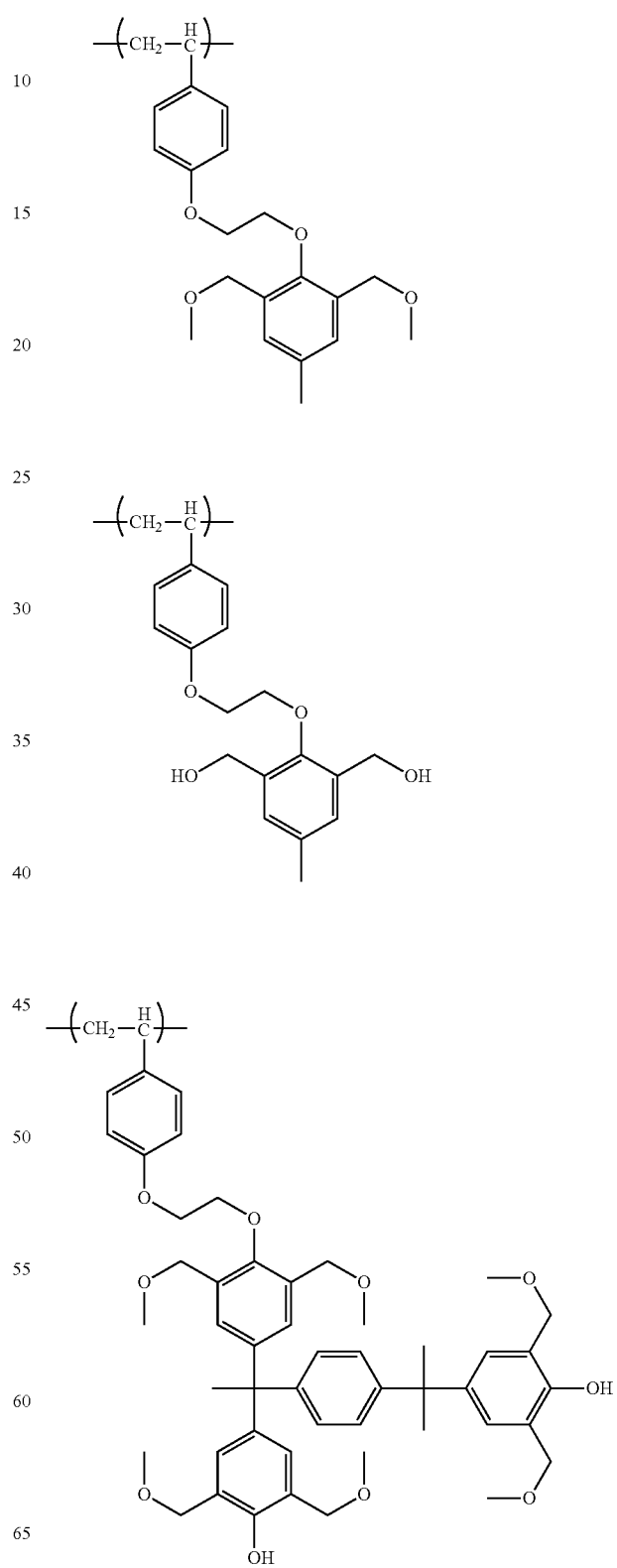

In Formula (L-2), $R_1$ represents a hydrogen atom, a methyl group, or a halogen atom; $R_2$ and $R_3$ each independently represent a hydrogen atom, an alkyl group, or a cycloalkyl group; L represents a divalent linking group or a single bond; Y represents a monovalent substituent excluding a methylol group; Z represents a hydrogen atom or a monovalent substituent; m represents an integer of 0 to 4; n represents an integer of 1 to 5; m+n is 5 or less; in a case where m is 2 or greater, a plurality of Y's may be identical to or different from each other, and a plurality of Y's may be bonded to each other to form a ring structure; and in a case where n is 2 or greater, a plurality of $R_2$'s, $R_3$'s, and Z's may be identical to or different from each other.

It is preferable that L includes a divalent aromatic ring, or a linking group represented by —COO—.

Specific examples of the repeating unit represented by Formula (L-2) are provided below, but the present invention is not limited thereto.

-continued

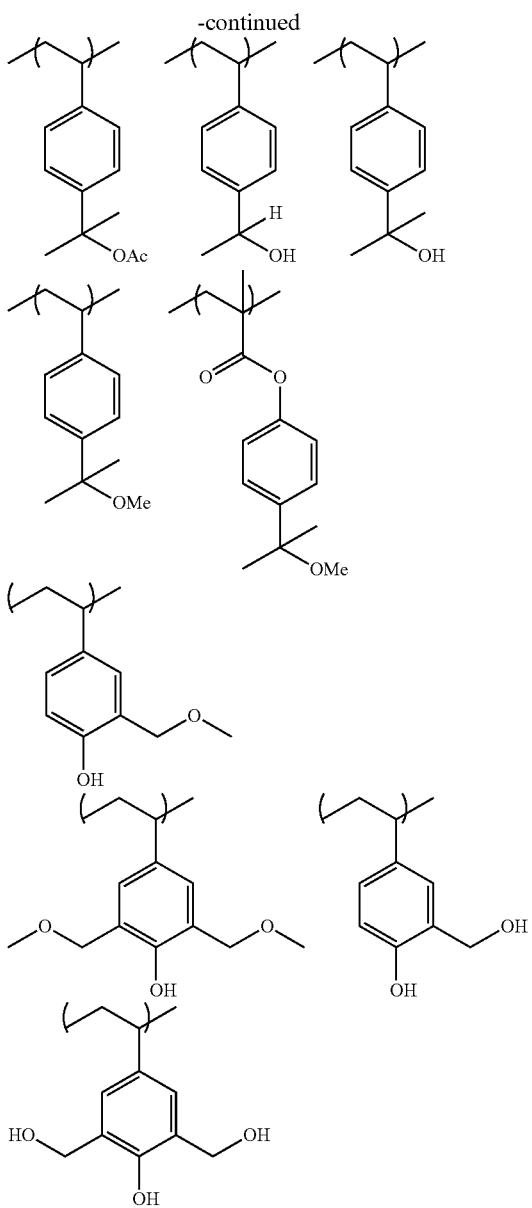

The resin [N-A] may include a repeating unit having an epoxy sthicture or an oxetane structure. Specifically, paragraphs [0076] to [0080] of JP2013-122569A can be referred to, and the contents thereof may be incorporated to the present specification.

In a case where a negative image is formed, the content of the repeating unit represented by Formula (L-1) and the repeating unit represented by Formula (L-2) is preferably 5 to 50 mol % and more preferably 10 to 40 mol % with respect to the total repeating unit included in the resin [N-A].

The resin [N-A] may contain other repeating units in addition to the repeating unit represented by Formula (L-1) and the repeating unit represented by Formula (L-2) and may contain a repeating unit included in the resin (A).

The resin [N-A] can be synthesized by a radical polymerization method, a anionic polymerization method, or a living radical polymerization method (such as an iniferter method), which are well-known. For example, in the anionic polymerization method, a polymer can be obtained by dissolving a vinyl monomer in a suitable organic solvent and performing reaction with a metal compound (butyllithium or the like) as an initiator, usually under cooling conditions.

The weight-average molecular weight of the resin [N-A] is preferably 1,000 to 50,000 and more preferably 2,000 to 20,000.

The resin [N-A] can be used singly or two or more kinds thereof may combined to be used. The content of the resin [N-A] is preferably 20 to 99 mass %, more preferably 30 to 99 mass %, and even more preferably 40 to 99 mass % with respect to the total solid content in the actinic ray-sensitive or radiation-sensitive resin composition of the present invention.

[N-C] Low Molecular Compound in which Dissolution Rate with Respect to Developer Decreases Due to Action of Acid A low molecular compound (also referred to as a "low molecular compound [N-C]") in which a dissolution rate with respect to a developer decreases due to an action of an acid is not particularly limited. However, examples thereof include a compound in which a dissolution rate with respect to a developer decreases due to an action of an acid generated from the following acid generator.

The molecular weight range of the low molecular compound [N-C] is preferably 100 to 1,000, more preferably 200 to 900, and particularly preferably 300 to 800.

Here, the low molecular compound according to the present invention is not a so-called polymer or oligomer but a compound (compound substantially not having molecular weight distribution) having a constant molecular weight which is obtained by cleaving a unsaturated bond of a compound (so-called polymerizable monomer) having an unsaturated bond while using an initiator and growing the bond in a chain manner.

Examples of the low molecular compound [N-C] include an addition polymerizable compound having a double bond. In this case, the low molecular compound [N-C] is selected from compounds having at least one, preferably two or more terminal ethylenically unsaturated bonds. The compound group is widely known in this industry field, and these compounds can be used without particular limitation in the present invention.

As the addition polymerizable compound having a double bond, monomers disclosed in [0108]to [0113] of JP2014-104631A can be suitably used.

Examples of the low molecular compound [N-C] suitably include a compound (hereinafter, referred to as a "crosslinking agent") that crosslinks the resin (A) having a phenolic hydroxyl group. Here, well-known crosslinking agents can be effectively used.

For example, the crosslinking agent is a compound having a crosslinkable group that can crosslink the resin (A) having a phenolic hydroxyl group and is preferably a compound having two or more of hydroxymethyl groups, alkoxymethyl groups, acyloxymethyl groups, or alkoxymethyl ether groups as crosslinkable groups, or an epoxy compound.

More preferable examples thereof include alkoxyniethylated or acyloxymethylated melamine compounds, alkoxymethylated or acyloxymethylated urea compounds, hydroxymethylated or alkoxymethylated phenolic compounds, and alkoxymethyl etherified phenol compounds.

As a compound [N-C], epoxy compounds disclosed in paragraphs [0196] to [0200] of JP2013-64998A ([0271] to [0277] of corresponding US2014/0178634A) or oxetane compounds disclosed in paragraph [0065] of JP2013-258332A can be referred to, and the contents thereof are incorporated to the present specification.

The crosslinking agent preferably has a structure represented by Formula (1).

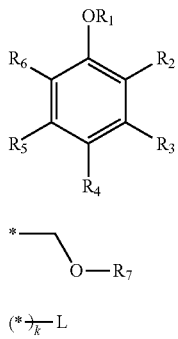

In Formula (1), $R_1$ to $R_6$ each independently represent a hydrogen atom, an organic group having 1 to 50 carbon atoms, or a bonding portion to a linking group represented by L in Formula (3) or a single bond. Here, at least one of $R_2$ to $R_6$ is a structure represented by Formula (2).

In. Formula (2), $R_7$ represents a hydrogen atom or an organic group having 1 to 30 carbon atoms, and * represents a bonding portion in any one of $R_2$ to $R_6$.

In Formula (3), L represents a linking group or a single bond, * represents a bonding portion in any one of $R_1$ to $R_6$, and k represents an integer of 2 to 5.

In a case where a crosslinking agent is a compound represented by Formula (1), $R_1$ to $R_6$ each independently represent a hydrogen atom or an organic group having 1 to 50 carbon atoms. Examples of the organic group having 1 to 50 carbon atoms include an alkyl group, a cycloalkyl group, an aryl group, and a group obtained by linking these groups via an alkylene group, an arylene group, a carboxylic acid ester bond, a carbonic acid ester bond, an ether bond, a thioether bond, a sulfo group, a sulfone group, a urethane bond, a urea bond, or a group obtained by combining these.

At least one of $R_2$ to $R_6$ is a structure represented by Formula (2). Examples of the organic group having 1 to 30 carbon atoms which is represented by $R_7$ in Formula (2) include the same specific examples as in the organic group represented by $R_1$ to $R_6$. It is preferable to have two or more structures represented by Formula (2) in one molecule.

According to another aspect of the present invention, the crosslinking agent may be a compound obtained by linking one to five structures represented by Formula (1) via a linking group represented by L in Formula (3) or a single bond. In this case, at least one of $R_1$ to $R_6$ in Formula (1) represents a bonding portion to a linking group represented by Formula (3) or a single bond.

Examples of the linking group represented by L in Formula (3) include an alkylene group, an arylene group, a carboxylic acid ester bond, a carbonic acid ester bond, an ether bond, a thioether bond, a sulfo group, a sulfone group, a urethane bond, a urea bond, and a group obtained. by combining two or more of these, An alkylene group, an arylene group, and a carboxylic acid ester bond are preferable.

k preferably represents 2 or 3.

According to an aspect of the present invention, the crosslinking agent of the present invention is a compound represented by Formula (1), and is preferably a compound obtained by linking a compound having a structure represented by Formula (4) as a polarity conversion group or two or three of the compound via a linking group represented by L in Formula (3a) or a single bond.

In Formula (3a), L is the same as L in Formula (3), and $k_1$ represents 2 or 3.

Specific examples of L are provided below, but the present invention is not limited thereto.

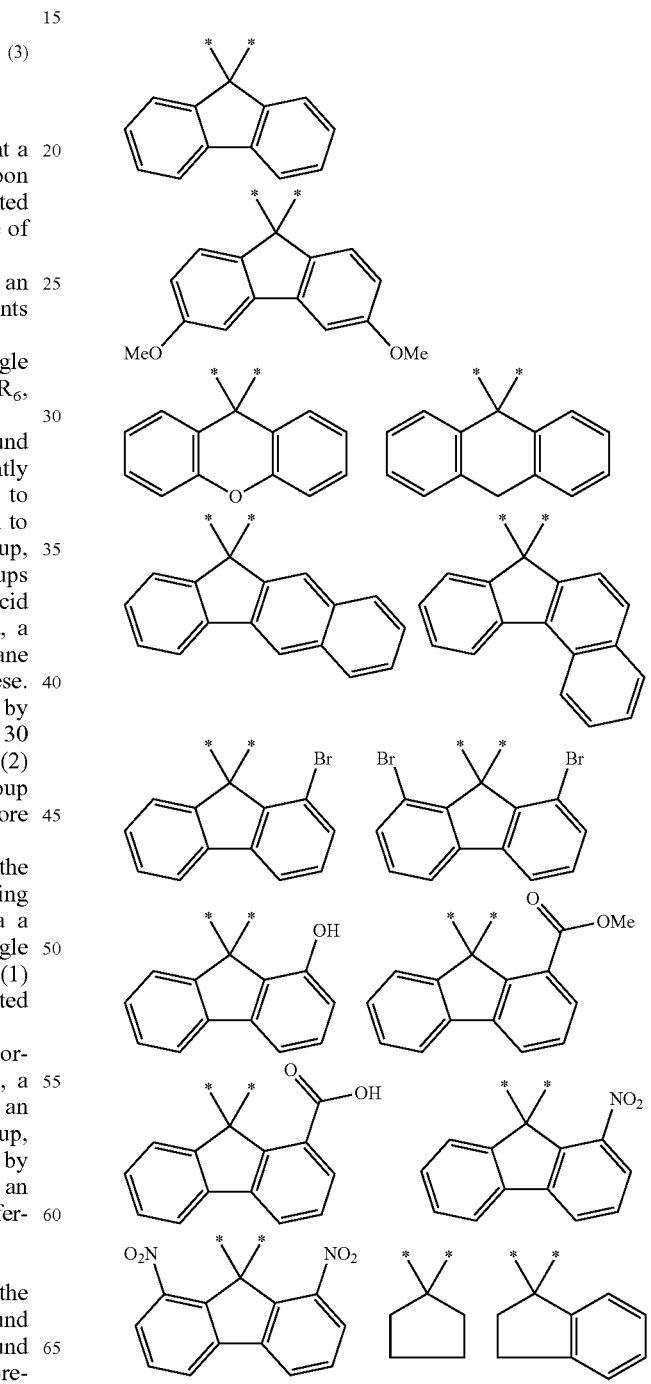

-continued
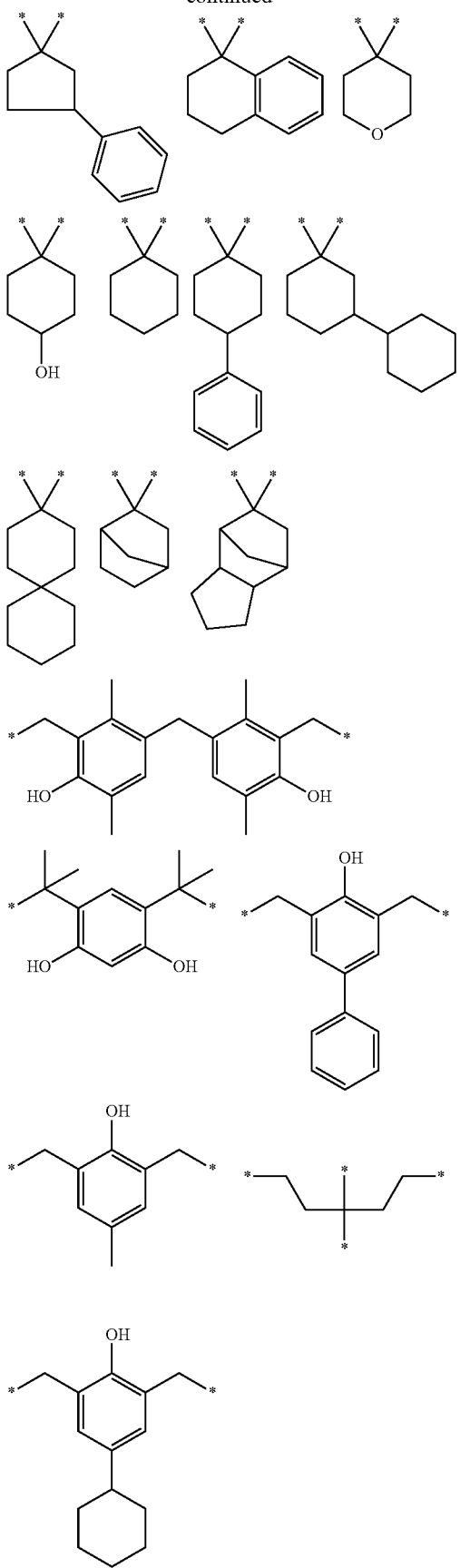
-continued
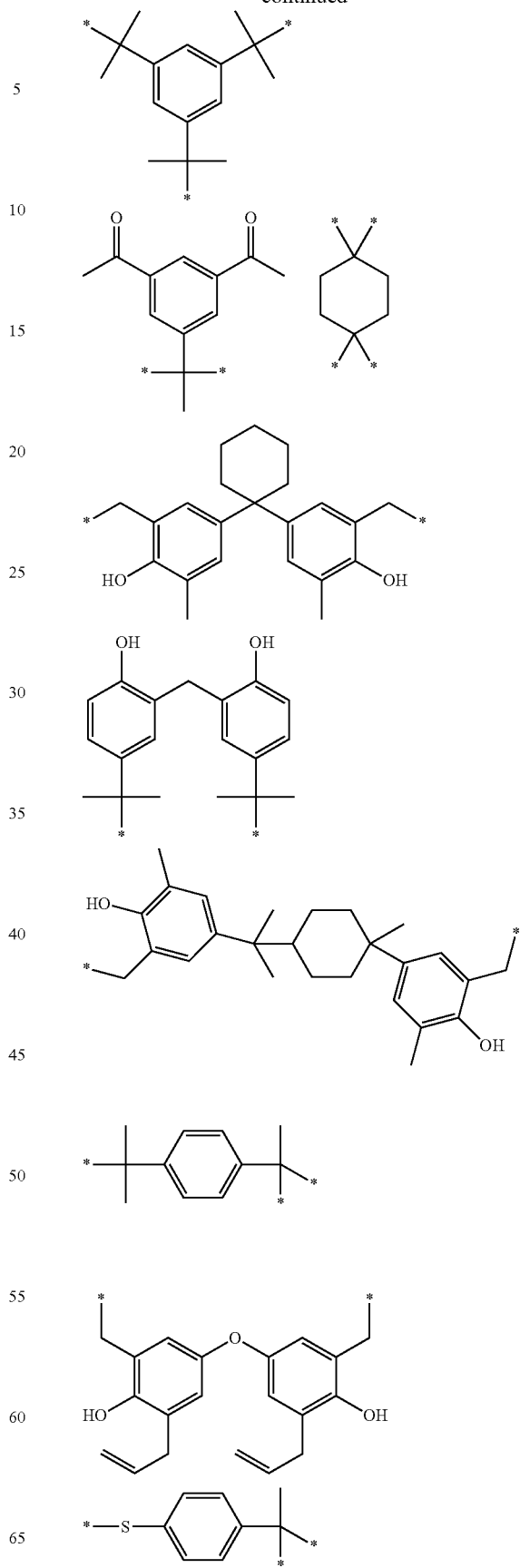

125
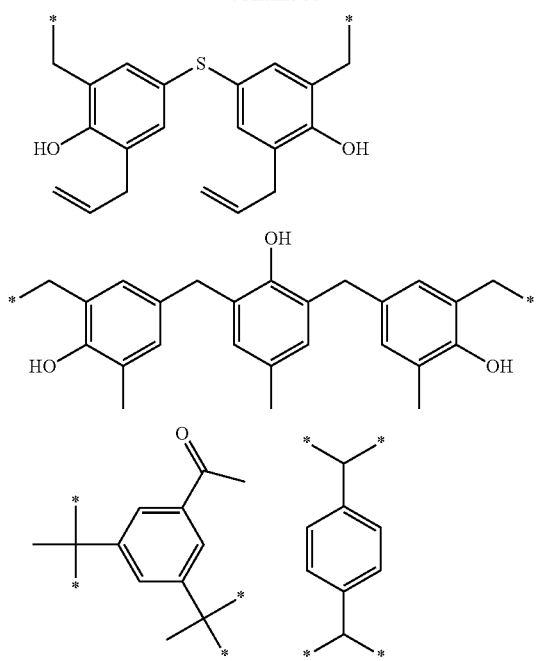
Specific examples of the crosslinking agent of the present invention are provided below, but the present invention is not limited thereto.
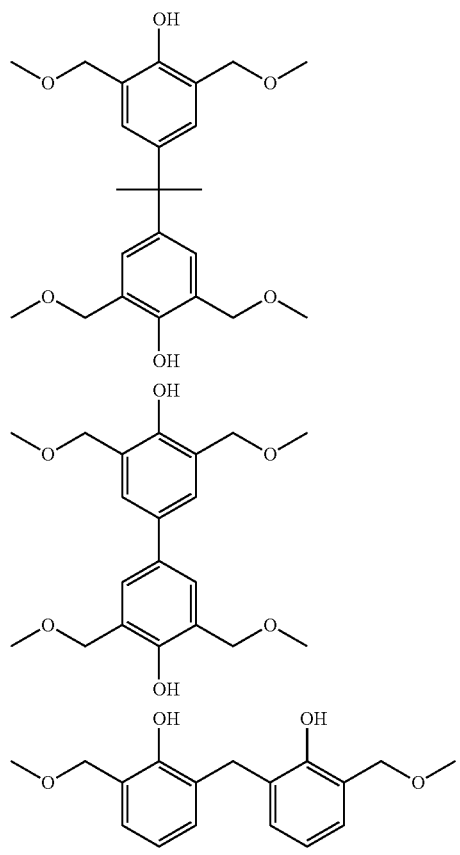
126
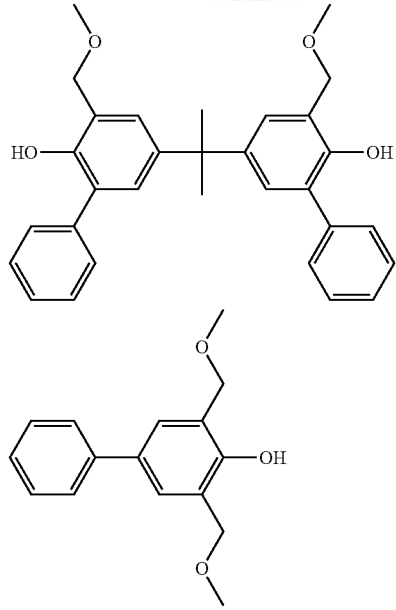
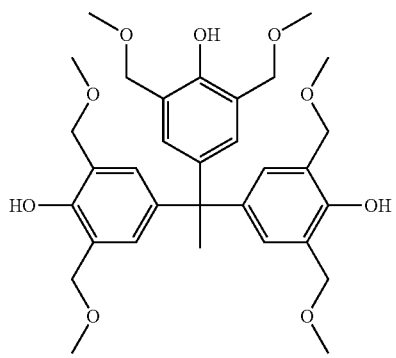
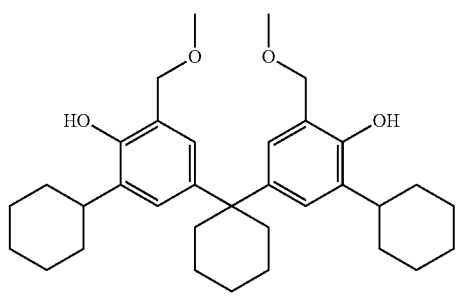
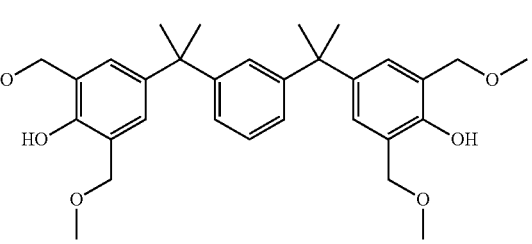

127
-continued
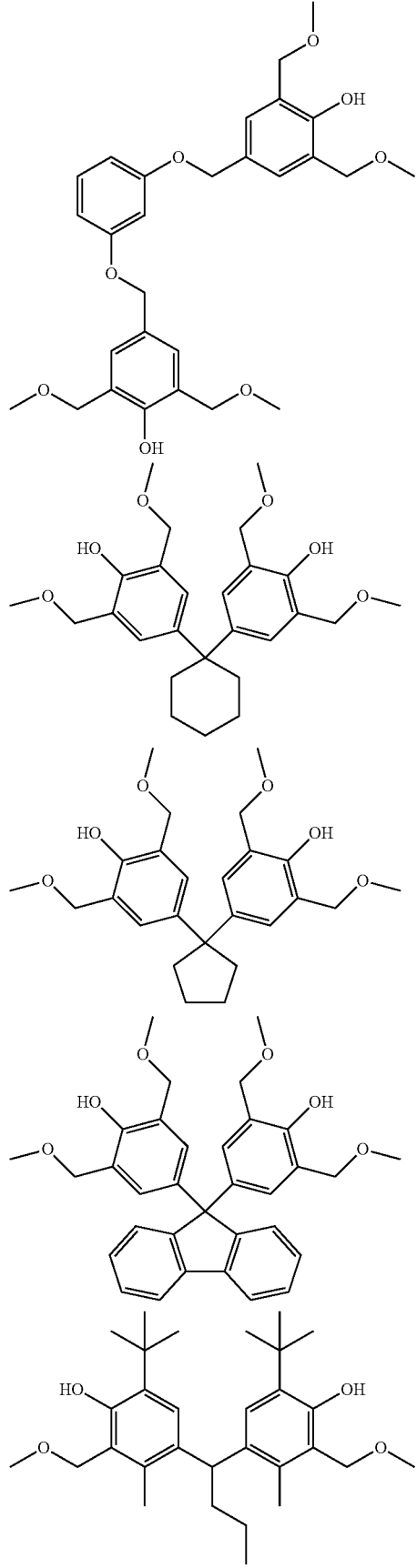
128
-continued
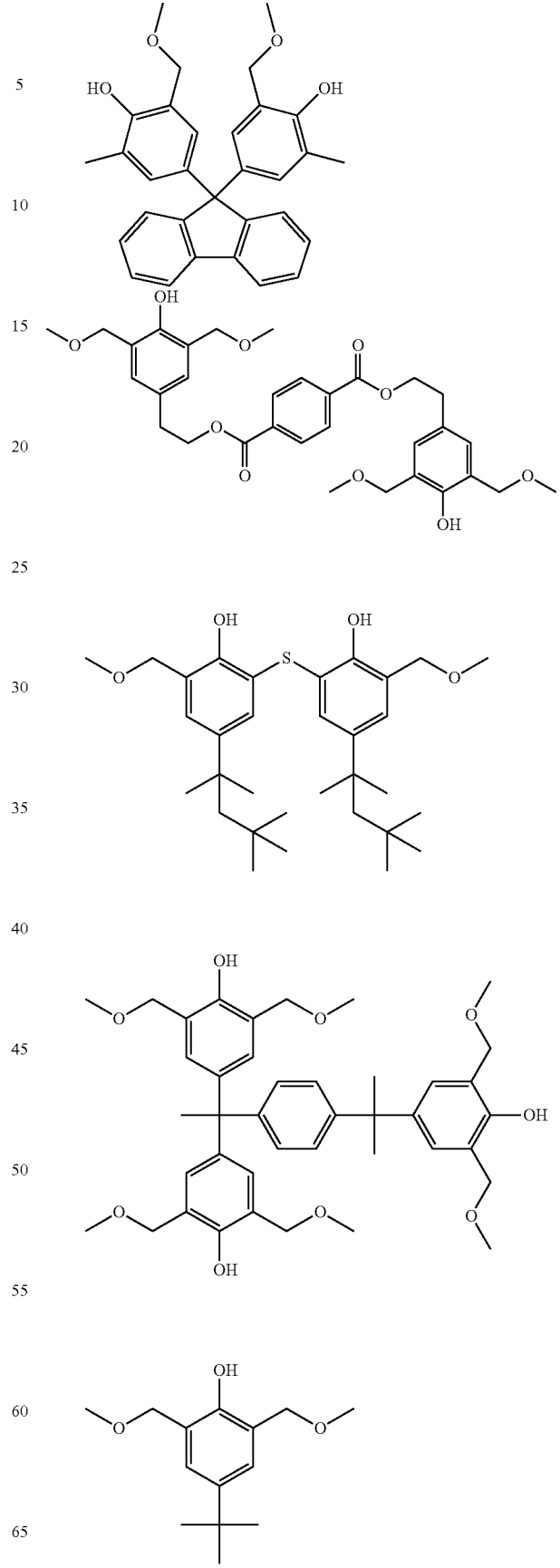

129
-continued
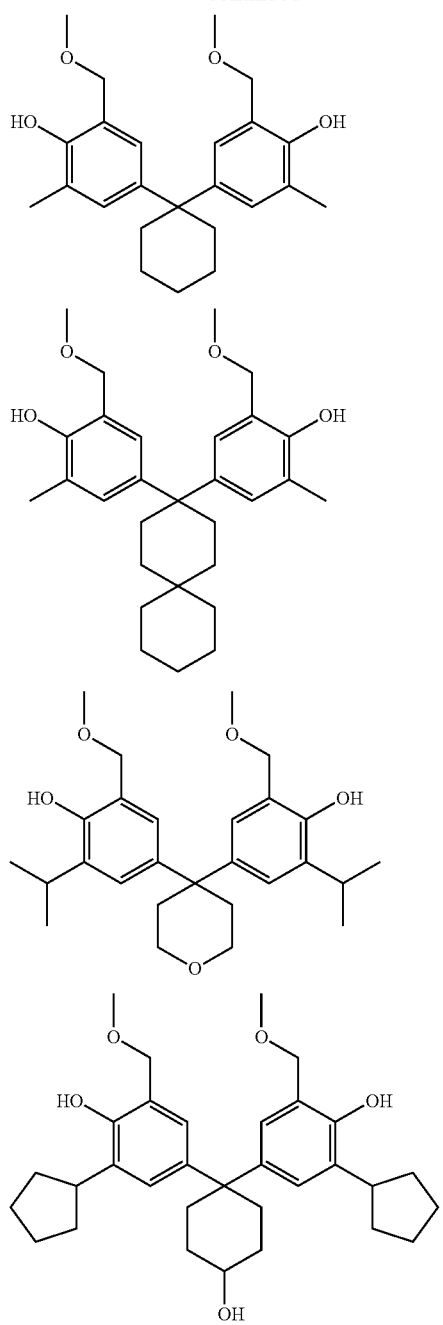
130
-continued
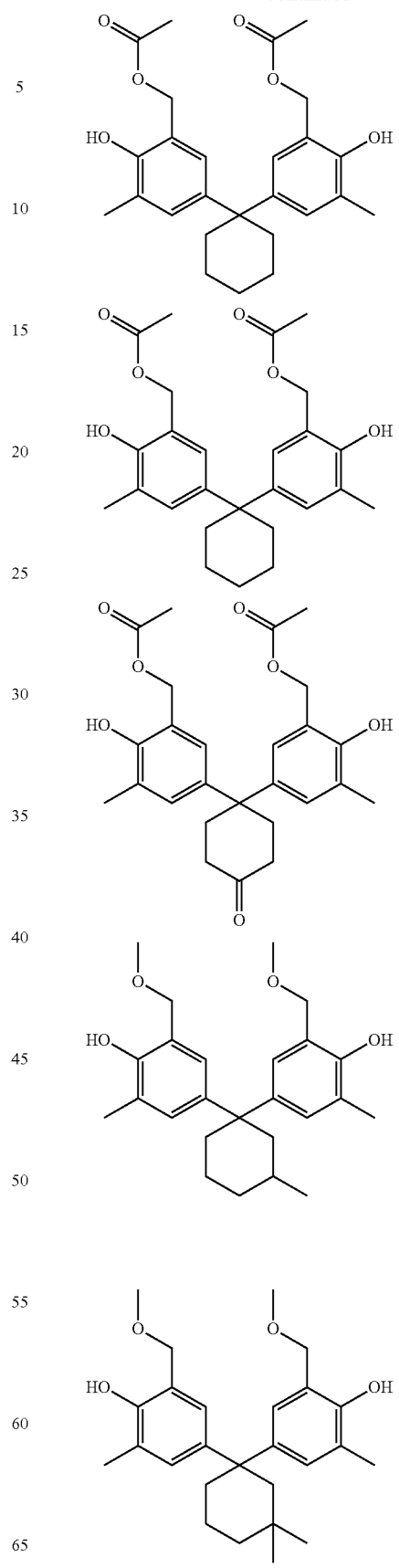

131
-continued
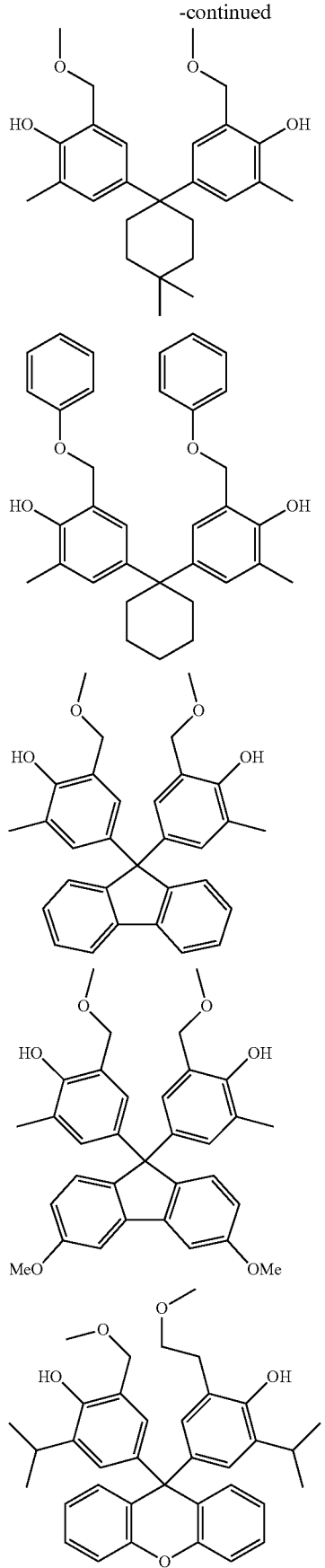
132
-continued
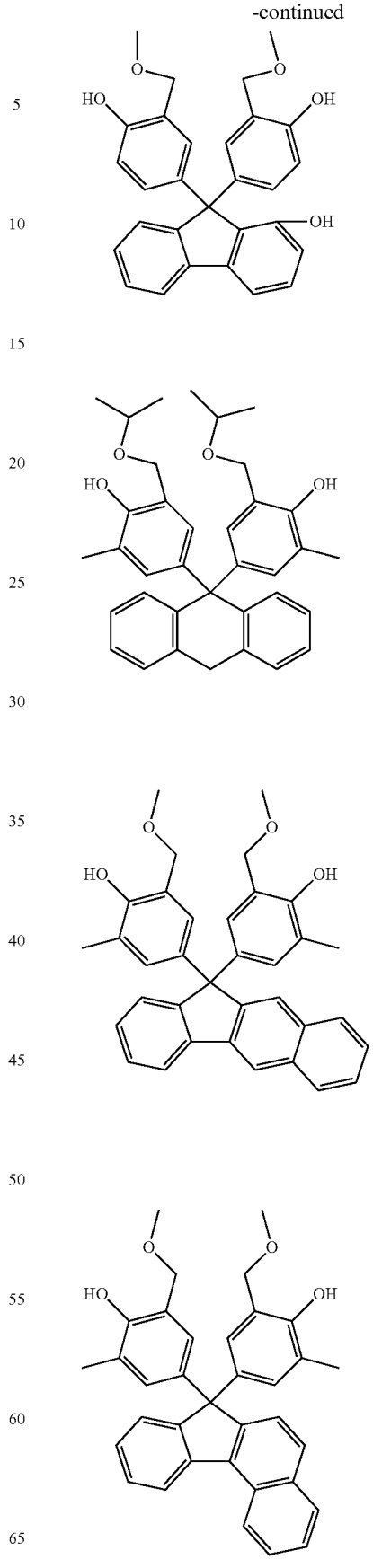

133
-continued
134
-continued
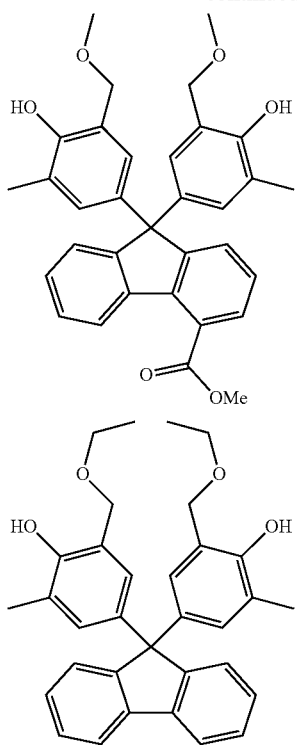
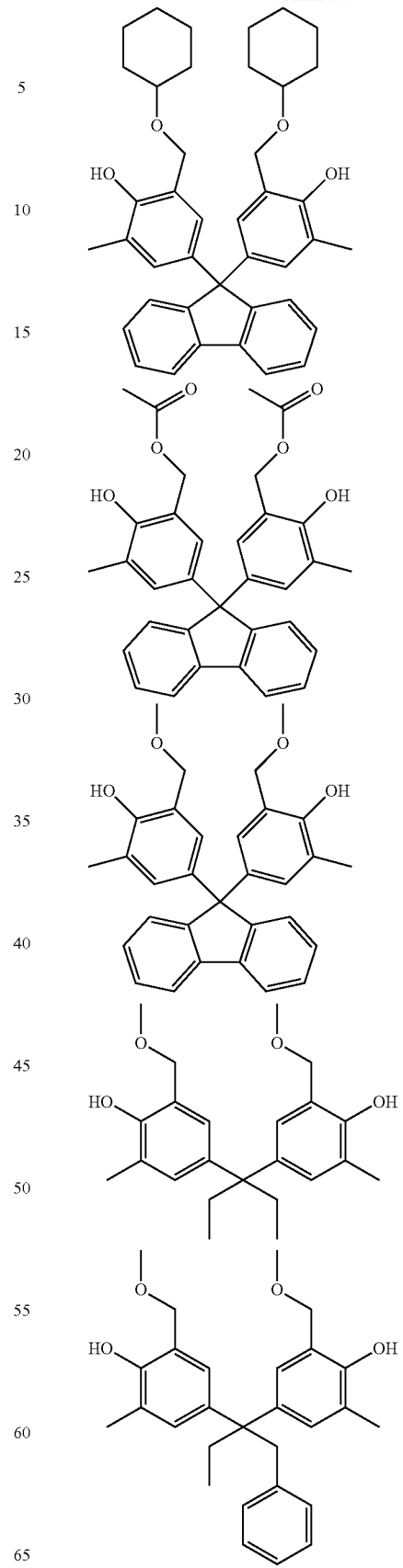
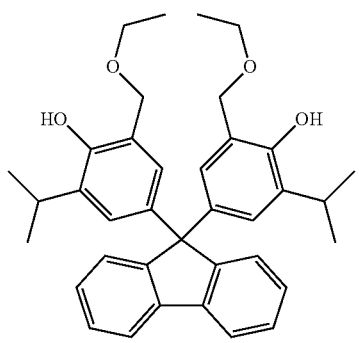
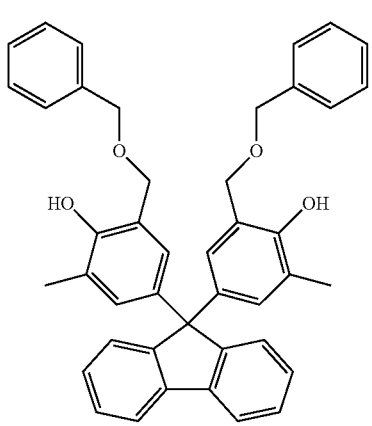

The method of synthesizing a crosslinking agent according to the present invention can be appropriately selected according to a target compound, and is not limited to a specific synthesizing method. Examples thereof include a method of obtaining a crosslinking agent by performing substitution reaction using a compound having both of a crosslinking group and a nucleophilic group (for example, a hydroxyl group) and a compound having a polar conversion group and a leaving group (a halogen atom such as bromine) as raw materials.

The content of the crosslinking agent according to the present invention is preferably 3 to 65 mass % and more preferably 5 to 50 mass % with respect to the solid content of the actinic ray-sensitive or radiation-sensitive resin composition according to the present invention.

According to the present invention, the crosslinking agent may be used singly or two or more kinds thereof may be used in combination.

As the crosslinking agent, commercially available products can be used, or a crosslinking agent may be synthesized in a well-known method. For example, a phenol derivative having a hydroxymethyl group can be obtained by causing a corresponding phenol compound not having a hydroxymethyl group and formaldehyde under a basic catalyst to react with each other. At this point, in order to prevent resinification and gelation, it is preferable to perform the reaction at a temperature of 60° C. or lower. Specifically, the synthesization may be performed by the methods disclosed in JP1994-282067A (JP-H06-282067A) and JP1995-64285A (JP-H07-64285A).

A phenol derivative having an alkoxymethyl group can be obtained by causing a corresponding phenol derivative having a hydroxymethyl group and an alcohol under an acid. catalyst to react with each other. At this point, in order to prevent resinification and gelation, it is preferable to perform the reaction at a temperature of 100'C or lower. Specifically, the synthesization may be performed by the methods disclosed in EP632003A1. The phenol derivative having a hydroxymethyl group or an alkoxymethyl group is preferable in view of preservation stability, but the phenol derivative having an alkoxymethyl group is particularly preferable in view of preservation stability. A phenol derivative which has two or more hydroxyrnethyl groups or alkoxymethyl groups in total and which is obtained by concentrating the groups in some benzene rings or combining the groups in a divided manner may be used singly or two or more kinds thereof may be used in combination.

Examples of the crosslinking agent include (i) a compound having an N-hydroxymethyl group, an N-alkoxymethyl group, or an N-acyloxymethyl group, and (ii) an epoxy compound. Specifically, the compound generally represented by [0294] to [0315] of JP2012-242556A can be suitably used. Particularly, the compound having an N-hydroxymethyl group, an N-alkoxymethyi group, or an N-acyloxymethyl group is preferably a compound having two or more (more preferably two to eight) partial structures represented by Formula (CLNM-1).

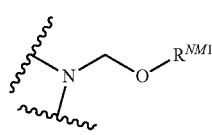
(CLNM-1)

In Formula (CLNM-1),
$R^{NM1}$ represents a hydrogen atom, an alkyl group, a cycloalkyl group, or an oxoalkyl group.

In a more preferable aspect of the compound having two or more partial structures represented by Formula (CLNM-1), a urea-based crosslinking agent represented by Formula (CLNM-2), an alkylene urea crosslinking agent represented by Formula (CLNM-3), a glycoluril-based crosslinking agent represented by Formula (CLNM-4), and a melamine-based crosslinking agent represented by Formula (CLNM-5) are exemplified.

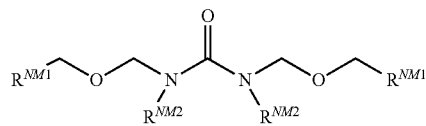
(CLNM-2)

In Formula (CLNM-2),
$R^{NM1}$'s are each independently the same as $R^{NM1}$'s in Formula (CLNM-1).
$R^{NM2}$ each independently represent a hydrogen atom, an alkyl group (preferably having 1 to 6 carbon atoms), or a cycloalkyl group (preferably having 5 to 6 carbon atoms).

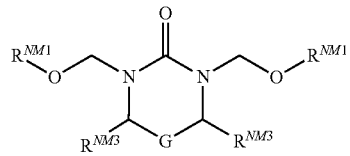
(CLNM-3)

In Formula (CLNM-3),
$R^{NM1}$'s are each independently the same as $R^{NM1}$ in Formula (CLNM-1).
$R^{NM3}$'s each independently represent a hydrogen atom, a hydroxyl group, a linear or branched alkyl group (preferably having 1 to 6 carbon atoms), a cycloalkyl group (preferably having 5 to 6 carbon atoms), an oxoalkyl group (preferably having 1 to 6 carbon atoms), an alkoxy group (preferably having 1 to 6 carbon atoms) oxoalkoxy group (preferably having 1 to 6 carbon atoms)

G represents a single bond, an oxygen atom, a sulfur atom, an alkylene group (preferably having 1 to 3 carbon atoms), or a carbonyl group.

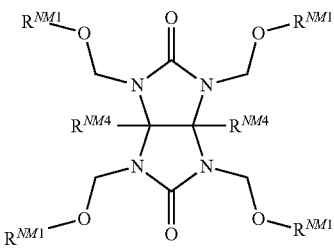
(CLNM-4)

In Formula (CLNM-4),
$R^{NM1}$'s are each independently the same as $R^{NM1}$ in Formula (CLNM-1).
$R^{NM4}$ each independently represent a hydrogen atom, a hydroxyl group, an alkyl group, a cycloalkyl group, or an alkoxy group.

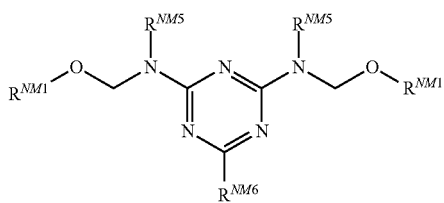
(CLNM-5)

In Formula (CLNM-5),
$R^{NM1}$'s are each independently the same as $R^{NM1}$'s in Formula (CLNM-1).
$R^{NM5}$ each independently represent a hydrogen atom, an alkyl group, a cycloalkyl group, an aryl group, or an atomic group represented by Formula (CLNM-5').
$R^{NM6}$ represents a hydrogen atom, an alkyl group, a cycloalkyl group, an group, or an atomic group represented by Formula (CLNM-5").

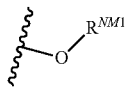
(CLNM5')

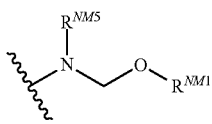
(CLNM5")

In Formula (CLNM-5'),
$R^{NM1}$ is the same as $R^{NM1}$ in Formula (CLNM-1).
Formula (CLNM-5"),
$R^{NM1}$ is the same as $R^{NM1}$ in Formula (CLNM-1), and $R^{NM5}$ is the same as $R^{NM5}$ in Formula (CLNM-5).

Alkyl groups of $R^{NM5}$ and $R^{NM6}$ each are preferably an alkyl group having 1 to 6 carbon atoms, cycloalkyl groups each are preferably a cycloalkyl group having 5 to 6 carbon atoms, and aryl groups each are preferably an aryl group having 6 to 10 carbon-atoms.

In Formulae (CLNM-1) to (CLNM-5), groups represented by $R^{NM1}$ to $R^{NM6}$ may further have substituents.

Hereinafter, specific examples of the compound having two or more partial structures represented by Formula (CLNM-1) are provided below, but the present invention is not limited thereto.

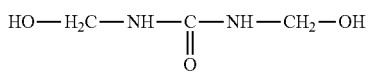
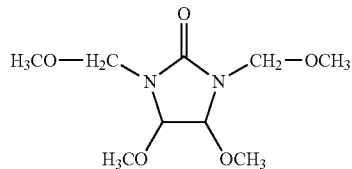
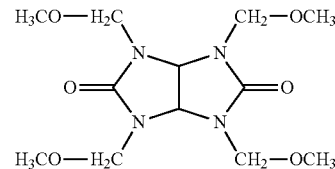

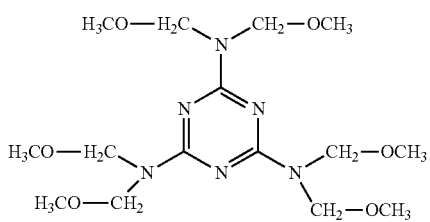
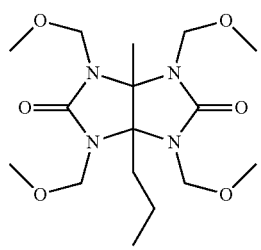
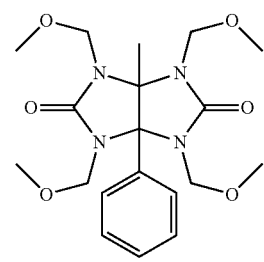

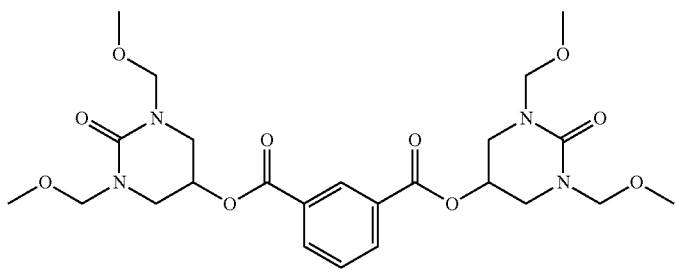

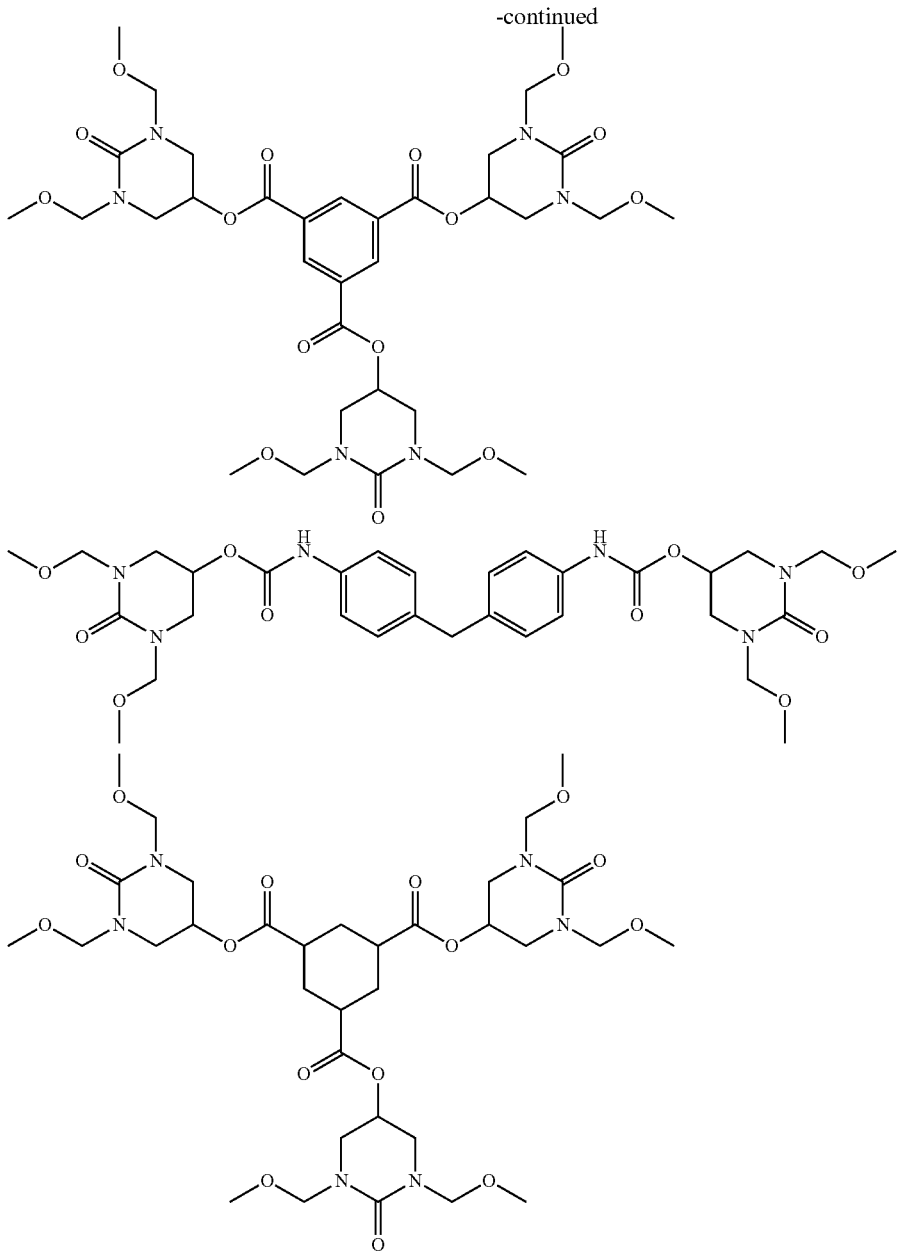

As the low molecular compound [N-C], tertiary alcohol having a hydroxyl group on a carbon that is directly bonded to an aromatic ring as provided above can be also used. Compounds disclosed in JP1997-197672A (JP-H9-197672A), JP2001-324811A, and JP2000-31020A can be suitably used.

As the low molecular compound [N—C], a compound represented by Formula (X) is preferable.

Formula (X)

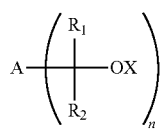

X represents a hydrogen atom, an alkyl group, a cycloalkyl group, an aryl group, or an acyl group.

A represents an aromatic hydrocarbon group, an aromatic heterocyclic group, or an alicyclic group.

$R_1$ and $R_2$ each independently represent a hydrogen atom, an alkyl group, a cycloalkyl group, or an aryl group. Here, all $R_1$ and all $R_2$ do not have to be hydrogen atoms, at the same time.

n's each independently represent an integer of 2 or greater.

The compound represented by Formula (X) is preferably a compound represented by Formula (1), (2), (3), (4), or (I).

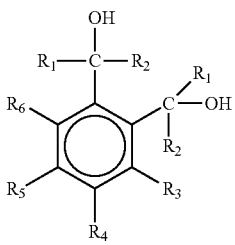
(1)

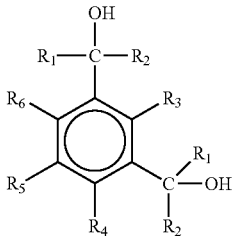
(2)

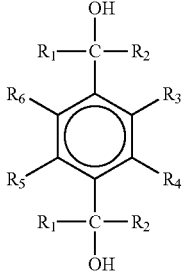
(3)

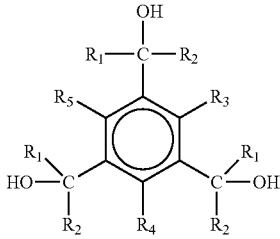
(4)

Here, $R_1$ and $R_2$ represent a hydrogen atom or a substituted or unsubstituted alkyl group having 1 to 4 carbon atoms. $R_3$, $R_4$, $R_5$, and $R_6$ each independently represent a hydrogen atom, a halogen atom, or an atom or an atomic group selected from a substituted or unsubstituted alkyl group having 1 to 4 carbon atoms, a substituted or unsubstituted alkoxy group having 1 to 4 carbon atoms, a phenyl group, a methoxy group, and a cyclopropyl group, $R_1$ and $R_2$ may be identical to or different from each other. $R_3$, $R_4$, $R_5$, and $R_6$ may be may be identical to or different from each other.

Formula (I)

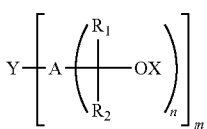

In the formula,

X represents a hydrogen atom, an alkyl group, a cycloalkyl group, an aryl group, or an acyl group.

A represents an aromatic hydrocarbon group, an aromatic heterocyclic group, or an alicyclic group.

$R_1$ and $R_2$ each independently represent a hydrogen atom, an alkyl group, a cycloalkyl group, or an aryl group. Here, all $R_1$ and all $R_2$ do not have to be hydrogen atoms, at the same time.

m and n each independently represent an integer of 1 or greater.

In a case where at least one of in and n represents an integer of 2 or greater, a plurality of $R_1$'s, a plurality of $R_2$'s, and a plurality of X's may be identical to or different from each other.

In a case where M represents an integer of 2 or greater, a plurality of A's may be identical to or different from each other.

Y represents an m-valent group. Y is preferably an m-valent group having a hetero atom.

A and at least one of $R_1$ and $R_2$ are bonded to each other to form a ring.

$R_1$ and $R_2$ are bonded to each other, so as to form a ring together with a carbon atom to which these are bonded.

Formula (X) is preferably Formula (I-1).

Formula (I-1)

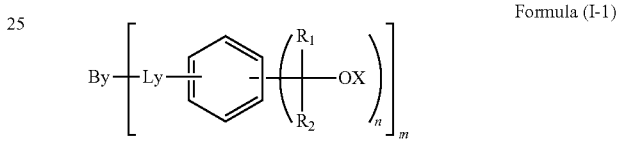

In Formula (I-1),

X represents a hydrogen atom, an alkyl group, a cycloalkyl group, an aryl group, or an acyl group.

$R_1$ and $R_2$ each independently represent a hydrogen atom, an alkyl group, a cycloalkyl group, or an aryl group. Here, all $R_1$ and all $R_2$ do not have to be hydrogen atoms, at the same time.

Ly represents —S—, —O—, —CO—, —SO$_2$—, an alkylene group, and a divalent group obtained by combining a plurality of these.

m and n each independently represent an integer of 1 or greater.

In a case where at least one of m and n is an integer of 2 or greater, a plurality of $R_1$'s, a plurality of $R_2$'s, and a plurality of X's are identical to or different from each other.

In a case where in represents an integer of 2 or greater, a plurality of Ly's may be identical to or different from each other.

$R_1$ and $R_2$ are bonded to each other to from a ring together with a carbon atom to which these are bonded.

By represents an m-valent group having one structure selected from the following six structures.

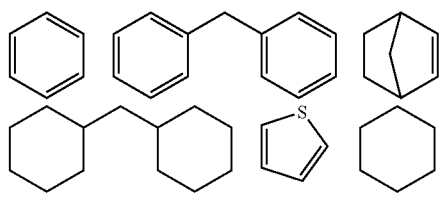

Specific examples and preferable ranges of X, $R_1$, $R_2$, $R_0$, m, and n in Formula (I) are respectively the same as the specific examples and the preferable ranges of X, $R_1$, $R_2$, $R_0$, m, and n in Formula (I-1).

Ly represents —S—, —O—, —CO—, —SO$_2$—, —N(R$_o$)—, —SO$_2$—, an alkylene group, and a divalent group obtained by combining a plurality of these. The alkylene group is preferably an alkylene group having 1 to 5 carbon atoms.

The compound (D) can be synthesized, for example, by the same method as in the synthesization of 2,2'-(5-hydroxy-1,3-phenylene) dipropan-2-ol in Journal of Photopolymer Science and Technology Volume 26, Number 5 (2013) 665-671.

Examples of the secondary or tertiary alcohol having a hydroxyl group on carbon directly bonded to an aromatic ring used in the present invention include α,α'-dimethyl-1,2-benzenedimethanol, α,α'-diethyl-1,2-benzenedimethanol, 4-methoxy-α,α'-dimethyl-1,2-benzenedimethanol, 4,5-dichloro-α,α'-dimethyl-1,2-benzenedimethanol, 4,5,α,α'-tetramethyl-1,2-benzenedimethanol, α,α'-dimethyl-1,3-benzenedimethanol, α,α'-diethyl-1,3-benzenedimethanol, 5-methoxy-α,α'-dimethyl-1,3-benzenedimethanol, 5-chloro-α,α'-dimethyl-1,3-benzenedimethanol, 5-bromo-α,α'-dimethyl-1,3-benzenedimethanol, α,α'-dimethyl-1,4-benzenedimethanol, α,α'-diethyl-1,4-benzenedimethanol, 2,3,5,6,α,α'-hexamethyl-1,4-benzenedimethanol, 2-chloro-α,α'-dimethyl-1,4-benzenedimethanol, 2-bromo-α,α'-dimethyl-1,4-benzenedimethanol, α,α',α''-trimethyl-1,3,5-benzene trimethanol, α,α',α''-triethyl-1,3,5-benzene trimethanol, α,α',α''-trihydroxy-1,3,5-triisopropylbenzene, α,α'-dimethyl-1,5-naphthalenedimethanol, α,α'-dimethyl-1,4-naphthalenedimethanol, and α,α'-dimethyl-9,10-anthracenedimethanol.

Among secondary or tertiary alcohol having a hydroxyl group on carbon directly bonded to an aromatic ring used in the present invention, tertiary alcohol is efficiently dehydrated in the presence of small amount of acid, and thus is more preferable as a material for forming a high sensitivity pattern. The tertiary alcohol having three or more 2-hydroxyisopropyl groups on the same aromatic ring is less volatile in a case of pre-exposure baking and is more preferable as an alcohol compound used for the pattern forming material of the present invention.

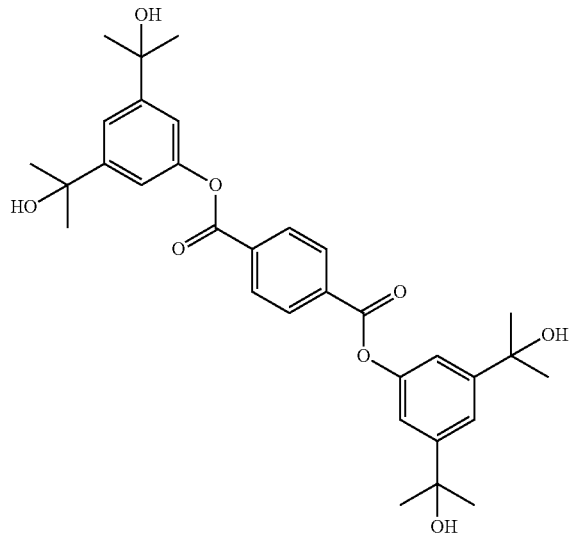

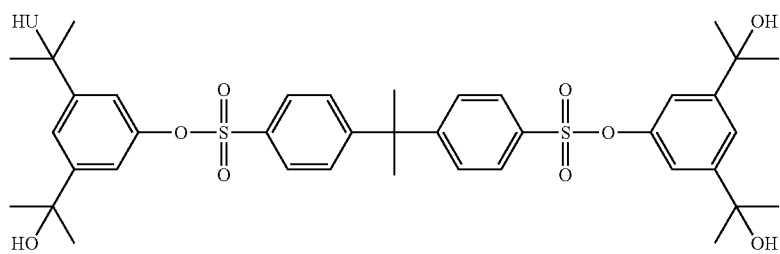

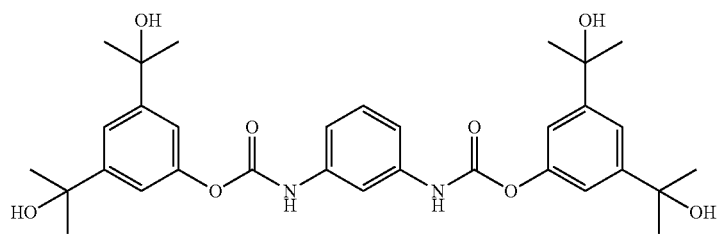

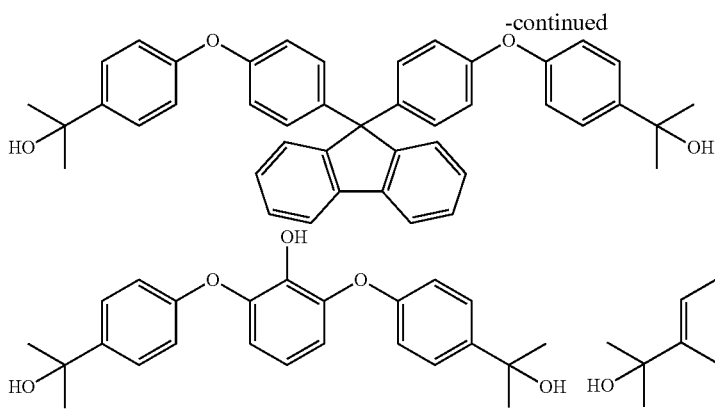

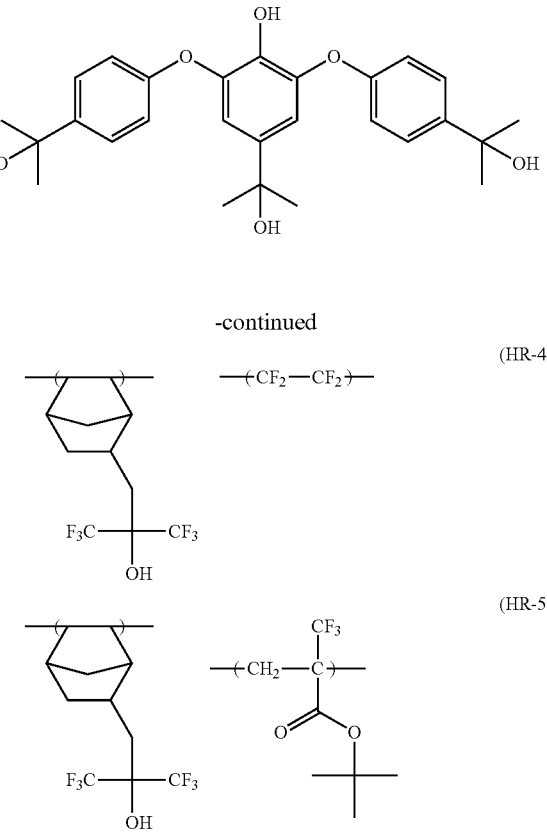

The actinic ray-sensitive or radiation-sensitive resin composition of the present invention preferably contains a compound having a molecular weight of 500 or greater as the low molecular compound [N—C]. Accordingly, it is possible to suppress volatilization from the inside of the film under the vacuum in a case of the pre-exposure baking step, the post exposure baking step, and the exposure.

<Hydrophobic Resin (HR)>

The actinic ray-sensitive or radiation-sensitive resin composition according to the present invention may have a hydrophobic resin (HR) different. from the resin (A).

The hydrophobic resin (HR) preferably contains a group having a fluorine atom, a group having a silicon atom, or a hydrocarbon group having 5 or greater carbon atoms, in order to evenly exist on the surface of a film. These groups may be included in a main chain or may be substituted on a side chain. Specific examples of the hydrophobic resin (HR) are provided below.

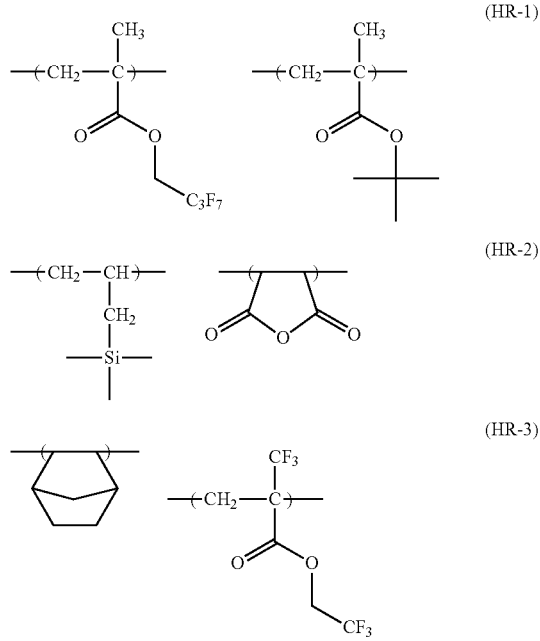

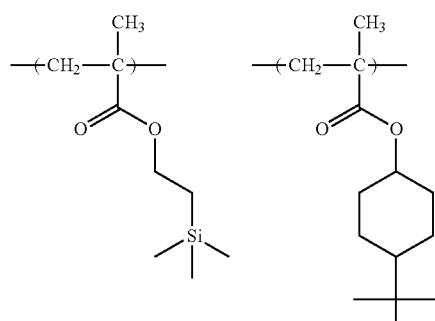
(HR-9)
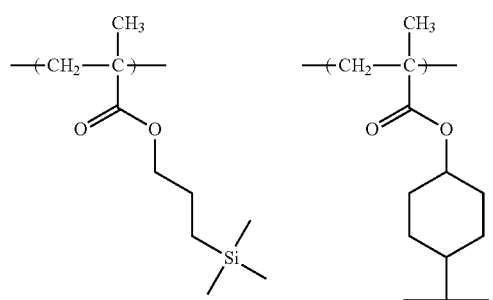
(HR-10)
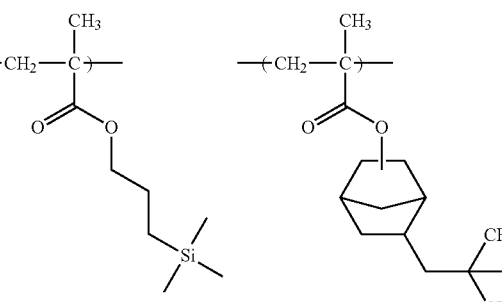
(HR-11)
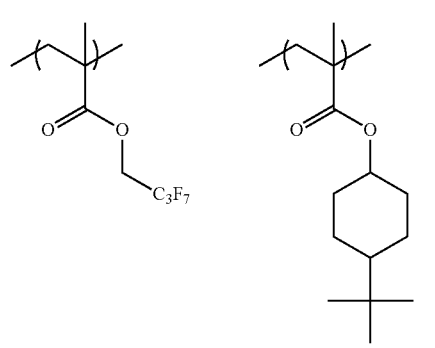
(HR-12)
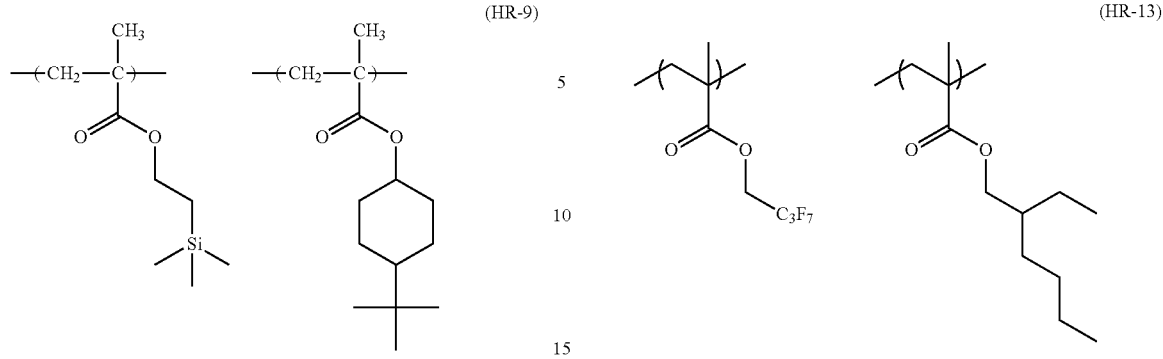
(HR-13)
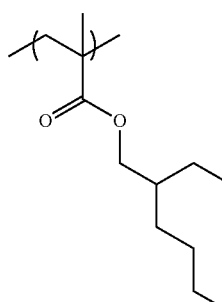
(HR-14)
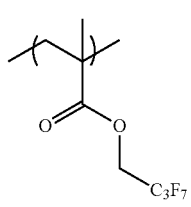
(HR-15)
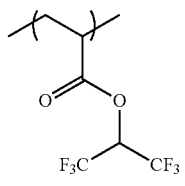
(HR-16)
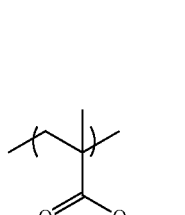
(HR-17)
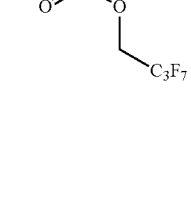
(HR-18)

(HR-19)
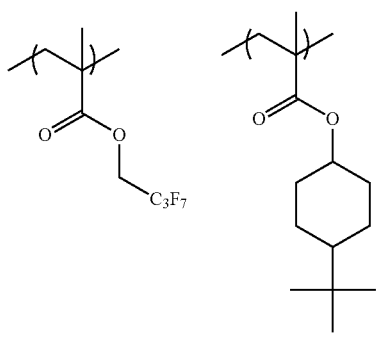
(HR-20)
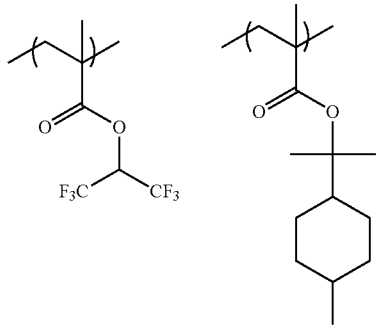
(HR-21)
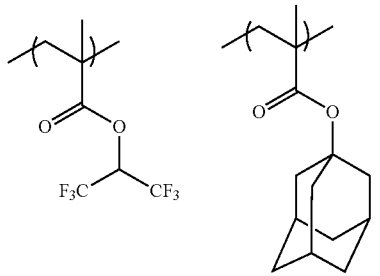
(HR-22)
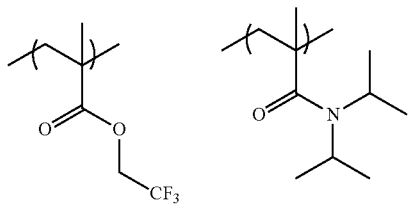
(HR-23)
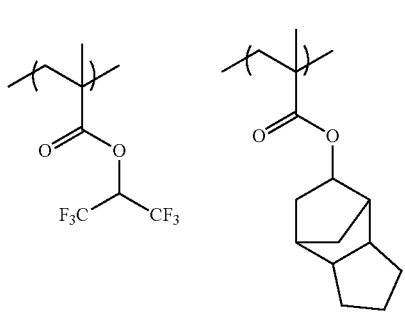
(HR-24)
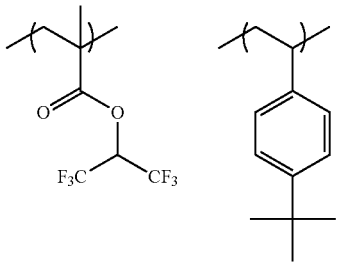
(HR-25)
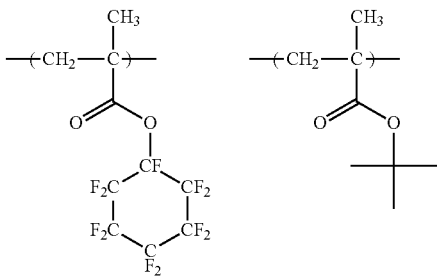
(HR-26)
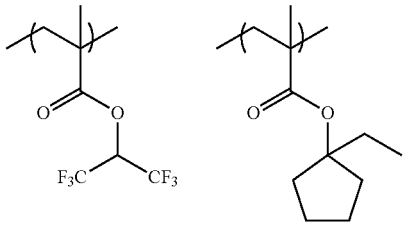
HR-27
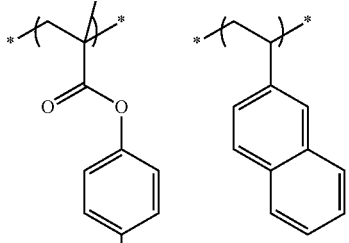
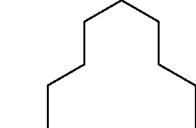
HR-28
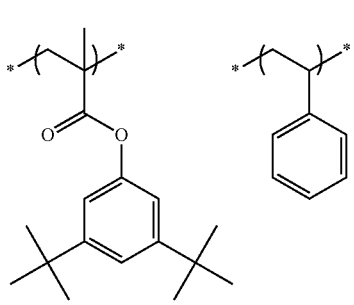

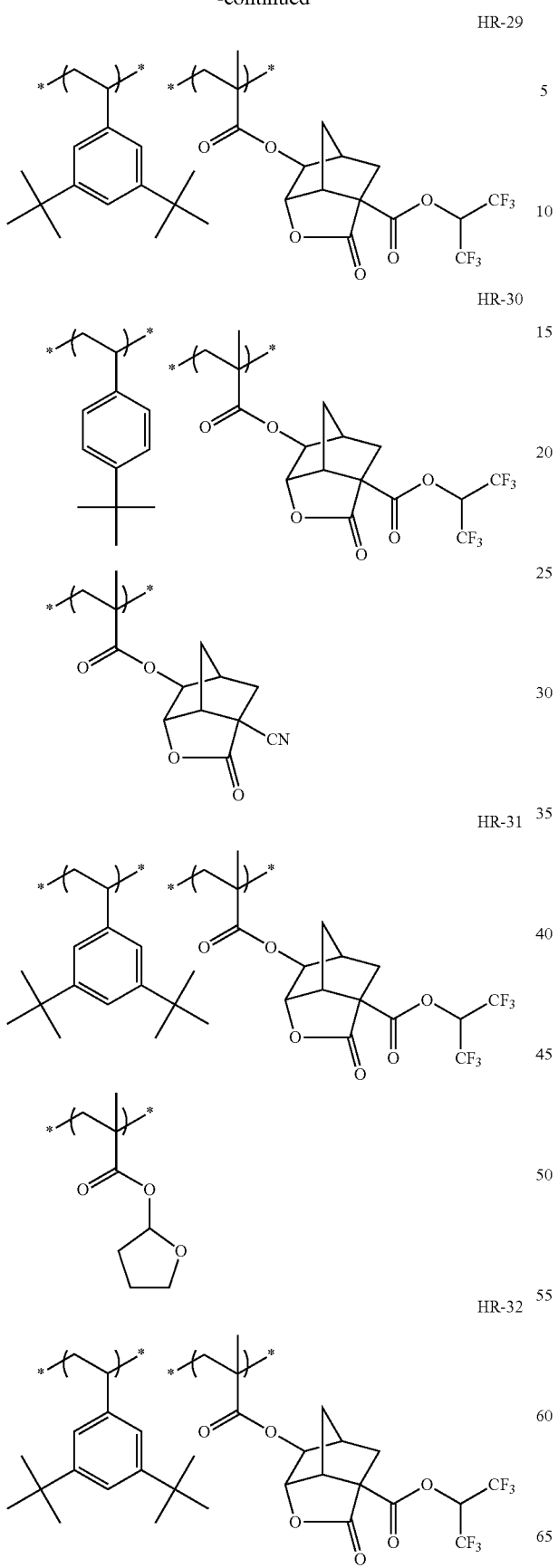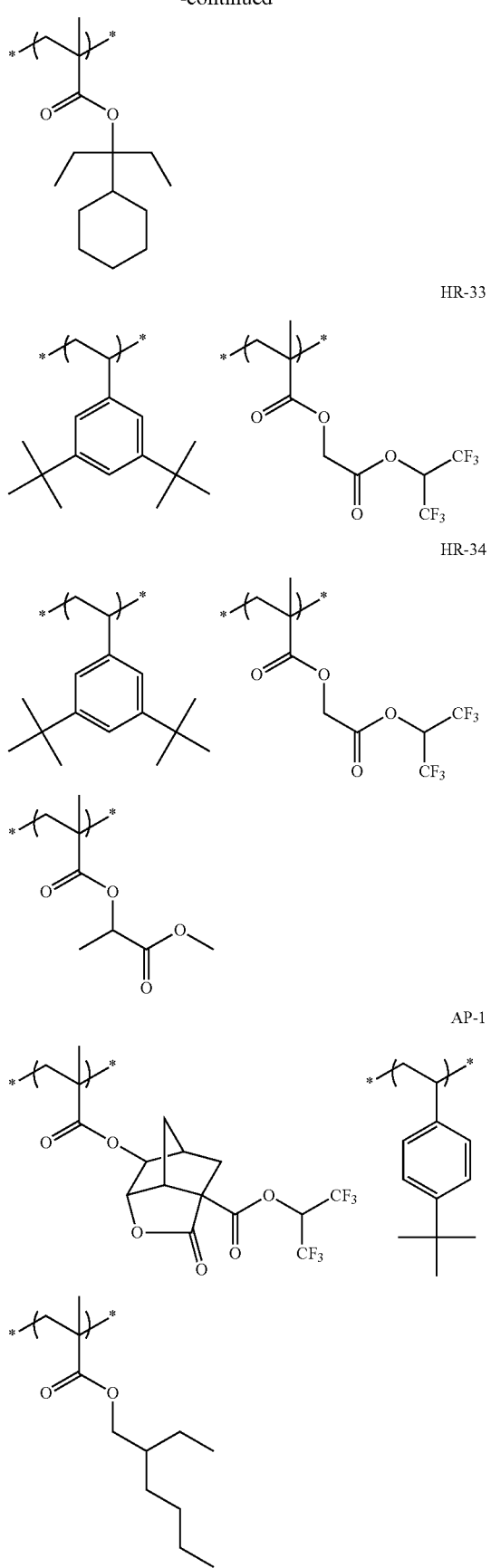

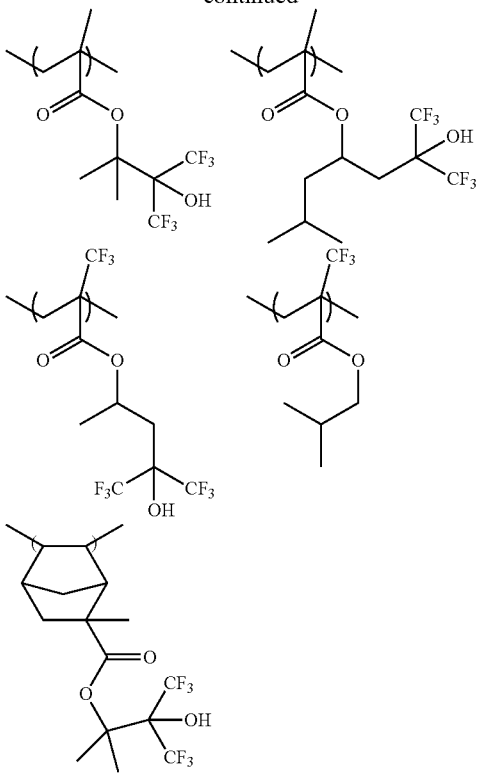

In addition to the above, resins disclosed in JP2011-248019A, JP2010-175859A, and JP2012-032544A can be preferably used as the hydrophobic resin.

The content of the hydrophobic resin in the actinic ray-sensitive or radiation-sensitive resin composition can be appropriately adjusted to be used, such that a receding contact angle of the actinic ray-sensitive or radiation-sensitive resin film is within the above range. However, the content thereof is preferably 0.01 to 20 mass %, more preferably 0.1 to 15 mass %, even more preferably 0.1 to 10 mass %, and particularly preferably 0.2 to 8 mass % with respect to the total solid content of the actinic ray-sensitive or radiation-sensitive resin composition.

The hydrophobic resin may be used singly or two or more kinds thereof may be used in combination.

<Surfactant>

The composition according to the present invention may further contain a surfactant in order to improve coating properties. Examples of the surfactant are not particularly limited, but include nonionic surfactants such as polyoxyethylene alkyl ethers, polyoxyethylene alkylallyl ethers, polyoxyethylene polyoxypropylene block copolymers, sorbitan fatty acid esters, polyoxyethylene sorbitan fatty acid esters, fluorine-based surfactants such as MEGAFACE F171 and F176 (manufactured by DIC Corporation) and FLUO-RAD FC430 (manufactured by Sumitomo 3M Limited) and SURFYNOL E1004 (manufactured by Asahi Glass Co., Ltd.), and PF656 and PF6320 manufactured by OMNOVA Solutions Inc., and an organosiloxane polymer such as a polysiloxane polymer KP-341 (manufactured by Shin-Etsu Chemical Co., Ltd.).

In a case where the composition according to the present invention contains a surfactant, the usage amount of the surfactant is preferably 0.0001% to 2% by mass and more preferably 0.0005% to 1% by mass with respect to a total amount (except for a solvent) of the actinic ray-sensitive or radiation-sensitive resin composition.

<Carboxylic Acid Onium Salt>

The composition according to the present invention may contain carboxylic acid onium salt. Examples of the carboxylic acid onium salt include carboxylic acid sulfonium salt, carboxylic acid iodonium salt, and carboxylic acid ammonium salt. Particularly, as the carboxylic acid onium salt, carboxylic acid iodonium salt and carboxylic acid sulfonium salt are preferable. According to the present invention, it is preferable that a carboxylate residue of the carboxylic acid onium salt does not contain an aromatic group and a carbon-carbon double bond. As a particularly preferable anion portion, a linear, branched, monocyclic or polycyclic cyclic alkylcarboxylate anion having 1 to 30 carbon atoms is preferable. An anion of a carboxylic acid in which a portion or all of alkyl groups are substituted with fluorine is more preferable. An oxygen atom may be included in an alkyl chain. Accordingly, transparency with respect to light of 220 nm or less is secured, and thus sensitivity and resolving power are improved, such that density dependency and exposure margins are improved.

<Compound Having Two or More Structures Represented by Formula (F1) and Not Having Acid Crosslinking Group>

The actinic ray-sensitive or radiation-sensitive resin composition of the present invention may contain (F) a compound (hereinafter, referred to as a compound (F)) that has two or more structures represented by Formula (F1).

In the formula, X represents an oxygen atom or a sulfur atom, R represents a hydrogen atom or a monovalent organic group. * represents a bonding hand.

In a case where the actinic ray-sensitive or radiation-sensitive resin composition has the compound, the resins interact with each other via the compound, a pseudo-crosslinked structure consisting of the compound (F) and the resin (A) is formed, destruction of the pattern or the like hardly occurs, the resolution is enhanced, and the pattern sectional shape becomes excellent.

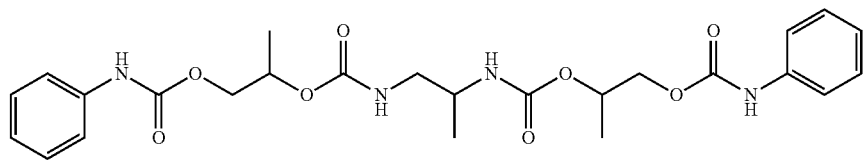

(A-1)

(A-2)

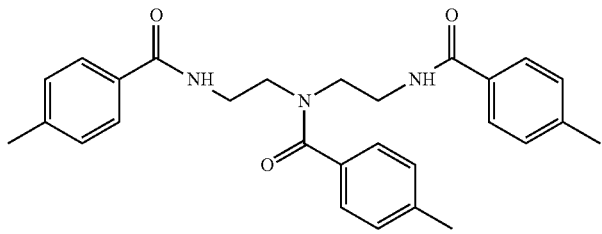

<Compound that is Decomposed Due to Action of an Acid and Generates Acid>

The chemical amplification type resist composition may include one or more types of compounds that is decomposed due to an action of an acid and generates an acid. The acid that is generated by the compound that is decomposed due to an action of an acid and generates an acid is preferably a sulfonic acid, a methide acid, or an imide acid.

Hereinafter, examples of the compounds that can be used in the present invention are provided, but the present invention is riot limited thereto.

(PA-1)

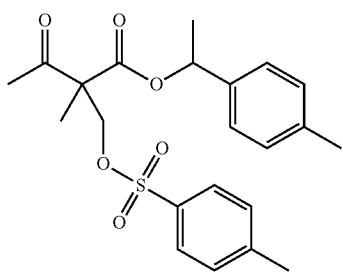

(PA-2)

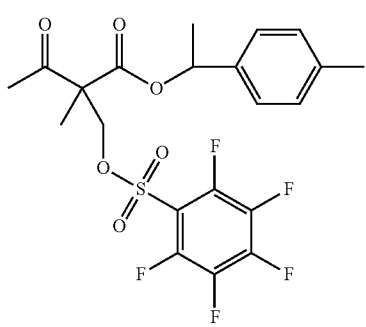

(PA-3)

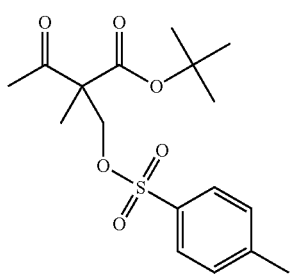

(PA-4)

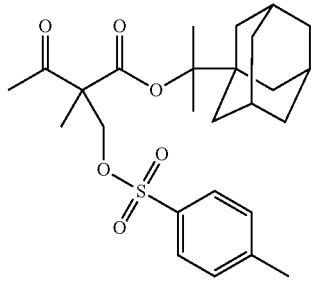

(PA-5)

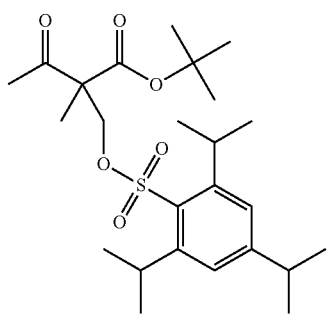

(PA-6)

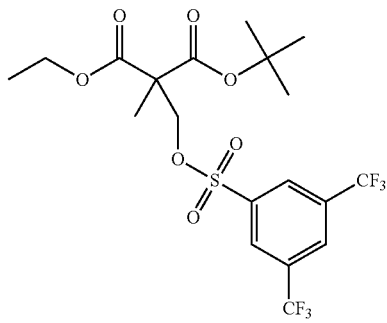

(PA-7)

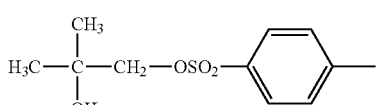

(PA-8)

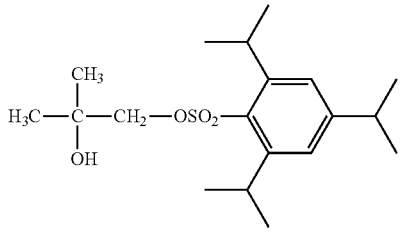

(PA-9) 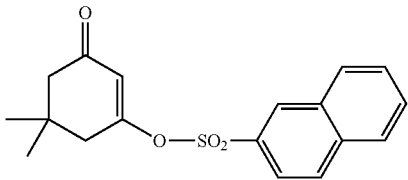

(PA-10) 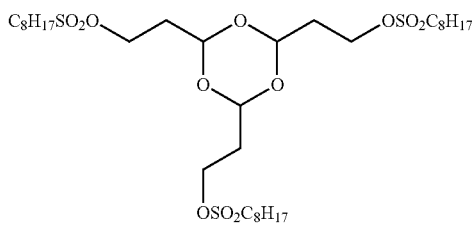

(PA-11) 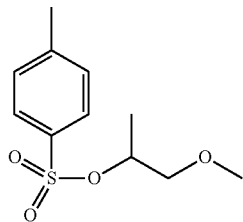

(PA-12) 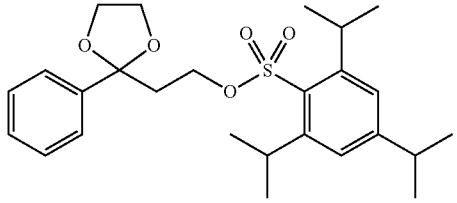

(PA-13) 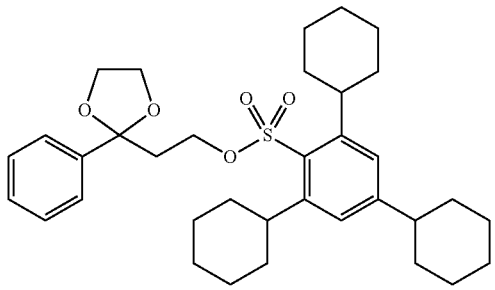

(PA-14) 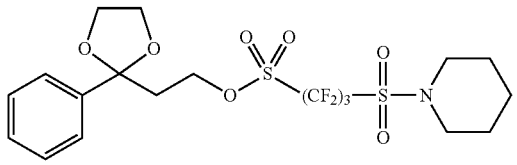

(PA-15) 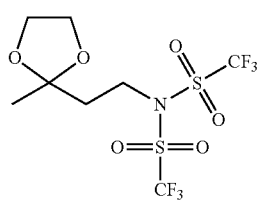

(PA-16) 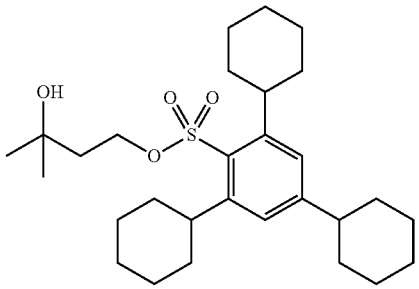

(PA-17) 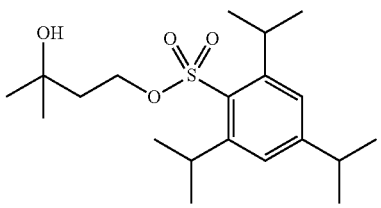

(PA-18) 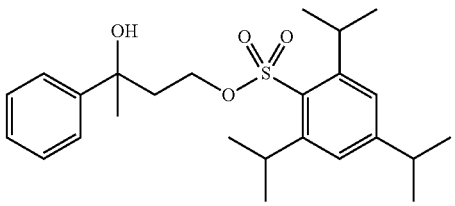

The composition according to the present invention may further contain a dye, a plasticizer, and an acid proliferating agent (disclosed in WO95/29968A, WO98/24000A, JP1996-305262A (JP-H08-305262A), JP1997-34106A (JP-H09-34106A), JP1996-248561A (JP-H08-248561A), JP1996-503082A (JP-H08-503082A), US5445917A, JP1996-503081A (JP-H08-503081A), US5534393A, US5395736A, US5741630A, US5334489A, US5582956A, US5578424A, US5453345A, EP665960B, EP757628B, EP665961B, US5667943A, JP1998-1508A (JP-H10-1508A), JP1998-282642A (JP-H10-282642A), JP1997-512498A (JP-H10-282642A), JP2000-62337A, JP2005-17730A, and JP2008-209889A) other than the acid generator (B), if necessary. With respect to these compounds, respective compounds disclosed in JP2008-268935A can be included.

Subsequently, an overcoat composition that may be used in the pattern forming method of the present invention is described below.

<Overcoat Composition>

The overcoat composition may include, for example, an overcoat resin, an additive, and a solvent.

[Overcoat Resin]

The overcoat resin is not particularly limited. However, a resin that is the same as the hydrophobic resin that can be included in the actinic ray-sensitive or radiation-sensitive resin composition can be used.

With respect to the hydrophobic resin, disclosure in [0017] to [0023] of JP2013-61647A ([0017] to [0023] of corresponding US2013/244438A), [0016] to [0165] of JP2014-56194A, and paragraphs 0014 to 0077 of JP2015-152773A can be referred to, and the contents thereof are incorporated to the present specification.

According to the present invention, the overcoat composition preferably includes a resin containing a repeating unit that has an aromatic ring. In a case where a repeating unit that has an aromatic ring is contained, especially in the electron beams or EUV exposure, the generation efficiency of secondary electrons and the acid generation efficiency from a compound that generates an acid by actinic rays or radiation are increased, and the effect of high sensitivity and high resolution in a case of pattern formation can be expected.

The weight-average molecular weight of the resin is preferably 3,000 to 100,000, more preferably 3,000 to 30,000, and most preferably 5,000 to 20,000. The formulation amount of the resin in the composition for forming an upper layer film is preferably 50 to 99.9 mass %, more preferably 70 to 99.7 mass %, and even more preferably 80 to 99.5 mass % with respect to the total solid content.

The overcoat resin may be used singly or two or more kinds thereof may be used in combination.

In a case where the overcoat composition includes a plurality of resins (X), it is preferable to include at least one resin (XA) having a fluorine atom and/or a silicon atom. It is more preferable that the overcoat composition includes at least one resin (XA) having a fluorine atom and/or a silicon atom and a resin (XB) in which the content of a fluorine atom and/or a silicon atom is smaller than that in the resin (XA). Accordingly, in a case where an overcoat film is formed, the resin (XA) evenly exists on the surface of the overcoat film, and thus performance such as developability can be improved.

The content of the resin (XB) is preferably 0.01 to 30 mass %, more preferably 0.1 to 10 mass %, even more preferably 0.1 to 8 mass %, and particularly preferably 0.1 to 5 mass % with respect to the total solid content included in the overcoat composition. The content of the resin (XA) is preferably 50.0 to 99.9 mass %, more preferably 60 to 99.9 mass %, even more preferably 70 to 99.9 mass %, and particularly preferably 80 to 99.9 mass Io with respect to the total solid content included in the overcoat composition.

The preferable ranges of the contents of the fluorine atom and the silicon atom contained in the resin (XA) are the same as the preferable ranges in a case where the resin (X) has a fluorine atom and in a case where the resin (X) has a silicon atom.

As the resin (XB), an aspect in which a fluorine atom and a silicon atom are not substantially contained is preferable. In this case, specifically, the content of the sum of the repeating unit included in the fluorine atom and the repeating unit included in the silicon atom is preferably 0 to 20 mol %, more preferably 0 to 10 mol %, even more preferably 0 to 5 mol %, particularly preferably 0 to 3 mol %, and ideally 0 mol %, that is, not containing a fluorine atom and a silicon atom, with respect to the total repeating unit in the resin (XB).

The formulation amount of the resin (X) in the entire overcoat composition is preferably 50 to 99.9 mass % and more preferably 60 to 99.0 mass % with respect to the total solid content.

[Additive]

The overcoat composition may contain at least one compound selected from the group consisting of (A1) to (A4), as an additive.

(A1) Basic Compound or Base Generator
(A2) Compound containing a bond or a group selected from the group consisting of an ether bond, a thioether bond, a hydroxyl group, a thiol group, a carbonyl bond, and an ester bond
(A3) Ionic Compound
(A4) Compound having radical trapping group
[(A1) Basic Compound or Base Generator]

The overcoat composition preferably contains at least any one of a basic compound and a base generator (hereinafter, these may be collectively referred to as an "additive" or a "compound (A1)").

(Basic Compound)

The basic compound in which the overcoat composition is contained is preferably an organic basic compound and more preferably a nitrogen-containing basic compound. For example, the compounds described as the basic compound that may be contained in the actinic ray-sensitive or radiation-sensitive resin composition may be used. Specifically, compounds having structures represented by Formulae (A') to (E') are suitably exemplified.

For example, the basic compound (N'), the basic compound (N"), ammonium salt, onium salt, betaine compound, and compound classified into (1) to (4) which are exemplified as the acid diffusion control agent (C) that is contained in the actinic ray-sensitive or radiation-sensitive resin composition can be used.

(1) Compound Represented by Formula (BS-1)

(BS-1)

In Formula (BS-1),

R's each independently represent a hydrogen atom or an organic group. Here, at least one of the three R's is an organic group. This organic group is a linear or branched alkyl group, a monocyclic or polycyclic cycloalkyl group, an aryl group, or an aralkyl group.

The number of carbon atoms in the alkyl group as R is not particularly limited, and is generally 1 to 20 and preferably 1 to 12.

The number of carbon atoms in the cycloalkyl group as R is not particularly limited, and is generally 3 to 20 and preferably 5 to 15.

The number of carbon atoms of the aryl group as R is not particularly limited, and is generally 6 to 20 and preferably 6 to 10. Specifically, examples thereof include a phenyl group and a naphthyl group.

The number of carbon atoms of e aralkyl group as R is not particularly limited, and is generally 7 to 20 and preferably 7 to 11. Specifically, examples thereof include a benzyl group.

In the alkyl group, the cycloalkyl group, the aryl group, and the aralkyl group as R, a hydrogen atom may be substituted with a substituent. Examples of the substituent include an alkyl group, a cycloalkyl group, an aryl group, an aralkyl group, a hydroxy group, a carboxy group, an alkoxy group, an aryloxy group, an alkylcarbonyloxy group, and an. alkyloxycarbonyl group.

In the compound represented by Formula (BS-1), at least two or R's are preferably organic groups.

Specific examples of the compound represented by Formula (BS-1) include tri-n-butylamine, tri-isopropylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyl octadecyl amine, dimethyl undecyl amine, N,N-dimethyldodecylamine, methyl dioctadecyl amine, N,N-dibutylaniline, N,N-dihexylaniline, 2,6-diisopropylaniline, and 2,4,6-tri (t-butyl) aniline.

The preferable basic compound represented by Formula (BS-1) is an alkyl group in which at least one R is substituted with a hydroxy group. Specifically, examples thereof include triethanolamine and N,N-dihydroxyethylaniline.

The alkyl group as R may have an oxygen atom in an alkyl chain. That is, an oxyalkylene chain may be formed. As the oxyalkylene chain, —CH₂CH₂O— is preferable. Specifically, examples thereof include tris(methoxyethoxyethyl) amine and examples in 60th row and the following rows on Column 3 of U.S. Pat. No. 6,040,112.

Examples of the basic compound represented by Formula (BS-1) are provided below.

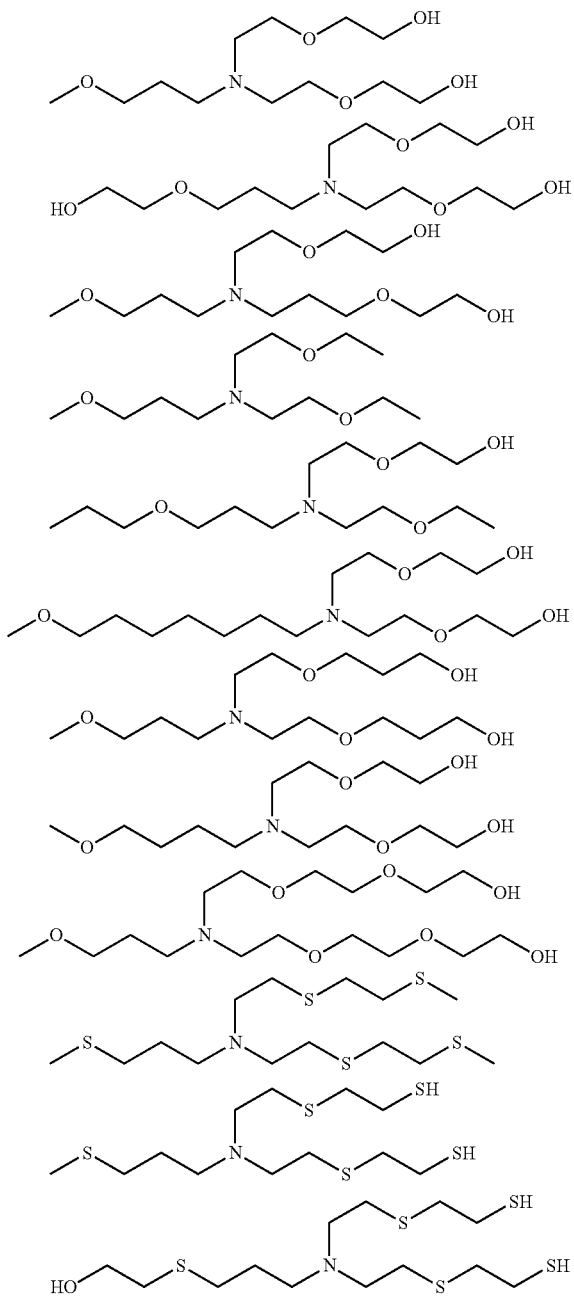

-continued

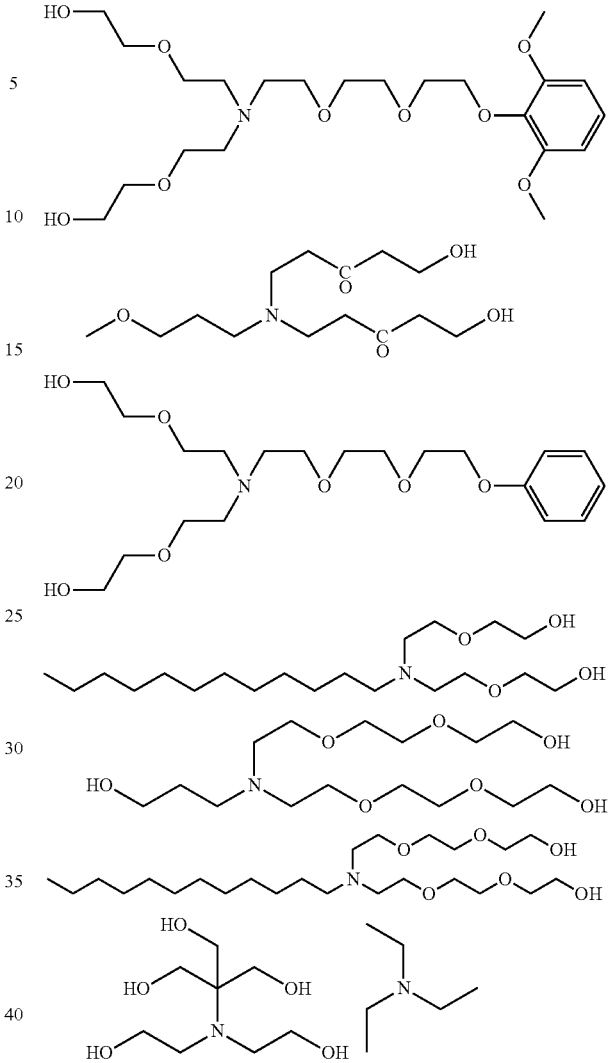

(2) Compound (PA) that generates a compound which has a proton acceptor functional group and is decomposed due to the irradiation with actinic rays or radiation, in which proton acceptor properties decrease or disappear, or proton acceptor properties change to acidity.

The overcoat composition may further include a compound [hereinafter, also referred to as the compound (PA)] that generates a compound which has a proton acceptor functional group and is decomposed due to the irradiation with actinic rays or radiation, in which proton acceptor properties decrease or disappear, or proton acceptor properties change to acidity, as an additive.

The proton acceptor functional group is a group that can electrostatically interact with a proton and a functional group having electrons. For example, the proton acceptor functional group means a functional group having a macrocyclic structure such as cyclic polyether or a functional group having a nitrogen atom having an unshared electron pair not contributing to π conjugation. A nitrogen atom having an unshared electron pair not contributing to π conjugation is, for example, a nitrogen atom having a partial structure represented by the following general formula.

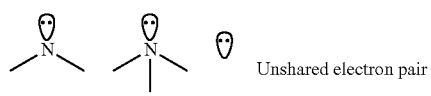
Unshared electron pair

Examples of the preferable partial structure of the proton acceptor functional group include crown ether, azacrown ether, primary to tertiary amine, pyridine, imidazole, and pyrazine structures.

The compound (PA) generates a compound that is decomposed due to irradiation with actinic rays or radiation and in which proton acceptor properties decrease or disappear or proton acceptor properties change to acidity. Here, the decrease or disappearance of the proton acceptor properties or the change of proton acceptor properties to acidity is the change of proton acceptor properties caused by the addition of a proton to a proton acceptor functional group. Specifically, in a case where a proton adduct is generated from the compound (PA) having a proton acceptor functional group and a proton, the change means that an equilibrium constant in the chemical equilibrium decreases.

Specific examples of the compound (PA) include the following compounds. As specific examples of the compound (PA), disclosure in paragraphs 0421 to 0428 of JP2014-41328A and paragraphs 0108 to 0116 of JP2014-134686A are referred to, and the contents thereof may be incorporated to the present specification.

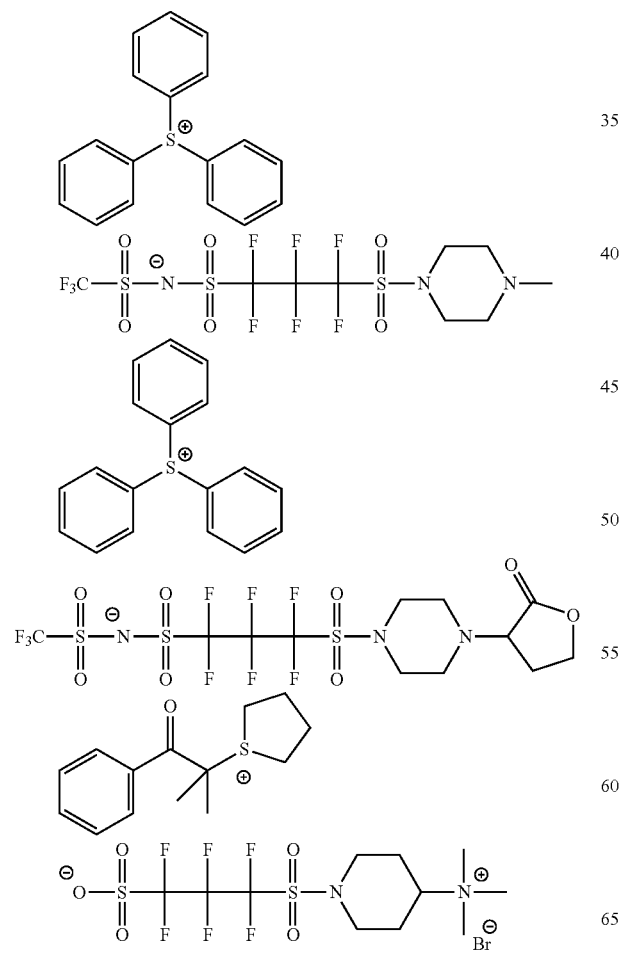

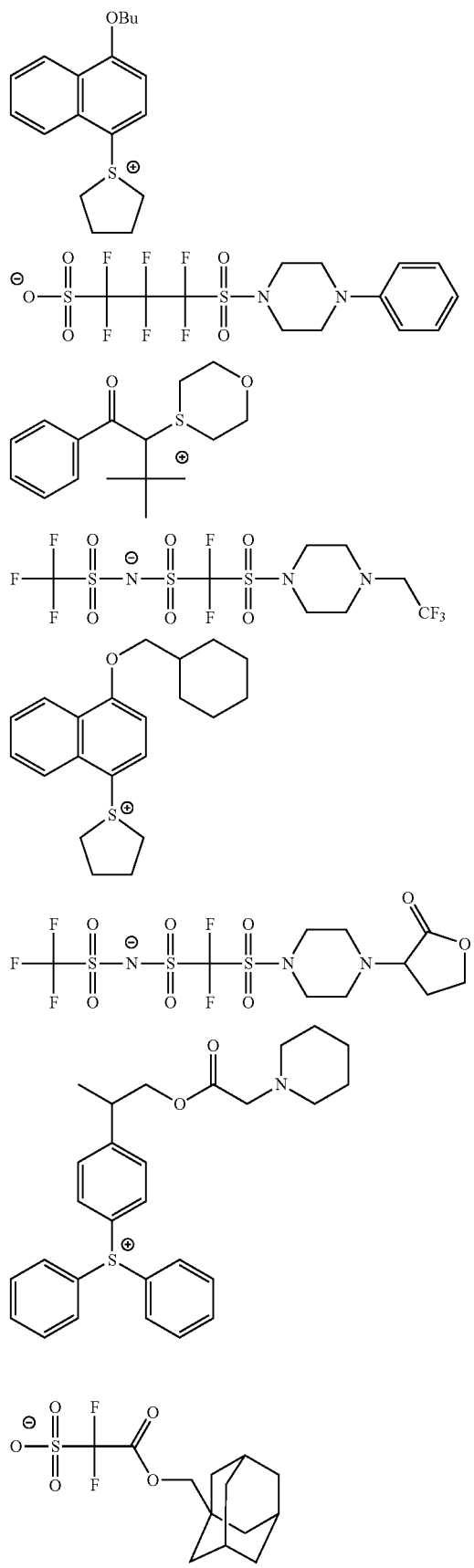

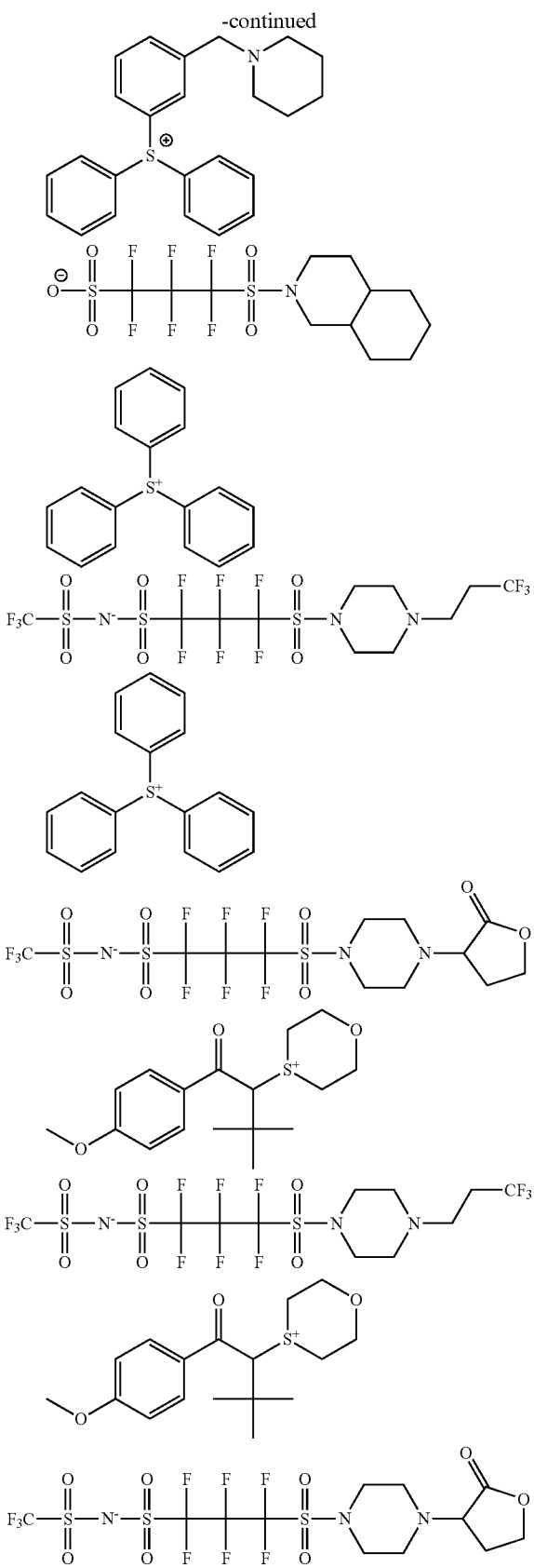

These compounds may be synthesized according to the synthesization examples disclosed in JP2006-330098A.

In the composition of the present invention, a formulation ratio of the compound (PA) with respect to the entire composition is preferably 0.1 to 10 mass % and more preferably 1 to 8 mass % with respect to the total solid content.

(3) Guanidine Compound

The composition of the present invention may include a compound (hereinafter, also referred to as the compound (PA)) as a basic compound, which generates a compound which has a proton acceptor functional group and is decomposed due to irradiation with actinic rays or radiation and in which proton acceptor properties decrease or disappear, or proton acceptor properties change to acidity.

A guanidine compound exhibits strong basicity because positive charges of a conjugate acid are dispersed and stabilized by three nitrogen atoms.

With respect to the basicity of a guanidine compound (A) of the present invention, pKa of a conjugate acid is preferably 6,0 or greater, more preferably 7.0 to 20.0 because of high neutralization reactivity with an acid and excellent roughness characteristics, and even more preferably 8.0 to 16.0.

Because of this strong basicity, the diffusibility of acid can be suppressed so as to contribute to the formation of an excellent pattern shape.

According to the present invention, log P is a logarithmic value of a n-octanol/water partition coefficient (P) and is an effective parameter that can characterize hydrophilicity/hydrophobicity in a wide range of compounds. Generally, the partition coefficient is obtained by calculation without experiments, and represents a value calculated by CS Chem-Draw Ultra Ver. 8.0 software package (Crippen's fragmentation method).

It is preferable that log P of the guanidine compound (A) is 10 or less. In a case where log P is the above value or less, the guanidine compound (A) can be evenly contained in. a resist film.

Log P of the guanidine compound (A) according to the present invention is preferably in the range of 2 to 10. more preferably in the range of 3 to 8, and even more preferably in the range of 4 to 8.

It is preferable that the guanidine compound (A) according to the present invention does not have a nitrogen atom in addition to the guanidine structure.

Specific examples of the guanidine compound include compounds of paragraphs [0765] to [0768] of JP2013-83966A, but the present invention is not limited thereto.

(4) Low molecular compound having nitrogen atom and having a group that leaves due to an action of an acid The composition of the present invention that can contain a low molecular compound (hereinafter, also referred to as a "low molecular compound (E)" or a "compound (E)") that has a nitrogen atom and has a group that leaves due to an action of an acid. The low molecular compound (E) preferably has basicity after a group that leaves due to an action of an acid leaves.

The group that leaves due to an action of an acid is not particularly limited, is preferably an acetal group, a carbonate group, a carbamate group, a tertiary ester group, a tertiary hydroxyl group, and a hemiaminal ether group, and is a carbamate group and a hemiaminal ether group.

The molecular weight of the low molecular compound (E) having a group that leaves due to an action of an acid preferably 100 to 1,000, more preferably 100 to 700, and particularly preferably 100 to 500.

The compound (E) is preferably an amine derivative having a group that leaves due to an action of an acid on a nitrogen atom.

The compound (E) may have a carbamate group having a protecting group on a nitrogen atom and have a carbamate group. The protecting group that constitutes a carbamate group can be represented by Formula (d-1).

(d-1)

In Formula (d-1),

R"s each independently represent a hydrogen atom, a linear or branched alkyl group, a cycloalkyl group, an aryl group, an aralkyl group, or an alkoxyalkyl group. R"s may be bonded to each other to form a ring.

R' is preferably a linear or branched alkyl group, a cycloalkyl group, and an aryl group. R' is more preferably a linear or branched alkyl group and a cycloalkyl group.

The compound (E) can be constituted by arbitrarily combining a basic compound and a structure represented by Formula (d-1).

The compound (E) particularly preferably has a structure represented by Formula (J).

As long as the compound (E) is a low molecular compound having a group that leaves due to an action of an acid, the compound (E) may be a compound corresponding to the basic compound.

Formula (J)

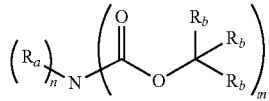

In Formula (J), Ra represents a hydrogen atom, an alkyl group, a cycloalkyl group, an aryl group, or an aralkyl group. In a case where n=2, two Ra's are identical to or different from each other, two Ra's are bonded to each other, a divalent heterocyclic hydrocarbon group (preferably having 20 or less carbon atoms) or a derivative thereof may be formed.

Rb's each independently represent a hydrogen atom, an alkyl group, a cycloalkyl group, an aryl group, an aralkyl group, and an alkoxyalkyl group. Here, in —C(Rb)(Rb)(Rb), in a case where one or more Rb's are hydrogen atoms, at least one of the rest Rb's is a cyclopropyl group, a 1-alkoxyalkyl group, or an aryl group.

At least two Rb's are bonded to form an alicyclic hydrocarbon group, an aromatic hydrocarbon group, a heterocyclic hydrocarbon group, or a derivative thereof.

n represents an integer of 0 to 2, m represents an integer of 1 to 3, and n+m=3.

In Formula (J), Ra and Rb may be substituted with a functional group such as an alkyl group, a cycloalkyl group, an aryl group, an aralkyl group, a hydroxyl group, a cyano group, an amino group, a pyrrolidino group, a piperidino group, a morpholino group, and an oxo group, an alkoxy group, or a halogen atom. An alkoxyalkyl group represented by Rb is also the same.

Particularly preferable specific examples of the compound (E) according to the present invention include compounds disclosed in [0786] to [0788] of JP2013-83966A, but the present invention is not limited thereto.

The compound represented by Formula (J) can be synthesized based on JP2007-298569A and JP2009-199021A.

According to the present invention, the low molecular compound (E) can he used singly or two or more kinds thereof may be used in combination.

As compounds to be used, compounds synthesized in the examples of JP2002-363146A and compounds disclosed in paragraph 0108 of JP2007-298569A can be exemplified.

As the basic compound, a photosensitive basic compound may be used. As the photosensitive basic compound, for example, compounds disclosed in JP2003-524799A and J. Photopolym. Sci & Tech. Vol. 8, P. 543 to 553 (1995) can be used.

As the basic compound, a compound called a photodegradable base may be used. Examples of the photodegradable base include an onium salt of carboxylic acid and an onium salt of sulfonic acid which is not fluorinated at the α-position. Specific examples of the photodegradable base include paragraph 0145 of WO2014/133048A1, JP2008-158339A, arid JP399146B.

(Content of Basic Compound)

The content of the basic compound in the overcoat composition is preferably 0.01 to 20 mass %, more preferably 0.1 to 10 mass %, and even more preferably 1 to 5 mass % with respect to the solid content of the overcoat composition.

(Base Generator)

Examples of a base generator (photobase generator) that can be contained in the overcoat composition include compounds disclosed in JP1992-151156A (JP-H04-151156A), JP1992-162040A (JP-H04-162040A), JP1993-197148A (JP-H05-197148A), JP1993-5995A (JP-H05-5995A), JP1994-194834A (JP-H06-194834A), JP1996-146608A (JP-H08-146608A), JP1998-83079A (JP-H10-83079A), and EP622682B.

Compounds disclosed in JP2010-243773A are appropriately used.

Specific examples of the photobase generator suitably include 2-nitrobenzyl carbamate, 2,5-dinitrobenzyl cyclohexyl carbamate, N-cyclohexyl-4-methylphenylsulfonamide, and 1,1-dimethyl-2-phenylethyl-N-isopropylcarbamate, but the present invention is not limited thereto.

(Content of Base Generator)

The content of the base generator of the overcoat composition is preferably 0.01 to 20 mass %, more preferably 0.1 to 10 mass %, and even more preferably 1 to 5 mass % with respect to the solid content of the overcoat composition.

[(A2) Compound containing a bond or a group selected from the group consisting of an ether bond, a thioether bond, a hydroxyl group, a thiol group, a carbonyl bond, and an ester bond]

A compound (hereinafter, referred to as the compound (A2)) including at least one bond or group selected from the group consisting of an ether bond, a thioether bond, a hydroxyl group, a thiol group, a carbonyl bond, and an ester bond is described below.

As described above, the compound (A2) is a compound including at least one bond or group selected from the group consisting of an ether bond, a thioether bond, a hydroxyl group, a thiol group, a carbonyl bond, and an ester bond. An oxygen atom or a sulfur atom included in these groups or bonds has an unshared electron pair, and thus it is possible to trap an acid by interaction with an acid diffused from an actinic ray-sensitive or radiation-sensitive film.

According to an aspect of the present invention, the compound (A2) preferably has two or more groups or bonds, more preferably has three or more groups or bonds, and even more preferably four or more groups or bonds which are selected from the above group. In this case, a plurality of bonds or groups selected from the group consisting of an ether bond, a thioether bond, a hydroxyl group, a thiol group, a carbonyl bond, and an ester bond which are included in the compound (A2) may be identical to or different from each other.

According to an aspect of the present invention, the molecular weight of the compound (A2) is preferably 3,000 or less, more preferably 2,500 or less, even more preferably 2,000 or less, and particularly preferably 1,500 or less.

According to an aspect of the present invention, the number of carbon atoms included in the compound (A2) is preferably 8 or more, more preferably 9 or more, and even more preferably 10 or more.

According to an aspect of the present invention, the number of carbon atoms included in the compound (A2) is preferably 30 or less, more preferably 20 or less, and even more preferably 15 or less.

According to an aspect of the present invention, the compound (A2) is preferably a compound having a boiling point of 200° C. or higher, more preferably a compound having a boiling point of 220° C. or higher, an even more preferably a compound having a boiling point of 240° C. or higher.

According to an aspect of the present invention, the compound (A2) is preferably a compound having an ether bond, preferably a compound having two or more ether bonds, more preferably a compound having three or more ether bonds, and even more preferably a compound having four or more ether bonds.

According to an aspect of the present invention, the compound (A2) even more preferably contains a repeating unit containing an oxyalkylene structure represented. by Formula (T6).

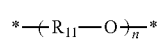

(T6)

In the formula, $R_{11}$ represents an alkylene group that may have a substituent, n represents an integer of 2 or greater, and

* represents a bonding hand.

The number of carbon atoms in the alkylene group represented by $R_{11}$ in Formula (T6) is not particularly limited, and is preferably 1 to 15, more preferably 1 to 5, even more preferably 2 or 3, and particularly preferably 2. In a case where the alkylene group has a substituent, the substituent is not particularly limited, but is preferably an alkyl group (preferably having 1 to 10 carbon atoms).

n is preferably an integer of 2 to 20. Among these, n is more preferably 10 or less because DOF becomes greater.

Because DOF becomes greater, an average value of n is preferably 20 or less, more preferably 2 to 10, even more preferably 2 to 8, and particularly preferably 4 to 6. Here, the "average value of n" means a value of n determined by measuring a weight-average molecular weight of the compound (A2) by GPC and causing the obtained weight-average molecular weight and a general formula to be consistent. In a case where n is not an integer, n is rounded off.

A plurality of $R_{11}$'s may be identical to or different from each other.

Because DOF becomes greater, the compound having a partial structure represented by Formula (T6) is preferably a compound represented by Formula (T6-1).

(T6-1)

In the formula,

The definition, specific examples, and preferable aspects of $R_{11}$ are the same as those in $R_{11}$ of Formula (1).

$R_{12}$ and $R_{13}$ each independently represent a hydrogen atom or an alkyl group. The number of carbon atoms of the alkyl group is not particularly limited, but is preferably 1 to 15. $R_{12}$ and $R_{13}$ are bonded to each other to form a ring.

m represents an integer of 1 or greater. in is preferably an integer of to 20. Among these, because DOF becomes greater, in is more preferably 10 or less.

Because DOF becomes greater, the average value of in is preferably 20 or less, more preferably 1 to 10, even more preferably 1 to 8, and particularly preferably 4 to 6. Here, an "average value of m" is the same as the "average value of n".

In a case where m is 2 or greater, a plurality of $R_{11}$'s may be identical to or different from each other.

According to an aspect of the present invention, the compound having a partial structure represented by Formula (T6) is preferably an alkylene glycol including at least two ether bonds.

As the compound (A2), commercially available products may be used, or the compound (A2) may be synthesized in a well-known method.

Specific examples of the compound (A2) are provided below, but the present invention is not limited thereto.

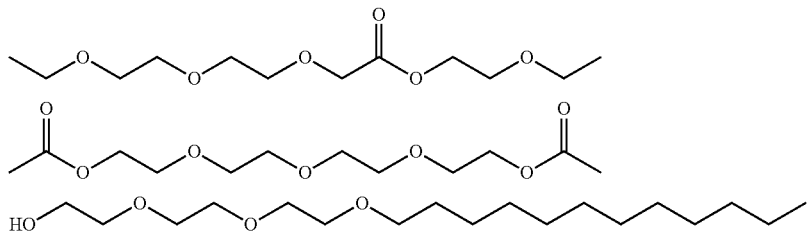

-continued
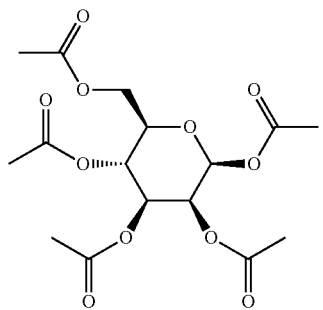
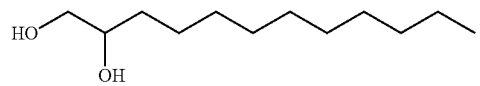
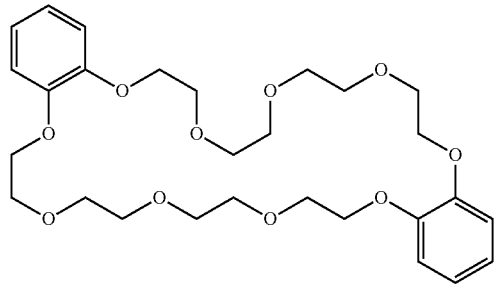
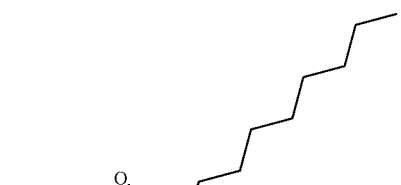
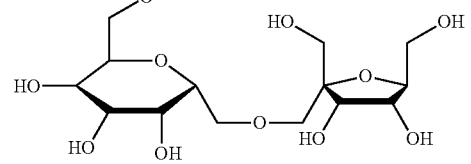
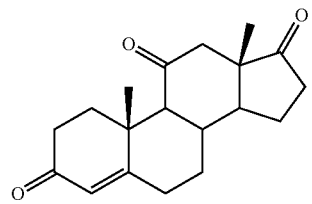 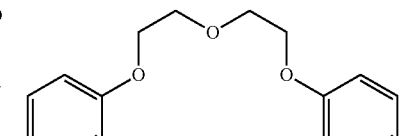 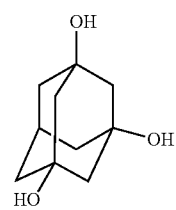
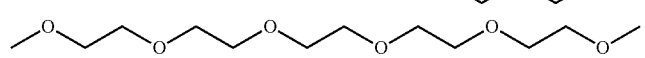
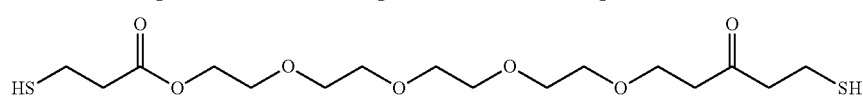
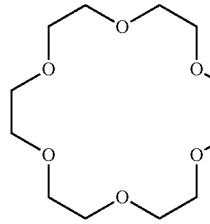 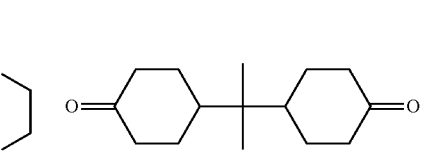 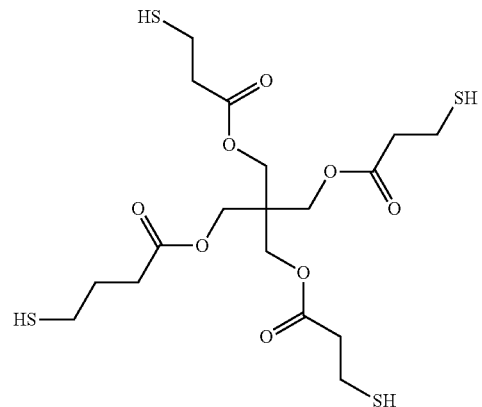
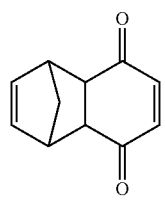  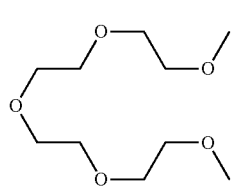 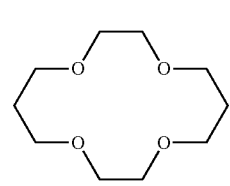

-continued

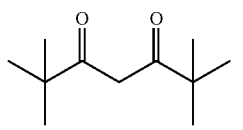
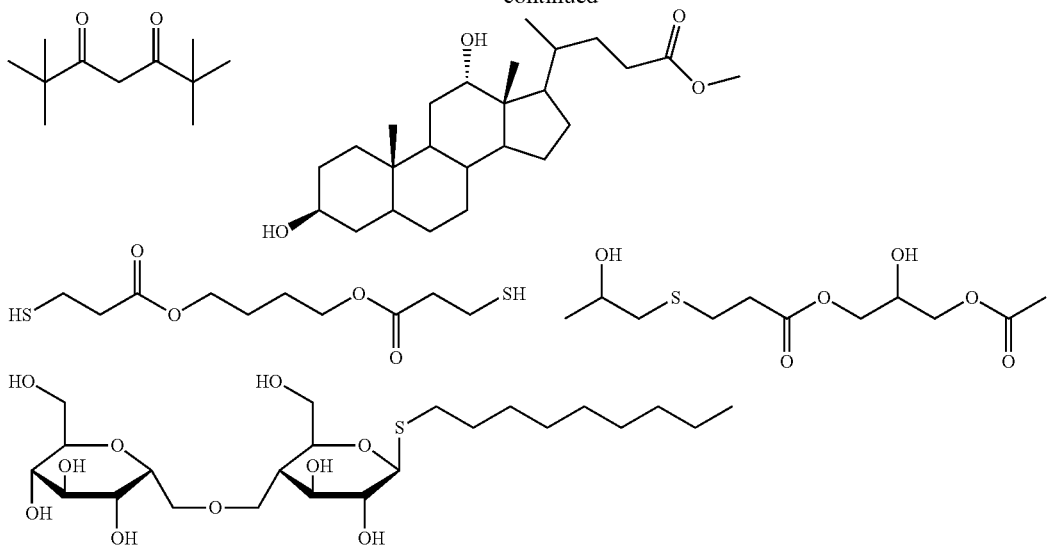

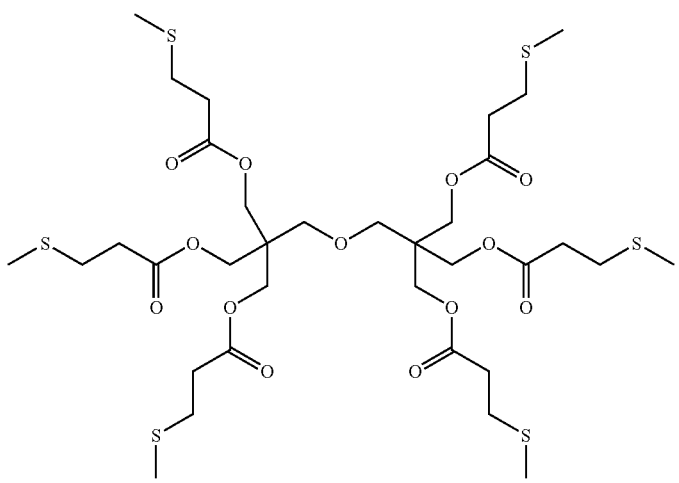

The content of the compound (A2) is preferably 0.1 to 30 mass %, more preferably 1 to 25 mass %, even more preferably 2 to 20 mass %, and particularly preferably 3 to 18 mass % with respect to the total solid content of the overcoat composition.

[(A3) Ionic Compound]

The overcoat composition may contain an ionic compound which becomes a weaker acid relatively to a acid generator. As the ionic compound, an onium salt is preferable. In a case where an acid generated from an acid generator by irradiation with actinic ray or radiation collides with an onium salt having an unreacted weak acid anion, a weak acid is released by salt exchange so as to generate an onium salt having a strong acid anion. In this process, a strong acid is exchanged to a weak acid having a lower catalytic ability, and thus the acid is apparently inactivated so as to control the acid diffusion.

An onium salt which becomes a weaker acid relatively to the acid generator is preferably a compound represented by Formulae (d1-1) to (d1-3).

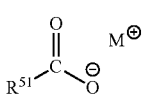 (d1-1)

 (d1-2)

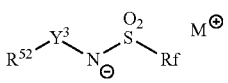 (d1-3)

In the formula, $R^{51}$ is a hydrocarbon group that may have a substituent, $Z^{2C}$ is a hydrocarbon group having 1 to 30 carbon atoms, which may have a substituent (here, it is assumed that carbon adjacent to S is not substituted with a fluorine atom), $R^{52}$ is an organic group, $Y^3$ is a linear, branched chain, or cyclic alkylene group, or an arylene group, Rf is a hydrocarbon group including a fluorine atom, and $M^+$ each independently represent a sulfonium or iodonium cation.

Preferable examples of a sulfonium cation or an iodonium cation represented by M+ include a sulfonium cation represented by Formula (ZI) and an iodonium cation represented by Formula (ZII).

Preferable examples of the anion portion of the compound represented by Formula (d1-1) include structures disclosed in paragraph [0198] of JP2012-242799A.

Preferable examples of the anion portion of the compound represented by Formula (d1-2) include structures disclosed in paragraph [0201] of JP2012-242799A.

Preferable examples of the anion portion of the compound represented by Formula (d1-3) include structures disclosed, in paragraphs [0209] and [0210] of JP2012-242799A.

The onium salt that becomes a weaker acid relatively to the acid generator may be (C) a compound having a cation portion and an anion portion in the same molecule and the cation portion and the anion portion are linked by a covalent bond (hereinafter, also referred to as a "compound (CA)").

The compound (CA) is preferably a compound represented by any one of Formulae (C-1) to (C-3).

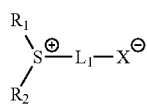

(C-1)

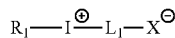

(C-2)

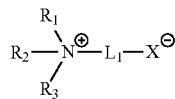

(C-3)

In Formulae (C-1) to (C-3), $R_1$, $R_2$, and $R_3$ represents a substituent having 1 or greater carbon atoms.

$L_1$ represents a divalent linking group that links a cation portion and an anion portion or a single bond.

-X$^-$ represents an anion portion selected from —COO$^-$, —SO$_3^-$, —SO$_2^-$, and —N$^-$R$_4$. $R_{hd\ 4}$ represents a monovalent substituent having a carbonyl group: —C(=O)—, a sulfonyl group: —S(=O)$_2$—, and a sulfinyl group: —S(=O)— at a linking portion to an adjacent N atom.

$R_1$, $R_2$, $R_3$, $R_4$, and $L_1$ may be bonded to each other to form a ring structure. In (C-3), two of $R_1$ to $R_3$ are bonded to form a double bond with an N atom.

Examples of the substituent having 1 or greater carbon atoms in $R_1$ to $R_3$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group. An alkyl group, a cycloalkyl group, and an aryl group are preferable.

Examples of $L_1$ as the divalent linking group include a linear or branched chain alkylene group, a cycloalkylene group, an arylene group, a carbonyl group, an ether bond, an ester bond, an amide bond, a urethane bond, a urea bond, and a group obtained by combining two or more of these. $L_1$ is more preferably an alkylene group, an arylene group, an ether bond, an ester bond, and a group obtained by combining two or more of these.

Preferable examples of the compound represented by Formula (C-1) include compounds disclosed in paragraphs [0037] to [0039] of JP2013-6827A and paragraphs [0027] to [0029] of JP2013-8020A.

Preferable examples of the compound represented by Formula (C-2) include compounds disclosed in paragraphs [0012] to [0013] of JP2012-189977A.

Preferable examples of the compound represented by Formula (C-3) include compounds disclosed in paragraphs [0029] to [0031] of JP2012-252124A.

(Content of Onium Salt)

The content of the onium salt in the overcoat composition is preferably 0.5 mass % or greater, more preferably 1 mass % or greater, and even more preferably 2.5 mass % or greater with respect to the solid content of the overcoat composition.

Meanwhile, the upper limit of the content of the onium salt is preferably 25 mass % or less, more preferably 20 mass % or less, even more preferably 10 mass % or less, and particularly preferably 8 mass % or less with respect to the solid content of the overcoat composition.

[(A4) Compound Having Radical Trapping Group]

(A4) A compound having a radical trapping group is also referred to as a compound. (A4).

The radical trapping group is a group that captures active radicals and stops the radical reaction. Examples of the radical trapping group include a group which reacts with an active radical and is converted into a stable free radical and a group having a stable free radical. Specific examples of the radical trapping group not having basicity include at least one group selected from the group consisting of a hindered phenol group, a hydroquinone group, an N-oxyl free radical group, a nitroso group, and a nitrone group.

The number of radical trapping groups included in the compound (A4) is not particularly limited. However, in a case where the compound (A4) is a compound other than the polymer compound, the number of the radical trapping groups in one molecule is preferably 1 to 10, more preferably 1 to 5, and even more preferably 1 to 3.

Meanwhile, in a case where the compound (A4) is a polymer compound having a repeating unit, the repeating unit having a radical trapping group preferably has one to five radical trapping groups and more preferably has one to three radical trapping groups. The composition ratio of the repeating unit having a radical trapping group in the polymer compound is preferably 1 to 100 mol %, more preferably 10 to 100 mol %, and even more preferably 30 to 100 mol %.

Since excellent effects of the present invention are exhibited, the compound having a radical trapping group is preferably a compound having a nitrogen oxygen bond. Since excellent effects of the present invention are exhibited, a compound represented by any one of Formulae (T7), (T8), and (T9) is more preferable.

The compound represented by Formula (T7) corresponds to a compound having an N-oxyl free radical group, the compound represented by Formula (T8) corresponds to a compound having a nitroso group, and the compound represented by Formula (T9) corresponds to a compound having a nitron group.

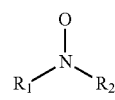

(T7)

(T8)

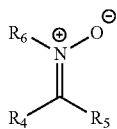

(T9)

In Formulae (T7) to (T9), $R_1$ to $R_6$ each independently represent an alkyl group, a cycloalkyl group, or an aryl group. $R_1$ and $R_2$ in Formula (T7) may be bonded to each other to form a ring, and at least. two of $R_4$ to $R_6$ in Formula (T9) may be bonded to each other to form a ring.

An alkyl group, a cycloalkyl group, and an aryl group represented by $R_1$ to $R_6$, a ring that may be formed by bonding $R_1$ and $R_2$, and a ring that may be formed by bonding at least two of $R_4$ to $R_6$ each may have a substituent.

The compound represented by any one of Formulae (T7) to (T9) may have a form of a resin. In this case, at least one of $R_1$ to $R_6$ may be bonded to a main chain or a side chain of a resin.

Specific examples of the compound having a radical trapping group are provided below, but the present invention is not limited thereto.

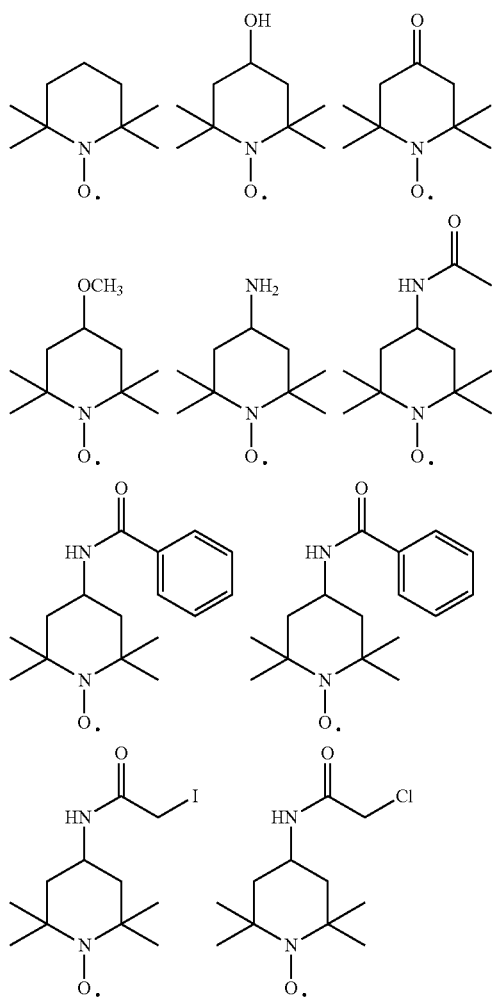

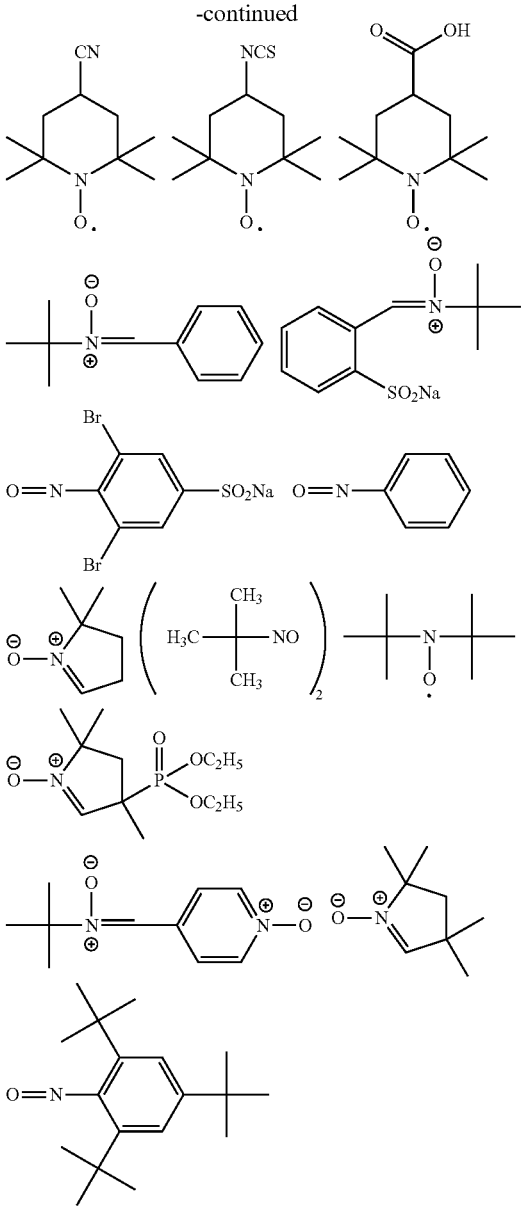

As described above, the compound (A4) may be a polymer compound having a repeating unit. Specific examples of the repeating unit having the compound (A4) which is a polymer compound are provided below, but the present invention is not limited thereto.

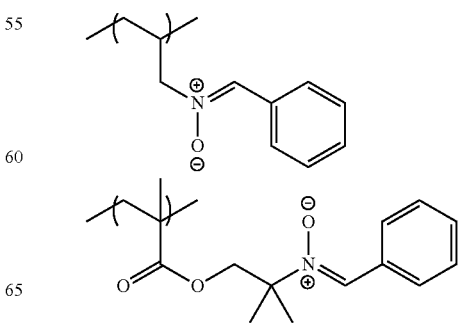

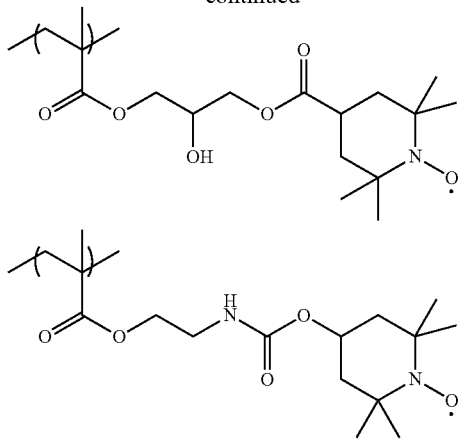

The molecular weight of the compound having a radical trapping group (low molecular compound) is not particularly limited. However, the molecular weight is preferably 1.00 to 5,000, more preferably 100 to 2,000, and even more preferably 100 to 1,000.

In a case where the compound having a radical trapping group is a polymer compound having a repeating unit, the weight-average molecular weight thereof is preferably 5,000 to 20,000 and more preferably 5,000 to 10,000.

As the compound having a radical trapping group, commercially available compounds may be used, or the compound synthesized in the well-known method may be used. The compound (A) may be synthesized by the reaction with a commercially available low molecular compound having a radical trapping group and a polymer compound having a reactive group such as an epoxy group, a halogenated alkyl group, an acid halide group, a carboxyl group, and an isocyanate group.

The content of the compound having a radical trapping group is generally 0.001 to 10 mass % and preferably 0.01 to 5 mass % with respect to the total solid content of the overcoat composition of the present invention.

The overcoat composition may include a plurality of one kind of compounds selected from the group consisting of (A1) to (A4). For example, two or more kinds of the compounds (A1) which are different from each other may be included.

The overcoat composition may contain two or more kinds of compounds selected from the group consisting of (A1) to (A4). For example, both of the compound (A1) and the compound (A2) may be contained.

In a case where the overcoat composition includes a plurality of compounds selected from the group consisting of (A1) to (A4), the sum of the contents of these compounds is generally 0.001 to 20 mass %, preferably 0.01 to 10 mass %, and more preferably 1 to 8 mass % with respect to the total solid content of the overcoat composition of the present invention.

[Solvent]

As the solvent, for example, a solvent used in the actinic ray-sensitive or radiation-sensitive resin composition can be used.

The overcoat composition is preferably dissolved in a solvent and filtrated through a filter. As the filter, a filter which is made of polytetrafluoroethylene, polyethylene, and nylon and of which a pore size is 0.1 μm or less, more preferably 0.05 μm or less, and even more preferably 0.03 μm or less is preferable. The filter may be used by connecting a plurality thereof in series or in a juxtaposition. The composition may be filtrated in a plurality of times, and a step of filtering a plurality of times may be a circulation filtration step. A deaeration treatment or the like may be performed on the composition before and after filter filtration. It is preferable that the overcoat composition of the present invention does not contain impurities such as metals. The content of the metal components included in these materials is preferably 10 ppm or less, more preferably 5 ppm or less, and even more preferably 1 ppm or less. It is particularly preferable that the metal components are not substantially included (the content thereof is the detection limit or less of a measuring device).

Preferable properties that the overcoat (overcoat composition) preferably has are suitability for application to an actinic ray-sensitive or radiation-sensitive film and transparency to radiation, particularly at 193 nm. It is preferable that the overcoat is not mixed with the actinic ray-sensitive or radiation-sensitive film and is capable of being evenly applied to the surface of the actinic ray-sensitive or radiation-sensitive film.

In order to evenly coating the surface of the actinic ray-sensitive or radiation-sensitive film with the overcoat composition without dissolving the actinic ray-sensitive or radiation-sensitive film, the overcoat composition preferably contains a solvent that does not dissolve the actinic ray-sensitive or radiation-sensitive film. As the solvent that does not dissolve the actinic ray-sensitive or radiation-sensitive film, it is more preferable that a solvent having components different from those of a developer (organic developer) containing an organic solvent is used.

It is preferable that the actinic ray-sensitive or radiation-sensitive resin composition of the present invention and various materials (for example, a resist solvent, a developer, a rinse solution, a composition for forming an antireflection film, and a composition for forming an overcoat) used in the pattern forming method of the present invention do not include impurities such as metal, metal salts including halogen, an acid and an alkali. The content of the impurities included in these materials is preferably 1 ppm or less, more preferably 1 ppb or less, even more preferably 100 ppt or less, and particularly preferably 10 ppt or less, and it is most preferably the impurities are not substantially included (the content thereof is the detection limit or less of a measuring device).

Examples of a method for removing impurities such as metals from the above various materials include filtration using a filter. With respect to a filter pore size, the pore size is preferably 10 nm or less, more preferably 5 nm or less, and even more preferably 3 nm or less. As the material of the filter, filters made of polytetrafluoroethylene, polyethylene, or nylon are preferable. The filter may be washed in advance with an organic solvent. In the filter filtration step, a plurality of types of filters may be connected in series or in a juxtaposition. In a case where a plurality of types of filters are used, filters having different pore sizes and/or different materials may be used in combination. Various materials may be filtered a plurality of times, and the step of filtering a plurality of times may be a circulation filtration step.

Examples of a method for reducing impurities such as metals included in the various materials include a method of performing distillation under conditions that minimize contamination as much as possible by selecting raw materials with a low metal content as raw materials for constituting various materials, performing filter filtration on raw materials constituting various materials, lining inside a device with Teflon (Registered Trademark), and the like. Preferable conditions for the filter filtration performed on raw materials constituting various materials are the same as the above conditions.

In addition to the filter filtration, impurities may be removed by the adsorbent, or filter filtration and an adsorbent may be used in combination. As the adsorbent, well-known adsorbents may be used. For example, an inorganic adsorbent such as silica gel and zeolite, and an organic adsorbent such as activated carbon can be used.

Examples of a method for reducing impurities such as metals contained in the organic treatment liquid of the present invention include a method of performing distillation under conditions that minimize contamination as much as possible by selecting raw materials with a low metal content as raw materials for constituting various materials, performing filter filtration on raw materials constituting various materials, lining inside a device with Teflon (Registered Trademark), and the like. Preferable conditions for the filter filtration performed on raw materials constituting various materials are the same as the above conditions.

In addition to the filter filtration, impurities may be removed by the adsorbent, or filter filtration and an adsorbent may be used in combination. As the adsorbent, well-known adsorbents may be used. For example, an inorganic adsorbent such as silica gel and zeolite, and an organic adsorbent such as activated carbon can be used.

<Pattern Forming Method>

Subsequently, a pattern forming method of the present invention is described.

As described above, the pattern forming method of the present invention includes a step (film forming step) of coating the substrate with the actinic ray-sensitive or radiation-sensitive resin composition of the present invention and forming an actinic ray-sensitive or radiation-sensitive film, a step (exposure step) of simultaneously irradiating the actinic ray-sensitive or radiation-sensitive film with a plurality of electron beams, and a step (developing step) of developing the actinic ray-sensitive or radiation-sensitive film after the irradiation with electron beams.

Hereinafter, each of the steps of the pattern forming method of the present invention including a step that can be suitably included in the pattern forming method of the present invention is described.

(1) Film Forming Step

The film forming step is a step of forming an actinic ray-sensitive or radiation-sensitive film on a substrate by using the actinic ray-sensitive or radiation-sensitive resin composition.

The method of forming an actinic ray-sensitive or radiation-sensitive film on a substrate by using the actinic ray-sensitive or radiation-sensitive resin composition is not particularly limited. However, well-known method can be employed. Among these, in view of easier adjustment of the film thickness, a method of forming a film by coating a substrate with the actinic ray-sensitive or radiation-sensitive resin composition is exemplified.

The coating method is not particularly limited, and well-known methods can be employed. For example, an appropriate coating method such as spin coating, roll coating, flow coating, dip coating, spray coating, and doctor coating may be performed so as to perform coating on the substrate, but spin coating is preferable. The rotation speed thereof is preferably 1,000 to 3,000 rpm.

After coating with the actinic ray-sensitive or radiation-sensitive resin composition, a drying treatment for removing the solvent may be performed, if necessary. The coated film can be obtained by performing prebaking at 60° C. to 150° C. for 1 to 20 minutes, and preferably 80° C. to 120° C. for 1 to 10 minutes.

The thickness of the actinic ray-sensitive or radiation-sensitive film is preferably 200 nm or less, more preferably 10 to 200 nm, and even more preferably 20 to 150 nm.

[Substrate]

As a material for forming a substrate to be processed and the outermost layer thereof, for example, a silicon wafer can he used, in a case of a semiconductor wafer. Examples of a material that becomes an outermost layer include Si, $SiO_2$, SiN, SiON, TiN, WSi, Boron Phosphorus Silicon Glass (BPSG). Spin On Glass (SOG), and an organic antireflective film.

In a case where the pattern forming method of the present invention is used in the photo mask manufacturing method, mask blanks are used as the substrate, and an actinic ray-sensitive or radiation-sensitive film is formed on the mask blanks. Examples of the transparent substrate used in mask blanks include a transparent substrate such as quarts and calcium fluoride. Generally, a necessary functional film such as a light shielding film, an antireflective film, and further a phase shift film, and additionally; an etching stopper film are stacked on the substrate. As a material of the functional film, a film containing transition metal such as silicon, chromium, molybdenum, zirconium, tantalum, tungsten, titanium, and niobium is stacked. In addition, as a material used in the outermost layer, a silicon compound material having a material having silicon or a material containing oxygen and/or nitrogen in silicon, as a main constituent material or a material further containing transition metal in this material, as a main constituent material, and a transition metal compound material having a material including one or more types selected from transition metal, particularly, chromium, molybdenum, zirconium, tantalum, tungsten, titanium, and niobium, or a material having 1 or more element selected from oxygen, nitrogen, and carbon, further to this material, as a main constituent material are exemplified.

The light shielding film may be a single layer, but a multilayer structure in which plural materials are coated in an overlapped manner is more preferable. In a case of the multilayer structure, a thickness of the film per one layer is not particularly limited, but is preferably 5 nm to 100 nm and more preferably 10 nm to 80 nm. The total thickness Of the light shielding film is not particularly limited, but is preferably 5 nm to 200 nm and more preferably 10 nm to 150 nm.

The actinic ray-sensitive or radiation-sensitive film formed in the film forming step is coated with the overcoat composition, and heating (PB; Prebake) is performed, if necessary, such that an overcoat is formed on the actinic ray-sensitive or radiation-sensitive film.

The method of coating the overcoat composition is not particularly limited. A spin coating method, a spray method, a roller coating method, a dipping method, or the like which are well-known in the art can be used.

The film thickness of the overcoat is not particularly limited. However, in view of transparency to the exposure light source, the film is formed in the film thickness of generally 5 nm to 300 nm, preferably 10 nm to 300 nm, more preferably 20 nm to 200 nm, and even more preferably 30 nm to 100 nm.

In view of resolution, it is preferable that the refractive index of the overcoat is close to the refractive index of the actinic ray-sensitive or radiation-sensitive film.

In a case where the overcoat is formed, a step of peeling the overcoat after the exposure step may be included.

In the step of peeling the overcoat, an organic developing solution may be used or a release agent may be used separately in order to peel off the overcoat. The release agent is preferably a solvent having less permeation to the actinic ray-sensitive or radiation-sensitive film. Since the release of the overcoat is simultaneously performed with the development of the actinic ray-sensitive or radiation-sensitive film, is preferably it is preferable that the overcoat can be peeled off with an organic developer. The organic developer used for peeling is not particularly limited as long as the organic developer can dissolve and remove a low exposed portion of the actinic ray-sensitive or radiation-sensitive film.

In view of peeling off with an organic developer, the dissolution rate of the overcoat to the organic developer is preferably 1 to 300 nm/sec and more preferably 10 to 100 nm/sec.

Here, the dissolution rate of the overcoat to the organic developer is a film thickness reduction rate in a case where an overcoat is formed and then exposed to a developer and is a speed in a case where the film is immersed in butyl acetate at 23° C., according to the present invention.

In a case where the dissolution rate of the overcoat to the organic developer is 1 nm/sec or greater and preferably 10 nm/sec or greater, there is an effect of reducing occurrence of development defects after the actinic ray-sensitive or radiation-sensitive film is developed.

The overcoat may be removed using another known developer such as an aqueous alkaline solution. Specific examples of the alkaline aqueous solution that can be used include an aqueous solution of tetramethylammonium hydroxide.

(2) Exposure Step

The exposure is performed by simultaneously irradiating the actinic ray-sensitive or radiation-sensitive film with a plurality of electron beams This exposure can be performed by using a multi-beam type mask writer (MBMW). Since a plurality of portions can be drawn (exposed) at a time with the multi-beam type mask writer, the throughput can be enhanced.

(3) Baking Step

It is preferable to perform post exposure bake (PEB) after exposure and before development. The reaction of exposed portion is accelerated by PEB, and thus sensitivity and pattern profiles are improved.

The heating temperature is, for example, preferably 60° C. to 150° C. and more preferably 80° C. to 130° C.

The heating time is not particularly limited, and is, for example, preferably 1 to 20 minutes and more preferably 1 to 10 minutes.

The heating can be performed by means provided in a usual exposure/developing machine and may be performed by a hot plate or the like.

It is also preferable to include a heating step (Post Bake; PB) after the rinsing step described below. Preferable heating temperature and heating time are the same as preferable ranges of the heating temperature and heating time relating to the PEB process. The developer and the rinsing liquid remaining between the patterns and inside the pattern are removed by PB.

(4) Developing Step

The developer used in the step of developing the actinic ray-sensitive or radiation-sensitive film after exposure is not particularly limited. For example, a developer (hereinafter, referred to as an "alkaline developer") containing an alkaline aqueous solution or a developer (hereinafter, referred to as an "organic developer") containing an organic solvent can be used.

As the alkaline developer, for example, alkaline aqueous solutions of inorganic alkalis such as sodium hydroxide, potassium hydroxide, sodium carbonate, sodium silicate, sodium silicate, and ammonia water, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, tetraalkylammonium hydroxide such as tetramethylammonium hydroxide, tetraethylammonium hydroxide, tetrapropylammonium hydroxide, tetrabutylammonium hydroxide, tetrapentylammonium hydroxide, tetrahexylammonium hydroxide, tetraoctylammonium hydroxide, ethyltrimethylammonium hydroxide, butyltrimethylammonium hydroxide, methyltriamylammonium hydroxide, and dibutyldipentylammonium hydroxide, quaternary ammonium salt such as trimethylphenylammonium hydroxide, trimethylbenzylammonium hydroxide, and triethylbenzylammonium hydroxide, and cyclic amines such as pyrrole and piperidine can be used. An appropriate amount of alcohols or a surfactant may be added to an alkaline developer, to be used. The alkaline concentration of the alkaline developer is generally 0.1% to 20% by mass. pH of the alkaline developer is generally 10.0 to 15.0. An alkaline concentration and pH of the alkaline alkaline developer can be appropriately prepared to be used. The alkaline developer may be used by adding a surfactant or an organic solvent.

As the organic solvent used in the developer, various organic solvents are widely used. For example, a solvent such as an ester-based solvent, a ketone-based solvent, an alcohol-based solvent, an amide-based solvent, an ether-based solvent, and a hydrocarbon-based solvent can be used.

According to the present invention, the ester-based solvent is a solvent having an ester group in a molecule, a ketone-based solvent is a solvent having a ketone group in a molecule, and an alcohol-based solvent is a solvent having an alcoholic hydroxyl group in a molecule, an amide-based solvent is a solvent having an amide group in a molecule, and an ether-based solvent is a solvent having an ether bond in a molecule. Among these, there is also a solvent having a plurality of kinds of the above functional groups in one molecule. However, in that case, the solvent corresponds to any solvent species including functional groups included in the solvent. For example, diethylene glycol monomethyl ether corresponds to both an alcohol-based solvent and an ether-based solvent in the above classification. The hydrocarbon-based solvent is a hydrocarbon solvent having no substituent.

Particularly, a developer containing at least one solvent selected from a ketone:based solvent, an ester-based solvent, an alcohol-based solvent, and an ether-based solvent is preferable.

Examples of the ester-based solvent include methyl acetate, ethyl acetate, butyl acetate, pentyl acetate, isopropyl acetate, amyl acetate, isoamyl acetate, ethyl inethoxyacetate, ethyl ethoxyacetate, propyl propionate, butyl propionate, propylene glycol monomethyl ether acetate (PGMEA; also known as 1-methoxy-2-acetoxypropane), ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate.

Examples of the ketone-based solvent include 1-octanone, 2-octanone, 1-nonanone, 2-nonanone, acetone, 2-heptanone, 4-heptanone, 1-hexanone, 2-hexanone, diisobutyl ketone, cyclohexanone, methyl cyclohexanone, phenyl acetone, methyl ethyl ketone, methyl isobutyl ketone, acetylacetone, acetonylacetone, ionone, diacetonyl alcohol, acetyl carbinol, acetophenone, methyl naphthyl ketone, isophorone, propylene carbonate, and γ-butyrolactone.

Examples of the alcohol-based solvent include alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, n-decanol, and 3-methoxy-1-butanol, a glycol-based solvent such as ethylene glycol, diethylene glycol, and triethylene glycol, and a glycol ether-based solvent containing a hydroxyl group such as ethylene glycol monomethyl ether, propylene glycol monomethyl ether (PGME; also known as 1-methoxy-2-propanol), diethylene glycol monomethyl ether, triethylene glycol monoethyl ether, methoxymethyl butanol, ethylene glycol monoethyl ether, ethylene glycol monopropyl ether, ethylene glycol monobutyl ether, propylene glycol monoethyl ether, propylene glycol monopropyl ether, propylene glycol monobutyl ether, and propylene glycol monophenyl ether. Among these, a glycol ether-based solvent is preferably used.

Examples of the ether-based solvent include a glycol ether-based solvent not containing a hydroxyl group such as propylene glycol dimethyl ether, propylene glycol diethyl ether, diethylene glycol dimethyl ether, and diethylene glycol diethyl ether, an aromatic ether solvent such as anisole and phenetole, dioxane, tetrahydrofuran, tetrahydropyran, perfluoro-2-butyltetrahydrofuran, perfluorotetrahydrofuran, and 1,4-dioxane, in addition to the glycol ether-based solvents containing hydroxyl groups. Preferably, a glycol ether-based solvent, or an aromatic ether solvent such as anisole is used.

As the amide-based solvent, for example, N-methyl-2-pyrrolidone, N,N-dimethylacetamide, N,N-dimethylformamide, hexamethylphosphoric triamide, and 1,3-dimethyl-2-imidazolidinone can be used.

Examples of the hydrocarbon solvent include an aliphatic hydrocarbon-based solvent such as pentane, hexane, octane, nonane, decane, dodecane, undecane, hexadecane, 2,2,4-trimethylpentane, 2,2,3-trimethylhexane, perfluorohexane, and perfluoroheptane, and an aromatic hydrocarbon-based solvent such as toluene, xylene, ethylbenzene, propyl benzene, 1-methylpropylbenzene, 2-methylpropylbenzene, dimethyl benzene, diethylbenzene, ethyl methyl benzene, trimethylbenzene, ethyl dimethyl benzene, and dipropylbenzene.

The aliphatic hydrocarbon-based solvent may be a mixture of compounds having the same number of carbon atoms and different structures. For example, in a case where decane is used as the aliphatic hydrocarbon-based solvent, 2-methylnonane, 2,2-dimethyloctane, 4-ethyloctane, and isooctane which are compounds having the same number of carbon atoms and different structures may be included in an aliphatic hydrocarbon-based solvent. The compound having the same number of carbon atoms and different structures may be included singly or a plurality of kinds thereof may be included. The same applies to an aliphatic hydrocarbon-based solvent in a hydrocarbon-based solvent used as a rinse solution described below.

It is preferable that the number of carbon atoms in the developer is 7 or greater (more preferably 7 to 14 carbon atoms, more preferably 7 to 12 carbon atoms, and even more preferably 7 to 10 carbon atoms), and the ester-based solvent having two or less hetero atoms is used.

The hetero atom of the ester-based solvent is an atom other than a carbon atom and a hydrogen atom, and examples thereof include an oxygen atom, a nitrogen atom, and a sulfur atom. The number of hetero atoms is preferably 2 or less.

Preferable examples of the ester-based solvent having 7 or more carbon atoms and 2 or less hetero atoms include amyl acetate, isoamyl acetate, 2-methylbutyl acetate, 1-methylbutyl acetate, hexyl acetate, pentyl propionate, hexyl propionate, butyl propionate, isobutyl isobutyrate, heptyl propionate, and butyl. butanoate. It is particularly preferable to use isoamyl acetate.

In the developer, a mixed solvent of the ester-based solvent and the hydrocarbon-based solvent, or a mixed solvent of the ketone-based solvent and the hydrocarbon solvent may be used instead of the ester-based solvent having 7 or more carbon atoms and 2 or less hetero atoms. Also in this case, it is effective for suppressing the swelling of a resist film.

In a case where an ester-based solvent and a hydrocarbon-based solvent are used in combination, it is preferable to use isoamyl acetate as the ester-based solvent. As the hydrocarbon-based solvent, in view of preparation of solubility of a resist film, it is preferable to use a saturated hydrocarbon solvent (for example, octane, nonane, decane, dodecane, undecane, and hexadecane).

A plurality of the above solvents may be mixed, or the above solvent may be mixed with a solvent other than the above solvent or water to be used. Here, in order to achieve the effect of the present invention, a moisture content with respect to the total organic developer is preferably less than 10% by mass and it is more preferable not to substantially contain moisture.

The concentration of the organic solvent (a sum in the case of a mixture of a plurality of solvents) in the developer is preferably 50 mass % or greater, more preferably 70 mass % or greater, and even more preferably 90 mass % or greater. A case where the organic solvent is substantially composed of an organic solvent only is particularly preferable. The case where the organic solvent is substantially composed of an organic solvent only includes the case of containing a very small amount of a surfactant, an antioxidant, a stabilizer, and an antifoaming agent.

It is more preferable to contain at least one or more selected from the group consisting of butyl acetate, pentyl acetate, isopentyl acetate, propylene glycol monomethyl ether acetate, 2-heptanone, and anisole among the above solvents.

Preferable examples of the organic solvent used as a developer include an ester-based solvent.

As the ester-based solvent, a solvent represented by Formula (S1) and a solvent represented by Formula (S2) are more preferably used, a solvent represented by Formula (S1) is even more preferably used, alkyl acetate is particularly preferably used, and butyl acetate, pentyl acetate, and isopentyl acetate are most preferably used.

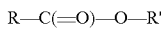  Formula (S1)

In Formula (S1),

R and R' each independently represent a hydrogen atom, an alkyl group, a cycloalkyl group, an alkoxyl group, an alkoxycarbonyl group, a carboxyl group, a hydroxyl group, a cyano group, or a halogen atom. R and R' may be bonded to each other to form a ring.

The number of carbon atoms of the alkyl group, the alkoxyl group, and the alkoxycarbonyl group with respect to the R and R' is preferably in the range of 1 to 15, and the number of carbon atoms of cycloalkyl group is preferably 3 to 15.

As R and R', a hydrogen atom or an alkyl group is preferable. An alkyl group, a cycloalkyl group, an alkoxyl group, and an alkoxycarbonyl group with respect to R and R' and a ring formed by bonding R and R' to each other may be substituted with a group including a hydroxyl group and a carbonyl group (for example, an acyl group, an aldehyde group, and alkoxycarbonyl group), a cyano group, or the like.

Examples of the solvent represented by Formula (S1) include methyl acetate, butyl acetate, ethyl acetate, isopropyl acetate, amyl acetate, isoamyl acetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, and ethyl 2-hydroxypropionate.

Among these, R and R' each are preferably an unsubstituted alkyl group.

The solvent represented by Formula (S1) is preferably alkyl acetate, more preferably butyl acetate, amyl acetate (pentyl acetate), isoamyl acetate (isopentyl acetate), and even more preferably isoamyl acetate.

The solvent represented by Formula (S1) may be used in combination with one or more of other organic solvents. In this case, the combination solvent is not particularly limited, as long as the solvent can be mixed with the solvent represented by Formula (S1) without being separated. The solvents represented by Formula (S1) may be used with each other in combination, and the solvent. represented by Formula (S1) may be mixed with a solvent selected from other ester-based solvents, ketone-based solvents, alcohol-based solvents, amide-based solvents, ether-based solvents, and hydrocarbon-based solvents, to be used, One or more kinds of the combination solvents can be used, but one kind thereof is preferable in view of obtaining stable performance. In a case where one kind of the combination. solvents is mixed to be used, the mixture ratio of the solvent represented by Formula. (S1) and the combination solvent is generally 20:80 to 99:1, preferably 50:50 to 97:3, more preferably 60:40 to 95:5, and most preferably 60:40 to 90:10 in a mass ratio.

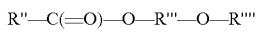  Formula (S2)

In Formula (S2),

R" and R"" each independently represent a hydrogen atom, an alkyl group, a cycloalkyl group, an alkoxyl group, an alkoxycarbonyl group, a carboxyl group, a hydroxyl group, a cyano group, or a halogen atom. R" and R"" may be bonded to each other to form a ring.

R" and R"" each are preferably a hydrogen atom or an alkyl group. The number of carbon atoms in the alkyl group, the alkoxyl group, and the alkoxycarbonyl group with respect to R" and R"" is preferably in the range of 1 to 15, and the number of carbon atoms in the cycloalkyl group is preferably 3 to 15.

R'" represents an alkylene group or a cycloalkylene group. R'" is preferably an alkylene group. The number of carbon atoms in the alkylene group with respect to R'" is preferably in the range of 1 to 10. The number of carbon atoms of the cycloalkylene group with respect to R'" is preferably in the range of 3 to 10.

The alkyl group, the cycloalkyl group, the alkoxyl group, and the alkoxycarbonyl group with respect to R" and R"", the alkylene group and the cycloalkylene group with respect to R'", and the ring formed by bonding R" and R"" to each other may be substituted with a group including a hydroxyl group and a carbonyl group (for example, an acyl group, an aldehyde group, and alkoxycarbonyl group), a cyano group, or the like.

In Formula (S2), the alkylene group with respect to R'" may have an ether bond in an alkylene chain.

Examples of the solvent represented by Formula (S2) include propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monophenyl ether acetate, diethylene glycol monobutyl ether acetate, diethylene glycol monoethyl ether acetate, propylene glycol monoethyl ether acetate, propylene glycol monopropyl ether acetate, methyl-3-methoxypropionate, ethyl-3-methoxypropionate, ethyl-3-ethoxypropionate, propyl-3-methoxypropionate, ethyl methoxyacetate, ethyl ethoxyacetate, 2-methoxybutyl acetate, 3-methoxybutyl acetate, 4-methoxybutyl acetate, 3-methyl-3-methoxybutyl acetate, 3-ethyl-3-methoxybutyl acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, and 4-methyl-4-methoxypentyl acetate. Propylene glycol monomethyl ether acetate is preferable.

Among these, R" and R"" each are an unsubstituted alkyl group, R'" is preferably an unsubstituted alkylene group, R" and R"" each are more preferably any one of a methyl group and an ethyl group, and R" and R"" each are even more preferably a methyl group.

The solvent represented by Formula (S2) may be used in combination with one or more of other organic solvents. In this case, the combination solvent is not particularly limited, as long as the solvent can be mixed with the solvent represented by Formula (S2) without being separated. The solvents represented by Formula (S2) may be used with each other in combination, and the solvent represented by Formula (S2) may be mixed with a solvent selected from other ester-based solvents, ketone-based solvents, alcohol-based solvents, amide-based solvents, ether-based solvents, and hydrocarbon-based solvents, to be used. One or more kinds of the combination solvents can be used, but one kind thereof is preferable in view of obtaining stable performance. In a case where one kind of the combination solvents is mixed to be used, the mixture ratio of the solvent represented by Formula (S2) and the combination solvent is generally 20:80 to 99:1, preferably 50:50 to 97:3, more preferably 60:40 to 95:5, and most preferably 60:40 to 90:10 in a mass ratio.

Examples of the organic solvent used as the developer suitably include an ether-based solvent.

Examples of the ether-based solvent that can be used include the ether-based solvents. Among these, an ether-based solvent including one or more aromatic rings is preferable, a solvent represented by Formula (S3) is more preferable, and anisole is most preferable.

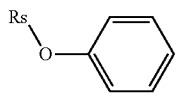

(S3)

In Formula (S3),

Rs represents an alkyl group. The number of carbon atoms in the alkyl group is preferably 1 to 4, a methyl group or an ethyl group is more preferable, and a methyl group is most preferable.

According to the present invention, the moisture content of the developer is generally 10 mass % or less, preferably 5 mass % or less, and more preferably 1 mass % or less, and it is most preferable that the developer does not substantially contain moisture.

Surfactant

An appropriate amount of the surfactant may be contained in the developer including an organic solvent, if necessary.

As the surfactant, a surfactant that is the same as that used in the actinic ray-sensitive or radiation-sensitive resin composition can be used.

The usage amount of the surfactant is generally 0.001% to 5% by mass, preferably 0.005% to 2% by mass, and even more preferably 0.01% to 0.5% by mass with respect to the total amount of the developer.

Basic Compound

The developer including an organic solvent may include a basic compound. Specific examples and preferable examples of the basic compound that can be included in the developer used in the present invention are the same as those of the acid diffusion control agent included in the actinic ray-sensitive or radiation-sensitive resin composition.

Developing Method

As the developing method, a method of dipping a substrate in a tank filled with a developer for a certain period of time (dipping method), a method of performing developing by piling a developer by surface tension on a substrate surface and stopping for a certain period of time (paddling method), a method of spraying a developer on a surface of a substrate (spraying method), and a method of scanning a developer discharging nozzle at a regular speed on a substrate that rotates at a regular speed and continuously discharging a developer (dynamic dispensing method) can be applied.

After a step of performing development, a step of stopping development while substituting the developer with another solvent may be performed.

The development time is not particularly limited, as long as a resin in an unexposed portion is sufficiently dissolved for the development time. The development time is generally 10 seconds to 300 seconds and preferably 20 seconds to 120 seconds.

The temperature of the developer is preferably 0° C. to 50° C. and more preferably 15° C. to 35° C.

(5) Rinse Step

The pattern forming method of the present invention may include a step of performing washing by using a rinse solution after the developing step. However, in view of throughput, a used amount of the rinse solution, it is preferable that a rinse step is not included.

Rinse Solution After Alkali Development

As the rinse solution in the rinse treatment after an alkali development step, pure water is preferable, and an appropriate amount of the surfactant may be added to be used.

Rinse Solution After Developing Step with Organic Solvent

Vapor pressure (the entire vapor pressure in a case of a mixed solvent) of the rinse solution used after developing step with organic solvent is preferably 0.05 kPa to 5 kPa, more preferably 0.1 kPa to 5 kPa, and most preferably 0.12 kPa to 3 kPa at 20° C. In a case where the vapor pressure of the rinse solution is caused to be 0.05 kPa to 5 kPa, wafer in-plane temperature evenness is enhanced, swelling caused by permeation of the rinse liquid is suppressed, and wafer in-plane dimension evenness is improved.

As the rinse solution, various organic solvents are used. However, a rinse solution containing at least one organic solvent selected from a hydrocarbon-based solvent, a ketone-based solvent, an ester-based solvent, an alcohol-based solvent, an amide-based solvent, and an ether-based solvent or water is preferably used.

It is more preferable that a step of performing washing with a rinse liquid containing at least one organic solvent selected from a ketone-based solvent, an ester-based solvent, an alcohol-based solvent, an amide-based solvent, and a hydrocarbon-based solvent is performed after the development. Specific examples of the ketone-based solvent, the ester-based solvent, the alcohol-based solvent, the amide-based solvent, and the hydrocarbon-based solvent include solvents exemplified in the above developer.

It is even more preferable that that a step of performing washing with a rinse liquid. containing an alcohol-based solvent and a hydrocarbon-based solvent is performed after the development.

It is particularly preferable that a rinse solution containing at least one selected from the group consisting of monohydric alcohol and a hydrocarbon-based solvent is used.

Here, examples of the monohydric alcohol used in the rinse step after the organic solvent development include linear, branched, or cyclic monohydric alcohol. Specifically, 1-butanol, 2-butanol, 3-methyl-1-butanol, tert-butyl alcohol, 1-pentanol, 2-pentanol, 1-hexanol, 1-heptanal, 1-octanol, 2-hexanol, 2-heptanol, 2-octanol, 3-hexanol, 3-heptanol, 3-octanol, 4-octanol, 3-methyl-3-pentanol, cyclopentanol, 2,3-dimethyl-2-butanol, 3,3-dimethyl-2-butanol, 2-methyl-2-pentanol., 2-methyl-3-pentanol, 3-methyl-2-pentanol, 3-methyl-3-pentanol, 4-methyl-2-pentanol, 4-methyl-3-pentanol, cyclohexanol, 5-methyl-2-hexanol, 4-methyl-2-hexanol, 4,5-dityl-2-hexanol, 6-methyl-2-heptanol, 7-methyl-2-octanol, 8-methyl-2-nonanol, and 9-methyl-2-decanol can be used, 1-hexanol, 2-hexanol, 1-pentanol, 3-methyl-1-butanol, 3-methyl-2-pentanol, 3-methyl-3-pentanol, 4-methyl-2-pentanol, and 4-methyl-3-pentanol are preferable, and 1-hexanol and 4-methyl-2-pentanol are most preferable.

In the case of using extreme ultra violet (EUV) light or electron beams (EB) in the following exposure step as the organic solvent contained in the rinse solution, in view of suppression of swelling of the pattern and the like, among the above-mentioned organic solvents, a hydrocarbon-based solvent is preferably used, and an aliphatic hydrocarbon-based solvent is more preferably used. In view of improvement of the effect, the aliphatic hydrocarbon-based solvent used in the rinse solution is preferably an aliphatic hydrocarbon-based solvent having 5 or more carbon atoms (for example, pentane, hexane, octane, decade, undecane, dodecane, and hexadecane), more preferably an aliphatic hydrocarbon-based solvent having 8 or more carbon atoms, and even more preferably an aliphatic hydrocarbon-based solvent having 10 or more carbon atoms.

The upper limit of the number of carbon atoms in the aliphatic hydrocarbon-based solvent is not particularly limited. The upper limit thereof is, for example, 16 or less, preferably 14 or less, and more preferably 12 or less.

Among the aliphatic hydrocarbon-based. solvents, decane, undecane, and dodecane are particularly preferable, and undecane is most preferable.

A plurality of the above components may be mixed or may be mixed with an organic solvent other than the above. The solvent may be mixed with water, but the moisture content in the rinse solution is generally 60 mass % or less; preferably 30 mass % or less, even more preferably 10 mass % or less, and most preferably 5 mass % or less. In a case where the moisture content is 60 mass % or less, satisfactory rinse characteristics can be obtained.

An appropriate amount of a surfactant may be contained in the rinse solution.

As the surfactant, the same surfactants as used in the above actinic ray-sensitive or radiation-sensitive resin composition can be used. The used amount thereof is generally 0.001 to 5 mass %, preferably 0.005 to 2 mass %, and even more preferably 0.01 to 0.5 mass % with respect to the total amount of the rinse solution.

Rinse Method

In the rinse step, a washing treatment is performed on a wafer subjected to development by using the rinse solution containing the above organic solvent.

Storage Container

As an organic solvent (hereinafter, referred to as an "organic type treatment liquid") that can be used for the developer and the rinsing solution, an organic solvent which is preserved in a storage container of a patterning organic treatment liquid of a chemically amplification-type resist film, which has a storage portion is preferable. The storage container is preferably a storage container of an patterning organic treatment liquid of the chemically amplification-type resist film of which an inner wall of the storage portion which comes into contact with the organic type treatment liquid is formed of a resin different from any one of a polyethylene resin, a polypropylene resin, and a polyethylene-polypropylene resin, or metal subjected to rust prevention•metal elution prevention treatments. An organic solvent to be used as a patterning organic type treatment liquid of the chemically amplification-type resist film is stored in the storage portion of the storage container, and the organic solvent discharged from the storage container can be used in a case of patterning the chemically amplification-type resist film.

In the case where the storage container further has a seal portion for sealing the storage portion, it is preferable that the seal portion is also formed of a resin different from one or more resins selected from the group consisting of a polyethylene resin, a polypropylene resin, and a polyethylene-polypropylene resin or metal subjected to rust prevention•metal elution prevention treatments.

Here, the seal portion means a member that can shield the storage portion from the outside air, and examples thereof suitably include packing and an O ring.

The resin different from one or more resins selected from the group consisting of a polyethylene resin, a polypropylene resin, and a polyethylene-polypropylene resin is preferably a perfluoro resin.

Examples of the perfluoro resin include a tetrafluoroethylene resin (PTFE), an ethylene tetrafluoride•perfluoroalkyl vinyl ether copolymer (PFA), an ethylene tetrafluoride-hexafluoropropylene copolymer resin (FEP), an ethylene tetrafluoride-ethylene copolymer resin (ETFE), a trifluorochloroethylene-ethylene copolymer resin (ECTFE), a vinylidene fluoride resin (PVDF), a trifluorochloroethylene copolymer resin (PCTFE), and a fluorinated vinyl resin (PVF).

Particularly preferable examples of the perfluoro resin include a tetrafluoroethylene resin, an ethylene tetrafluoride•perfluoroalkyl vinyl ether copolymer, and an ethylene tetrafluoride-hexafluoropropylene copolymer resin.

Examples of the metal subjected to rust prevention•metal elution prevention treatments include carbon steel, alloy steel, nickel chrome steel, nickel chromium molybdenum steel, chromium steel, chromium molybdenum steel, and manganese steel.

As the rust prevention•metal elution prevention treatment, coating techniques are preferably applied.

Coating techniques are greatly divided into three kinds of metal coating (various plating), inorganic coating (various chemical conversion treatments, glass, concrete, ceramics, and the like), and organic coating (rust preventive oil, paint, rubber, and plastics).

Examples of the preferable coating techniques include surface treatments with rust preventive oil, a rust inhibitor, a corrosion inhibitor, a chelate compound, peelable plastic, and a lining agent.

Among these, various carboxylic acids such as chromic acid salt, nitrous acid salt, silicic acid salt, phosphoric acid salt, oleic acid, dimer acid, and naphthenic acid, carboxylic acid metal soap, sulfonic acid salt, amine salt, corrosion inhibitors such as ester (glycerin ester and phosphoric acid ester of higher fatty acid), chelate compounds such as ethylenediaminetetraacetic acid, gluconic acid, nitrilotriacetic acid, hydroxy ethyl ethylene diamine triacetic acid, and diethylenetriaminepentaacetic acid, and fluororesin lining are preferable. A phosphoric acid salt treatment and fluororesin lining are particularly preferable.

Compared with a direct coating treatment, it is also preferable to employ a "pretreatment" which is the stage prior to a rust prevention treatment, as a treatment method that does not directly prevent rust but that causes prolongation of a rust prevention period owing by a coating treatment.

Specific examples of the pretreatment suitably include a treatment of removing various corrosive factors such as chloride and sulfuric acid salt existing on the metal surface by washing or polishing.

Specific examples of the storage container are provided below.

FluoroPure PFA composite drum manufactured by Entegris, Inc. (liquid contacting inner surface; PFA resin lining)

Steel drum can manufactured by JFE Steel Corporation (liquid contacting inner surface; zinc phosphate coated film)

An etching treatment, ion implantation, and the like are appropriately performed by using the pattern obtained by the pattern forming method of the present invention as a mask, so as to manufacture a semiconductor fine circuit, an imprint mold structure, a photomask, and the like.

The pattern formed by the method can be used. for forming a guide pattern (for example, see ACS Nano Vol. 4 No. 8, Pages 4815 to 4823) in directed self-assembly (DSA). The pattern formed by the method can be used as a core of a spacer process disclosed in JP1991-270227A (JP-H3-270227A) and JP2013-164509A.

Processes in a case of creating an imprint mold using the composition according to the present invention are disclosed, for example, in JP4109085B, JP2008-162101A, and "Science and New Technology in Nanoimprint—Substrate technology of nanoiniprint and latest technology development—edited by HIRAI, Yoshihiko (Frontier Publishing)".

The photo mask that is manufactured by using the pattern forming method according to the present invention may be a light transmission-type mask used in ArF excimer laser and the like, or may be a light reflection-type mask used in a reflection system lithography having EUV light as a light source.

The present invention also relates to an electronic device manufacturing method including the patterning forming method according to the present invention described above.

The electronic device manufactured by the electronic device manufacturing method according to the present invention is suitably mounted on an electric and electronic apparatus (home electric appliances, office appliance (OA) •media related-apparatuses, optical apparatuses, communication apparatuses, and the like).

EXAMPLES

Hereinafter, the present invention is described in detail with reference to examples, but the present invention is not limited thereto.

Reference Synthesization Example 1: Synthesization of Resin Poly-2

20 g of poly(p-hydroxystyrene) (VP2500) manufactured by Nippon Soda Co., Ltd. was dissolved in 120 mL of tetrahydrofuran (THF), 4.96 g of 1-adamantanecarbonyl chloride and 3.37 g of triethylamine were added, and stirring was performed for four hours at 50° C. After the temperature of the reaction solution returned to room temperature, 100 mL of ethyl acetate and 100 mL of distilled water were added, and a 1 N HCl aqueous solution was gradually added to the reaction solution while the reaction solution was stirred in ice water such that the reaction solution was neutralized. The reaction solution was transferred by using a reparatory funnel, 100 mL of ethyl acetate and 100 mL of distilled water were further added, stirring was perfonned, and the aqueous layer was removed. Subsequently, the organic layer was washed five times with 200 mL of distilled water, and the organic layer was concentrated and added dropwise to 2 L of hexane. The powder was filtrated, collected, and vacuum-dried, so as to obtain 20.6 g of a polymer compound (Poly-2).

Poly-1 was synthesized in the same manner as in Poly-2.

With respect to the obtained resin, the weight-average molecular weight (Mw: in terms of polystyrene), the number-average molecular weight (Mn: in terms of polystyrene), and a degree of dispersion (Mw/Mn, hereinafter "Pd") were calculated by a GPC (carrier: tetrahydrofuran (THF)) measurement. A composition ratio (molar ratio) was calculated by the 1H-NMR (Nuclear Magnetic Resonance) measurement.

The structure of the synthesized resin is described below together with a composition ratio (molar ratio), a mass-average molecular weight (Mw), and degree of dispersion (MwfMn) of the repeating unit.

[Resin (A)]

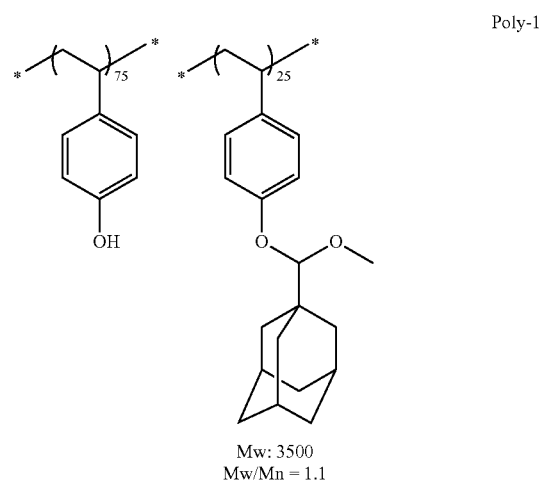

Poly-1

Mw: 3500
Mw/Mn = 1.1

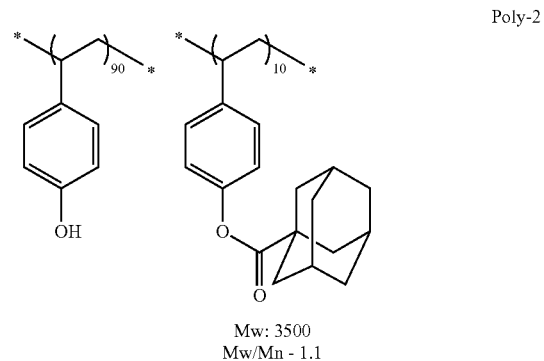

Poly-2

Mw: 3500
Mw/Mn - 1.1

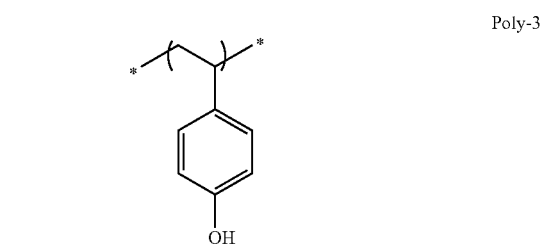

Poly-3

Mw: 3500
VP2500 manufactured by Nippon Soda Co., Ltd.

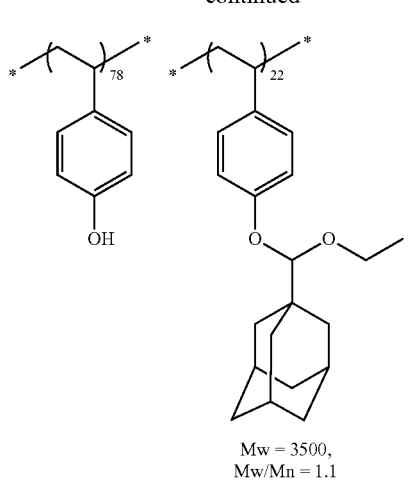

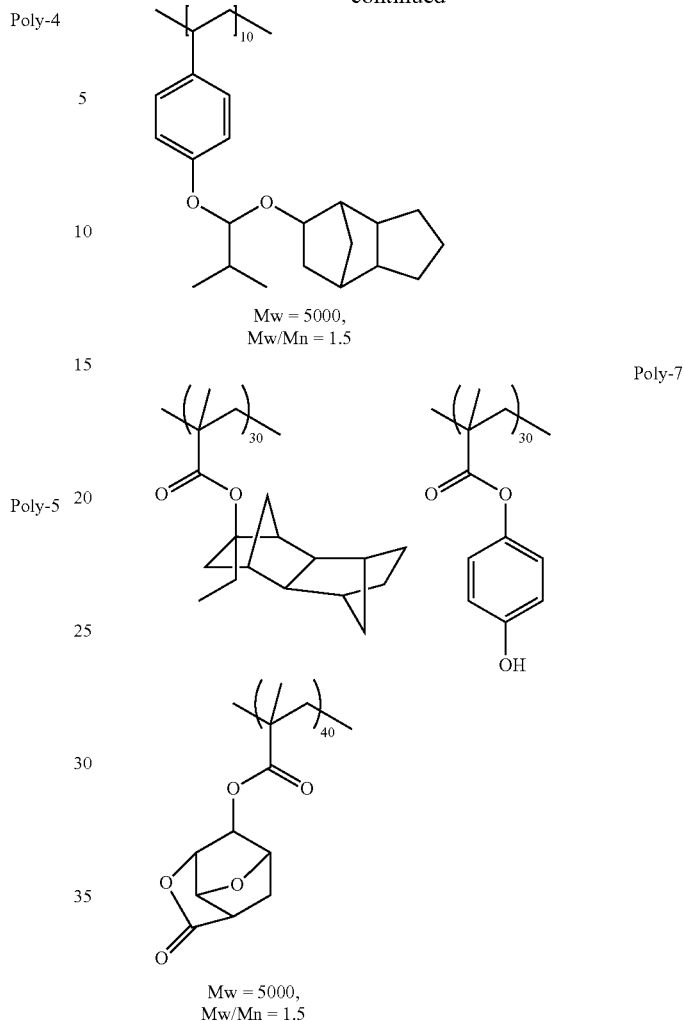

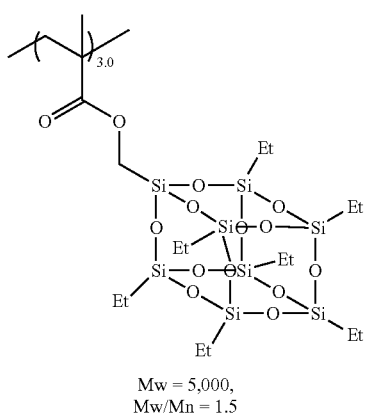

[Preparation of Resist Composition]

The components presented in Tables 1-2 and 2 were dissolved in a solvent (PGME/PGMEA=2:8 (mass ratio)), respective solutions each having a solid content concentration of 1.5 mass % was prepared, and the solutions were filtrated with a polyethylene filter having a pore size of 0.03 µm, so as to prepare a resist composition.

The photoacid generator (B), the acid diffusion control agent (C), the crosslinking agent, the additive, the hydrophobic resin, and the solvent used in the preparation of the resist composition are provided below.

[Photoacid Generator (B)]

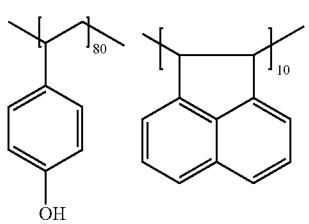

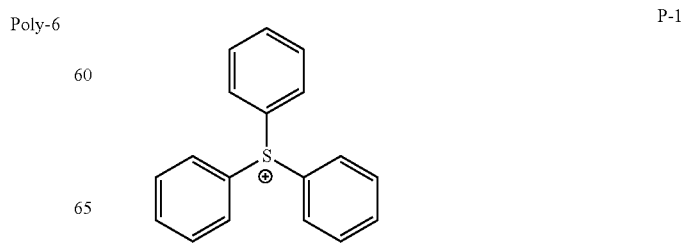

-continued
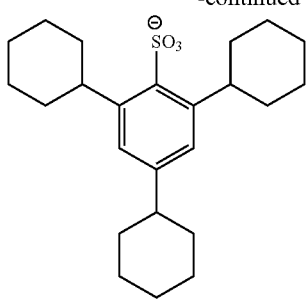
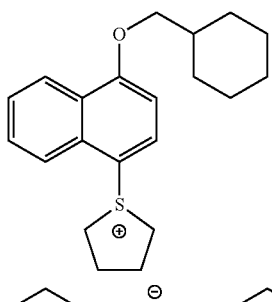
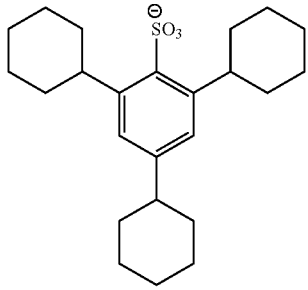
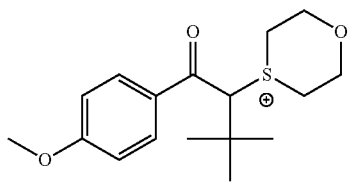
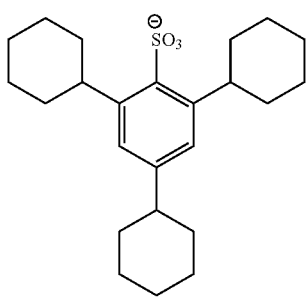
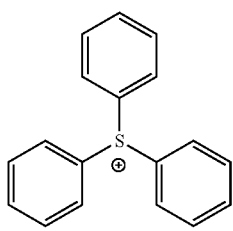
P-2
P-3
P-4
-continued
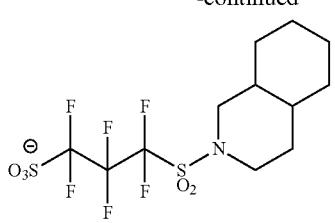
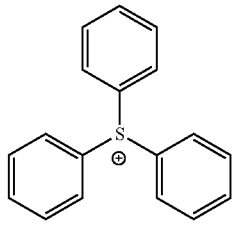
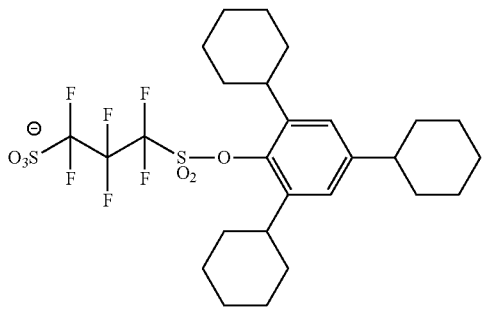
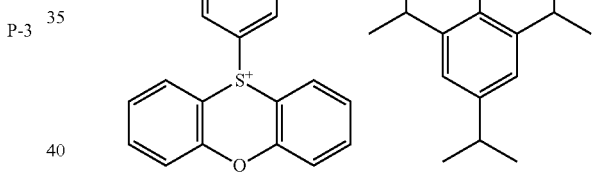
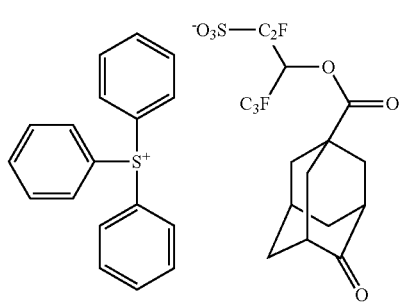
P-5
P-6
P-7
[Acid Diffusion Control Agent (C)]
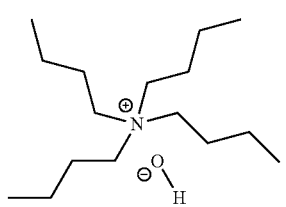
Q-1

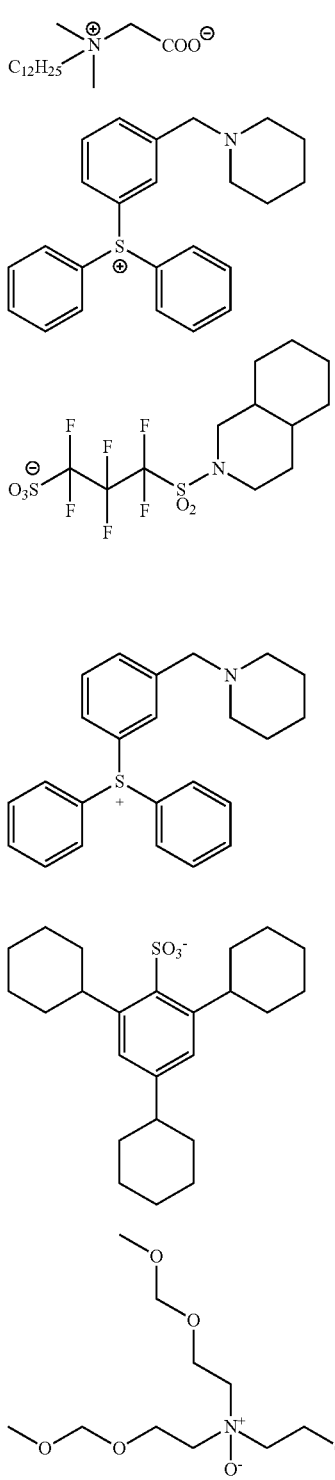
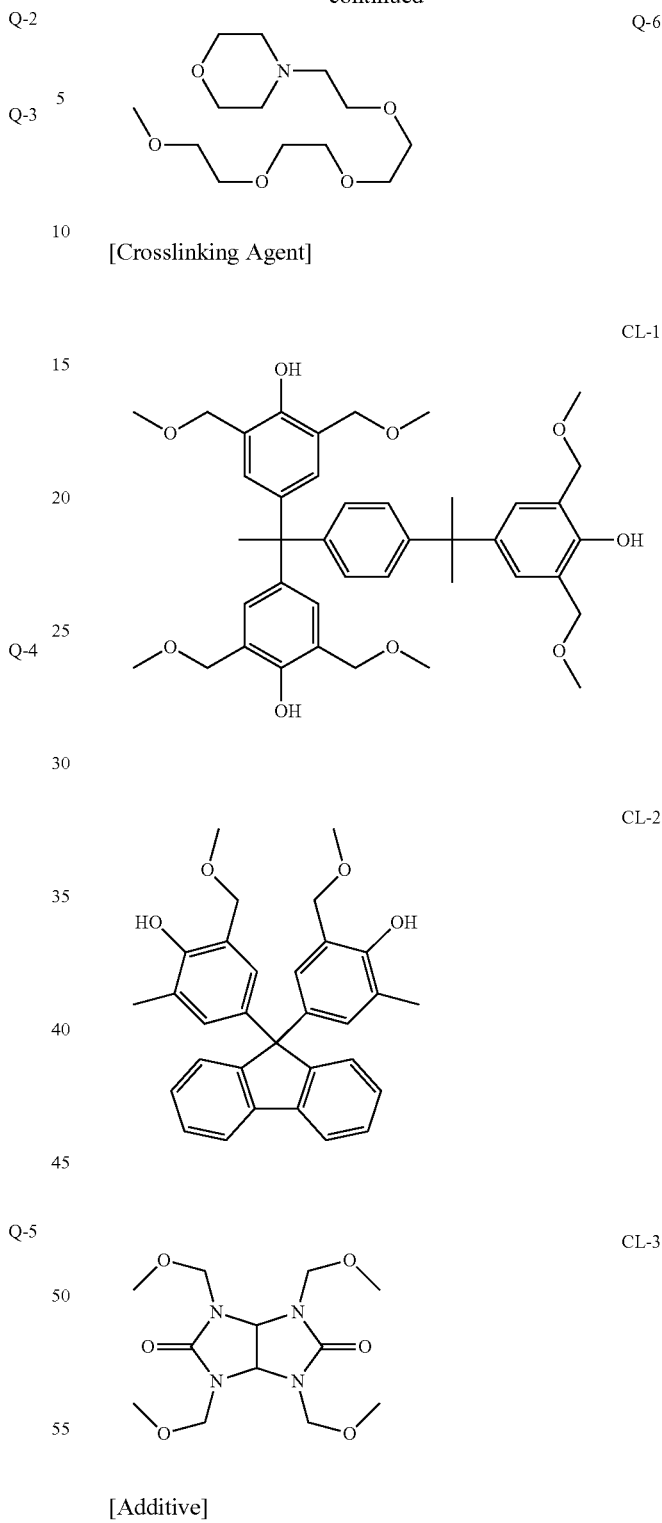
[Crosslinking Agent]
[Additive]
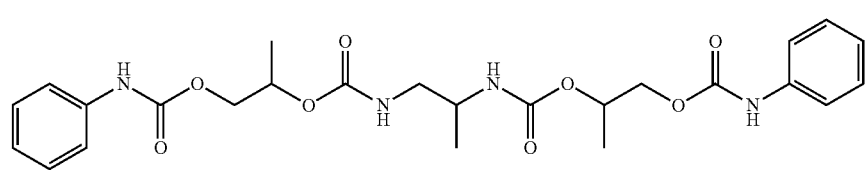

-continued

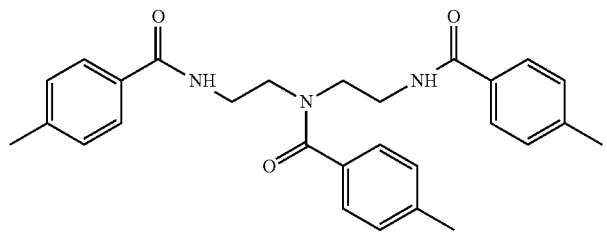

A-2

[Hydrophobic Resin]

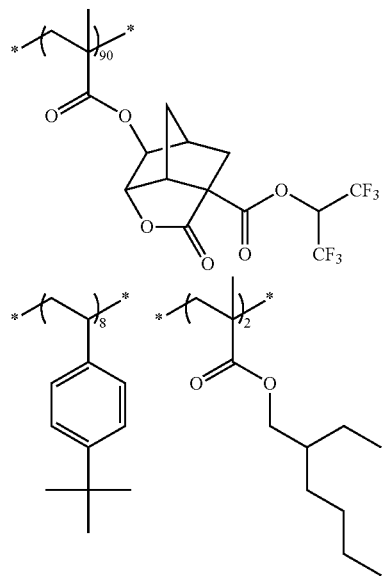

AP-1

Mw = 12000 Mw/Mn = 1.5

[Solvent]
PGME: Propylene Glycol Monomethyl Ether Acetate
PGMEA: Propylene Glycol Monomethyl Ether [Preparation of Overcoat Composition]

The overcoat composition was prepared by the same method as in the resist composition by using components presented in Table 1-1.

The polymer, the additive, and the solvent used in the preparation of the overcoat composition are provided below.

TABLE 1-1

| TC | Polymer | Content (mass %) | Additive | Content (mass %) | Solvent |
|---|---|---|---|---|---|
| TC-15 | V11 | 98 | TQ-2 | 2 | Y1 |
| TC-16 | V12 | 96 | A-2 | 4 | Y2 |

[Polymer]
The composition ratio (molar ratio) of the polymer is calculated in the same method as in the resin (A).

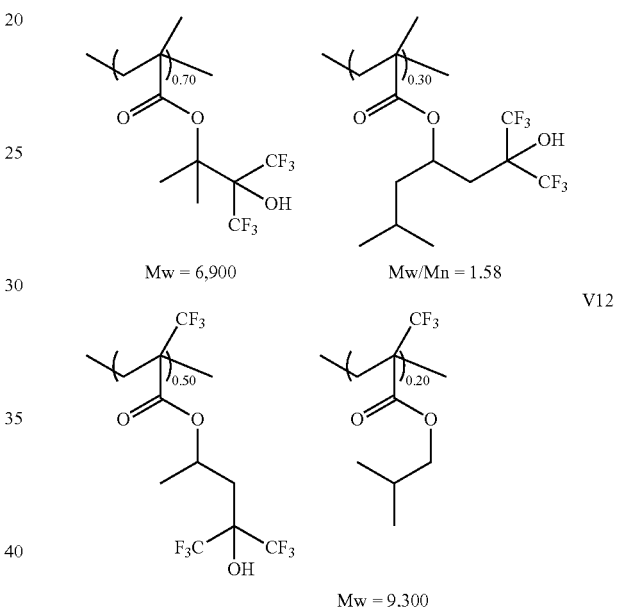

V11

Mw = 6,900    Mw/Mn = 1.58

V12

Mw = 9,300

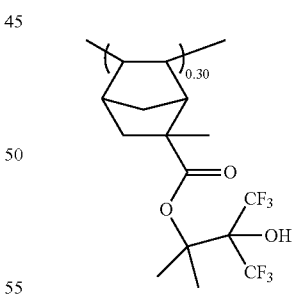

Mw/Mn = 1.93

[Additive]

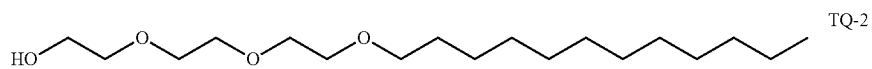

TQ-2

A-2

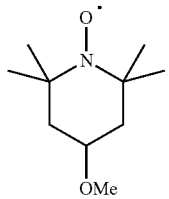

[Solvent]
Y1: 4-methyl-2-pentanol
Y2: Decane

Examples 1-1 to 1-8, Comparative Example 1-1(Alkali Development/Positive Type)

A 6-inch silicon substrate treated with hexamethyldisilazane was evenly coated with resists A1 to A9 presented in Table 1-2 prepared as described above by using a spin coater. Subsequently, baking was performed at 110° C. for 90 seconds by using a hot plate. Accordingly, a resist film having a film thickness of 30 nm was formed.

The obtained resist film was exposed by using an electron beam irradiation apparatus (JBX6000 manufactured by JEOL Corporation, accelerating voltage 50 keV, Spot Beam method) by varying irradiation amounts, so as to form line patterns (0.5 mm in the length direction, the number of drawings: 50) having a line width of 20 nm to 40 nm at intervals of 2.5 nm.

After the irradiation, baking (Post Exposure Bake; PEB) was immediately performed on a hot plate at 120° C. for 90 seconds.

Subsequently, the wafer was rotated at 50 rpm by using a shower-type developing apparatus (ADE-3000S manufactured by ActesKyosan Inc.), a 0.238% TMAH (tetramethylammonium hydroxide) developer (23° C.) was sprayed at a flow rate of 200 mL/min for five seconds, such that the developer was piled up on the wafer. Then, the rotation of the wafer was stopped, and the wafer was left for 60 seconds, so as to perform development.

Thereafter, the wafer was rotated at 50 rpm, pure water was used as a rinsing liquid (23° C.) and sprayed for 30 seconds at a flow rate of 200 mL/min, and a rinse treatment was performed, so as to obtain a line-and-space (L/S) resist pattern in which line patterns are aligned at equal intervals.

The exposure performed by using an electron beam irradiation apparatus (JBX6000 manufactured by JEOL Corporation) was a single beam method but was not a multi-beam method in which a plurality of single beams are simultaneously scanned. However, it was assumed that the effect obtained by replacing the multi-beam method with the single beam method was only for the total drawing time, and obtainable evaluation results of the resolution and the LWR were equivalent to the evaluation results in the case of using the multi-beam method. Therefore, here, the evaluation results were substituted with the result of the multi-beam method.

<Evaluation>
[Sensitivity]

The obtained pattern was observed by using a scanning electron microscope (S-9220 manufactured by Hitachi, Ltd.). An exposure dose at which a line width of 30 nm was separated and resolved such that the ratio of line to space was 1:1 was set as sensitivity ($\mu C/cm^2$). The results are provided in Table 1-2.

[Resolving Power]

A minimum line width was separated and resolved such that a ratio of line to space was 1:1 was set as resolution (nm). The results are presented in Table 1-2.

[Line Width Roughness (LWR)]

The line width at arbitrary 30 points in 1 μm in a longitudinal direction of a line pattern having a line width of 30 nm was measured by using a scanning electron microscope (S-9220, manufactured by Hitachi, Ltd.), and 3σ was calculated from the standard deviation. A smaller value exhibits more satisfactory LWR performance. The results are provided in Table 1-2.

TABLE 1-2

| | | Resin (A) | | Photoacid generator (B) | | Acid diffusion control agent(C) | | Qp (mol/mol) Acid diffusion control agent | Evaluation items | | |
|---|---|---|---|---|---|---|---|---|---|---|---|
| | | Structural formula | Content (mass %) | Structural formula | Content (mass %) | Structural formula | Content (mass %) | (C)/Photoacid generator (B) | Sensitivity [$\mu C/cm^2$] | Resolving power [nm] | LWR [nm] |
| Example 1-1 | Resist A1 | Poly-1 | 86.6 | P-1 | 12 | Q-1 | 1.4 | 0.3 | 106 | 27.5 | 5.4 |
| Example 1-2 | Resist A2 | Poly-1 | 85.7 | P-1 | 12 | Q-1 | 2.3 | 0.5 | 178 | 25.0 | 5.1 |
| Example 1-3 | Resist A3 | Poly-1 | 46.2 | P-1 | 45 | Q-1 | 8.8 | 0.5 | 134 | 25.0 | 4.7 |
| Example 1-4 | Resist A4 | Poly-1 | 47.0 | P-2 | 45 | Q-1 | 8.0 | 0.5 | 155 | 22.5 | 4.5 |
| Example 1-5 | Resist A5 | Poly-1 | 46.8 | P-3 | 45 | Q-1 | 8.2 | 0.5 | 161 | 22.5 | 4.2 |
| Example 1-6 | Resist A6 | Poly-1/ Poly-3 90/10 | 86.6 | P-1 | 12 | Q-1 | 1.4 | 0.3 | 100 | 30.0 | 5.5 |
| Example 1-7 | Resist A7 | Poly-1 | 86.7 | P-1/P-2 50/50 | 12 | Q-1 | 1.3 | 0.3 | 117 | 27.5 | 5.2 |
| Example 1-8 | Resist A8 | Poly-1 | 86.6 | P-1 | 12 | Q-1/Q-2 50/50 | 1.4 | 0.3 | 106 | 27.5 | 5.4 |
| Comparative Example 1-1 | Resist A9 | Poly-1 | 87.1 | P-1 | 12 | Q-1 | 0.9 | 0.2 | 67 | 35.0 | 7.2 |

Examples 2-1 to 2-7 and Comparative Example 2-1(Alkali Development/Crosslinking Negative Type)

Patterns were formed in the same manner as Examples 1-1 to 1-8 and Comparative Example 1-1 except for changing the resist compositions to resists B 1 to B8 presented in Table 2, and sensitivity, LWR and resolving power of the obtained negative tone patterns were evaluated in the same manner as above. The results are provided in Table 2.

TABLE 2

| | | Resist composition | | | | | | | | Qp (mol/ mol) Acid diffusion control agent (C)/ Photoacid generator (B) | Evaluation items | | |
|---|---|---|---|---|---|---|---|---|---|---|---|---|---|
| | | Resin (A) | | Photoacid generator (B) | | Acid diffusion control agent | | Cross-linking agent | | | Sensi-tivity [μC/cm²] | Re-solving Power [nm] | LWR [nm] |
| | | Structural formula | Content (mass %) | Structural formula | Content (mass %) | Structural formula | Content (mass %) | Structural formula | Content (mass %) | | | | |
| Example 2-1 | Resist B1 | Poly-2 | 63.3 | P-4 | 15 | Q-1 | 1.7 | CL1 | 20 | 0.3 | 101 | 30.0 | 5.2 |
| Example 2-2 | Resist B2 | Poly-2 | 62.2 | P-4 | 15 | Q-1 | 2.8 | CL1 | 20 | 0.5 | 163 | 27.5 | 4.9 |
| Example 2-3 | Resist B3 | Poly-2 | 63.3 | P-4 | 15 | Q-1 | 1.7 | CL2 | 20 | 0.3 | 113 | 27.5 | 5.1 |
| Example 2-4 | Resist B4 | Poly-2 | 63.3 | P-4 | 15 | Q-1 | 1.7 | CL3 | 20 | 0.3 | 121 | 32.5 | 5.5 |
| Example 2-5 | Resist B5 | Poly-2/Poly-3 90/10 | 63.3 | P-4 | 15 | Q-1 | 1.7 | CL1 | 20 | 0.3 | 111 | 30.0 | 5.1 |
| Example 2-6 | Resist B6 | Poly-2 | 63.5 | P-4/P-5 50/50 | 15 | Q-1 | 1.5 | CL1 | 20 | 0.3 | 105 | 30.0 | 5.4 |
| Example 2-7 | Resist B7 | Poly-2 | 61.6 | P-4 | 15 | Q-1/Q-3 50/50 | 3.4 | CL1 | 20 | 0.3 | 104 | 27.5 | 5.1 |
| Comparative Example 2-1 | Resist B8 | Poly-2 | 63.9 | P-4 | 15 | Q-1 | 1.1 | CL1 | 20 | 0.2 | 58 | 37.5 | 6.8 |

Examples 3-1 to 3-8(Alkali Development/Positive Type)

In Examples 3-1 to 3-8, patterns were formed in the same manner as in Examples 1-1 to 1-8 and Comparative Example 1-1 except for changing the resist compositions to resists C1 to C8 presented in in Table 3, and sensitivity, LWR and resolving power of the obtained negative tone patterns were evaluated in the same. manner as above. The results are provided in Table 3.

Examples 3-9 and 3-10(Alkali Development/Positive Type/Overcoat)

In Examples 3-9 and 3-10, a resist film was formed in the same manner as in Examples 1-1 to 1-8 and Comparative Example 1-1 except for changing the resist composition to resist C9 presented in in Table 4. The obtained resist film was coated with the overcoat composition, so as to form an overcoat. Patterns were formed on the obtained wafer in the same manner as in Examples 1-1 to 1-8 and Comparative Example 1-1, and sensitivity, LWR and resolving power of the obtained negative tone patterns Were evaluated in the same manner as above. The results are provided in Table 3.

TABLE 3

| | | Resist composition | | | | | | | | Qp(mol/mol) | | Evaluation items | | |
|---|---|---|---|---|---|---|---|---|---|---|---|---|---|---|
| | | Resin (A) | | Photoacid generator (B) | | Acid diffusion control agent (C) | | Additive | | Acid diffusion control agent (C)/ Photoacid generator (B) | Over-coat composition | Sensitivity [μC/cm²] | Resolving power [nm] | LWR [nm] |
| | | Structural formula | Content (mass %) | Structural formula | Content (mass %) | Structural formula | Content (mass %) | Structural formula | Content (mass %) | | | | | |
| Example 3-1 | Resist C1 | Poly-4 | 82.0 | P-1 | 14.5 | Q-1 | 3.5 | — | | 0.6 | — | 108 | 27.5 | 4.8 |
| Example 3-2 | Resist C2 | Poly-4 | 68.0 | P-1 | 27.0 | Q-1 | 5.0 | — | | 0.5 | — | 102 | 25.0 | 4.2 |
| Example 3-3 | Resist C3 | Poly-5 | 82.5 | P-1 | 14.5 | Q-1 | 3.0 | — | | 0.5 | — | 115 | 22.5 | 5.2 |
| Example 3-4 | Resist C4 | Poly-4 | 71.6 | P-1 | 14.5 | Q-1 | 3.9 | A-1 | 10.0 | 0.7 | — | 106 | 25.0 | 4.5 |
| Example 3-5 | Resist C5 | Poly-4 | 72.5 | P-1 | 14.5 | Q-1 | 3.0 | A-2 | 10.0 | 0.5 | — | 110 | 25.0 | 4.7 |
| Example 3-6 | Resist C6 | Poly-1 | 71.0 | P-1 | 12.3 | Q-4 | 16.7 | — | | 0.5 | — | 108 | 27.5 | 4.0 |
| Example 3-7 | Resist C7 | Poly-6 | 79.2 | P-6 | 16.6 | Q-5 | 4.2 | — | | 0.5 | — | 111 | 30.0 | 5.5 |
| Example 3-8 | Resist C8 | Poly-7 | 83.2 | P-7 | 14.1 | Q-6 | 2.7 | — | | 0.4 | — | 113 | 30.0 | 5.7 |
| Example 3-9 | Resist C9 | Poly-4 | 82.0 | P-1 | 14.5 | Q-1 | 3.5 | — | | 0.6 | TC-15 | 114 | 25.0 | 4.1 |
| Example 3-10 | Resist C9 | Poly-4 | 82.0 | P-1 | 14.5 | Q-1 | 3.5 | — | | 0.6 | TC-16 | 118 | 25.0 | 4.0 |

Example 4-1(Organic Solvent Development/Crosslinking Negative Type)

Patterns were formed in the same manner as in Examples 1-1 to 1-8 and Comparative Example 1-1 except for changing the resist composition to a resist D1 presented in Table 4, and sensitivity, LWR and resolving power of the obtained negative tone patterns were evaluated in the same manner as above. The results are provided in Table 4.

The same effect can be performed even in a case where the overcoat composition contains two or more overcoat resins. For example, even in a case where a hydrophobic resin not containing a fluorine atom that can be included in the actinic ray-sensitive or radiation-sensitive resin composition and a hydrophobic resin containing a fluorine atom as in the resin AP-I used in Example 4-1 are included, the same effect can be obtained. The content of the hydrophobic resin having this fluorine atom is not particularly limited. For

TABLE 4

| | | Resist composition | | | | | | | | | | Qp (mol/mol) | Evaluation items | | |
|---|---|---|---|---|---|---|---|---|---|---|---|---|---|---|---|
| | | Resin (A) | | Photoacid generator | | Acid diffusion control agent (C) | | Cross-linking agent | | Hydrophobic resin | | Acid diffusion control agent (C)/ Photoacid generator (B) | Sensitivity [μC/cm²] | Resolving power [nm] | LWR [nm] |
| | | Structural formula | Content (mass %) | Structural formula | Content (mass %) | Structural formula | Content (mass %) | Structural formula | Content (mass %) | Structural formula | Content (mass %) | | | | |
| Example 4-1 | Resist D1 | Poly-2 | 60.3 | P-4 | 14.3 | Q-1 | 1.6 | CL1 | 19 | AP-1 | 4.8 | 0.3 | 104 | 32.5 | 4.7 |

In the resist composition of each of the examples, a Mixed solvent PGME and PGMEA was used as the solvent. However, in a case where the mixed solvent may be changed to another solvent exemplified above or another solvent exemplified above may be. further added to the mixed solvent, the same effect can be obtained.

Even in a case where the negative pattern is formed with the resist compositions of each of the above examples in the pattern forming method of the present invention, the same effect can be performed by (i) performing a rinse treatment by using 4-methyl-2-pentanol as a rinse solution after development with butyl acetate as a developer, (ii) performing a rinse treatment by using undecane as a rinse solution after development with isoamyl acetate as a developer, and (iii) performing a rinse treatment by using a mixed solution of undecane/diisobutyl ketone (30:70) as a rinse solution after development with isoamyl acetate as a developer.

example, even in a case where the hydrophobic resin having this fluorine atom is contained by 0.01 to 20 mass %, the same effect can be obtained.

What is claimed is:

1. A pattern forming method comprising:
    a step of coating a substrate with an actinic ray-sensitive or radiation-sensitive resin composition which contains a resin (A), a photoacid generator (B), and an acid diffusion control agent (C) and in which the molar ratio (Qp) between the photoacid generator (B) and the acid diffusion control agent (C), which is represented by Equation (1) below is 0.5 or greater and forming an actinic ray-sensitive or radiation-sensitive film;
    a step of simultaneously irradiating the actinic ray-sensitive or radiation-sensitive film with a plurality of electron beams; and a step of developing the actinic ray-sensitive or radiation-sensitive film after the irradiation with electron beams:

$Qp$ (molar ratio)=Acid diffusion control agent (C)/Photoacid generator (B)  (1)

wherein the acid diffusion control agent (C) is at least one selected from the group consisting of a basic compound or an ammonium salt compound in which basicity decreases due to irradiation with actinic rays or radiation, a nitrogen-containing organic compound having a group that leaves due to an action of acid, an ammonium salt, an onium salt and a betaine compound.

2. The pattern forming method according to claim 1, wherein the content of the photoacid generator (B) in the actinic ray-sensitive or radiation-sensitive resin composition is 10 mass % to 50 mass % with respect to the total solids content in the composition.

3. The pattern forming method according to claim 1, wherein the actinic ray-sensitive or radiation-sensitive resin composition contains a compound represented by Formula (1-1) or (1-2), as the photoacid generator (B),

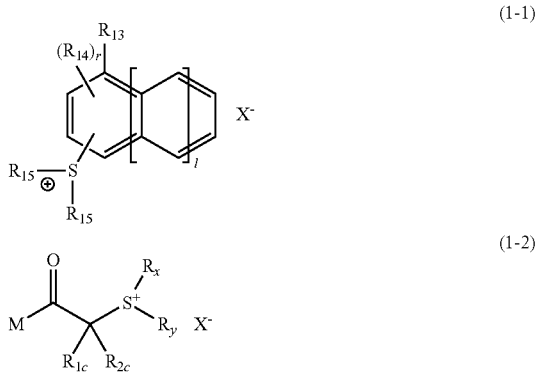

in Formula (1-1),
$R_{13}$ represents a hydrogen atom, a fluorine atom, a hydroxyl group, an alkyl group, a cycloalkyl group, an alkoxy group, an alkoxycarbonyl group, or an alkoxy group having a monocyclic or polycyclic cycloalkyl skeleton,
$R_{14}$'s, in a case where a plurality of $R_{14}$'s exist, each independently represent an alkyl group, a cycloalkyl group, an alkoxy group, an alkylsulfonyl group, a cycloalkylsulfonyl group, an alkylcarbonyl group, an alkoxycarbonyl group, or an alkoxy group having a monocyclic or polycyclic cycloalkyl skeleton,
$R_{15}$'s each independently represent an alkyl group, a cycloalkyl group, or a naphthyl group, and two $R_{15}$'s may be bonded to each other to form a ring,
1 represents an integer of 0 to 2,
r represents an integer of 0 to 8, and
$X^-$ represents a non-nucleophilic anion,
in Formula (1-2),
M represents an alkyl group, a cycloalkyl group, or an aryl group, and a cycloalkyl group may include a carbon-carbon double bond, $R_{1c}$ and $R_{2c}$ each independently represent a hydrogen atom, an alkyl group, a cycloalkyl group, a halogen atom, a cyano group, or an aryl group,
Rx and Ry each independently represent an alkyl group, a cycloalkyl group, a 2-oxoalkyl group, an alkoxycarbonylalkyl group, an allyl group, or a vinyl group,
at least two of M, $R_{1c}$, $R_{2c}$, Rx, and Ry are bonded to each other to form a ring, and the ring structure may include a carbon-carbon double bond, and
$X^-$ represents a non-nucleophilic anion.

4. The pattern forming method according to claim 3, wherein the actinic ray-sensitive or radiation-sensitive resin composition contains at least a compound in which 1 in Formula (1-1) is 1, as the photoacid generator (B).

5. The pattern forming method according to claim 3, wherein the actinic ray-sensitive or radiation-sensitive resin composition contains at least a compound represented by Formula (1-2a) as the photoacid generator (B),

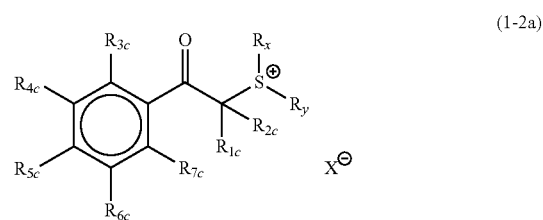

in the formula,
each of $R_{1c}$, $R_{2c}$, Rx, Ry, and $X^-$ is the same as $R_{1c}$, $R_{2c}$, Rx, Ry, and $X^-$ in Formula (1-2),
$R_{3c}$, $R_{4c}$, $R_{5c}$, $R_{6c}$, and $R_{7c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group, and two or more of $R_{3c}$, $R_{4c}$, $R_{5c}$, $R_{6c}$, and $R_{7c}$, $R_{1c}$ and $R_{7c}$, and $R_{7c}$ and $R_x$ may be bonded to each other to form rings.

6. The pattern forming method according to claim 1, wherein the resin (A) includes an acid decomposable group which is decomposed due to an action of an acid and of which polarity increases.

7. The pattern forming method according to claim 1, wherein the actinic ray-sensitive or radiation-sensitive resin composition further includes a compound in which a dissolution rate to a developer due to an action of an acid decreases.

8. A photo mask manufacturing method comprising: the pattern forming method according to claim 1.

9. An electronic device manufacturing method comprising: the pattern forming method according to claim 1.

* * * * *